US012150300B2

(12) United States Patent
Tanaka et al.

(10) Patent No.: US 12,150,300 B2
(45) Date of Patent: Nov. 19, 2024

(54) THREE-DIMENSIONAL MEMORY DEVICE INCLUDING CONTACT VIA STRUCTURES FOR MULTI-LEVEL STEPPED SURFACES AND METHODS FOR FORMING THE SAME

(71) Applicant: SANDISK TECHNOLOGIES LLC, Addison, TX (US)

(72) Inventors: Yusuke Tanaka, Yokkaichi (JP); Haruki Suwa, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 412 days.

(21) Appl. No.: 17/806,390

(22) Filed: Jun. 10, 2022

(65) Prior Publication Data

US 2022/0302153 A1 Sep. 22, 2022

Related U.S. Application Data

(63) Continuation-in-part of application No. 16/999,388, filed on Aug. 21, 2020, now Pat. No. 11,410,924.

(51) Int. Cl.
*H01L 21/00* (2006.01)
*H01L 23/48* (2006.01)
(Continued)

(52) U.S. Cl.
CPC ........... *H10B 41/27* (2023.02); *H01L 23/481* (2013.01); *H10B 41/10* (2023.02); *H10B 41/35* (2023.02);
(Continued)

(58) Field of Classification Search
CPC ........ H10B 41/27; H10B 41/10; H10B 41/35; H01L 23/481
See application file for complete search history.

(56) References Cited

U.S. PATENT DOCUMENTS 5,915,167 A 6/1999 Leedy
9,853,038 B1 * 12/2017 Cui ........................ H10B 43/35
(Continued)

FOREIGN PATENT DOCUMENTS

CN 111357109 A * 6/2020 ........ H01L 27/11519
CN 114730736 A * 7/2022 ......... H01L 23/5226
(Continued)

OTHER PUBLICATIONS

Endoh, T. et al., "Novel Ultra High Density Memory with a Stacked-Surrounding Gate Transistor (S-SGT) Structured Cell," IEDM Proc., (2001), 33-36.

*Primary Examiner* — Laura M Menz
(74) *Attorney, Agent, or Firm* — THE MARBURY LAW GROUP PLLC

(57) ABSTRACT

A three-dimensional memory device includes an alternating stack of insulating layers and electrically conductive layers containing a terrace region having a plurality of steps, memory stack structures extending through the alternating stack, a retro-stepped dielectric material portion overlying the terrace region, first laterally isolated contact structures including a respective first contact via structure and a respective first dielectric spacer, and second laterally isolated contact structures including a respective second contact via structure and a respective second dielectric spacer. The respective first contact via structure contacts a top surface of a respective first electrically conductive layer in the respective step of the plurality of steps. The respective second contact via structure extends through the respective first electrically conductive layer in the respective step and contacts a top surface of a respective second electrically conductive layer which underlies the first electrically conductive layer in the respective step.

20 Claims, 88 Drawing Sheets

(51) Int. Cl.

| | |
|---|---|
| ***H10B 41/10*** | (2023.01) |
| ***H10B 41/27*** | (2023.01) |
| ***H10B 41/35*** | (2023.01) |
| ***H10B 43/10*** | (2023.01) |
| ***H10B 43/27*** | (2023.01) |
| ***H10B 43/35*** | (2023.01) |

(52) U.S. Cl.
CPC ............. *H10B 43/10* (2023.02); *H10B 43/27* (2023.02); *H10B 43/35* (2023.02)

(56) References Cited

U.S. PATENT DOCUMENTS

| | | | | |
|---|---|---|---|---|
| 9,905,573 | B1 | 2/2018 | Mada et al. | |
| 9,960,181 | B1 * | 5/2018 | Cui | H10B 41/50 |
| 10,141,331 | B1 * | 11/2018 | Susuki | H10B 43/50 |
| 10,181,442 | B1 * | 1/2019 | Watanabe | H01L 23/5283 |
| 10,192,784 | B1 * | 1/2019 | Cui | H10B 43/50 |
| 10,211,215 | B1 | 2/2019 | Ishii et al. | |
| 10,217,746 | B1 | 2/2019 | Kim et al. | |
| 10,256,245 | B2 | 4/2019 | Ariyoshi | |
| 10,304,852 | B1 * | 5/2019 | Cui | H10B 43/10 |
| 10,355,009 | B1 | 7/2019 | Kai et al. | |
| 10,388,666 | B1 | 8/2019 | Kai et al. | |
| 10,453,798 | B2 | 10/2019 | Tsutsumi et al. | |
| 10,490,569 | B2 | 11/2019 | Mushiga et al. | |
| 10,608,010 | B2 | 3/2020 | Terasawa et al. | |
| 10,700,089 | B1 * | 6/2020 | Hojo | H01L 21/31116 |
| 10,707,233 | B1 * | 7/2020 | Cui | H01L 21/02208 |
| 10,727,248 | B2 | 7/2020 | Kaminaga | |
| 10,741,579 | B2 * | 8/2020 | Cui | H01L 29/40117 |
| 10,818,542 | B2 * | 10/2020 | Cui | H10B 43/27 |
| 10,847,524 | B2 | 11/2020 | Otsu et al. | |
| 10,937,801 | B2 | 3/2021 | Otsu et al. | |
| 11,049,876 | B2 * | 6/2021 | Kaminaga | H01L 21/76832 |
| 11,081,443 | B1 * | 8/2021 | Mizutani | H10B 43/27 |
| 11,094,715 | B2 * | 8/2021 | Cui | H01L 29/40117 |
| 11,244,958 | B2 * | 2/2022 | Cui | H01L 21/76802 |
| 11,251,191 | B2 * | 2/2022 | Weng | H10B 43/10 |
| 11,393,836 | B2 * | 7/2022 | Tsutsumi | H10B 43/50 |
| 11,410,924 | B2 * | 8/2022 | Suwa | H10B 41/50 |
| 11,569,260 | B2 * | 1/2023 | Rajashekhar | H10B 41/10 |
| 11,778,818 | B2 * | 10/2023 | Mochizuki | H10B 43/27 257/314 |
| 11,856,765 | B2 * | 12/2023 | Matsuno | H10B 43/27 |
| 11,871,580 | B2 * | 1/2024 | Zhang | H10B 43/10 |
| 11,889,684 | B2 * | 1/2024 | Tsutsumi | G11C 8/14 |
| 2018/0061850 | A1 | 3/2018 | Mada et al. | |
| 2018/0261613 | A1 | 9/2018 | Ariyoshi | |
| 2018/0342531 | A1 | 11/2018 | Susuki et al. | |
| 2018/0350879 | A1 * | 12/2018 | Sel | H01L 21/76831 |
| 2019/0096808 | A1 * | 3/2019 | Tsutsumi | H10B 43/35 |
| 2019/0229125 | A1 | 7/2019 | Zhou et al. | |
| 2019/0252396 | A1 | 8/2019 | Mushiga et al. | |
| 2019/0252403 | A1 | 8/2019 | Kaminaga et al. | |
| 2019/0252404 | A1 * | 8/2019 | Kaminaga | H10B 43/27 |
| 2019/0280001 | A1 * | 9/2019 | Terasawa | H01L 21/76865 |
| 2019/0280003 | A1 | 9/2019 | Mushiga et al. | |
| 2020/0035694 | A1 * | 1/2020 | Kaminaga | H10B 43/20 |
| 2020/0051995 | A1 * | 2/2020 | Tanaka | H10B 41/50 |
| 2020/0185405 | A1 * | 6/2020 | Cui | H01L 29/1037 |
| 2020/0203365 | A1 * | 6/2020 | Weng | H01L 21/76877 |
| 2020/0258896 | A1 * | 8/2020 | Baraskar | H10B 43/40 |
| 2020/0312706 | A1 * | 10/2020 | Cui | H10B 43/27 |
| 2020/0312875 | A1 * | 10/2020 | Cui | H01L 21/76877 |
| 2020/0335518 | A1 * | 10/2020 | Cui | H10B 41/10 |
| 2021/0159169 | A1 * | 5/2021 | Zhao | H10B 43/10 |
| 2021/0210424 | A1 * | 7/2021 | Otsu | H10B 43/35 |
| 2021/0210428 | A1 * | 7/2021 | Ohsawa | H10B 43/10 |
| 2021/0210503 | A1 * | 7/2021 | Matsuno | H01L 21/76877 |
| 2021/0265385 | A1 * | 8/2021 | Rajashekhar | H10B 43/10 |
| 2021/0296342 | A1 * | 9/2021 | Luo | H10B 43/35 |
| 2021/0358937 | A1 * | 11/2021 | Yamaguchi | H10B 43/27 |
| 2021/0366808 | A1 * | 11/2021 | Cui | H10B 43/27 |
| 2022/0005818 | A1 | 1/2022 | Tanaka et al. | |
| 2022/0005824 | A1 | 1/2022 | Tanaka et al. | |
| 2022/0013534 | A1 * | 1/2022 | Chandolu | H10B 43/35 |
| 2022/0028879 | A1 * | 1/2022 | Mochizuki | H10B 43/50 |
| 2022/0045089 | A1 * | 2/2022 | Mizutani | H10B 43/50 |
| 2022/0051979 | A1 * | 2/2022 | Kuroko | H01L 21/76816 |
| 2022/0059454 | A1 * | 2/2022 | Suwa | H10B 41/27 |
| 2022/0157841 | A1 * | 5/2022 | Tsutsumi | G11C 5/025 |
| 2022/0157842 | A1 * | 5/2022 | Tsutsumi | H10B 43/35 |
| 2022/0238453 | A1 * | 7/2022 | Sharangpani | H10B 43/50 |
| 2022/0302153 | A1 * | 9/2022 | Tanaka | H10B 41/50 |
| 2022/0367487 | A1 * | 11/2022 | Zhang | H01L 29/0649 |
| 2022/0367499 | A1 * | 11/2022 | Matsuno | H10B 43/27 |
| 2023/0345727 | A1 * | 10/2023 | Fujimura | H10B 43/27 |
| 2024/0038667 | A1 * | 2/2024 | Nakamura | H10B 41/27 |
| 2024/0172431 | A1 * | 5/2024 | Kai | H10B 43/35 |

FOREIGN PATENT DOCUMENTS

| | | | | |
|---|---|---|---|---|
| WO | WO-2022031352 | A1 * | 2/2022 | H01L 23/5226 |
| WO | WO-2022108624 | A1 * | 5/2022 | G11C 7/18 |

* cited by examiner

FIG. 37A
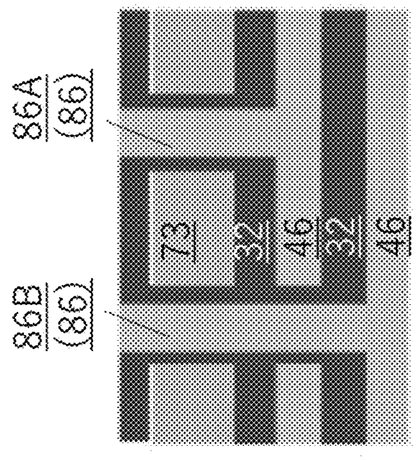
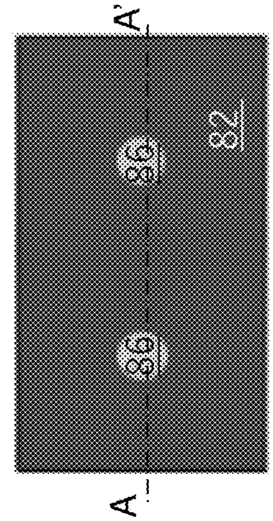
FIG. 37B
FIG. 36A
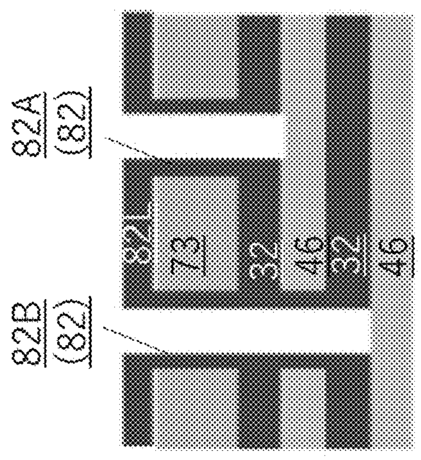
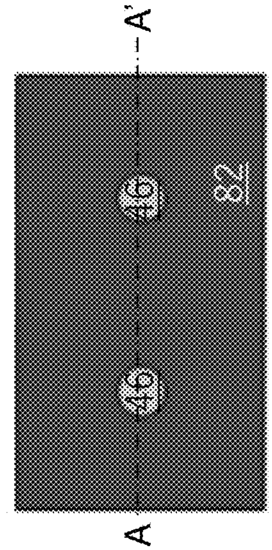
FIG. 36B
FIG. 35A
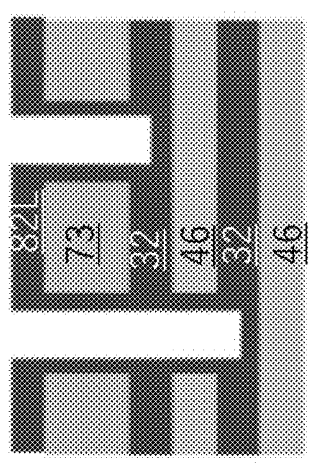
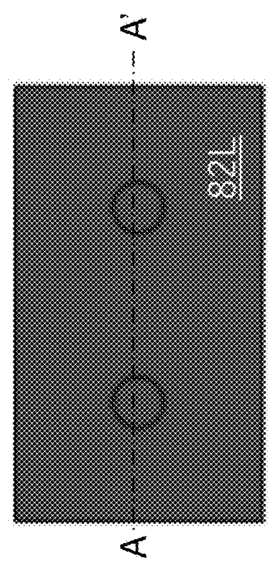
FIG. 35B

THREE-DIMENSIONAL MEMORY DEVICE INCLUDING CONTACT VIA STRUCTURES FOR MULTI-LEVEL STEPPED SURFACES AND METHODS FOR FORMING THE SAME

RELATED APPLICATIONS

This application is a continuation-in-part (CIP) application of U.S. application Ser. No. 16/999,388 filed on Aug. 21, 2020, the entire contents of which are incorporated herein by reference.

FIELD

The present disclosure relates generally to the field of semiconductor devices, and particularly to a three-dimensional memory device including contact via structures for multi-level stepped surfaces and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device includes an alternating stack of insulating layers and electrically conductive layers containing a terrace region having a plurality of steps, memory stack structures extending through the alternating stack, a retro-stepped dielectric material portion overlying the terrace region, first laterally isolated contact structures including a respective first contact via structure and a respective first dielectric spacer, and second laterally isolated contact structures including a respective second contact via structure and a respective second dielectric spacer. The respective first contact via structure contacts a top surface of a respective first electrically conductive layer in the respective step of the plurality of steps. The respective second contact via structure extends through the respective first electrically conductive layer in the respective step and contacts a top surface of a respective second electrically conductive layer which underlies the first electrically conductive layer in the respective step.

According to another aspect of the present disclosure, a method of forming a three-dimensional memory device is provided. The method comprises: forming a combination of an alternating stack of insulating layers and electrically conductive layers, memory stack structures, and a retro-stepped dielectric material portion over a substrate, wherein the memory stack structures vertically extend through the alternating stack, the alternating stack comprises stepped surfaces that continuously extend from a bottommost layer of the alternating stack to a topmost layer of the alternating stack, and the retro-stepped dielectric material portion overlies the stepped surfaces of the alternating stack; forming first via cavities and second via cavities through the retro-stepped dielectric material portion, wherein each of the first via cavities and the second via cavities vertically extends through the retro-stepped dielectric material portion and has a bottom surface that coincides with a top surface segment of a respective one of the electrically conductive layers; vertically extending the second via cavities through a respective pair of an electrically conductive layer and an insulating layer while masking the first via cavities, whereby a top surface of a respective underlying electrically conductive layer is physically exposed underneath each of the second via cavities; and forming first laterally-isolated contact structure in the first via cavities and second laterally-isolated contact structure in the second via cavities, wherein each of the first laterally-isolated contact structures includes a respective first contact via structure and a respective first dielectric spacer, and each of the second contact via structures comprises a respective second contact via structure and a respective second dielectric spacer.

According to an aspect of the present disclosure, a three-dimensional memory device includes an alternating stack of insulating layers and electrically conductive layers containing a terrace region comprising a plurality of steps, memory stack structures extending through the alternating stack, a retro-stepped dielectric material portion overlying terrace region of the alternating stack, first laterally-isolated contact structures each including a respective first contact via structure and a respective first dielectric spacer, wherein the respective first contact via structure contacts a top surface of a respective upper electrically conductive layer of the electrically conductive layers in the respective step, and the respective first dielectric spacer extends through the retro-stepped dielectric material portion and does not contact any of the electrically conductive layers other than the respective upper electrically conductive layer in the respective step, and second laterally-isolated contact structures including a respective second contact via structure and a respective second dielectric spacer, wherein the respective second contact via structure contacts a top surface of a respective lower electrically conductive layer of the electrically conductive layers in the respective step, and the respective second dielectric spacer extends through the retro-stepped dielectric material portion and through the respective upper electrically conductive layer, and contacts the respective lower electrically conductive layer.

According to another aspect of the present disclosure, a method of forming a three-dimensional memory device comprises forming an alternating stack of insulating layers and spacer material layers over a substrate, wherein the spacer material layers comprise, or are subsequently replaced with, electrically conductive layers, forming a plurality of steps by patterning the alternating stack, forming a retro-stepped dielectric material portion over the plurality of steps, forming a first via cavity and a second via cavity that vertically extend through the retro-stepped dielectric material portion down to a top surface of an upper electrically conductive layer of the electrically conductive layers in a first step of the plurality of steps by performing a first anisotropic etch process, vertically extending the second via cavity through the upper electrically conductive layer and one of the insulating layers down to a top surface of a lower electrically conductive layer of the electrically conductive layers in the first step by performing a second anisotropic etch process without vertically extending the first via cavity, and forming a first laterally-isolated contact structure in the first via cavity and a second laterally-isolated contact structure in the second via cavity, wherein the first laterally-isolated contact structure includes a first contact via structure and a first dielectric spacer, and the second contact via structure comprises a second contact via structure and a second dielectric spacer.

BRIEF DESCRIPTION OF THE DRAWINGS

FIGS. 27A, 28A, 29A, 30A, 31A, 32A, 33A, 34A, 35A, 36A and 37A are schematic vertical cross-sectional views of steps in forming an alternative first exemplary structure according to an alternative embodiment of the present disclosure. FIGS. 27B, 28B, 29B, 30B, 31B, 32B, 33B, 34B, 35B, 36B and 37B are top-down views of the steps shown in respective FIGS. 27A, 28A, 29A, 30A, 31A, 32A, 33A, 34A, 35A, 36A and 37A.

DETAILED DESCRIPTION

Figure 1:
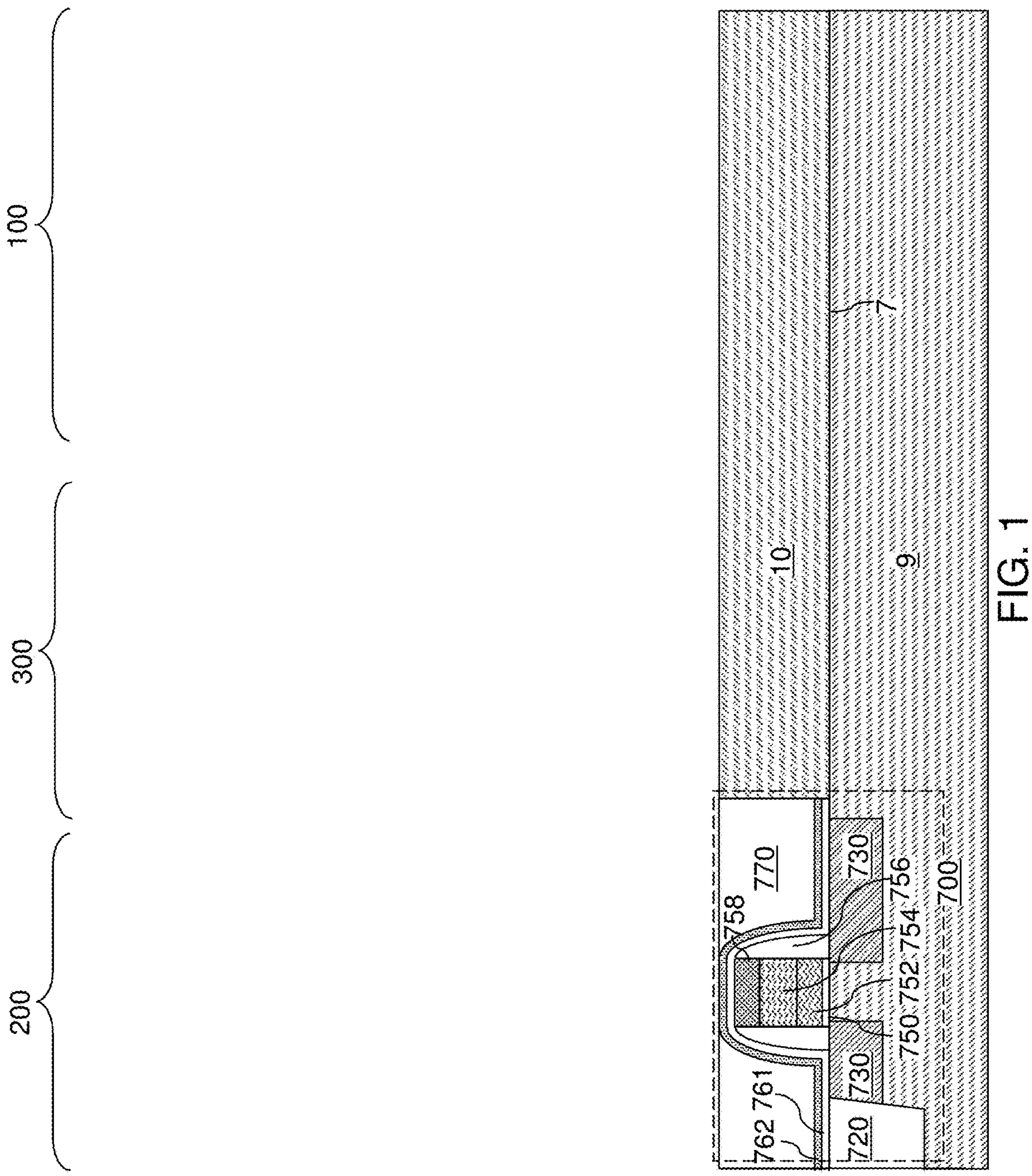
FIG. 1 is a schematic vertical cross-sectional view of a first exemplary structure after formation of at least one peripheral device and a semiconductor material layer according to an embodiment of the present disclosure.

As discussed above, the present disclosure is directed to three-dimensional memory devices including a vertical stack of multilevel memory arrays and methods of making thereof, the various aspects of which are described below. The embodiments of the disclosure can be employed to form various structures including a multilevel memory structure, non-limiting examples of which include semiconductor devices such as three-dimensional memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as “first,” “second,” and “third” are employed merely to identify similar elements, and different ordinals may be employed across the specification and the claims of the instant disclosure. The term “at least one” element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a “contact” between elements refers to a direct contact between elements that provides an edge or a surface shared by the elements. If two or more elements are not in direct contact with each other or among one another, the two elements are “disjoined from” each other or “disjoined among” one another. As used herein, a first element located “on” a second element can be located on the exterior side of a surface of the second element or on the interior side of the second element. As used herein, a first element is located “directly on” a second element if there exist a physical contact between a surface of the first element and a surface of the second element. As used herein, a first element is “electrically connected to” a second element if there exists a conductive path consisting of at least one conductive material between the first element and the second element. As used herein, a “prototype” structure or an “in-process” structure refers to a transient structure that is subsequently modified in the shape or composition of at least one component therein.

As used herein, a “layer” refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are “vertically coincident” with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

Generally, a semiconductor package (or a “package”) refers to a unit semiconductor device that can be attached to a circuit board through a set of pins or solder balls. A semiconductor package may include a semiconductor chip (or a “chip”) or a plurality of semiconductor chips that are bonded thereamongst, for example, by flip-chip bonding or another chip-to-chip bonding. A package or a chip may include a single semiconductor die (or a “die”) or a plurality of semiconductor dies. A die is the smallest unit that can independently execute external commands or report status. Typically, a package or a chip with multiple dies is capable of simultaneously executing as many number of external commands as the total number of planes therein. Each die includes one or more planes. Identical concurrent operations can be executed in each plane within a same die, although there may be some restrictions. In case a die is a memory die, i.e., a die including memory elements, concurrent read operations, concurrent write operations, or concurrent erase operations can be performed in each plane within a same memory die. In a memory die, each plane contains a number of memory blocks (or “blocks”), which are the smallest unit that can be erased by in a single erase operation. Each memory block contains a number of pages, which are the smallest units that can be selected for programming A page is also the smallest unit that can be selected to a read operation.

Referring to FIG. 1, a first exemplary structure according to an embodiment of the present disclosure is illustrated, which can be employed, for example, to fabricate a device structure containing vertical NAND memory devices. The first exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0\times10^{-5}$ S/m to $1.0\times10^{5}$ S/m. As used herein, a "semiconductor material" refers to a material having electrical conductivity in the range from $1.0\times10^{-5}$ S/m to 1.0 S/m in the absence of electrical dopants therein, and is capable of producing a doped material having electrical conductivity in a range from 1.0 S/m to $1.0\times10^{5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/m. As used herein, an "insulator material" or a "dielectric material" refers to a material having electrical conductivity less than $1.0\times10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0\times10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-5}$ S/m to $1.0\times10^{5}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors.

A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device. A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A staircase region 300 for subsequently forming stepped terraces of electrically conductive layers can be provided between the memory array region 100 and the peripheral device region 200. In one alternative embodiment, the peripheral device region 200 containing the at least one semiconductor device 700 for a peripheral circuitry may be located under the memory array region 100 in a CMOS under array configuration. In another alternative embodiment, the peripheral device region 200 may be located on a separate substrate which is subsequently bonded to the memory array region 100.

Figure 2:
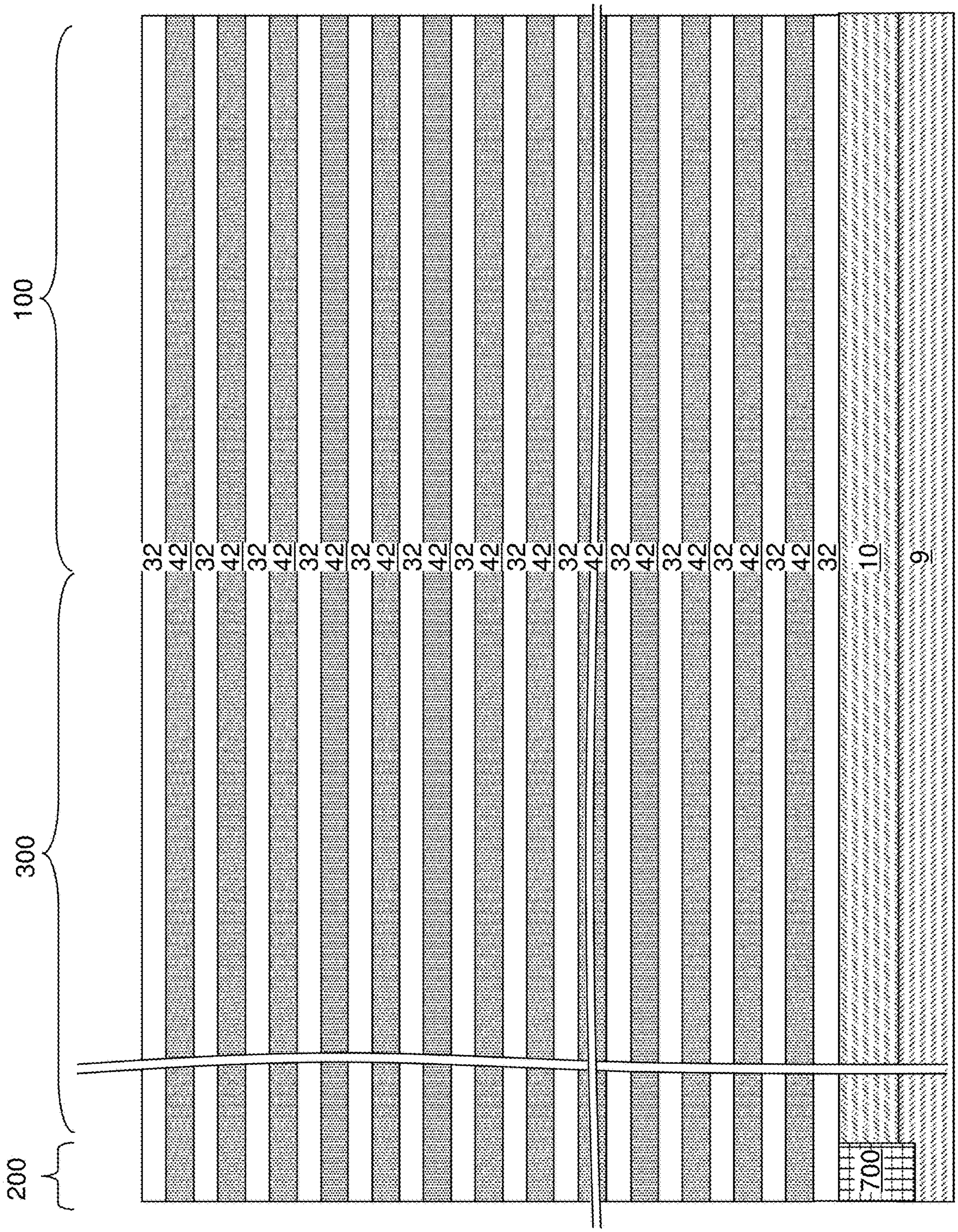
FIG. 2 is a schematic vertical cross-sectional view of the first exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide. In one embodiment, the insulating layers 32 can include, and/or can consist essentially of, undoped silicate glass or a doped silicate glass.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

In one embodiment, the topmost layer of the alternating stack (32, 42) may be an insulating layer 32. The topmost insulating layer 32 may have a greater thickness than each of the insulating layers 32.

Figure 3:
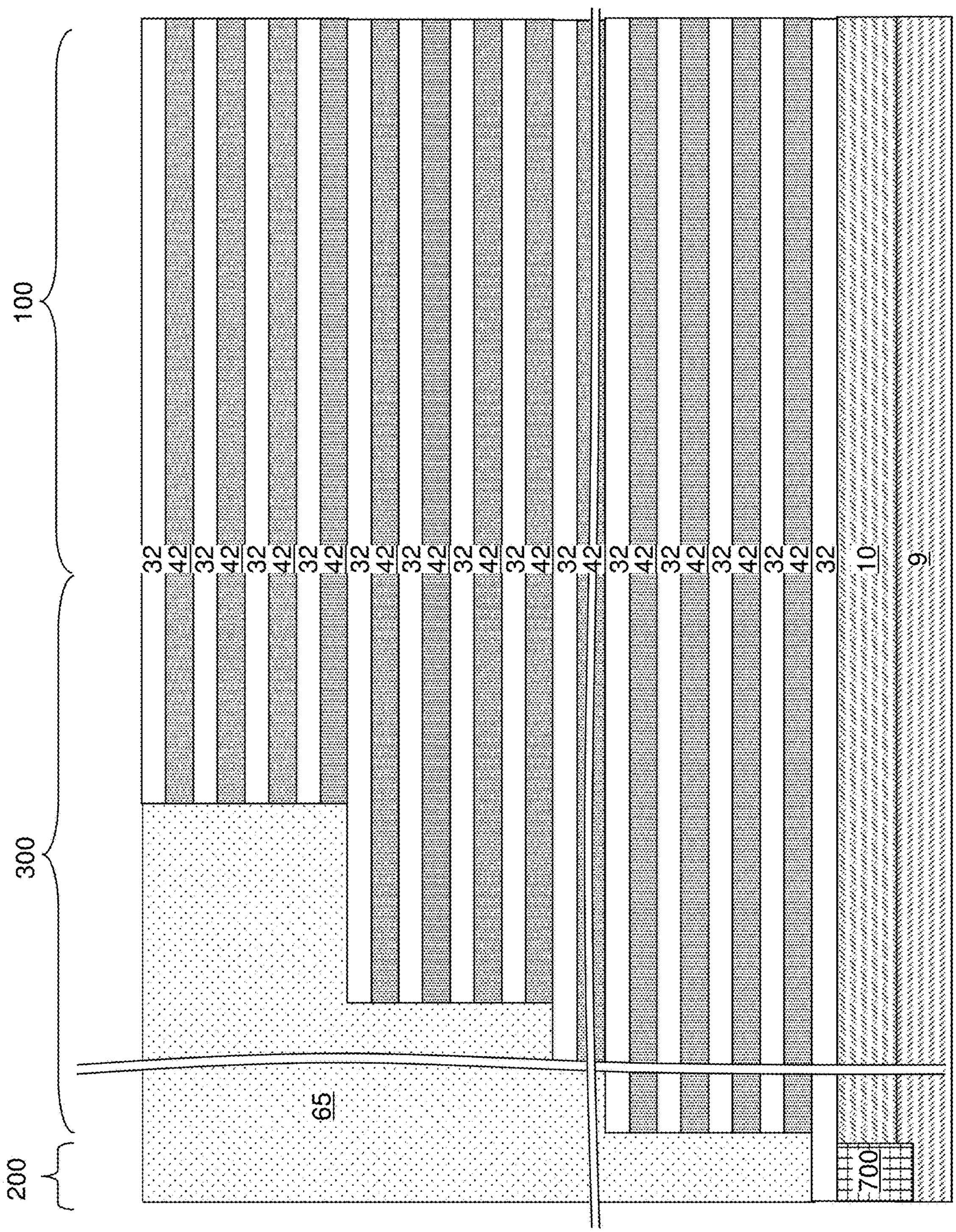
FIG. 3 is a schematic vertical cross-sectional view of the first exemplary structure after formation of stepped terraces and a retro-stepped dielectric material portion according to an embodiment of the present disclosure.

Referring to FIG. 3, stepped surfaces (i.e., horizontal steps) are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the staircase region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

In one embodiment, the layers within the alternating stack (32, 42) may have a vertical periodicity. The vertical periodicity of the alternating stack (32, 42) is the same as the vertical periodicity of the insulating layers 32, which is the same as the vertical periodicity of the sacrificial material layers 42. The vertical periodicity can be the same as the sum of a thickness of an insulating layer 32 and the thickness of a sacrificial material layer 42. The vertical periodicity can be the same as the vertical separation distance between top surfaces of a vertically neighboring pair of insulating layers 32 within the alternating stack (32, 42). Further, the vertical periodicity can be the same as the vertical separation distance between top surfaces of a vertically neighboring pair of sacrificial material layers 42 within the alternating stack (32, 42).

According to an aspect of the present disclosure, the stepped surfaces of the alternating stack (32, 42) can be vertically offset from each other by integer multiples of the vertical periodicity of the alternating stack (32, 42). For example, physically exposed horizontal surfaces of the alternating stack (32, 42) can be vertically spaced apart from each other by multiples of K times the vertical periodicity, where K is an integer greater than 1, i.e., an integer such as 2, 3, 4, 5, 6, 7, 8, etc. In one embodiment, K is an integer in a range from 2 to $2^N$, and wherein N is an integer in a range from 2 to 6. Thus, each vertical step in the stepped surfaces of the alternating stack (32, 42) can have a respective straight sidewall that vertically extends over at least two (e.g., two to four) insulating layers 32 and at least two (e.g., two to four) sacrificial material layers 42. Each vertical step of the stepped surfaces can have the height of multiple pairs of an insulating layer 32 and a sacrificial material layer 42.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the topmost insulating layer 32, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Generally, the retro-stepped dielectric material portion 65 comprises a contiguous set of surfaces that includes horizontal bottom surface segments and vertical surface segments. The retro-stepped dielectric material portion 65 includes a set of horizontal bottom surface segments and vertical surface segments. The horizontal bottom surface segments are vertically spaced apart from each other and are laterally spaced apart from each other. Each of the horizontal bottom surface segments other than the bottommost one of the horizontal bottom surface segments can be adjoined to a respective pair of vertical surfaces segments among the vertical surface segments of the retro-stepped dielectric material portion 65.

Optionally, drain-select-level isolation structures 72 can be formed through the topmost insulating layer 32 and a subset of the sacrificial material layers 42 located at drain select levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the topmost insulating layer 32.

Figure 4A:
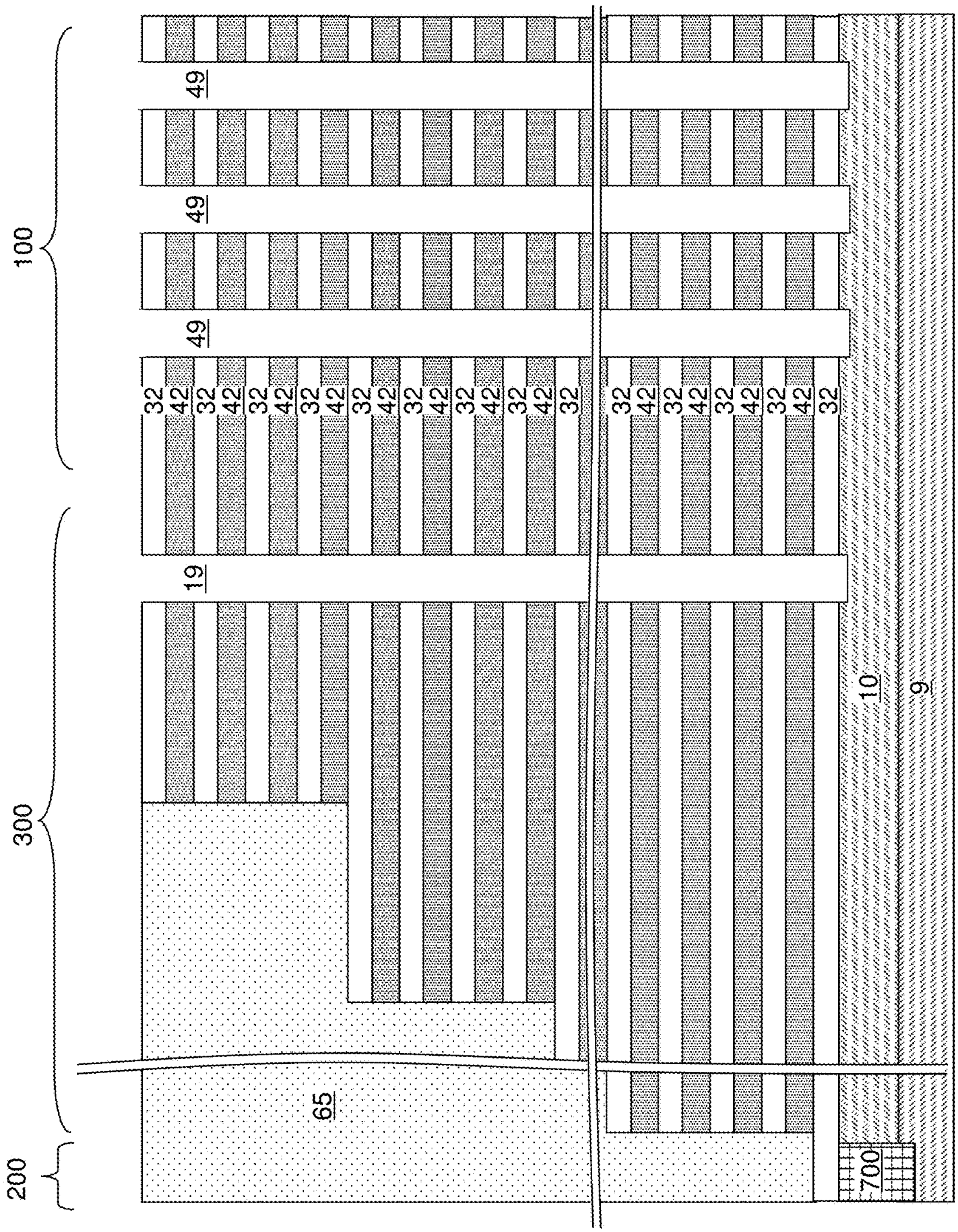
FIG. 4A is a schematic vertical cross-sectional view of the first exemplary structure after formation of memory openings and support openings according to an embodiment of the present disclosure.
Figure 4B:
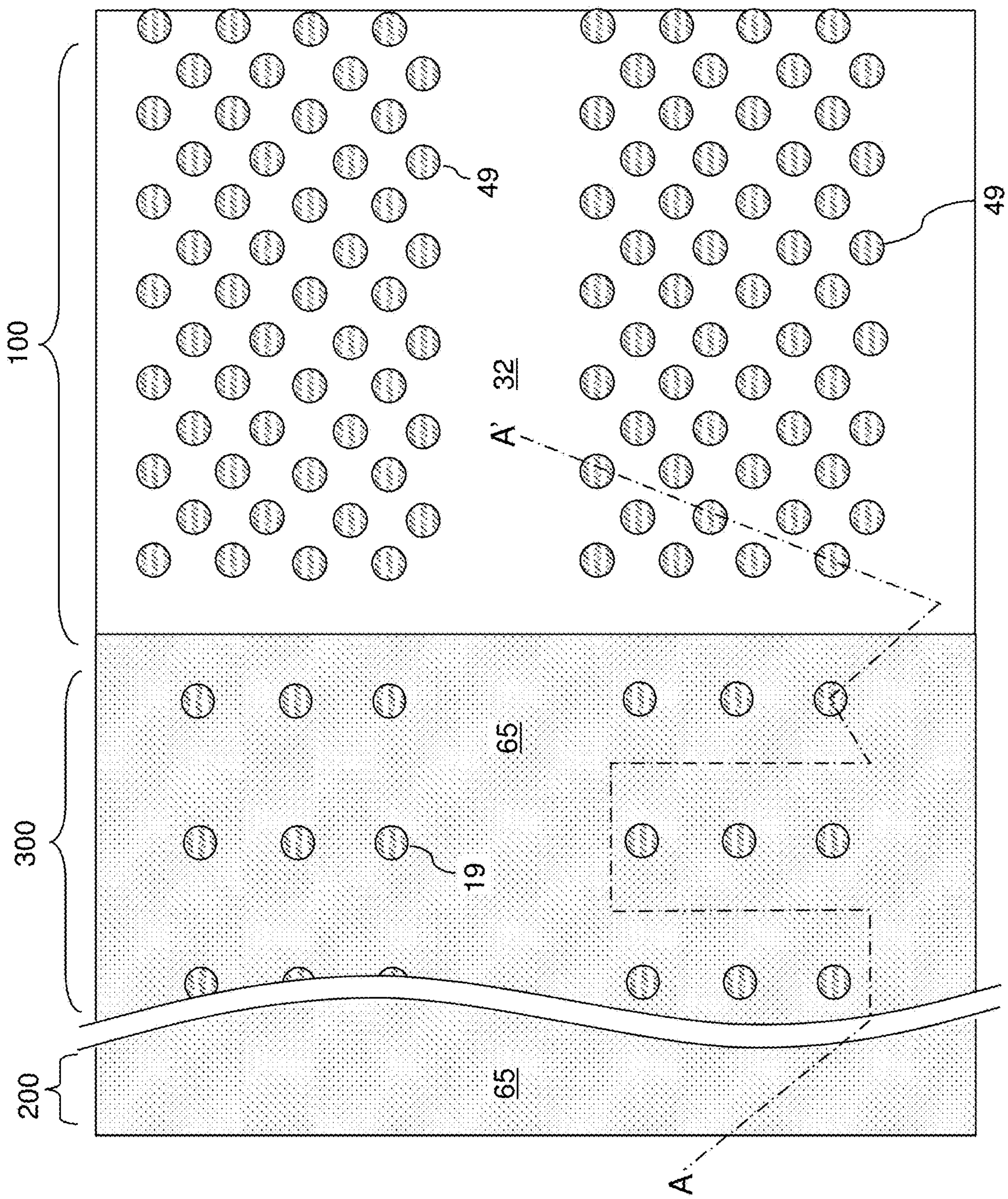
FIG. 4B is a top-down view of the first exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the topmost insulating layer 32 and the retro-stepped dielectric material portion 65, and can be lithographically patterned to form openings therein. The openings include a first set of openings formed over the memory array region 100 and a second set of openings formed over the staircase region 300. The pattern in the lithographic material stack can be transferred through the topmost insulating layer 32 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the topmost insulating layer 32 and the entirety of the alternating stack (32, 42) in the memory array region 100. The support openings 19 are formed through the retro-stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the staircase region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5H illustrate structural changes in a memory opening 49, which is one of the memory openings 49 in the first exemplary structure of FIGS. 4A and 4B. The same structural change occurs simultaneously in each of the other memory openings 49 and in each of the support openings 19.

Figure 5B:
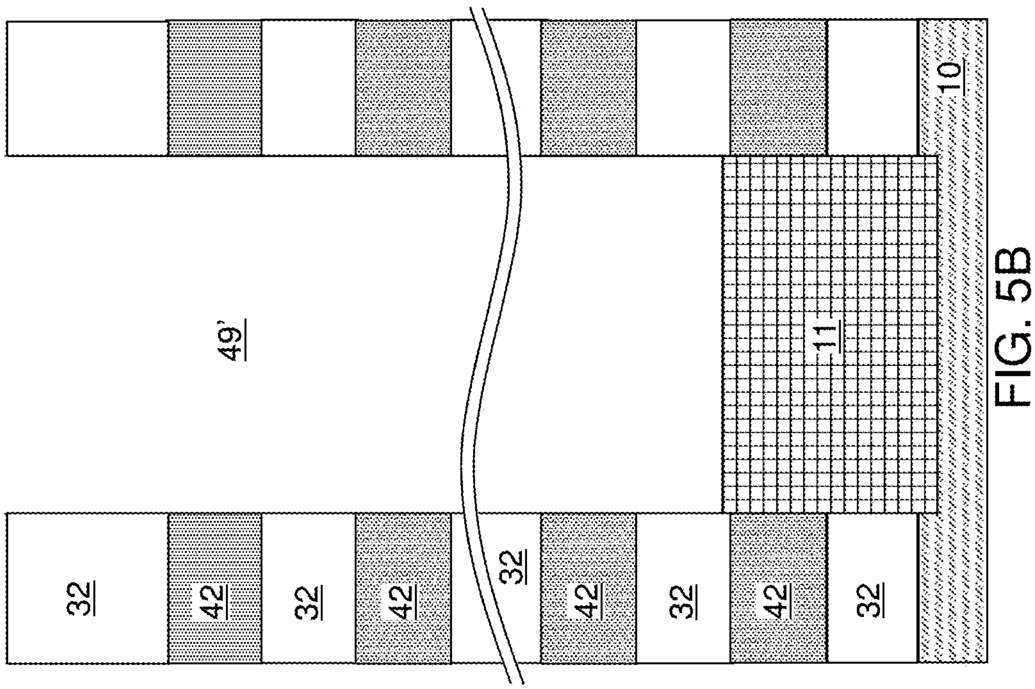
FIGS. 5A-5H are sequential schematic vertical cross-sectional views of a memory opening within the first exemplary structure during formation of a memory stack structure, an optional dielectric core, and a drain region therein according to an embodiment of the present disclosure.
Figure 5A:
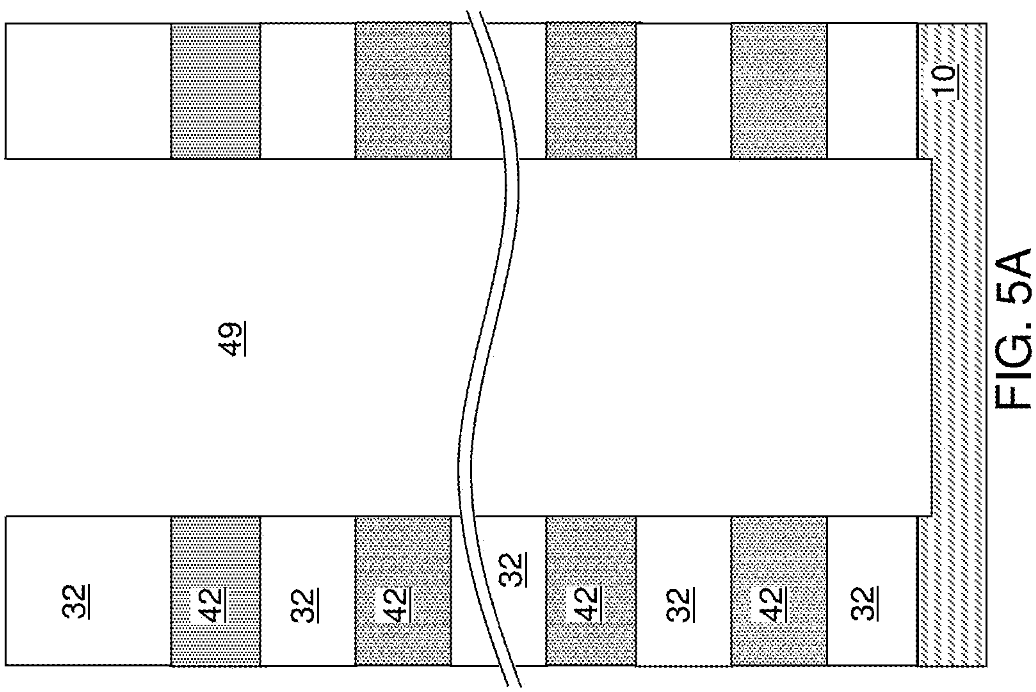

Referring to FIG. 5A, a memory opening 49 in the exemplary device structure of FIGS. 4A and 4B is illustrated. The memory opening 49 extends through the topmost insulating layer 32, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the top surface of each pedestal channel portion 11 can be formed above a horizontal plane including the top surface of a bottommost sacrificial material layer 42. In this case, a source select gate electrode can be subsequently formed by replacing the bottommost sacrificial material layer 42 with a conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Figure 5C:
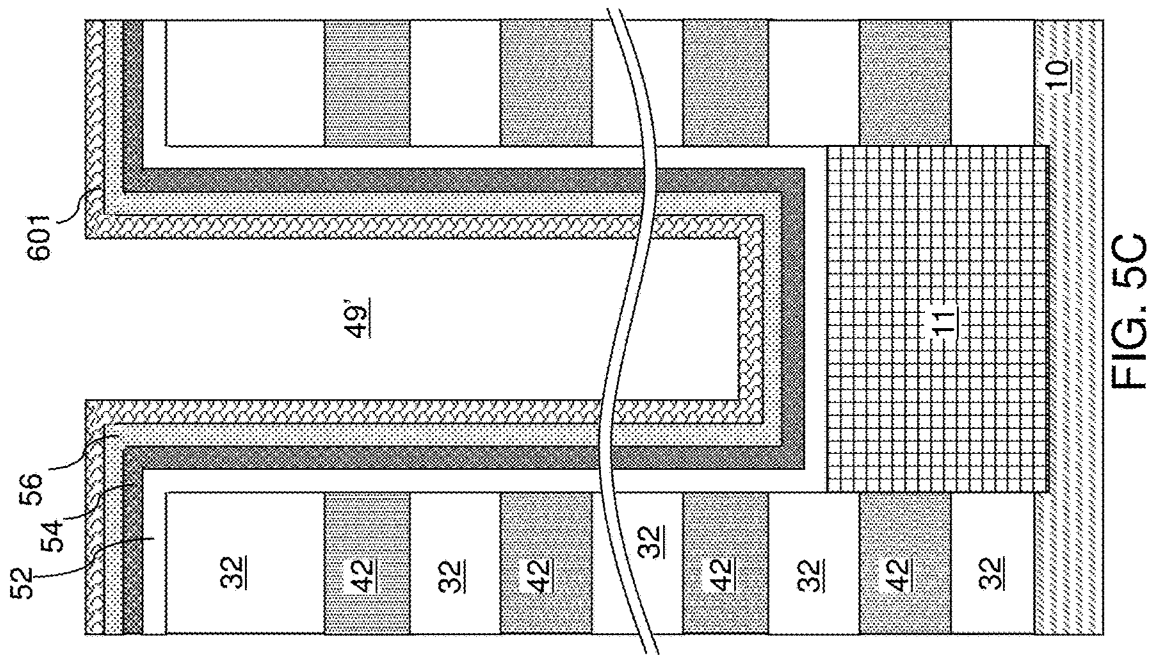

Referring to FIG. 5C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Figure 5D:
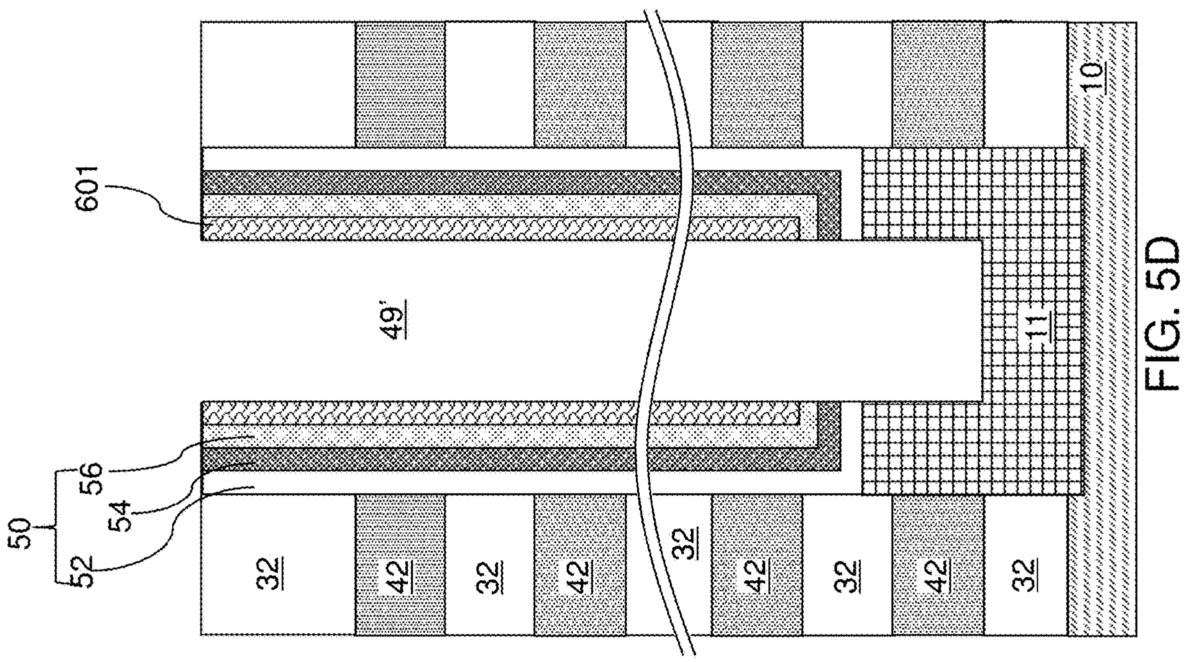

Referring to FIG. 5D, the optional first semiconductor channel layer 601, the tunneling dielectric layer 56, the charge storage layer 54, and the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the topmost insulating layer 32 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (comprising portions of the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Figure 5F:
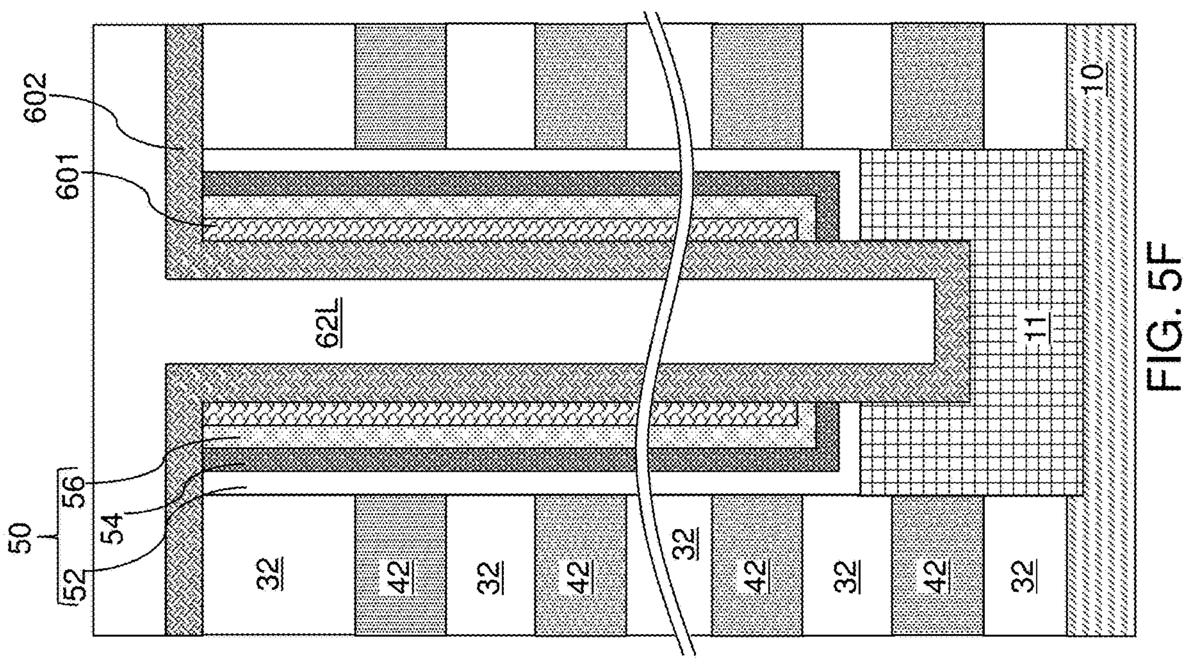
Figure 5E:
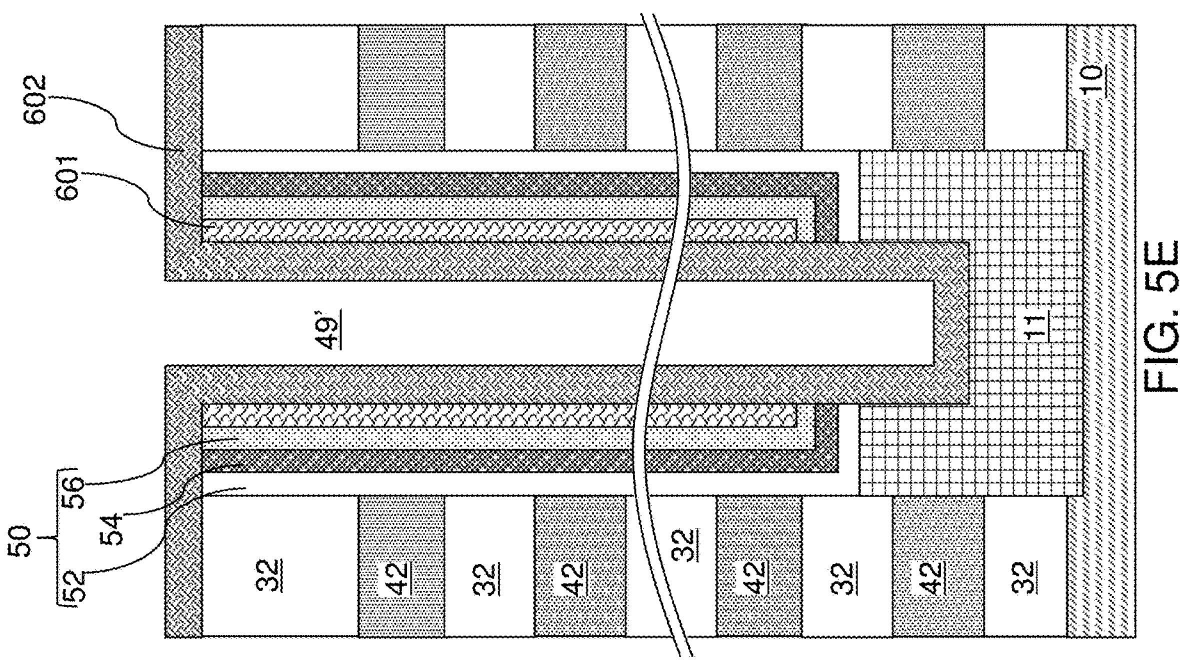

Referring to FIG. 5E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 5F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figures 5G, 5H:
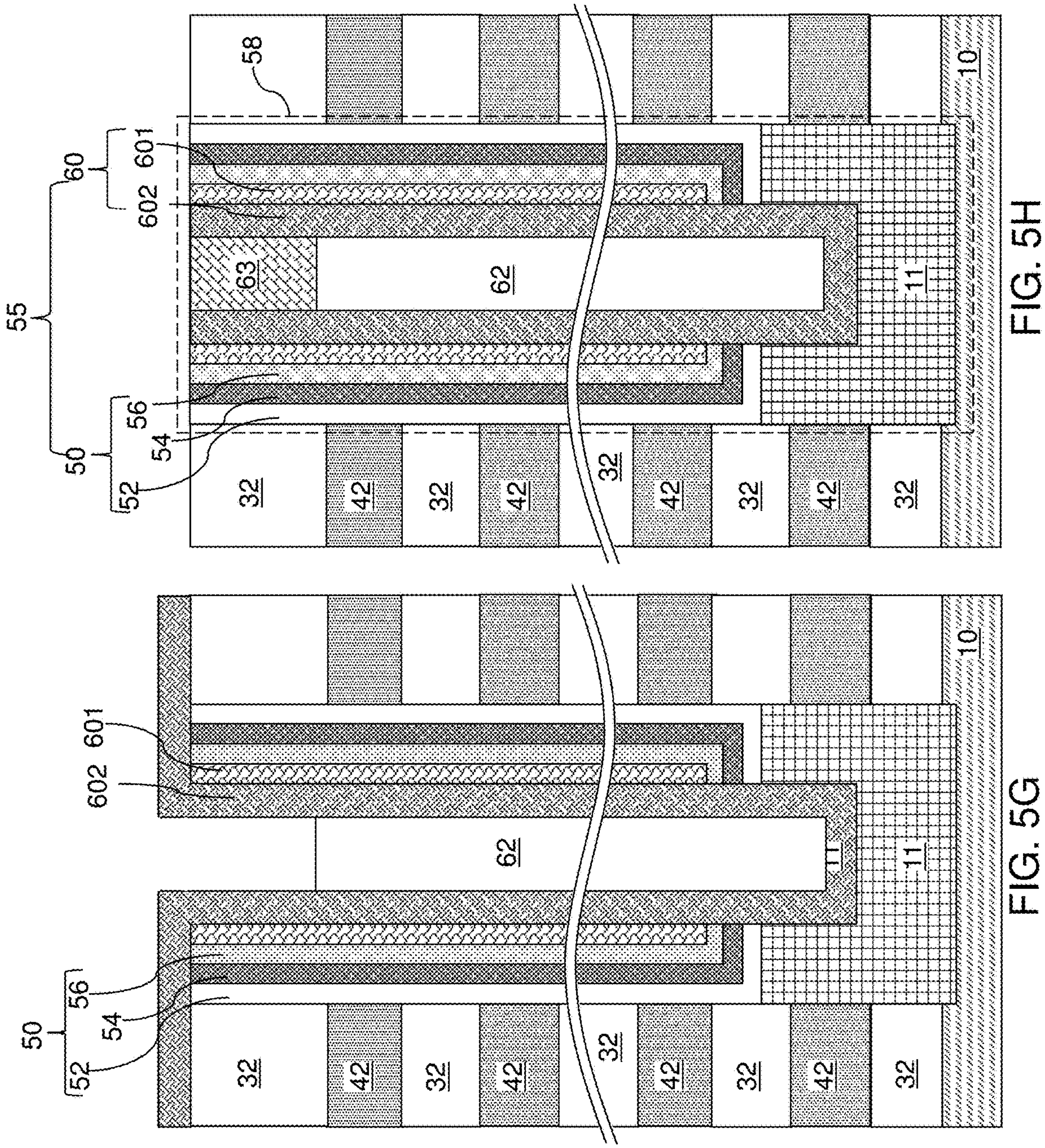

Referring to FIG. 5G, the horizontal portion of the dielectric core layer 62L can be removed, for example, by a recess etch from above the top surface of the second semiconductor channel layer 602. Further, the material of the dielectric core layer 62L can be vertically recessed selective to the semiconductor material of the second semiconductor channel layer 602 into each memory opening 49 down to a depth between a first horizontal plane including the top surface of the topmost insulating layer 32 and a second horizontal plane including the bottom surface of the topmost insulating layer 32. Each remaining portion of the dielectric core layer 62L constitutes a dielectric core 62.

Referring to FIG. 5H, a doped semiconductor material having a doping of a second conductivity type can be deposited within each recessed region above the dielectric cores 62. The second conductivity type is the opposite of the first conductivity type. For example, if the first conductivity type is p-type, the second conductivity type is n-type, and vice versa. The dopant concentration of the doped semiconductor material can be in a range from $5.0\times10^{18}/cm^3$ to $2.0\times10^{21}/cm^3$, although lesser and greater dopant concentrations can also be employed. The doped semiconductor material can be, for example, doped polysilicon.

Excess portions of the deposited semiconductor material can be removed from above the top surface of the topmost insulating layer 32, for example, by chemical mechanical planarization (CMP) or a recess etch. Each remaining portion of the semiconductor material having a doping of the second conductively type constitutes a drain region 63. The horizontal portion of the second semiconductor channel layer 602 located above the top surface of the topmost insulating layer 32 can be concurrently removed by a planarization process. Each remaining portion of the second semiconductor channel layer 602 can be located entirety within a memory opening 49 or entirely within a support opening 19.

Each remaining portion of the doped semiconductor material having a doping of the second conductivity type constitutes a drain region 63. Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a tunneling dielectric layer 56, a charge storage layer 54, and a blocking dielectric layer 52 collectively constitute a memory film 50, which includes a vertical stack of memory elements that can store a respective data bit with a macroscopic retention time. As used herein, a macroscopic retention time refers to a retention time suitable for operation of a memory device as a permanent memory device such as a retention time in excess of 24 hours. In alternative embodiments, a blocking dielectric layer 52 may not be formed in each memory opening 49, and may be subsequently formed in backside recesses that are formed by removal of the sacrificial material layers 42 at a subsequent processing step.

Each combination of a memory film 50 and a vertical semiconductor channel 60 within a memory opening 49 constitutes a memory stack structure 55. The memory stack structure 55 is a combination of a semiconductor channel 60, a tunneling dielectric layer 56, a plurality of memory elements comprising portions of the charge storage layer 54, and a blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figure 6:
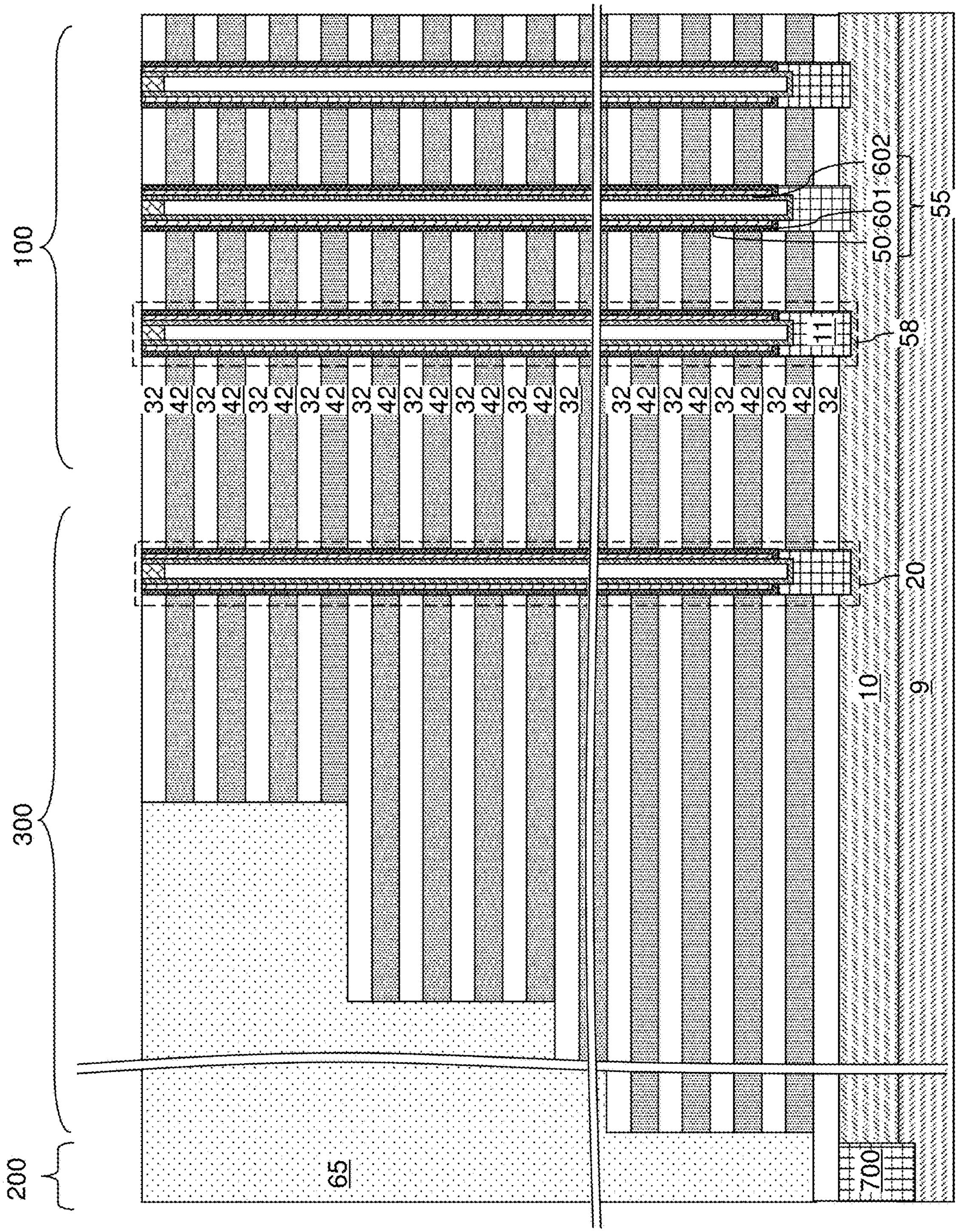
FIG. 6 is a schematic vertical cross-sectional view of the first exemplary structure after formation of memory stack structures and support pillar structures according to an embodiment of the present disclosure.

Referring to FIG. 6, the first exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60, a vertical stack of charge storage regions (comprising portions of the charge storage layer 54) laterally surrounding the tunneling dielectric layer 56, and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 7A:
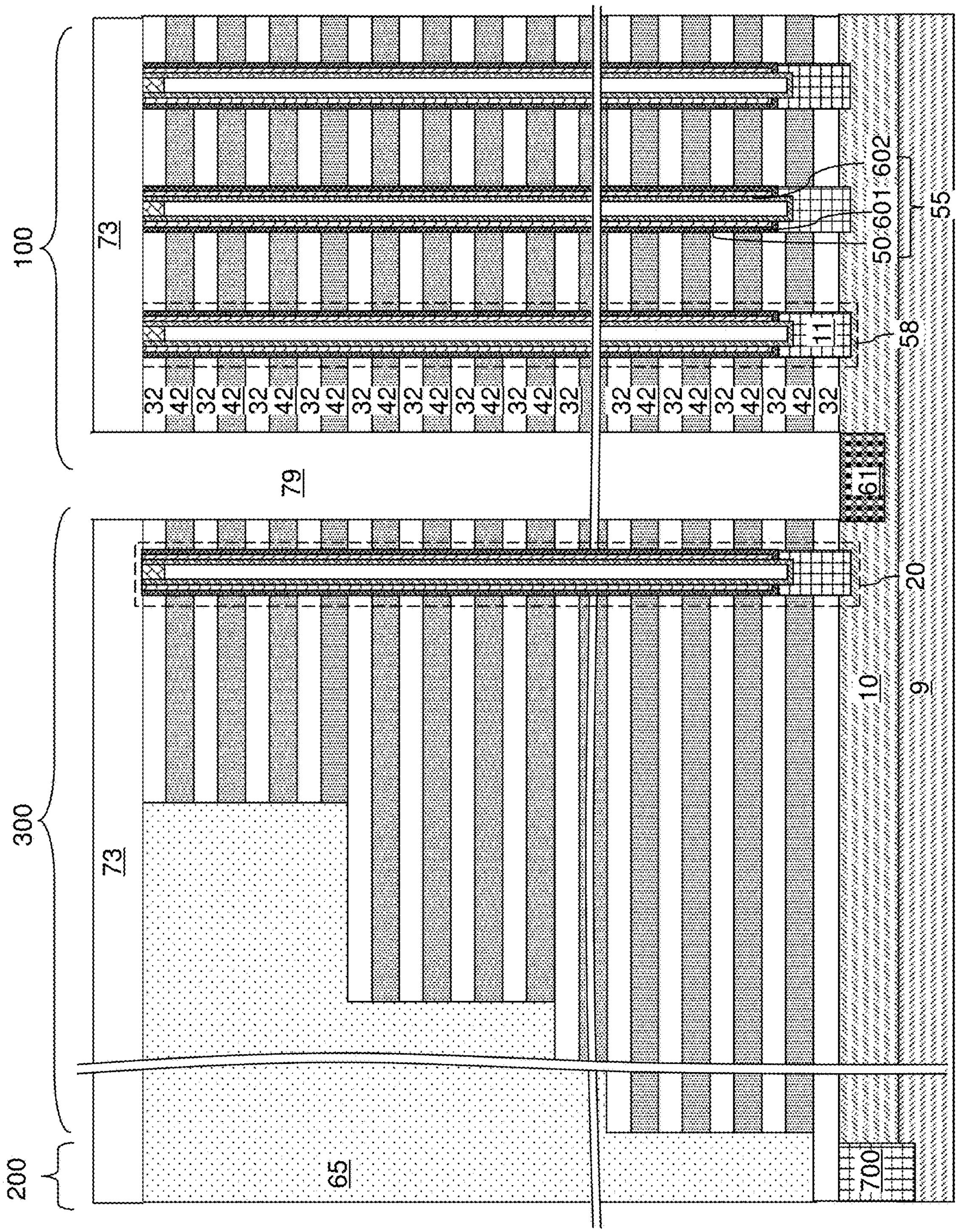
FIG. 7A is a schematic vertical cross-sectional view of the first exemplary structure after formation of backside trenches according to an embodiment of the present disclosure.
Figure 7B:
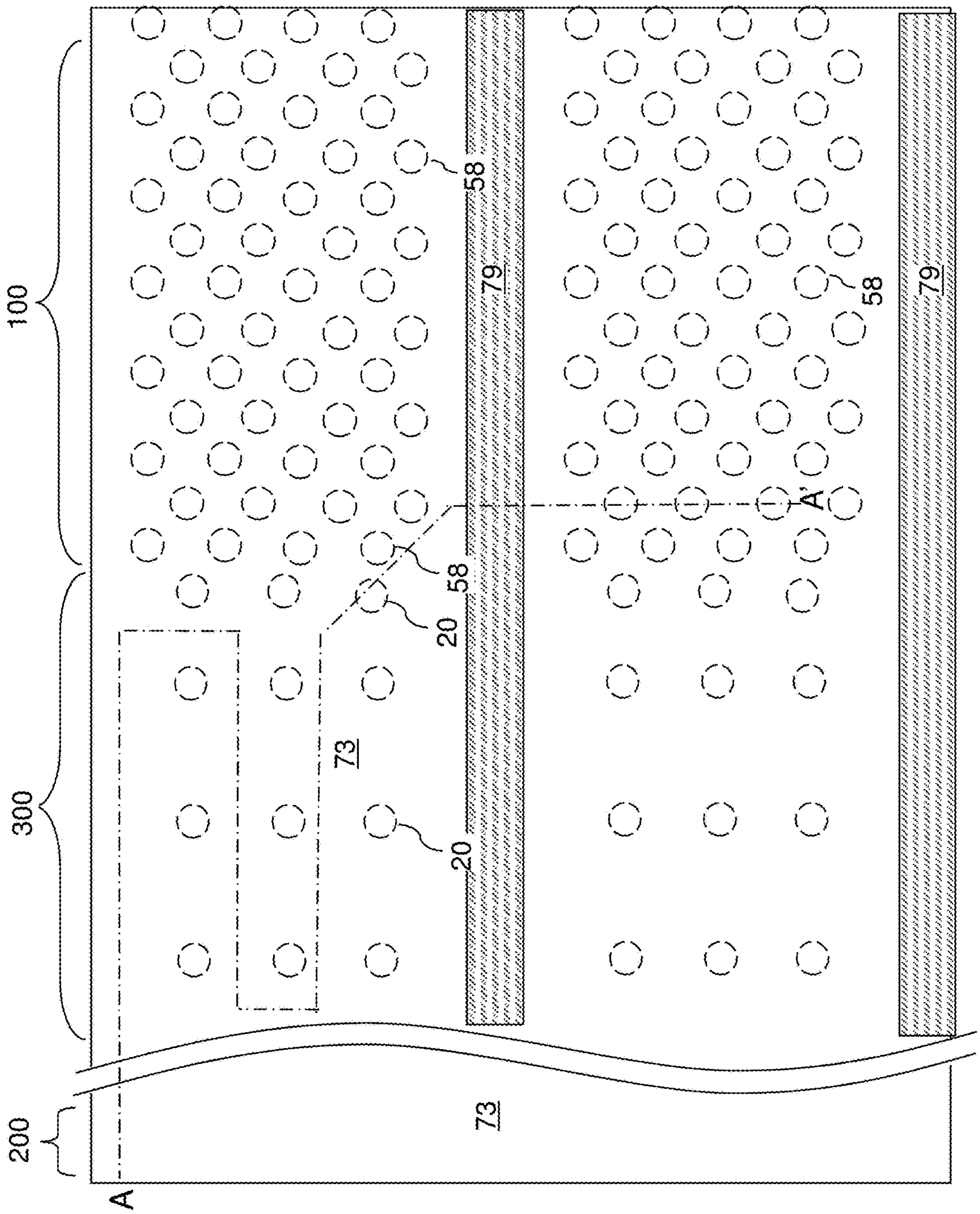
FIG. 7B is a partial see-through top-down view of the first exemplary structure of FIG. 7A. The vertical plane A-A' is the plane of the schematic vertical cross-sectional view of FIG. 7A.

Referring to FIGS. 7A and 7B, a contact-level dielectric layer 73 can be formed over the alternating stack (32, 42) of insulating layer 32 and sacrificial material layers 42, and over the memory stack structures 55 and the support pillar structures 20. The contact-level dielectric layer 73 includes a dielectric material that is different from the dielectric material of the sacrificial material layers 42. For example, the contact-level dielectric layer 73 can include silicon oxide. The contact-level dielectric layer 73 can have a thickness in a range from 50 nm to 500 nm, although lesser and greater thicknesses can also be employed.

A photoresist layer (not shown) can be applied over the contact-level dielectric layer 73, and is lithographically patterned to form openings in areas between clusters of memory stack structures 55. The pattern in the photoresist layer can be transferred through the contact-level dielectric layer 73, the alternating stack (32, 42) and/or the retro-stepped dielectric material portion 65 employing an anisotropic etch to form backside trenches 79, which vertically extend from the top surface of the contact-level dielectric layer 73 at least to the top surface of the substrate (9, 10), and laterally extend through the memory array region 100 and the staircase region 300.

In one embodiment, the backside trenches 79 can laterally extend along a first horizontal direction hd1 and can be laterally spaced apart among one another along a second horizontal direction hd2 that is perpendicular to the first horizontal direction hd1. The memory stack structures 55 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing.

Dopants of the second conductivity type can be implanted into portions of the semiconductor material layer 10 that underlie the backside trenches 79 to form source regions 61. The atomic concentration of the dopants of the second conductivity type in the source regions 61 can be in a range from $5.0\times10^{18}/cm^3$ to $2.0\times10^{21}/cm^3$, although lesser and greater atomic concentrations can also be employed. Surface portions of the semiconductor material layer 10 that extend between each source region 61 and adjacent memory opening fill structures 58 comprise horizontal semiconductor channels 59.

Figure 8:
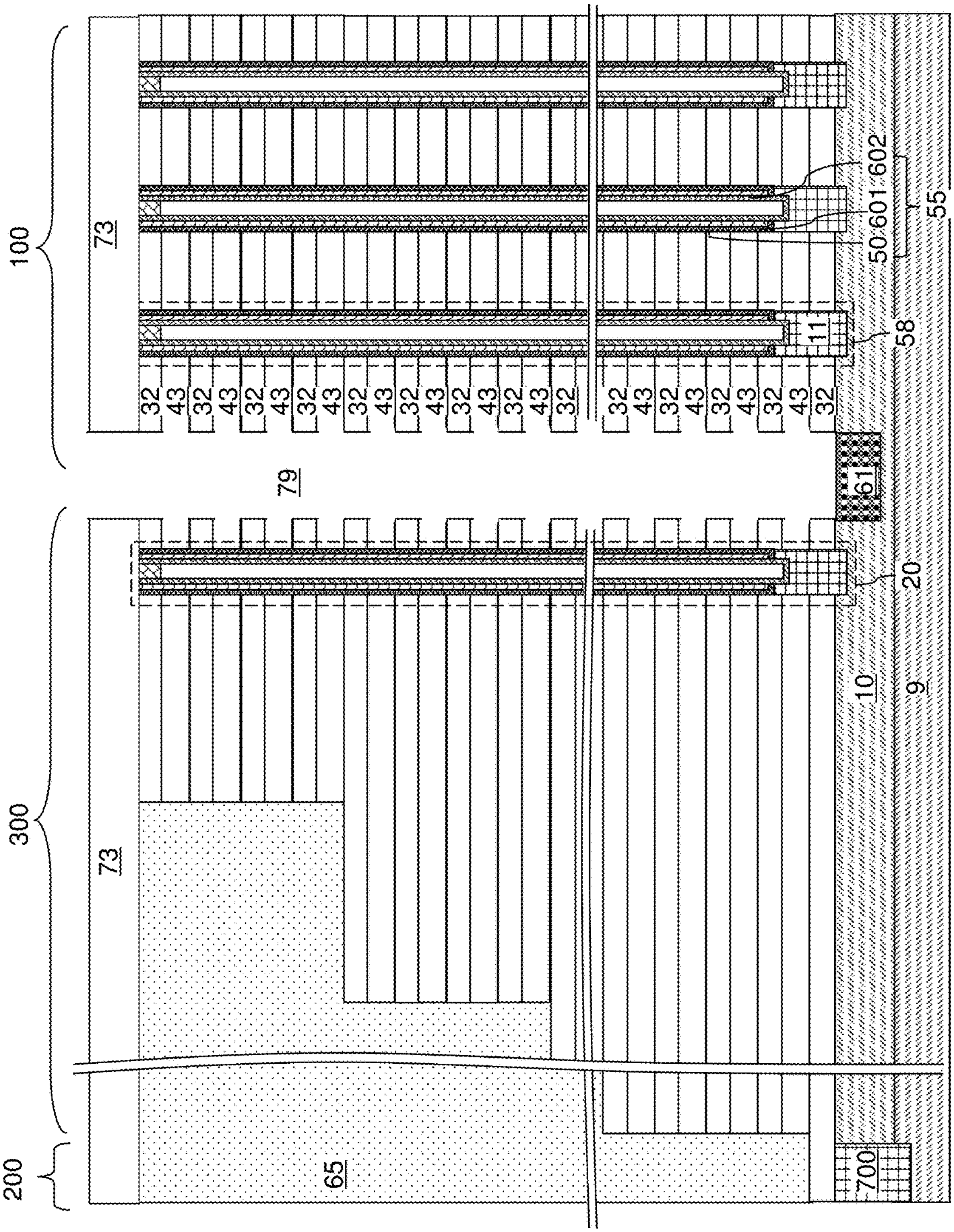
FIG. 8 is a schematic vertical cross-sectional view of the first exemplary structure after formation of backside recesses according to an embodiment of the present disclosure.
Figures 9A, 9B:
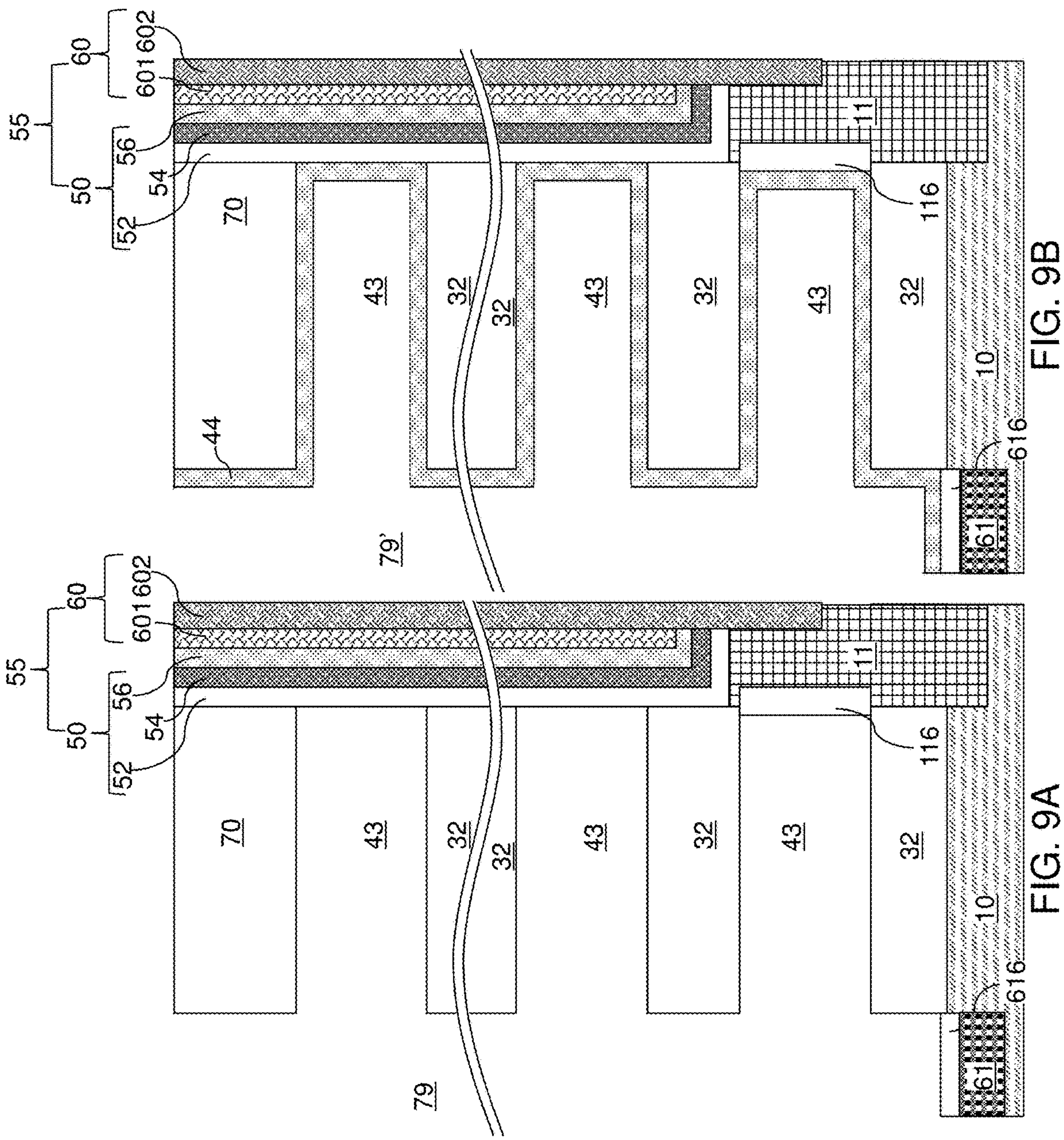
FIGS. 9A-9D are sequential vertical cross-sectional views of a region of the first exemplary structure during formation of electrically conductive layers according to an embodiment of the present disclosure.

Referring to FIGS. 8 and 9A, an etchant that selectively etches the second material of the sacrificial material layers 42 with respect to the first material of the insulating layers 32 can be introduced into the backside trenches 79, for example, employing an etch process. FIG. 9A illustrates a region of the first exemplary structure of FIG. 8. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The support pillar structures 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10. Dopants in the drain regions 63, the source regions 61, and the semiconductor channels 60 can be activated during the anneal process that forms the planar dielectric portions 616 and the tubular dielectric spacers 116. Alternatively, an additional anneal process may be performed to active the electrical dopants in the drain regions 63, the source regions 61, and the semiconductor channels 60.

Referring to FIG. 9B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Figure 9D:
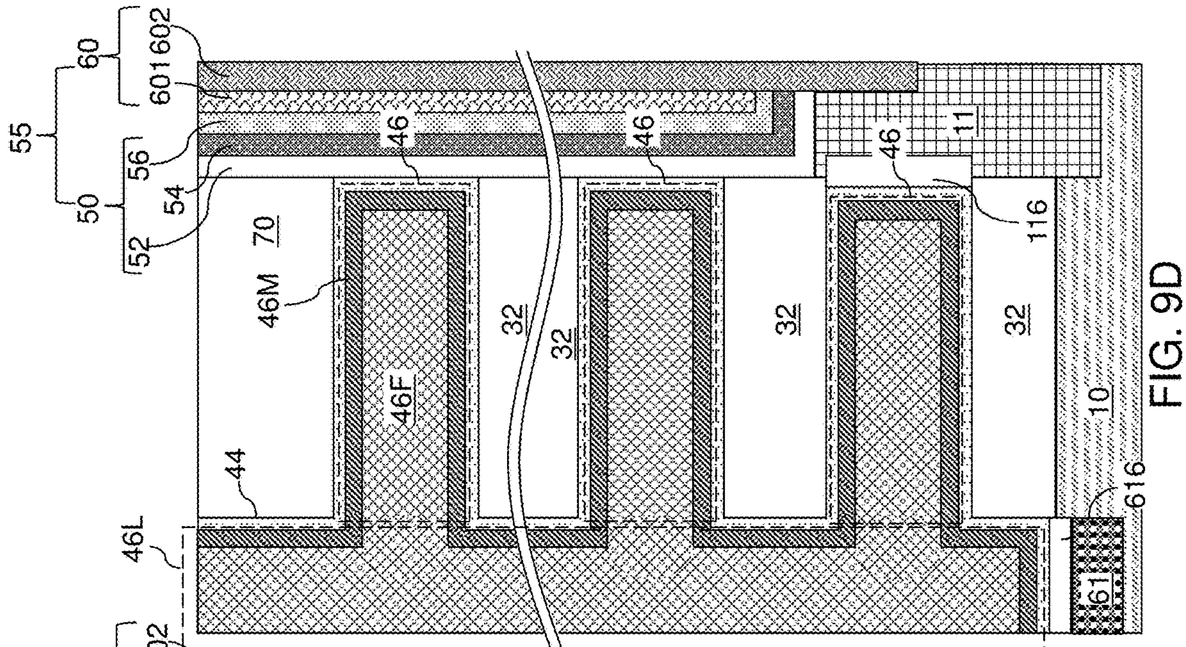
Figure 9C:
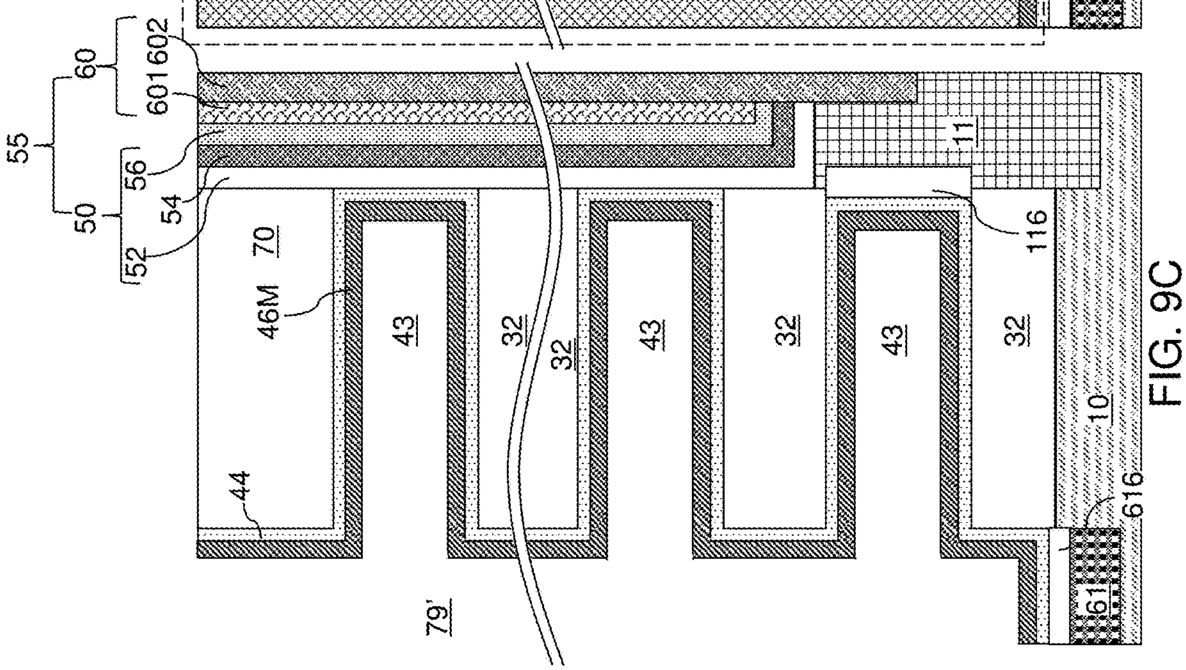

Referring to FIG. 9C, a metallic barrier layer 46M can be deposited in the backside recesses 43. The metallic barrier layer 46M includes an electrically conductive metallic material that can function as a diffusion barrier layer and/or adhesion promotion layer for a metallic fill material to be subsequently deposited. The metallic barrier layer 46M can include a conductive metallic nitride material such as TiN, TaN, WN, or a stack thereof, or can include a conductive metallic carbide material such as TiC, TaC, WC, or a stack thereof. In one embodiment, the metallic barrier layer 46M can be deposited by a conformal deposition process such as chemical vapor deposition (CVD) or atomic layer deposition (ALD). The thickness of the metallic barrier layer 46M can be in a range from 2 nm to 8 nm, such as from 3 nm to 6 nm, although lesser and greater thicknesses can also be employed. In one embodiment, the metallic barrier layer 46M can consist essentially of a conductive metal nitride such as TiN.

Referring to FIG. 9D, a metal fill material is deposited in the plurality of backside recesses 43, on the sidewalls of the at least one the backside trench 79, and over the top surface of the contact-level dielectric layer 73 to form a metallic fill material layer 46F. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46F can consist essentially of at least one elemental metal. The at least one elemental metal of the metallic fill material layer 46F can be selected, for example, from tungsten, cobalt, ruthenium, titanium, and tantalum. In one embodiment, the metallic fill material layer 46F can consist essentially of a single elemental metal. In one embodiment, the metallic fill material layer 46F can be deposited employing a fluorine-containing precursor gas such as $WF_6$. In one embodiment, the metallic fill material layer 46F can be a tungsten layer including a residual level of fluorine atoms as impurities. The metallic fill material layer 46F is spaced from the insulating layers 32 and the memory stack structures 55 by the metallic barrier layer 46M, which can block diffusion of fluorine atoms therethrough.

A plurality of electrically conductive layers 46 can be formed in the plurality of backside recesses 43, and a continuous electrically conductive material layer 46L can be formed on the sidewalls of each backside trench 79 and over the contact-level dielectric layer 73. Each electrically conductive layer 46 includes a portion of the metallic barrier layer 46M and a portion of the metallic fill material layer 46F that are located between a vertically neighboring pair of dielectric material layers such as a pair of insulating layers 32. The continuous electrically conductive material layer 46L includes a continuous portion of the metallic barrier layer 46M and a continuous portion of the metallic fill material layer 46F that are located in the backside trenches 79 or above the contact-level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous electrically conductive material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 10:
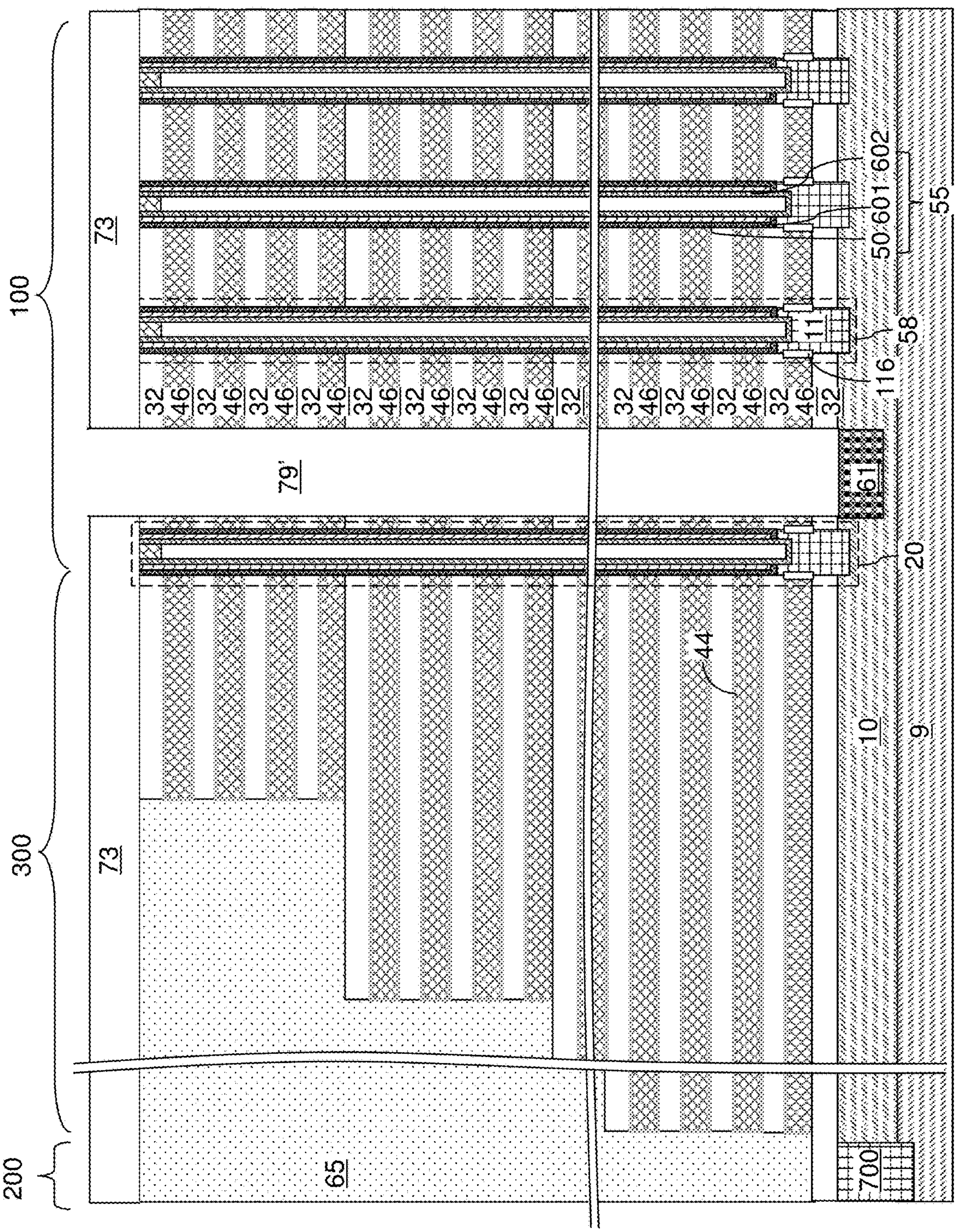
FIG. 10 is a schematic vertical cross-sectional view of the first exemplary structure after removal of a deposited conductive material from within the backside trench according to an embodiment of the present disclosure.

Referring to FIG. 10, the deposited metallic material of the continuous electrically conductive material layer 46L is etched back from the sidewalls of each backside trench 79 and from above the contact-level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity 79' is present within each backside trench 79.

Figure 11:
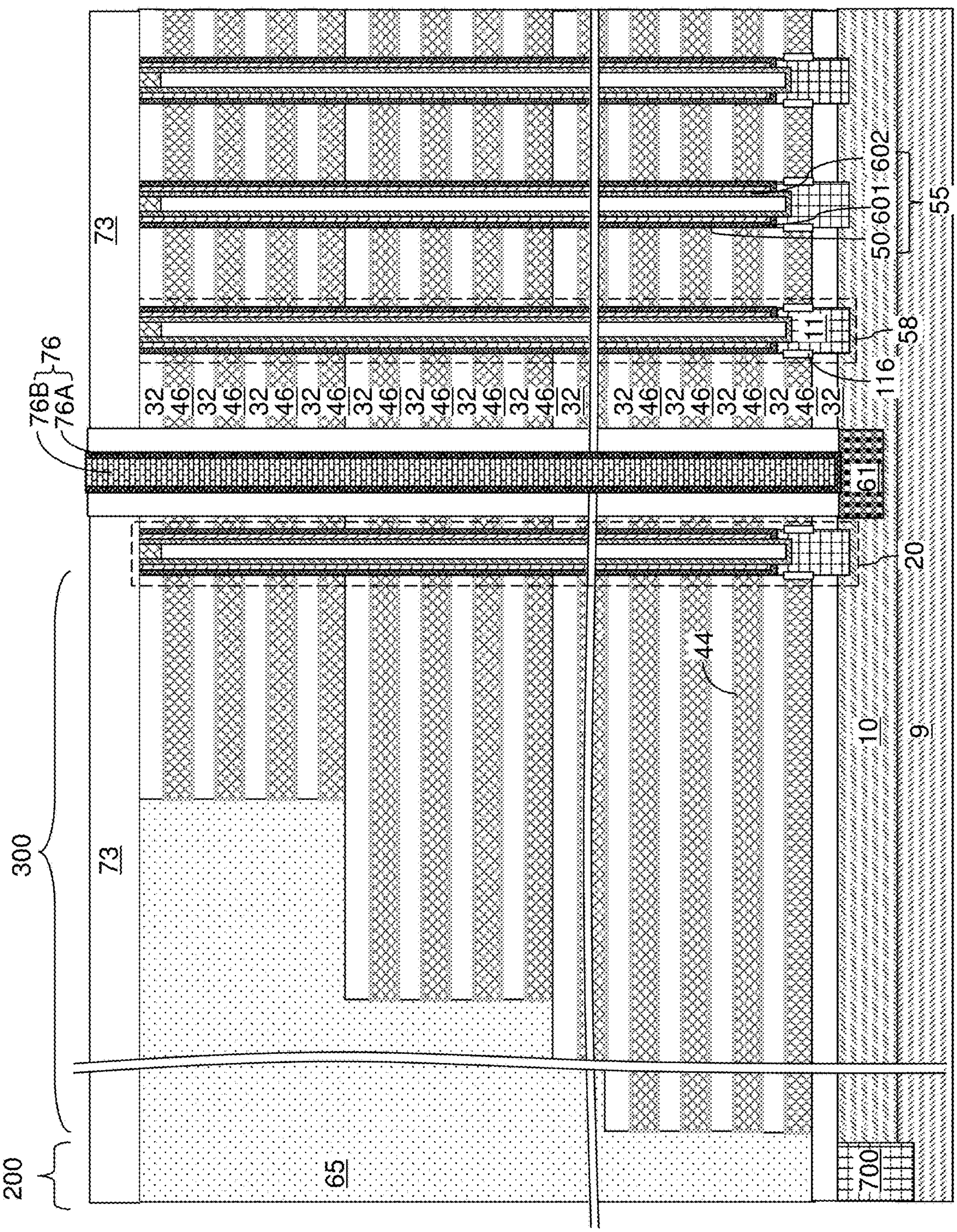
FIG. 11 is a schematic vertical cross-sectional view of the first exemplary structure after formation of an insulating spacer and a backside contact structure in each backside trench according to an embodiment of the present disclosure.

Referring to FIG. 11, an insulating material layer can be formed in the backside trenches 79 and over the contact-level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact-level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective backside cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact-level dielectric layer 73 overlying the alternating stack (32, 46) as a stopping layer. If chemical mechanical planarization (CMP) process is employed, the contact-level dielectric layer 73 can be employed as a CMP stopping layer. Each remaining continuous portion of the at least one conductive material in the backside trenches 79 constitutes a backside contact via structure 76. The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Alternatively, at least one dielectric material, such as silicon oxide, may be conformally deposited in the backside trenches 79 by a conformal deposition process. Each portion of the deposited dielectric material that fills a backside trench 79 constitutes a backside trench fill structure. In this case, each backside trench fill structure may fill the entire volume of a backside trench 79 and may consist essentially of at least one dielectric material. In this alternative embodiment, the source region 61 may be omitted, and a horizontal source line (e.g., direct strap contact) may contact an side of the lower portion of the semiconductor channel 60.

Figure 12A:
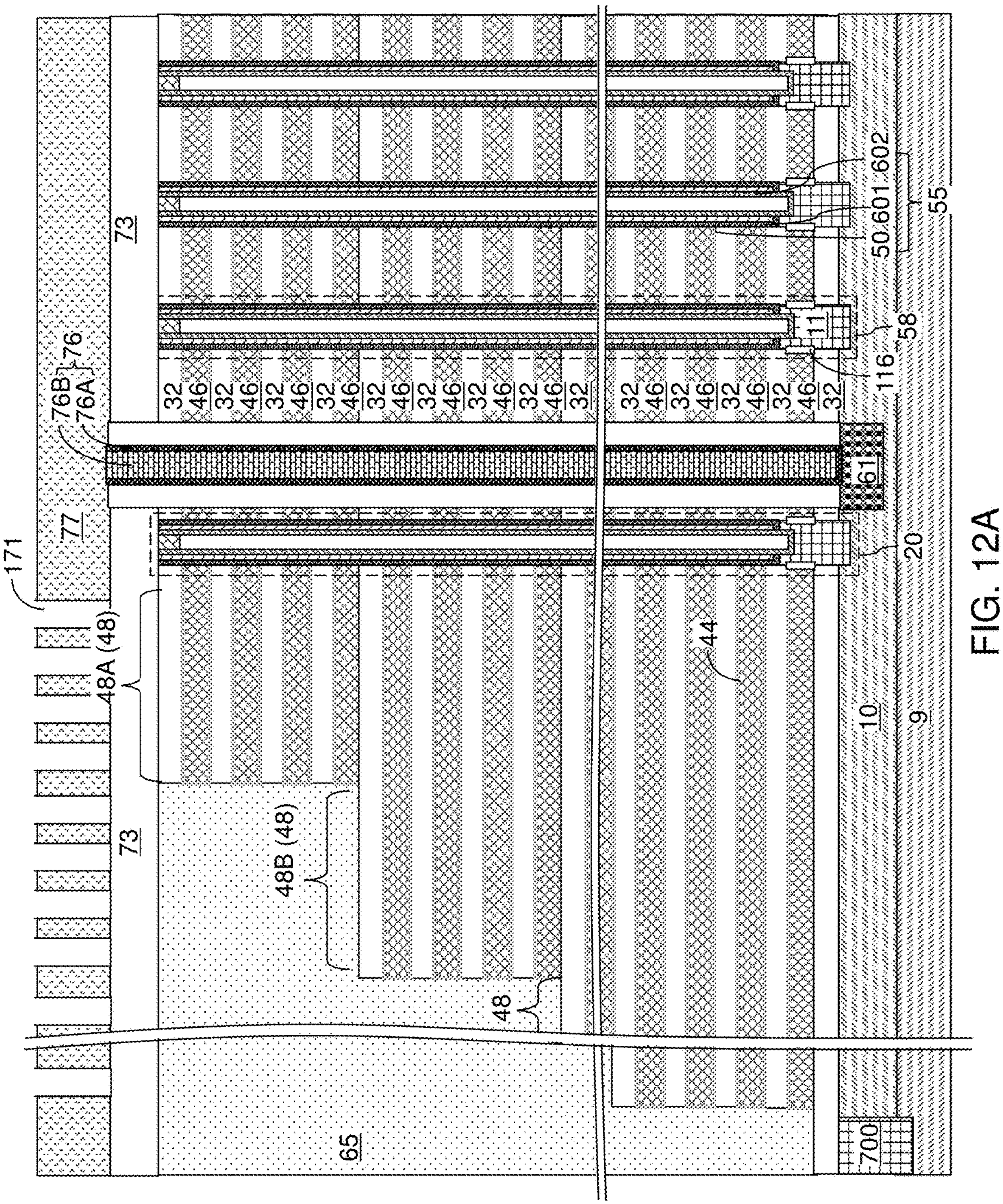
FIG. 12A is a schematic vertical cross-sectional view of the first exemplary structure after formation and patterning of a first etch mask layer according to an embodiment of the present disclosure.

As shown in FIG. 12A, the staircase region 300 contains horizontal steps 48. The top of each step 48 may comprise a top surface of an insulating layer 32 as shown in FIG. 12A. Alternatively, the top of each step 48 may comprise a top surface of an electrically conductive layer 46. Each horizontal step 48 is separated from adjacent horizontal steps 48 in the same level in the bit line horizontal direction BL by the backside trench 79 filled with a dielectric material or with the contact via structure 76.

Figure 12B:
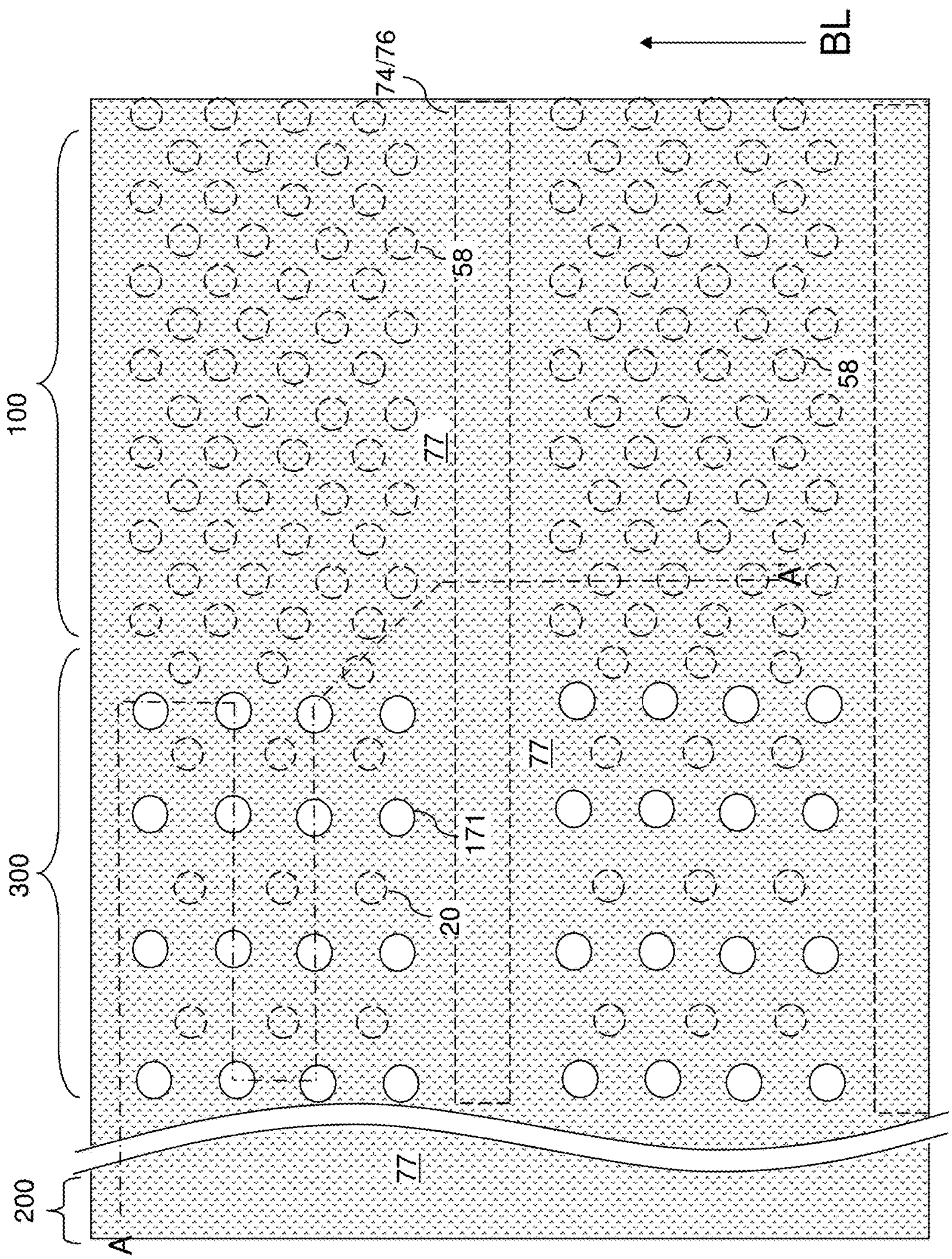
FIG. 12B is a top-down view of the first exemplary structure of FIG. 12A. The vertical plane A-A' is the plane of the schematic vertical cross-sectional view of FIG. 12A.

Referring to FIGS. 12A and 12B, a first etch mask layer 77 can be formed above the contact-level dielectric layer 73. In one embodiment, the first etch mask layer 77 includes a patterning film including a carbon-based material such as amorphous carbon, diamond-like carbon, or a compound thereof. For example, the first etch mask layer 77 may include Advanced Patterning Film (APF) commercially available from Applied Materials, Inc.™

The first etch mask layer 77 can be patterned to form an array of openings 171 therethrough. For example, a photoresist layer (not shown) can be applied over the first etch mask layer 77, and can be patterned by lithographic exposure and development. Each of the openings 171 in the first etch mask layer 77 can be formed within the area of a respective one of the steps 48. In one embodiment, the number of opening 171 within the area of each step 48 can be at least the total number of electrically conductive layers 46 in the step 48. For example, the steps 48 can be vertically offset from each other by K times the vertical distance between top surfaces of a vertically neighboring pair of insulating layers 32, where K is an integer greater than 1, such as an integer in a range from 2 to $2^N$, and N is an integer in a range from 2 to 6. In the illustrated example, K is four, and each area of the step 48 includes at least K (e.g., four) openings 171 through the first etch mask layer 77.

Each horizontal bottom surface segment of the stepped surfaces of the retro-stepped dielectric material portion 65 overlies a respective horizontal step 48. Thus, each of the openings 171 in the first etch mask layer 77 can be formed within the area of a respective one of the horizontal bottom surface segments of the stepped surfaces of the retro-stepped dielectric material portion 65. In one embodiment, the number of opening 171 within the area of each horizontal bottom surface segment of the stepped surfaces of the retro-stepped dielectric material portion 65 can be at least the total number of electrically conductive layers 46 contacting the vertical sidewall segment extending downward from an edge of the respective horizontal bottom surface segment. For example, the horizontal bottom surface segments of the stepped surfaces of the retro-stepped dielectric material portion 65 can be vertically offset from each other by K times the vertical distance between top surfaces of a vertically neighboring pair of insulating layers 32, where K is an integer greater than 1, such as an integer in a range from 2 to $2^N$, and N is an integer in a range from 2 to 6. In the illustrated example, K is four, and each area of a horizontal bottom surface segment of the retro-stepped dielectric material portion 65 includes at least K (e.g., four) openings 171 through the first etch mask layer 77. In one embodiment, the openings 171 through the first etch mask layer 77 can be formed in an array configuration such as a two-dimensional array configuration. The photoresist layer can be removed, for example, by ashing.

Figure 13:
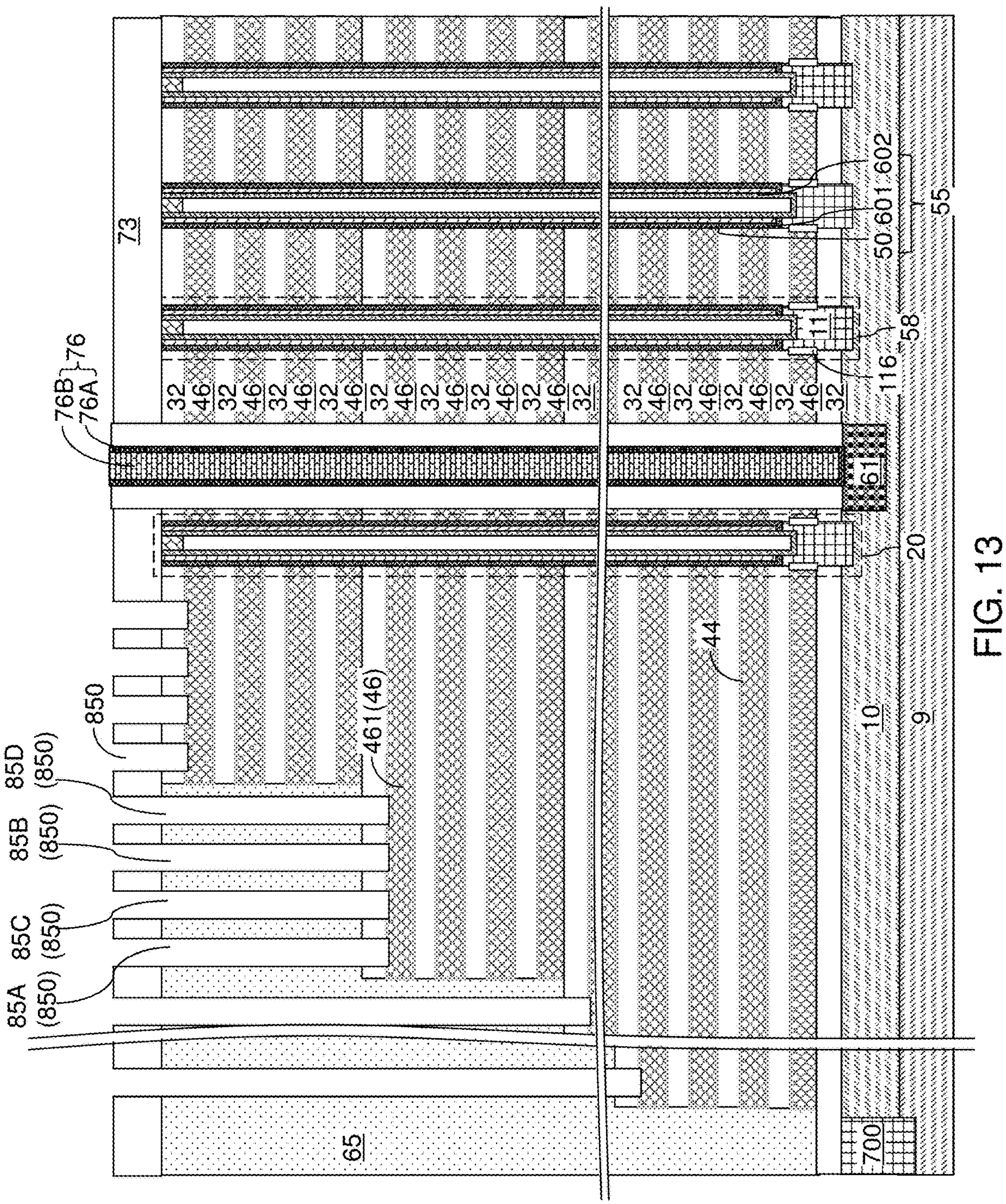
FIG. 13 is a schematic vertical cross-sectional view of the first exemplary structure after formation of via cavities according to an embodiment of the present disclosure.

Referring to FIG. 13, a first anisotropic etch process can be performed to transfer the pattern of the openings 171 through the contact-level dielectric layer 73 and through the retro-stepped dielectric material portion 65. If the top of each step 48 in the staircase region 300 comprises an insulating layer 32 rather than an electrically conductive layer 46, then the openings 171 also extend through the insulating layer 32 on top of each step 48. In this case, such insulating layer 32 on top of the step contacts a horizontal bottom surface segment of the stepped surfaces of the retro-stepped dielectric material portion 65. The first anisotropic etch process forms via cavities 850 underneath each opening 171 through the first etch mask layer 77. The via cavities 850 as formed by the first anisotropic etch process. The first anisotropic etch process can have an etch chemistry that etches the dielectric materials of the contact-level dielectric layer 73, the retro-stepped dielectric material portion 65, and the insulating layers 32 selective to the metallic material of the electrically conductive layers 46. In case backside blocking dielectric layers 44 are present, each portion of the backside blocking dielectric layers 44 that underlie the via cavities 850 can be removed to physically expose a top surface of an electrically conductive layer 46 under the via cavities 850.

A set of via cavities 850 can be formed through each step 48 and through each horizontal bottom surface segment of the retro-stepped dielectric material portion 65. For example, a first set of via cavities 850 can be formed through a first step 48 and through first horizontal bottom surface segment of the retro-stepped dielectric material portion 65, a second set of via cavities 850 can be formed through a second step 48 and through a second horizontal bottom surface segment of the retro-stepped dielectric material portion 65, etc. Each set of via cavities 850 extending through a respective step 48 and horizontal bottom surface segment of the retro-stepped dielectric material portion 65 can include more than one (i.e., a plurality) of via cavities 850. For example, each set of via cavities 850 can include a respective first via cavity, a respective second via cavity, etc. Each set of via cavities 850 includes at least K via cavities 850, in which K is an integer greater than 1.

For example, a first via cavity 85A, a second via cavity 85B, a third via cavity 85C, and a fourth via cavity 85D of each set of via cavities 850 (e.g., 85A, 85B, 85C, 85D) extend through a step 48 and a horizontal bottom surface segment of the retro-stepped dielectric material portion down to a top surface of a respective first electrically conductive layer 461 in each step 48 by performing the first anisotropic etch process. For example, a first via cavity 85A, a second via cavity 85B, a third via cavity 85C, and a fourth via cavity 85D of a first set of via cavities (85A, 85B, 85C, 85D) can extend through a first step 48A and a first one of the horizontal bottom surface segments, while a first via cavity 85A, a second via cavity 85B, a third via cavity 85C, and a fourth via cavity 85D of a second set of via cavities (85A, 85B, 85C, 85D) can extend through a second step 48B and a second one of the horizontal bottom surface segments, etc. Generally, each set of via cavities 850 vertically extending through a common step 48 and a common horizontal bottom surface segment of the retro-stepped dielectric material portion 65 includes at least a respective first via cavity 85A and a respective second via cavity 85B. The first etch mask layer 77 may be consumed during the first anisotropic etch process, or may be removed after the first anisotropic etch process, for example, by ashing.

While the present disclosure is described employing an embodiment in which each step 48 includes four electrically conductive layers 46 and in which vertical surface segment of the retro-stepped dielectric material portion 65 contacts four insulating layers and a set of via cavities (85A, 85B, 85C, 85D) is formed through each horizontal bottom surface segment, embodiments are expressly contemplated herein in which each step 48 includes two, three, five or more electrically conductive layers 46, and each set of via cavities 850 vertically extending through a horizontal bottom surface segment of a retro-stepped dielectric material portion 65 includes two, three, five, or more via cavities 85. The number of via cavities 850 within each set of via cavities 850 vertically extending through each step 48 and through each a horizontal bottom surface segment of a retro-stepped dielectric material portion 65 is at least the same as the number of electrically conductive layers 46 in each step 48 and is at least he same as the number of insulating layers 32 that contacts a vertical sidewall segment that extends downward from an edge of the horizontal bottom surface segment of a retro-stepped dielectric material portion 65, i.e., can be at least the number K discussed above.

Figure 14:
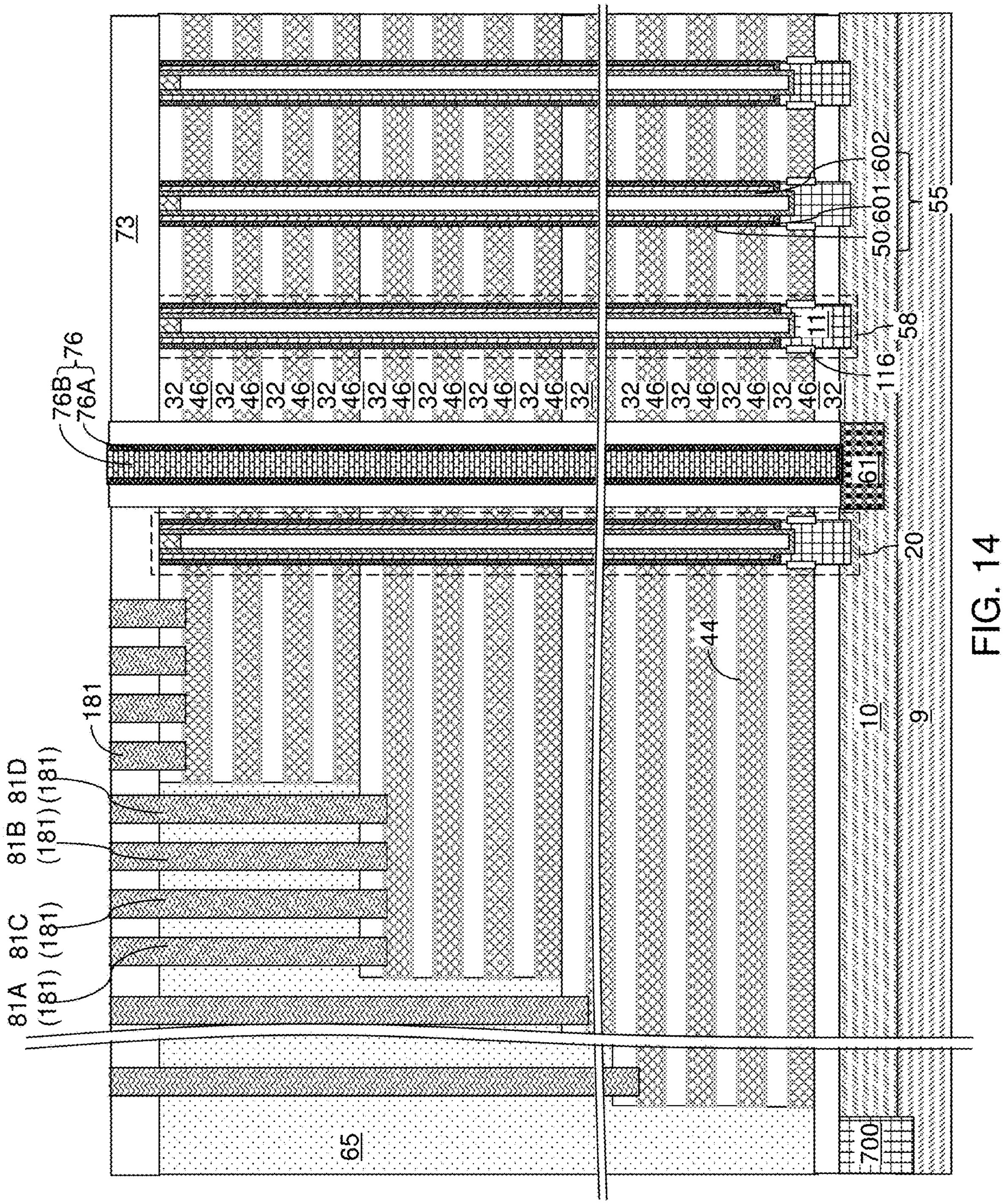
FIG. 14 is a schematic vertical cross-sectional view of the first exemplary structure after formation of primary sacrificial via cavity fill structures according to an embodiment of the present disclosure.

Referring to FIG. 14, a sacrificial cavity fill material can be deposited in the via cavities 850 by a conformal or non-conformal deposition process. The sacrificial cavity fill material may include any sacrificial fill material that can be subsequently removed selective to the material of the retro-stepped dielectric material portion 65 and the electrically conductive layers 46. For example, the sacrificial cavity fill material may include a semiconductor material such as amorphous silicon, polysilicon, germanium, or a silicon-germanium alloy. Alternatively, the sacrificial cavity fill material may include amorphous carbon or diamond-like carbon. Excess portions of the sacrificial cavity fill material can be removed from above the horizontal plane including the top surface of the contact-level dielectric layer 73 by a planarization process such as a chemical mechanical planarization process. Each remaining portion of the sacrificial cavity fill material that fills a respective one of the via cavities 850 constitutes a primary sacrificial via cavity fill structure 181. The primary sacrificial via cavity fill structures 181 can include, for example, a first primary sacrificial via cavity fill structure 81A that fills a respective first via cavity 85A, a second primary sacrificial via cavity fill structure 81B that fills a respective second via cavity 85B, a third primary sacrificial via cavity fill structure 81C that fills a respective third via cavity 85C, and a fourth primary sacrificial via cavity fill structure 81D that fills a respective fourth via cavity 85D.

Figure 15:
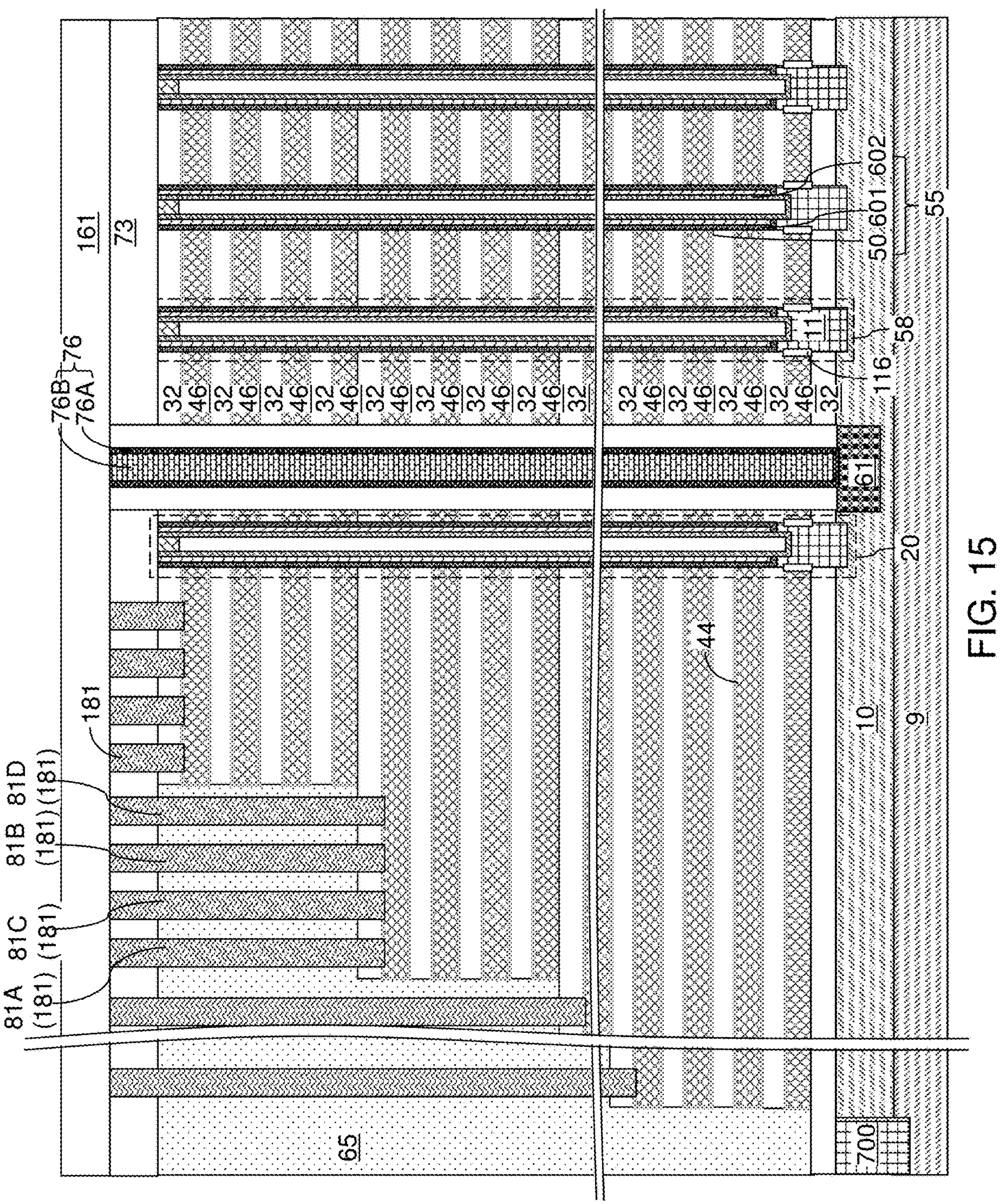
FIG. 15 is a schematic vertical cross-sectional view of the first exemplary structure after formation of a first sacrificial etch mask layer according to an embodiment of the present disclosure.

Referring to FIG. 15, a first sacrificial etch mask layer 161 can be formed over the contact-level dielectric layer 73 and the primary sacrificial via cavity fill structures 181. In one embodiment, the first sacrificial etch mask layer 161 may include the same material as the insulating layers 32. For example, each of the insulating layers 32 and the first sacrificial etch mask layer 161 can comprise undoped silicate glass (e.g., silicon oxide) or a doped silicate glass. The thickness of the first sacrificial etch mask layer 161 can be selected such that the entirety of the first sacrificial etch mask layer 161 can be removed during a subsequent second anisotropic etch process, which is described below.

Figure 17:
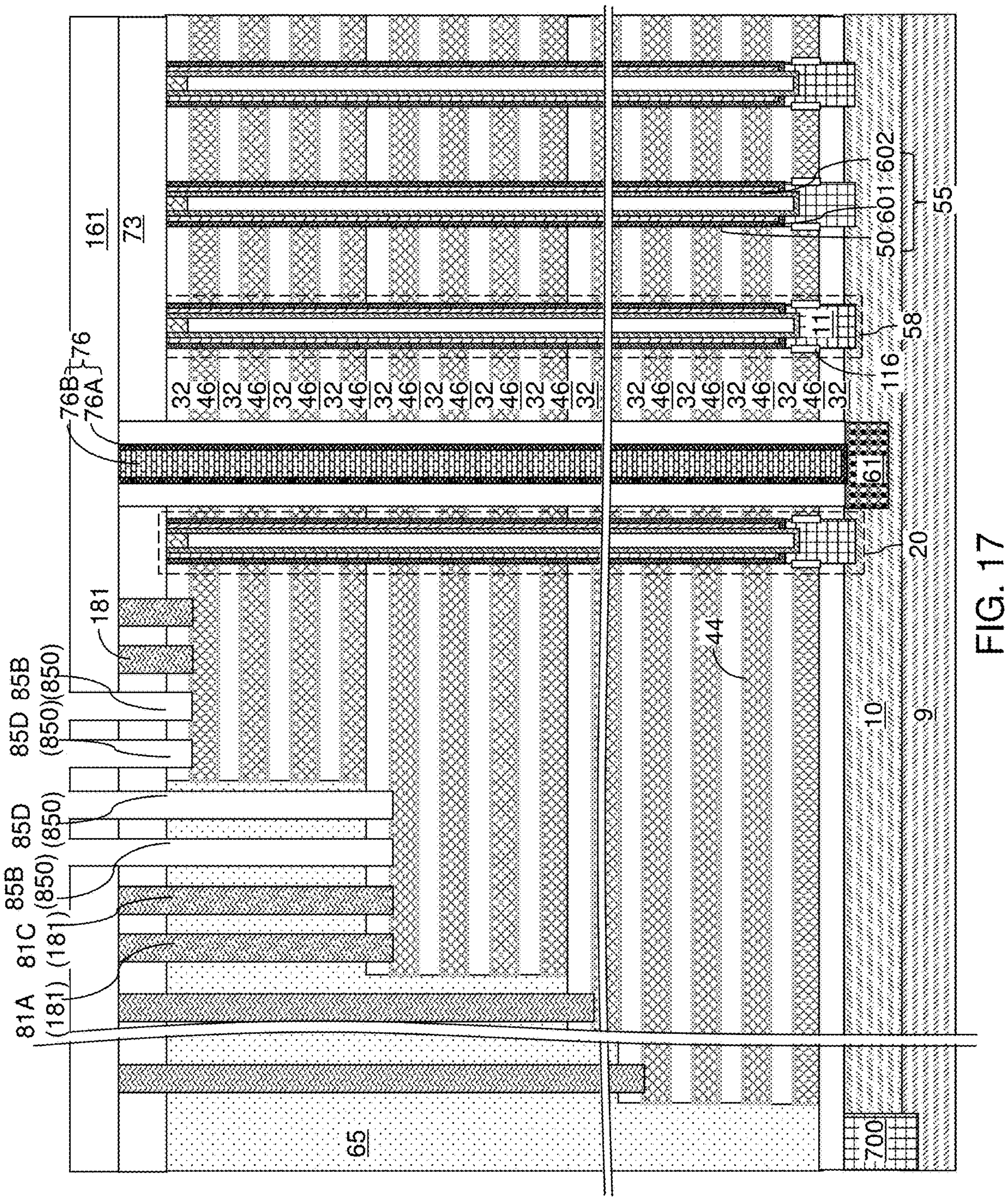
FIG. 17 is a schematic vertical cross-sectional view of the first exemplary structure after formation of a subset of the primary sacrificial via cavity fill structures according to an embodiment of the present disclosure.

Referring to FIG. 17, openings 172 can be formed through the first sacrificial etch mask layer 161 by applying and lithographically patterning a photoresist layer (not shown) over the first sacrificial etch mask layer 161, and by transferring the pattern of the openings in the photoresist layer through the first sacrificial etch mask layer 161. The photoresist layer can be subsequently removed, for example, by ashing. The pattern of the openings 172 through the first sacrificial etch mask layer 161 can be selected such that an opening 172 through the first sacrificial etch mask layer 161 is located over some but not all of the primary sacrificial via cavity fill structures 181. For example, an opening 172 through the first sacrificial etch mask layer 161 is located over each even-numbered primary sacrificial via cavity fill structure (81B, 81D) while the first sacrificial etch mask layer 161 covers each odd-numbered primary sacrificial via cavity fill structure (81A, 81C). For example, an opening 172 though the first sacrificial etch mask layer 161 can be provided over each second primary sacrificial via cavity fill structure 81B, and each first primary sacrificial via cavity fill structure 81A can be covered by the first sacrificial etch mask layer 161. Alternatively, the opening 172 through the first sacrificial etch mask layer 161 is located over each odd-numbered but not over each even-numbered sacrificial via cavity structure.

Referring to FIG. 17, a first subset of the primary sacrificial via cavity fill structures 181 that underlie openings through the first sacrificial etch mask layer 161 can be removed selective to the first sacrificial etch mask layer 161, the retro-stepped dielectric material portion 65 and the electrically conductive layers 46. For example, a wet etch process or an ashing process may be employed to remove the first subset of the primary sacrificial via cavity fill structures 181. The first sacrificial etch mask layer 161 protects a second subset of the primary sacrificial via cavity fill structures 181. Thus, the even-numbered primary sacrificial via cavity fill structures (81B, 81D) can be removed without removing the odd-numbered primary sacrificial via cavity fill structure (81A, 81C) (or vice-versa).

Figure 18:
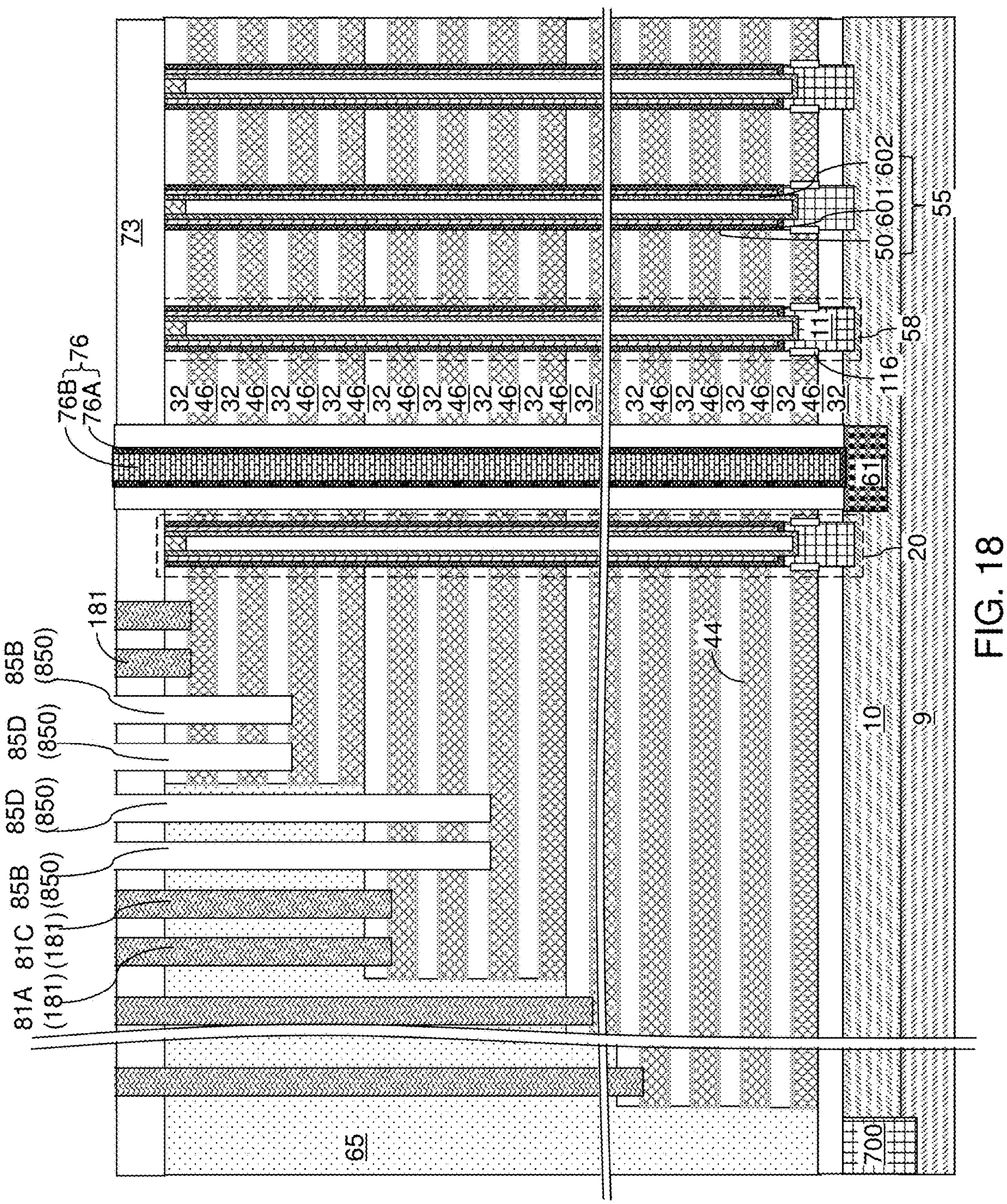
FIG. 18 is a schematic vertical cross-sectional view of the first exemplary structure after a first via cavity extension etch process according to an embodiment of the present disclosure.

Referring to FIG. 18, a second anisotropic etch process can be performed to vertically extend the even-numbered via cavities (85B, 85D), i.e., the subset of the via cavities 850 from which the even-numbered primary sacrificial via cavity fill structure (81B, 81D) are removed at the processing steps of FIG. 17. The second anisotropic etch is a via cavity extension etch process that vertically extends the even-numbered via cavities (85B, 85D), and is herein referred to as a first via cavity extension etch process. The second anisotropic etch process vertically extends the even-numbered via cavities (85B, 85D) through at least one electrically conductive layer 46 and at least one of the insulating layers 32 down to a top surface of a respective electrically conductive layer 46 without vertically extending the odd-numbered via cavities (85A, 85C).

In one embodiment, if each step 48 contains $2^N$ pairs of an insulating layer 32 and an electrically conductive layer 46 and the vertical sidewall segment of the retro-stepped dielectric material portion extends over $2^N$ pairs of an insulating layer 32 and an electrically conductive layer 46, then the even-numbered via cavities (85A, 85D) can be vertically extended by over $2^{N-1}$ pairs of an insulating layer 32 and an electrically conductive layer 46. In the illustrated example, N is 2, and the second anisotropic etch process vertically extends the even-numbered via cavities (85B, 85D) through two electrically conductive layers 46 and two insulating layers 32. In one embodiment, the thickness of the first sacrificial etch mask layer 161 can be selected to be collaterally etched during the second anisotropic etch process. Thus, the first sacrificial etch mask layer 161 can be removed concurrently with vertical extension of the even-numbered via cavities (85A, 85D). For example, the first sacrificial etch mask layer 161 can have the same material as the insulating layers 32, and can have a thickness that is the sum of $2^{N-1}$ times the thickness of an insulating layer 32 and a thickness that corresponds to the collateral etch rate of the material of the first sacrificial etch mask layer 161 during etching of $2^{N-1}$ of electrically conductive layers 46.

Figure 19:
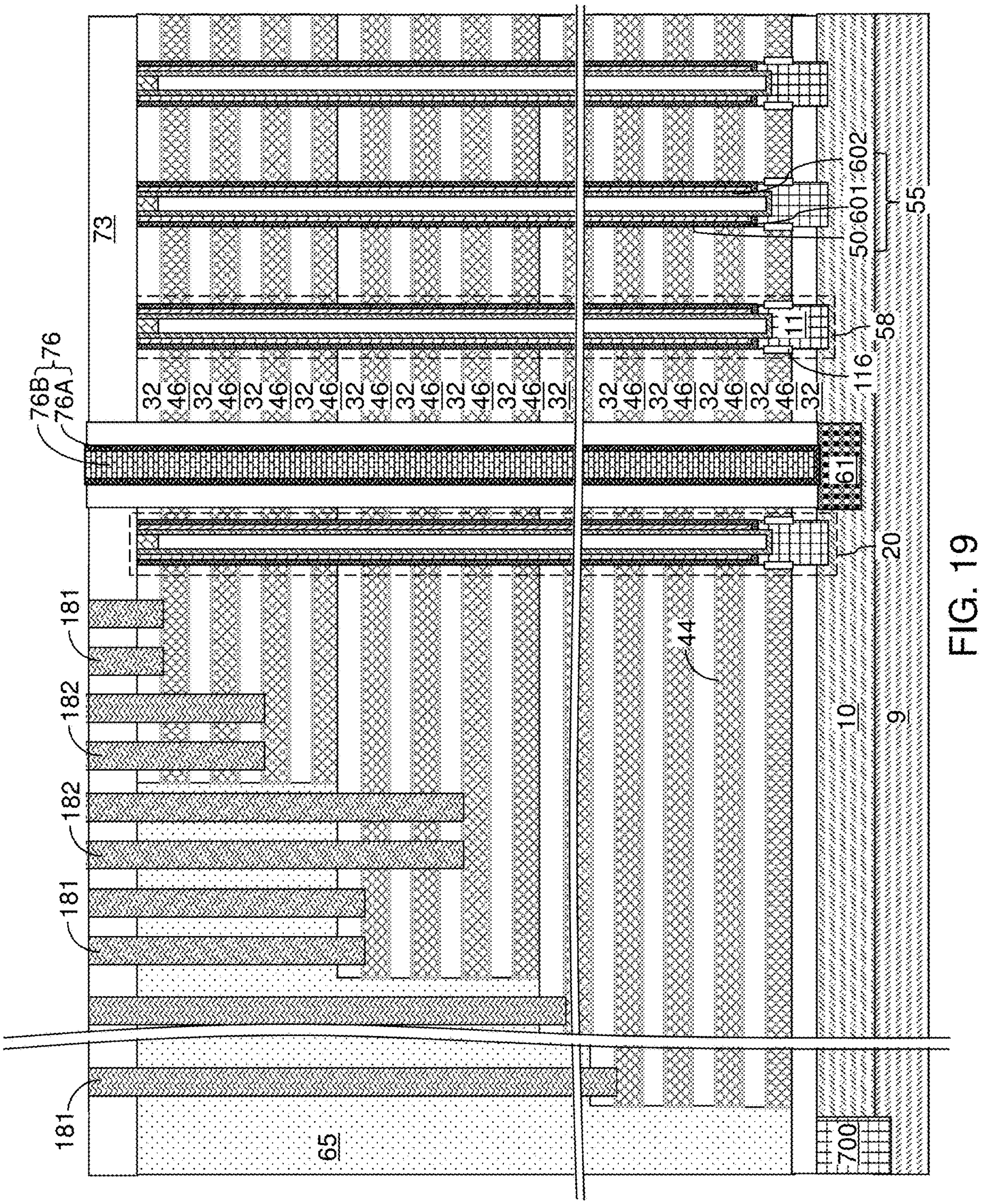
FIG. 19 is a schematic vertical cross-sectional view of the first exemplary structure after formation of second sacrificial via cavity fill structures according to an embodiment of the present disclosure.

Referring to FIG. 19, a sacrificial cavity fill material can be deposited in the vertically extended subset of the via cavities 850 by a conformal or non-conformal deposition process. The sacrificial cavity fill material may include any sacrificial fill material that can be subsequently removed selective to the material of the retro-stepped dielectric material portion 65 and the electrically conductive layers 46. For example, the sacrificial cavity fill material may include a semiconductor material such as amorphous silicon, polysilicon, germanium, or a silicon-germanium alloy. Alternatively, the sacrificial cavity fill material may include amorphous carbon or diamond-like carbon. Excess portions of the sacrificial cavity fill material can be removed from above the horizontal plane including the top surface of the contact-level dielectric layer 73 by a planarization process such as a chemical mechanical planarization process. Each remaining portion of the sacrificial cavity fill material that fills the vertically extended via cavities 850 constitutes a secondary sacrificial via cavity fill structure 182. The secondary sacrificial via cavity fill structures 182 can fill the extended via cavities (e.g., the extended even-numbered via cavities).

Figure 20:
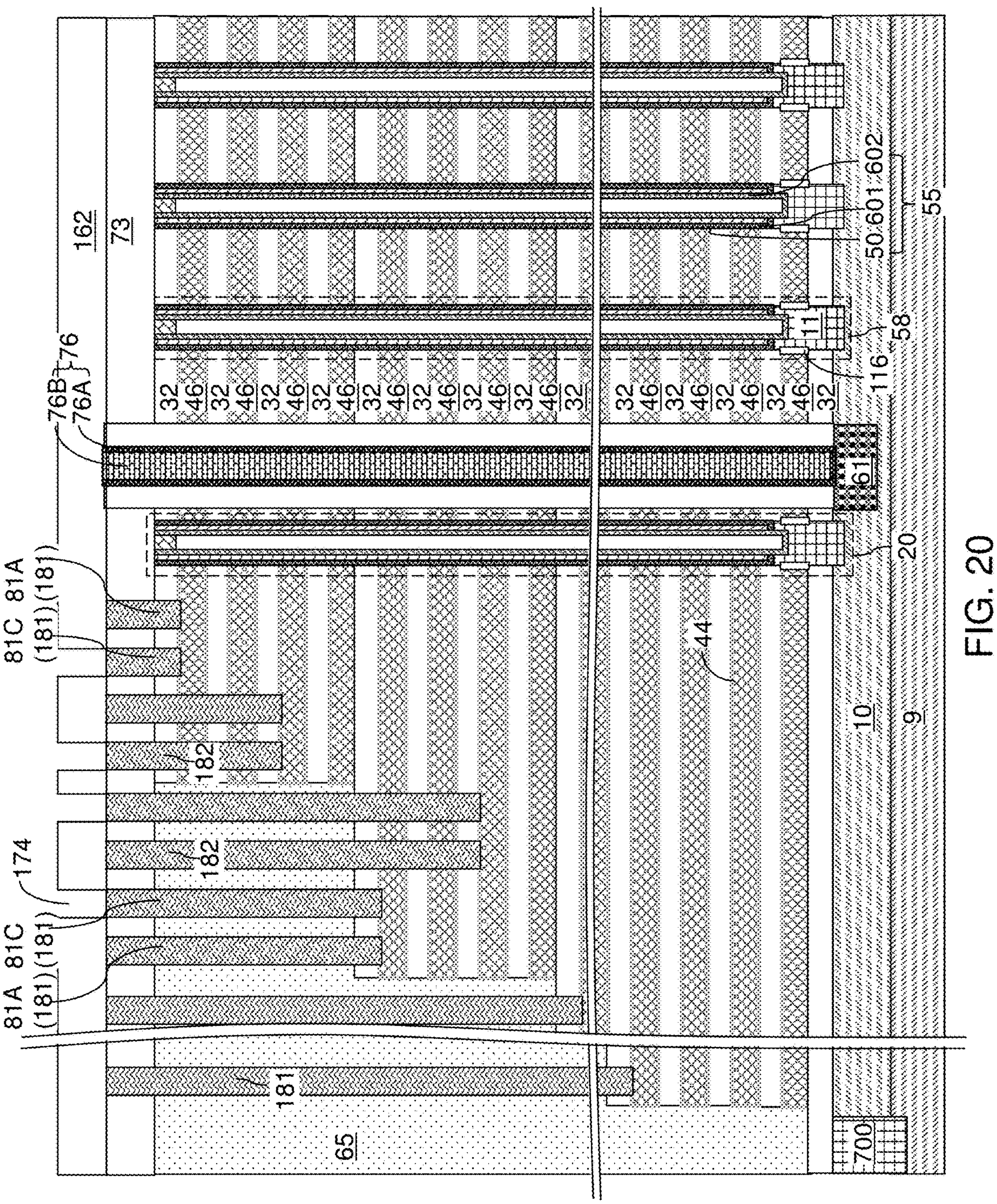
FIG. 20 is a schematic vertical cross-sectional view of the first exemplary structure after formation of a second sacrificial etch mask layer and openings therethrough according to an embodiment of the present disclosure.

Referring to FIG. 20, a second sacrificial etch mask layer 162 can be formed over the contact-level dielectric layer 73 and the sacrificial via cavity fill structures (181, 182). In one embodiment, the second sacrificial etch mask layer 162 may include the same material as the insulating layers 32. For example, each of the insulating layers 32 and the second sacrificial etch mask layer 162 can comprise undoped silicate glass or a doped silicate glass. The thickness of the second sacrificial etch mask layer 162 can be selected such that the entirety of the second sacrificial etch mask layer 162 can be removed during a subsequent third anisotropic etch process, which is described below.

Openings 174 can be formed through the second sacrificial etch mask layer 162 by applying and lithographically patterning a photoresist layer (not shown) over the second sacrificial etch mask layer 162, and by transferring the pattern of the openings in the photoresist layer through the second sacrificial etch mask layer 162. The photoresist layer can be subsequently removed, for example, by ashing. The pattern of the openings 174 through the second sacrificial etch mask layer 162 can be selected such that openings 174 through the second sacrificial etch mask layer 162 overlie one half of the sacrificial via cavity fill structures (181, 182) that fill odd-numbered via cavities and one half of the sacrificial via cavity fill structures (181, 182) that fill even-numbered via cavities. The complementary one half of the sacrificial via cavity fill structures (181, 182) that fill odd-numbered via cavities and the complementary one half of the sacrificial via cavity fill structures (181, 182) that fill even-numbered via cavities are covered by the second sacrificial etch mask layer 162.

Figure 21:
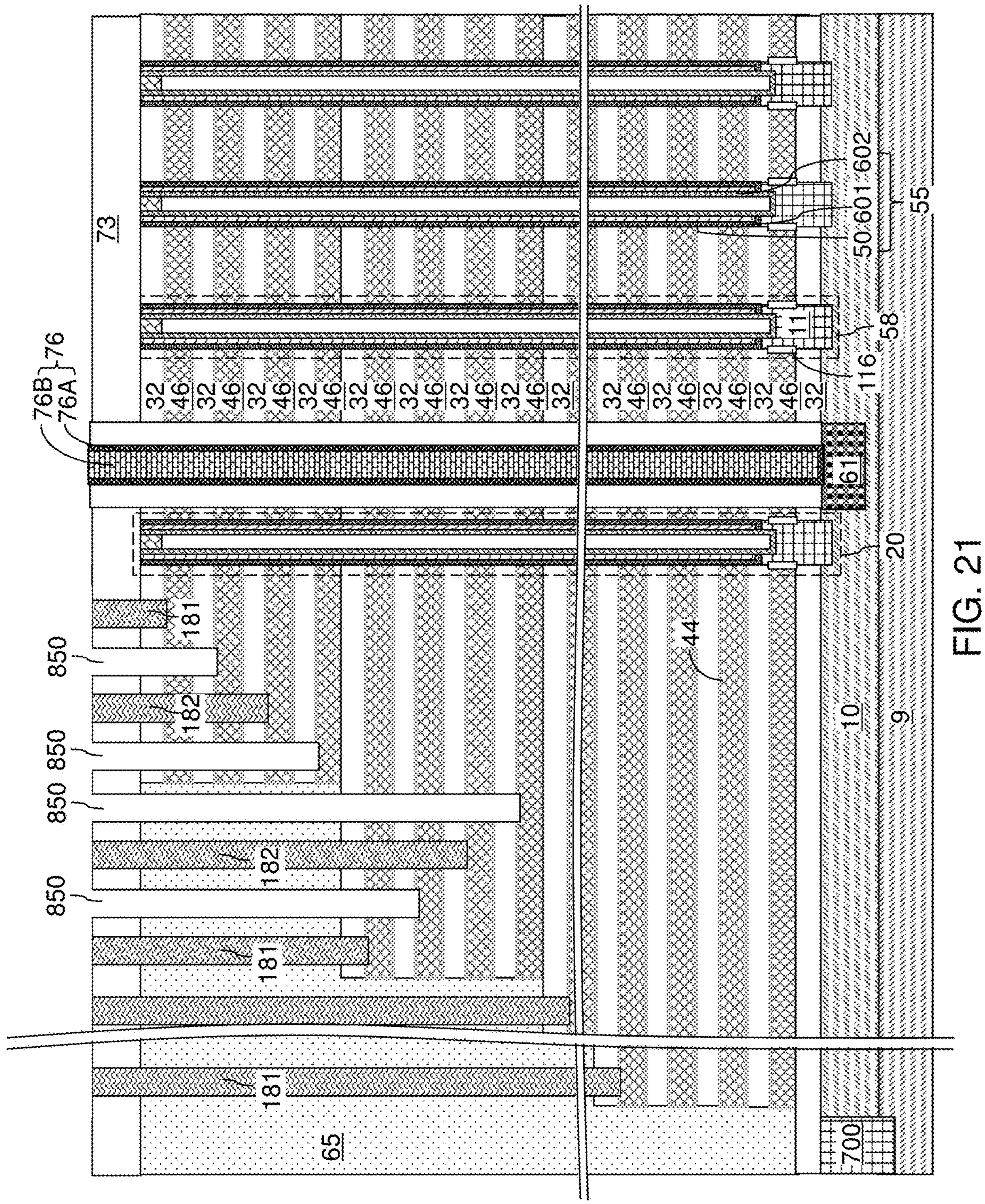
FIG. 21 is a schematic vertical cross-sectional view of the first exemplary structure after a second via cavity extension etch process according to an embodiment of the present disclosure.

Referring to FIG. 21, a first subset of the sacrificial via cavity fill structures (181, 182) that underlie openings through the second sacrificial etch mask layer 162 can be removed selective to the second sacrificial etch mask layer 162, the retro-stepped dielectric material portion 65 and the electrically conductive layers 46. For example, a wet etch process or an ashing process may be employed to remove the first subset of the sacrificial via cavity fill structures (181, 182). The second sacrificial etch mask layer 162 protects a second subset of the sacrificial via cavity fill structures (181, 182). Thus, the first subset of the sacrificial via cavity fill structures (181, 182) can be removed without removing the second subset of the sacrificial via cavity fill structure (181, 182).

Figure 22:
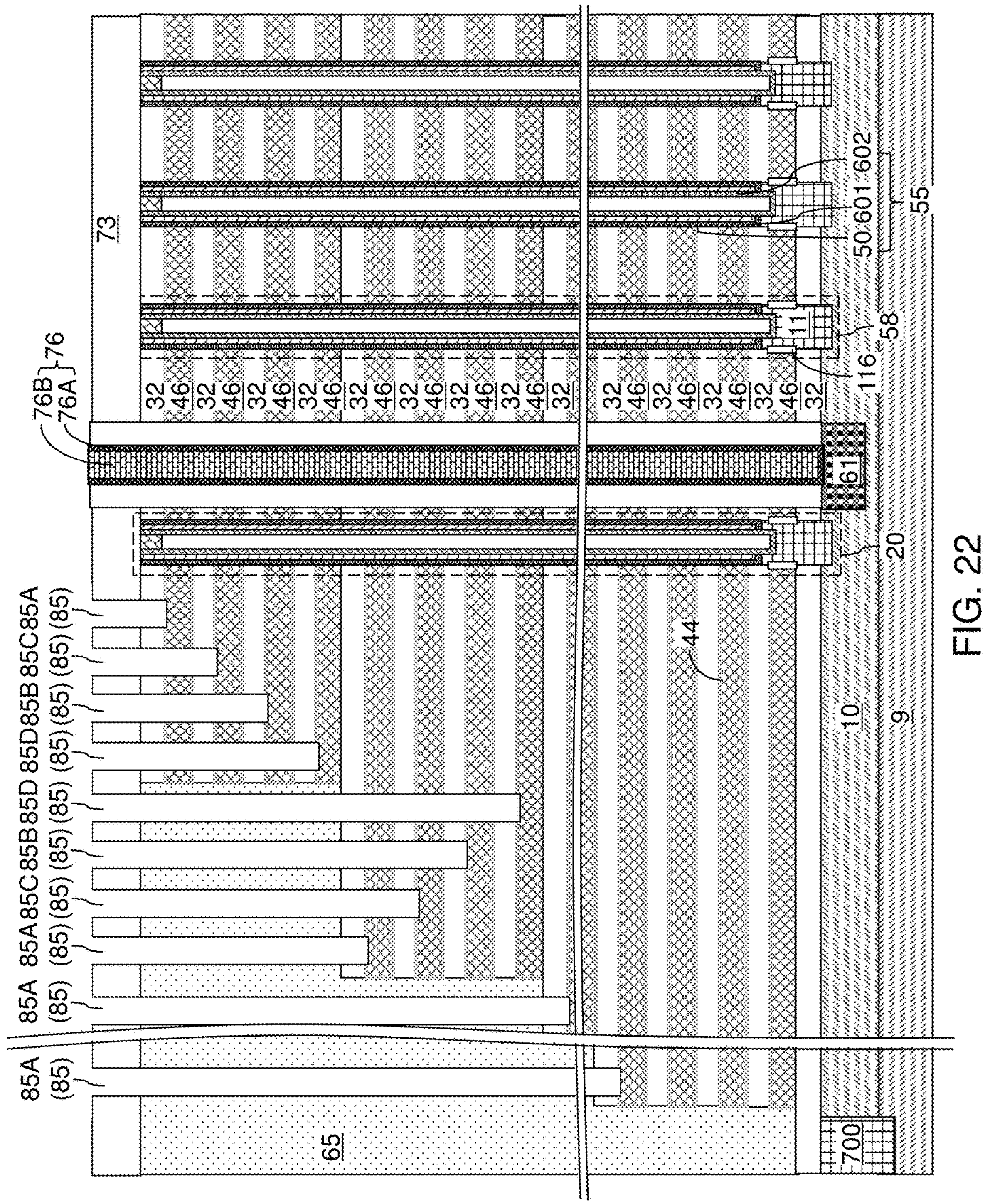
FIG. 22 is a schematic vertical cross-sectional view of the first exemplary structure after removal of the sacrificial via cavity fill structures according to an embodiment of the present disclosure.

Referring to FIG. 22, a third anisotropic etch process can be performed to vertically extend the via cavities 850 that are not filled with the sacrificial via cavity fill structures (181, 182). The third anisotropic etch is a via cavity extension etch process that vertically extends the vacant via cavities 850, and is herein referred to as a second via cavity extension etch process. The third anisotropic etch process vertically extends the vacant via cavities 850 through at least one electrically conductive layer 46 and at least one of the insulating layers 32 down to a top surface of a respective electrically conductive layer 46 without vertically extending the via cavities that are filled with the sacrificial via cavity fill structures (181, 182).

In one embodiment, if each step 48 contains $2^N$ pairs of an insulating layer 32 and an electrically conductive layer 46 and if each vertical sidewall segment of the retro-stepped dielectric material portion extends over $2^N$ pairs of an insulating layer 32 and an electrically conductive layer 46, then the vacant via cavities 850 can be vertically extended by over $2^{N-2}$ pairs of an insulating layer 32 and an electrically conductive layer 46. In the illustrated example, N is 2, and the third anisotropic etch process vertically extends the vacant via cavities 850 through an electrically conductive layer 46 and an insulating layer 32. In one embodiment, the thickness of the second sacrificial etch mask layer 162 can be selected to be collaterally etched during the third anisotropic etch process. Thus, the second sacrificial etch mask layer 162 can be removed concurrently with vertical extension of the vacant via cavities 850. For example, the second sacrificial etch mask layer 162 can have the same material as the insulating layers 32, and can have a thickness that is the sum of $2^{N-2}$ times the thickness of an insulating layer 32 and a thickness that corresponds to the collateral etch rate of the material of the second sacrificial etch mask layer 162 during etching of $2^{N-2}$ of electrically conductive layers 46.

Generally, the processing steps of FIGS. 19-21 can be repeated with appropriate variations in the pattern of the openings through a respective sacrificial etch mask layer. A subset of the via cavities can be vertically extended by a depth corresponding to $2^i$ times the thickness of a pair of an insulating layer 32 and an electrically conductive layer 46, in which i is an integer in a range from 0 to N−2. Generally, repetition of the via extension etch processes N time can generate a set of $2^N$ via cavities 850 that vertically extends through a respective horizontal bottom surface segment of the retro-stepped dielectric material portion 65.

Referring to FIG. 22, remaining sacrificial via cavity fill structures (181, 182) filling the via cavities 850 can be removed selective to the retro-stepped dielectric material portion 65 and the electrically conductive layers 46. All via cavities 850 are vacant at this step.

Figure 23:
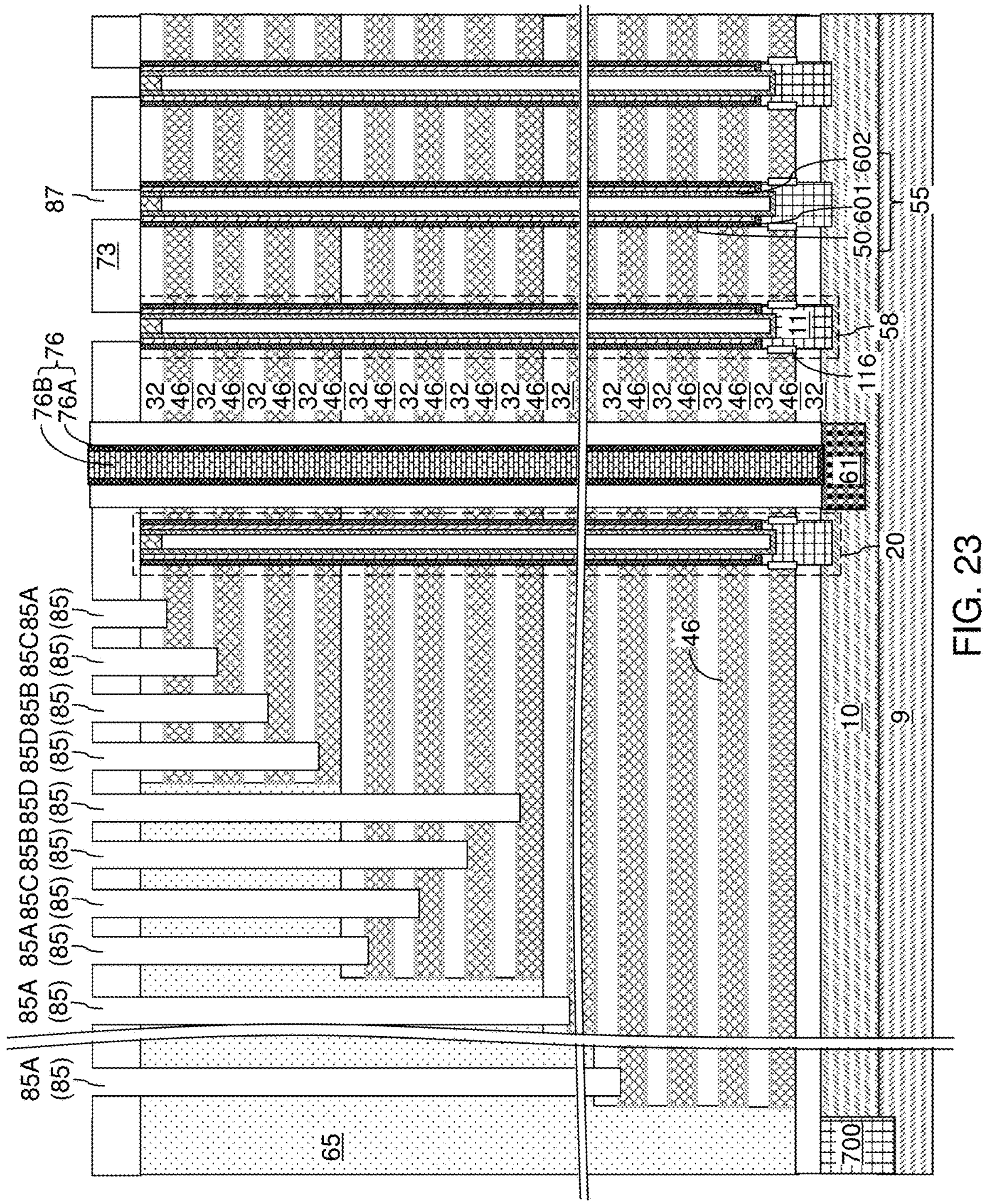
FIG. 23 is a schematic vertical cross-sectional view of the first exemplary structure after formation of drain contact via cavities according to an embodiment of the present disclosure.

Referring to FIG. 23, a photoresist layer (not shown) can be applied over the contact-level dielectric layer 73, and can be lithographically patterned to form openings over the memory opening fill structures 58. An anisotropic etch process can be performed to form via cavities that vertically extend to a top surface of a respective one of the drain regions 63. The via cavities are herein referred to as drain contact via cavities 87. The photoresist layer can be subsequently removed, for example, by ashing.

Figure 24:
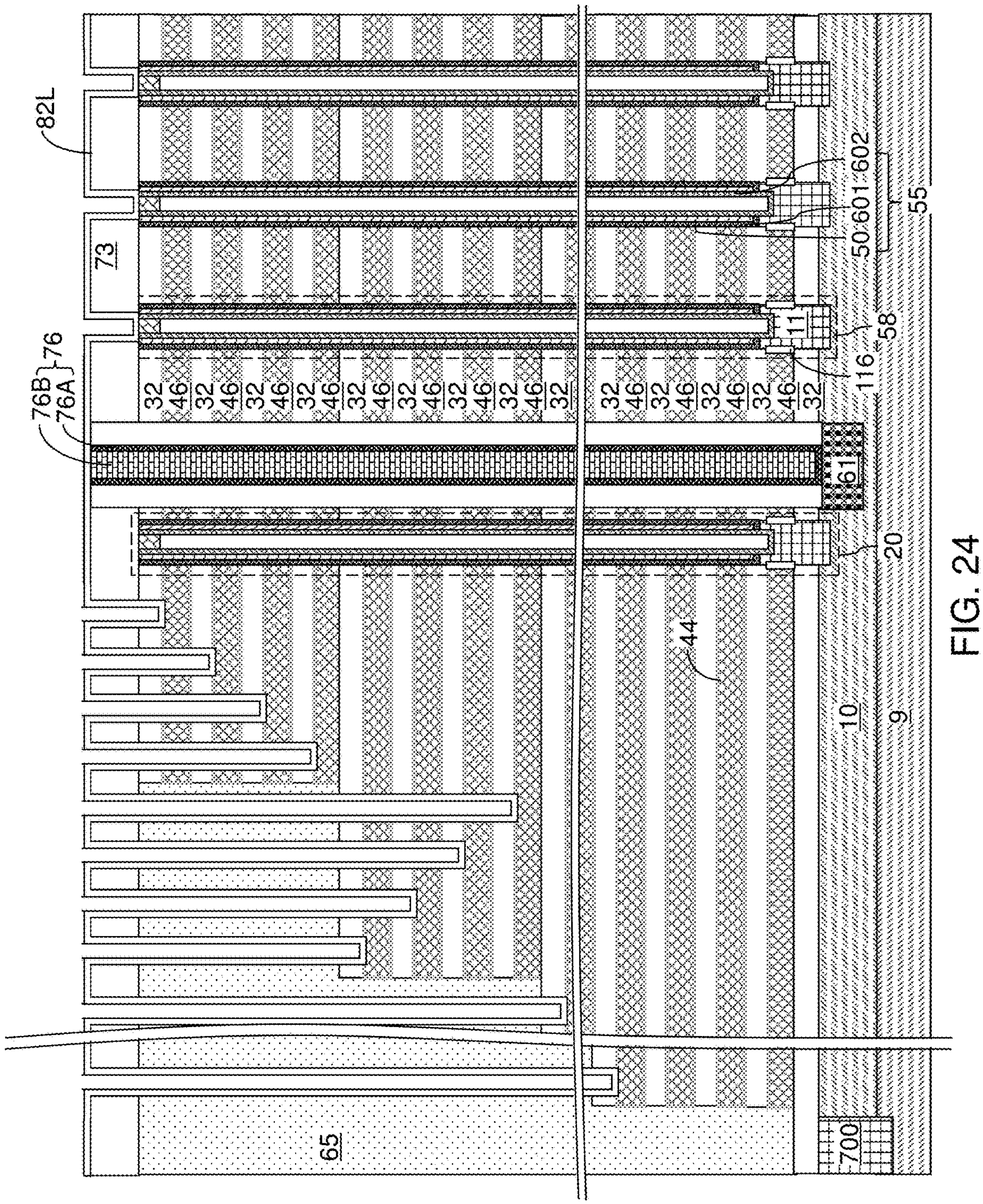
FIG. 24 is a schematic vertical cross-sectional view of the first exemplary structure after formation of a conformal dielectric spacer material layer according to an embodiment of the present disclosure.

Referring to FIG. 24, a conformal dielectric spacer material layer 82L can be deposited in the various via cavities (850, 87). The conformal dielectric spacer material layer 82L includes a dielectric material such as silicon oxide, silicon nitride, and/or a dielectric metal oxide (such as aluminum oxide or hafnium oxide). The conformal dielectric spacer material layer 82L can be formed by a conformal deposition process such as a chemical vapor deposition process. The thickness of the conformal dielectric spacer material layer 82L can be in a range from 3 nm to 60 nm, such as from 6 nm to 30 nm, although lesser and greater thicknesses can also be employed.

Figure 25:
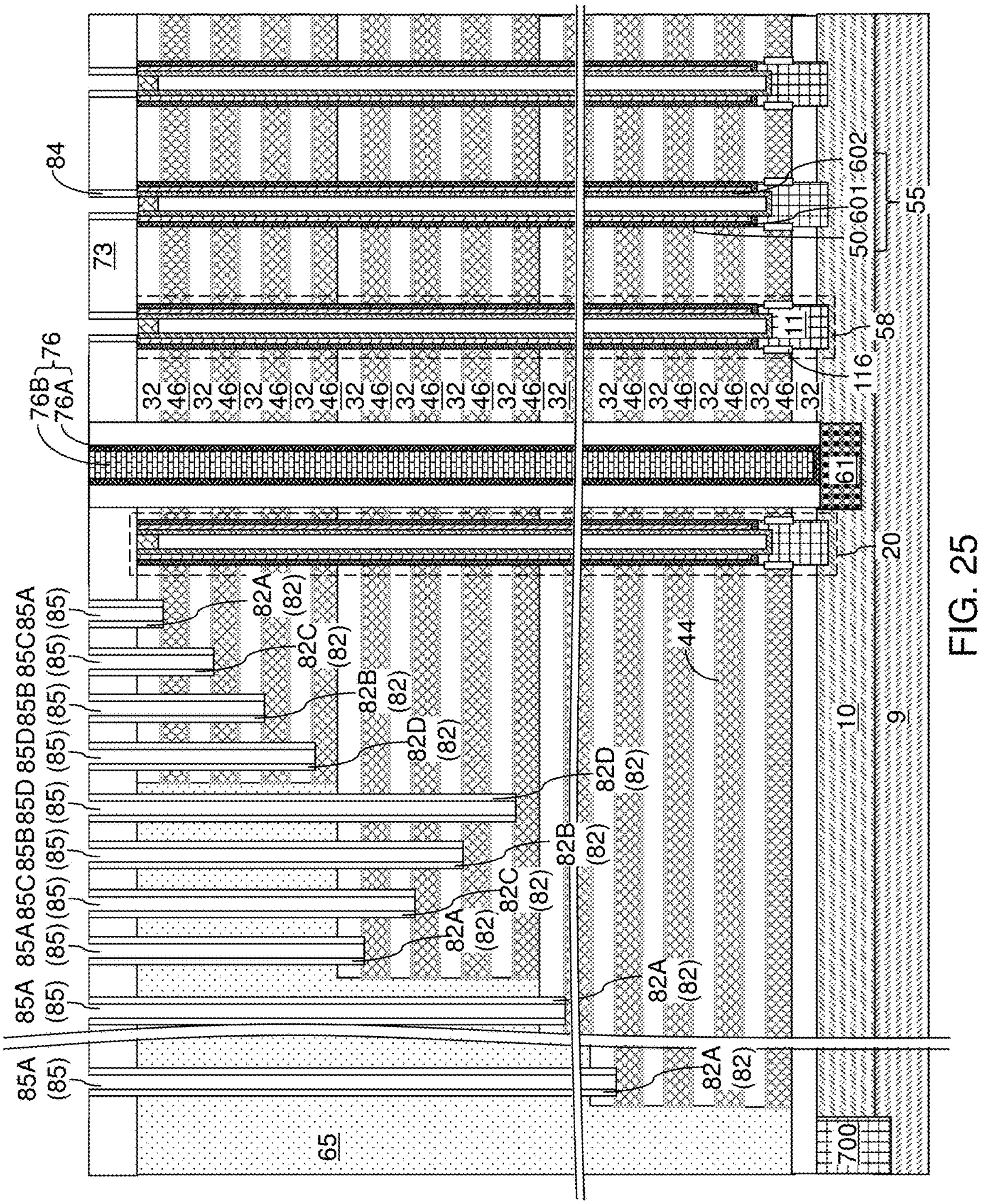
FIG. 25 is a schematic vertical cross-sectional view of the first exemplary structure after formation of dielectric spacers according to an embodiment of the present disclosure.

Referring to FIG. 25, an anisotropic etch process can be performed to remove horizontal portions of the conformal dielectric spacer material layer 82L. Each remaining cylindrical portion of the conformal dielectric spacer material layer 82L located in the via cavities 850 extending to a respective one of the electrically conductive layers 46 comprises a dielectric spacer, which is herein referred to as a layer contact dielectric spacer 82. The layer contact dielectric spacers 82 include first dielectric spacers 82A located within the first via cavities 85A, second dielectric spacers 82B located within the second via cavities 85B, third dielectric spacers 82C located within the third via cavities 85C, fourth dielectric spacers 82D located within the fourth via cavities 85D, etc. Each remaining cylindrical portion of the conformal dielectric spacer material layer 82L located in the drain contact via cavities 87 comprises a drain contact dielectric spacer 84.

Figure 26A:
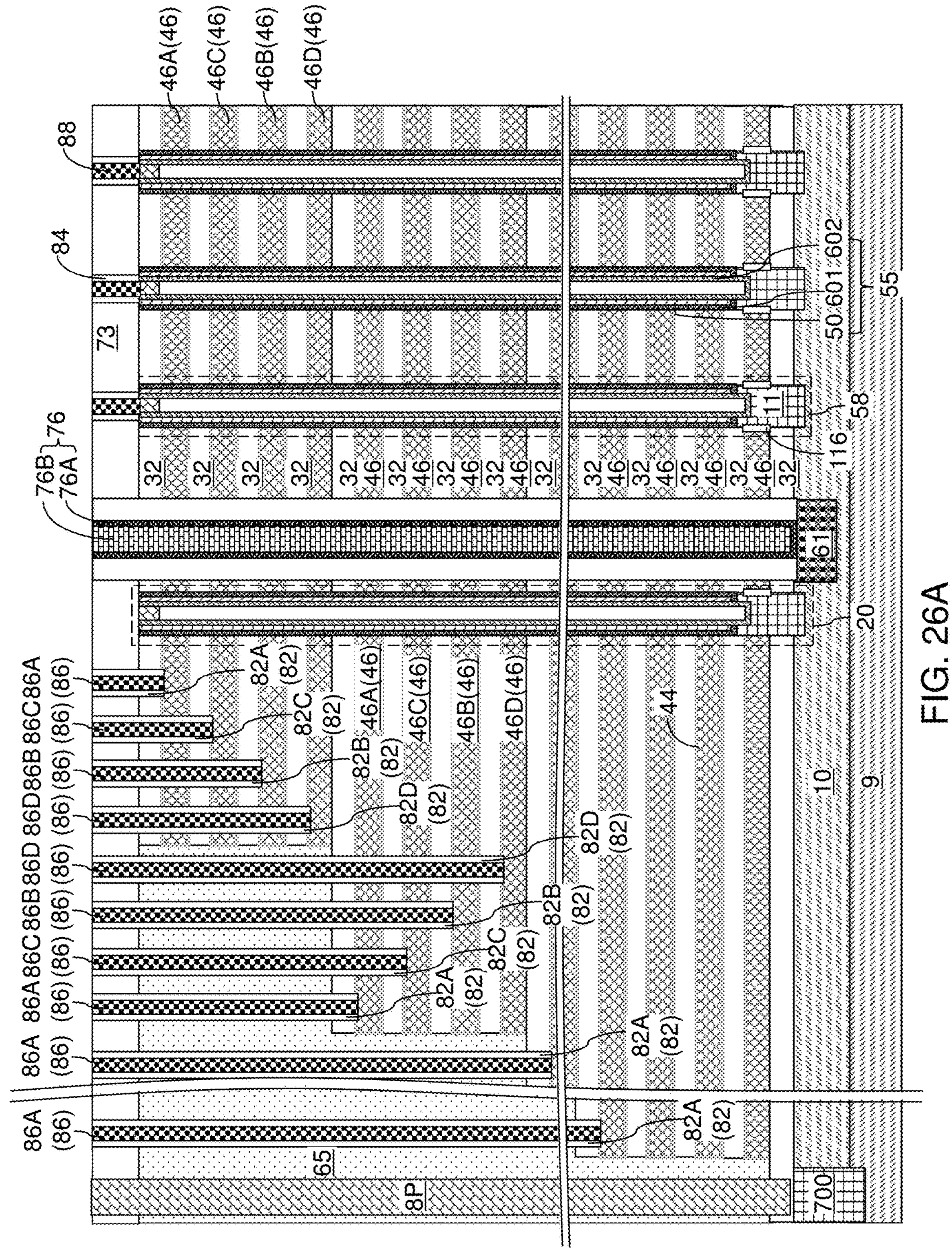
FIG. 26A is a schematic vertical cross-sectional view of the first exemplary structure after formation of various contact via structures according to an embodiment of the present disclosure.
Figure 26B:
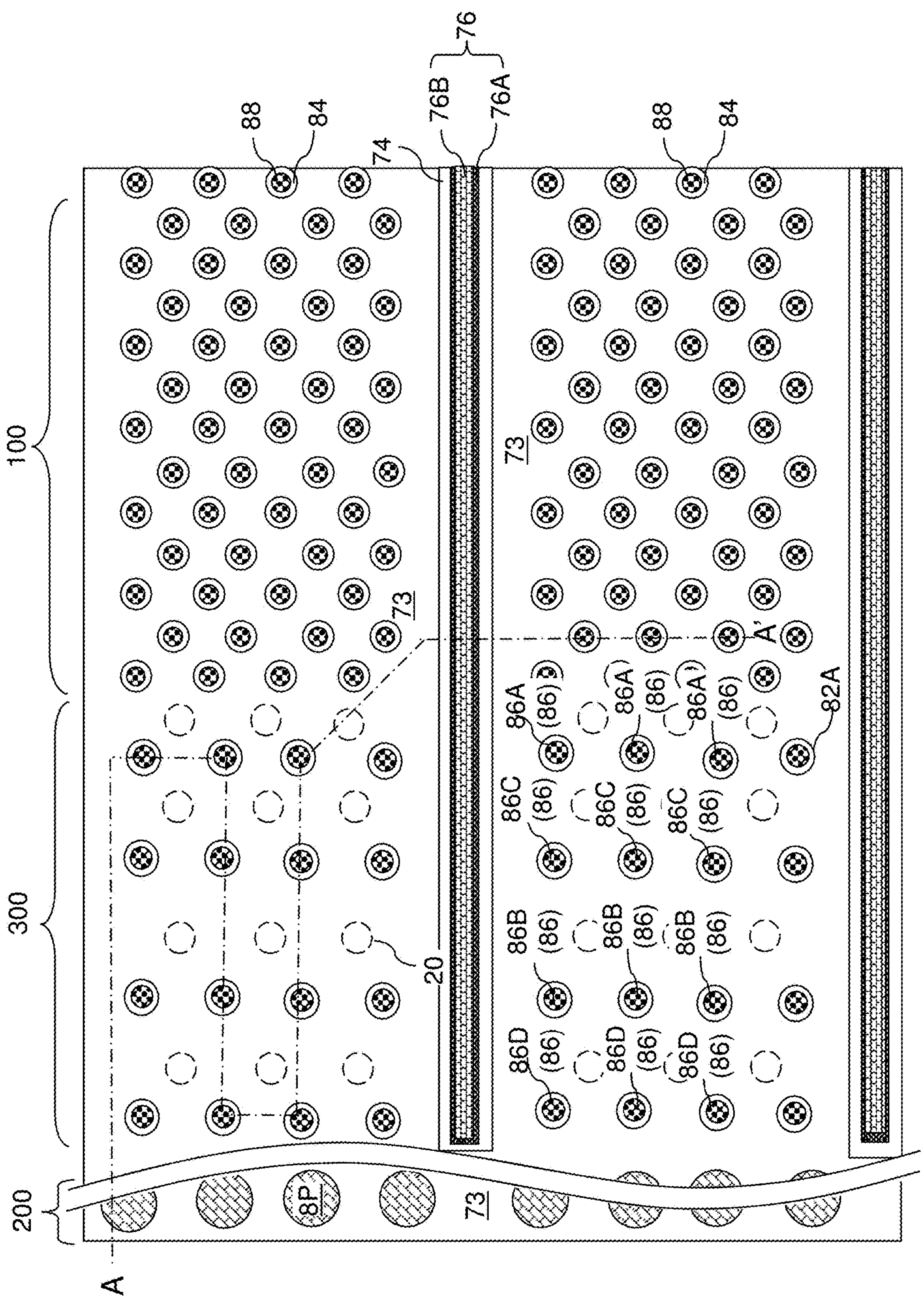
FIG. 26B is a top-down view of the first exemplary structure of FIG. 26A.

Referring to FIGS. 26A and 26B, additional contact via cavities vertically extending to the semiconductor devices 700 in the peripheral devices can be optionally formed. At least one conductive material can be deposited in the various via cavities by a respective conformal deposition process. For example, the at least one conductive material can include a metallic nitride barrier layer including a metallic barrier material (such as TiN, TaN, WN, TiC, TaC, or WC), and a metallic fill material (such as Cu, W, Mo, Ru, Co, or compounds or alloys thereof) that is deposited on the metallic barrier material. Excess portions of the at least one conductive material can be removed from above the horizontal plane including the top surface of the contact-level dielectric layer 73. Remaining portions of the at least one conductive material in the via cavities 850 comprise contact via structures, which are herein referred to as layer contact via structures 86. Each layer contact via structure 86 contacts a top surface of a respective one of the electrically conductive layers 46 (e.g., word line or select gate line). Remaining portions of the at least one conductive material in the drain contact via cavities 87 comprise drain contact via structures 88. Remaining portions of the at least one conductive material in the via cavities extending to the semiconductor devices 700 comprise peripheral contact via structures 8P.

Each contiguous combination of a layer contact via structure 86 and a layer contact dielectric spacer 82 constitutes a laterally-isolated contact structure (86, 82). Each via cavity 850 vertically extends to a respective one of the electrically conductive layers 46. While two patterns of four laterally-isolated contact structures (86, 82) are expressly illustrated in FIG. 26A, it is understood that multiple patterns of two, four, six, etc. laterally-isolated contact structures (86, 82) can be repeated. In an illustrative example, each step 48 includes $2^N$ insulating layers, each vertical sidewall segment of the retro-stepped dielectric material portion 65 may contact sidewalls of $2^N$ insulating layers, and M vertical sidewall segments may be provided on the retro-stepped dielectric material portion. M sets of laterally-isolated contact structures (86, 82) can be provided, and each set of laterally-isolated contact structures (86, 82) can include $2^N$ of laterally-isolated contact structures (86, 82). The number N may be in a range from 1 to 6, although greater integers may also be employed. The number M may be in a range from 2 to 100, such as from 4 to 20, although a greater integer may also be employed. While the present disclosure is described employing drawings corresponding to the case in which N is equal to 2, the first exemplary structure of the present disclosure can be generalized to structures in which N is 1 or a number greater than 2.

FIGS. 27A to 37B illustrate steps in forming an alternative first exemplary structure according to an alternative embodiment of the present disclosure. In this alternative embodiment, each step 48 includes two insulating layers 32 and two electrically conductive layers 46. Only one step 48 is shown in FIGS. 27A to 37B for clarity.

Figure 27A:
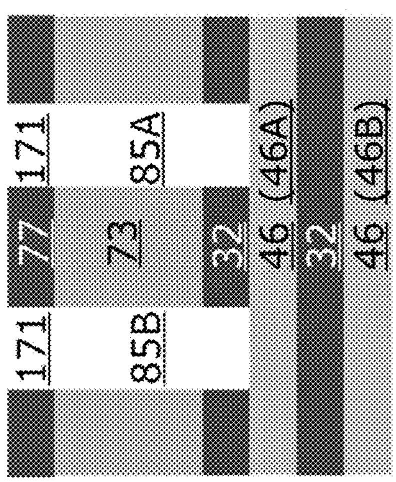
Figure 27B:
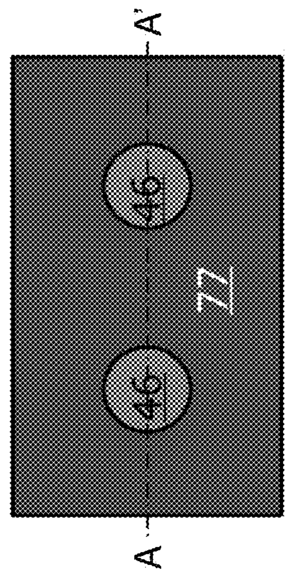

Referring to FIGS. 27A and 27B, the steps of FIGS. 12A and 12B are performed to form the first etch mask layer 77 above the contact-level dielectric layer 73. Only a portion of the structure of FIGS. 12A and 12B is shown in FIGS. 27A and 27B. The first etch mask layer 77 can be patterned to form an array of openings 171 therethrough, as described above. In this embodiment, two openings 171 in the first etch mask layer 77 are formed within the area of a respective one of the steps 48 (which are shown in FIG. 12A).

Figure 28A:
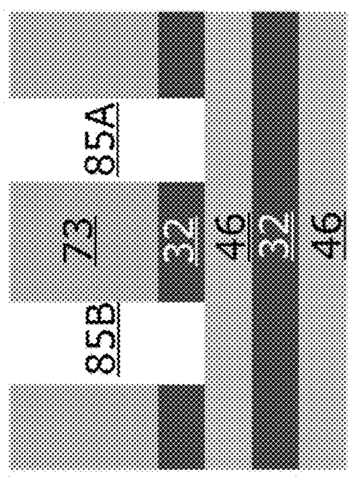
Figure 28B:
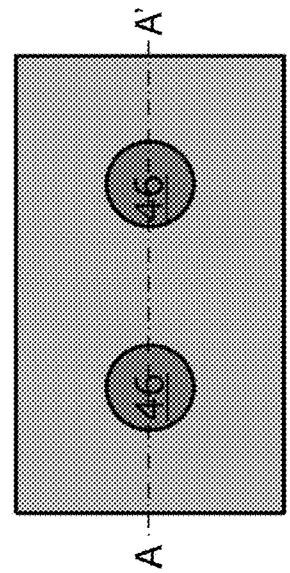

Referring to FIGS. 28A and 28B, the first anisotropic etch process can be performed to transfer the pattern of the openings 171 through the contact-level dielectric layer 73, through the retro-stepped dielectric material portion 65 (which is shown in FIG. 13) and through the insulating layer 32 on top of each step 48, as described above with respect to FIG. 13 above. A first via cavity 85A and a second via cavity 85B of each set of via cavities extend down to a top surface of a respective first (i.e., upper) electrically conductive layer 46 (e.g., 46A) in each step 48 by performing the first anisotropic etch process. The first etch mask layer 77 may be consumed during the first anisotropic etch process, or may be removed after the first anisotropic etch process, for example, by ashing.

Figure 29A:
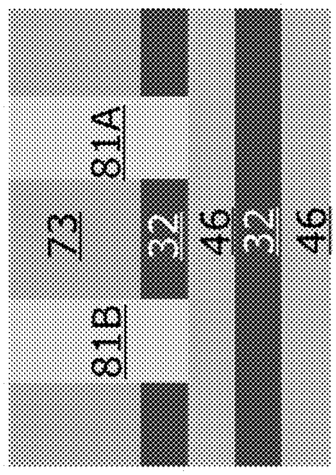
Figure 29B:
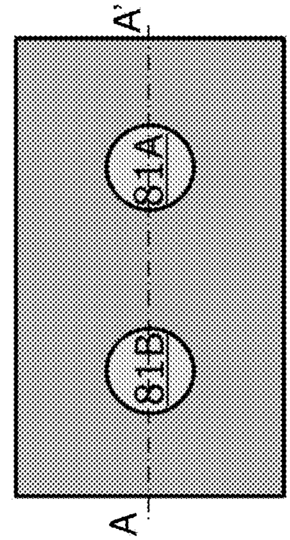

Referring to FIGS. 29A and 29B, the primary sacrificial via cavity fill structures are formed in the first and second via cavities (85A, 85B), as described above with respect to FIG. 14. The primary sacrificial via cavity fill structures include the first primary sacrificial via cavity fill structure 81A that fills the respective first via cavity 85A and the second primary sacrificial via cavity fill structure 81B that fills the respective second via cavity 85B.

Figure 30A:
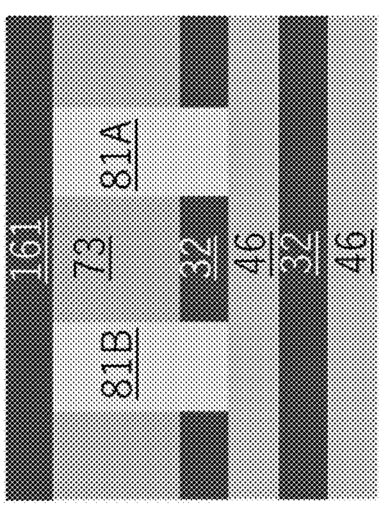
Figure 30B:
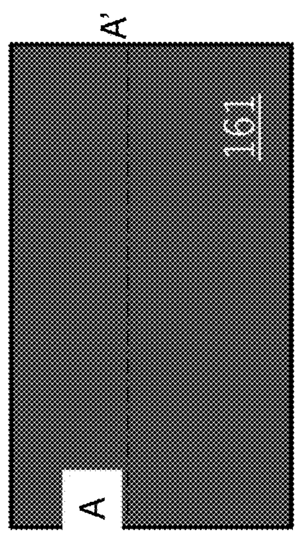

Referring to FIGS. 30A and 30B the first sacrificial etch mask layer 161 is formed over the contact-level dielectric layer 73 and the primary sacrificial via cavity fill structures (81A, 81B), as described above with respect to FIG. 15.

Figure 31A:
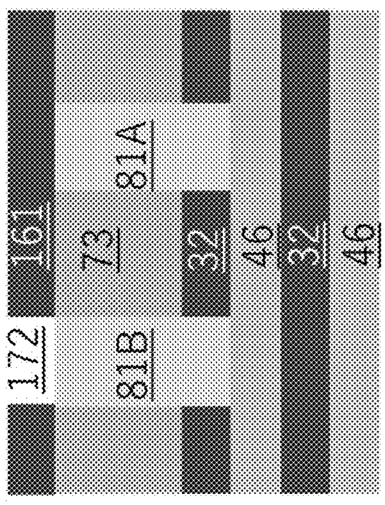
Figure 31B:
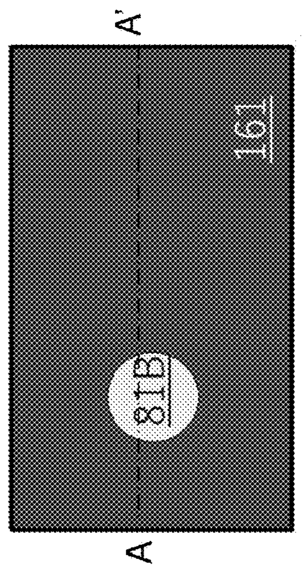

Referring to FIGS. 31A and 31B, the opening 172 is formed through the first sacrificial etch mask layer 161, as described above with respect to FIG. 15. The opening 172 through the first sacrificial etch mask layer 161 is located over the second primary sacrificial via cavity fill structure 81B, while the first sacrificial etch mask layer 161 covers the first primary sacrificial via cavity fill structure 81A.

Figure 16:
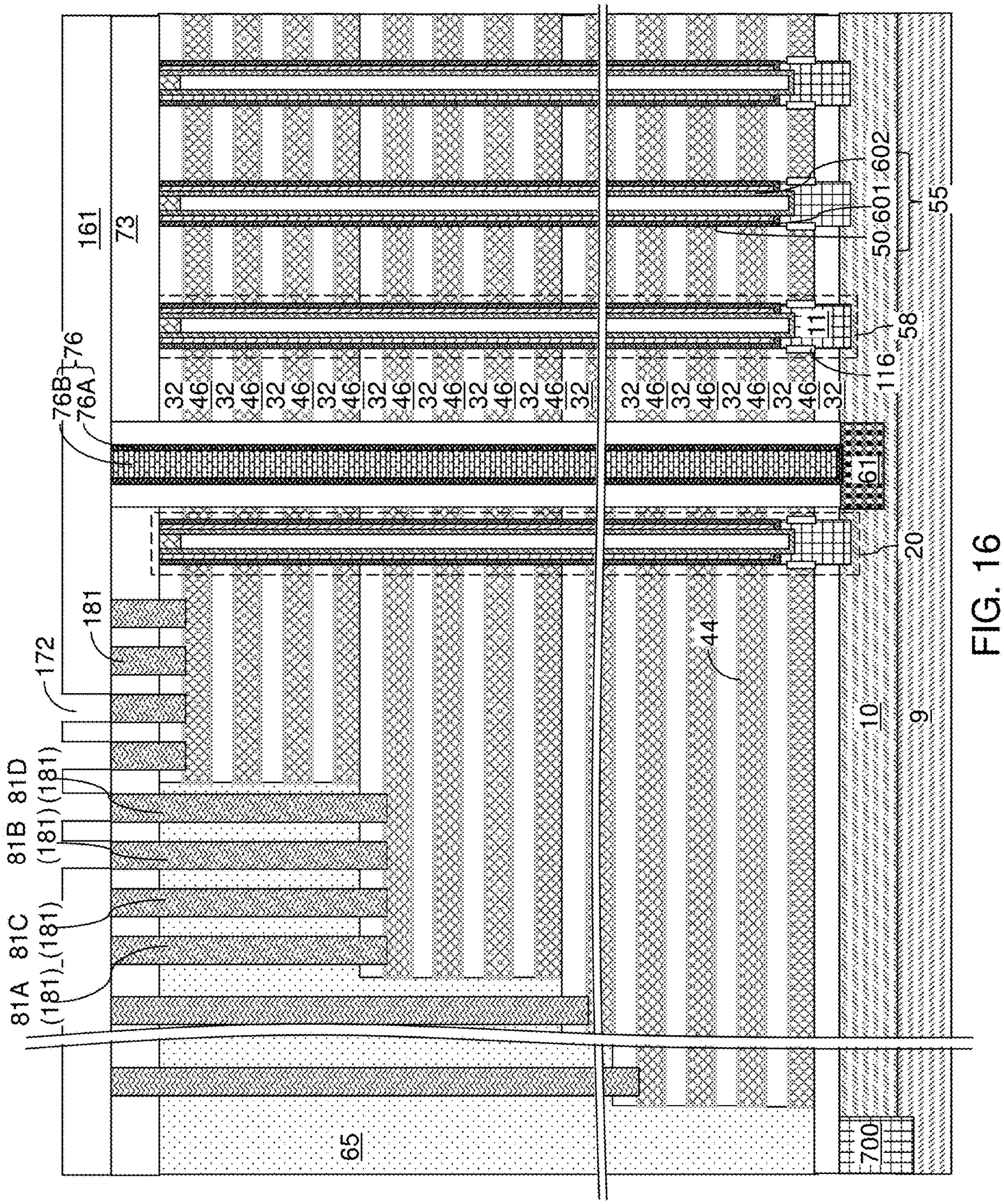
FIG. 16 is a schematic vertical cross-sectional view of the first exemplary structure after formation of openings through the first sacrificial etch mask layer according to an embodiment of the present disclosure.
Figure 32A:
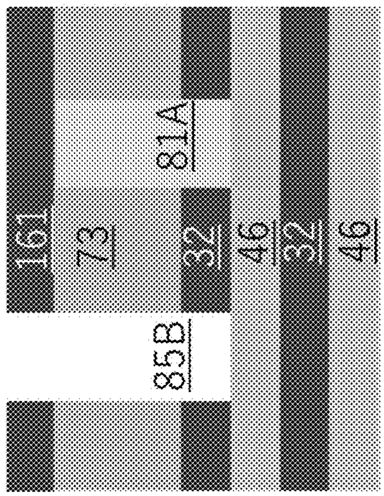
Figure 32B:
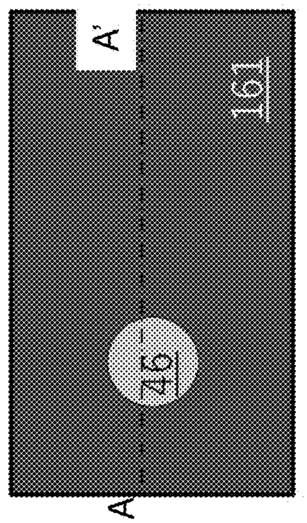

Referring to FIGS. 32A and 32B, the second primary sacrificial via cavity fill structure 81B that underlies the opening 172 through the first sacrificial etch mask layer 161 is removed from the second via cavity 85B, as described above with respect to FIG. 16. The upper electrically conductive layer 46 in the step is exposed in the second via cavity 85B.

Figure 33A:
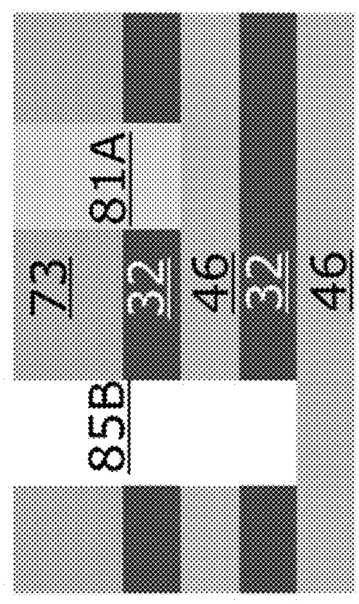
Figure 33B:
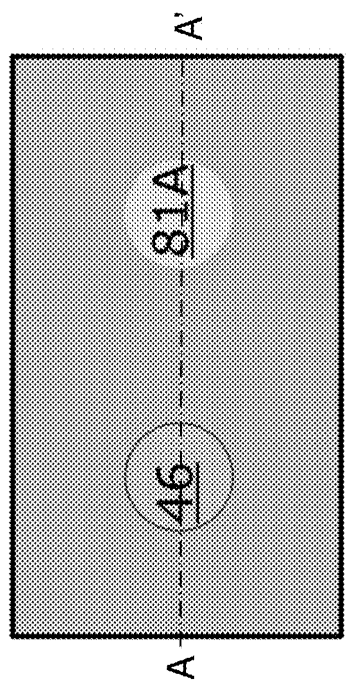

Referring to FIGS. 33A and 33B, the second anisotropic etch process is performed to vertically extend the second via cavity 85B, as described above with respect to FIG. 16. The first sacrificial etch mask layer 161 may be consumed during the etching steps or separately etched away. The second anisotropic etch process vertically extends the second via cavity 85B through the upper electrically conductive layer 46 (e.g., 46A) and the lower insulating layer 32 down to a top surface of the lower electrically conductive layer 46 (e.g., 46B) in each step without vertically extending the first via cavity 85A.

Figure 34A:
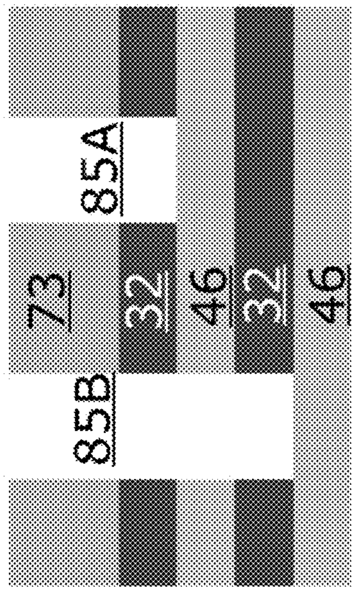
Figure 34B:
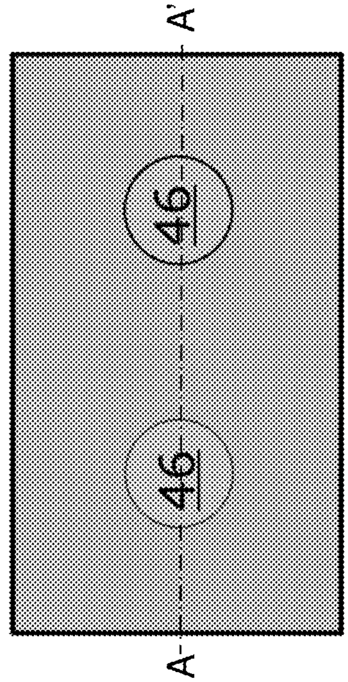

Referring to FIGS. 34A and 35B, the remaining first sacrificial via cavity fill structure 81A filling the first via cavity 85A is be removed selective to the retro-stepped dielectric material portion 65 and the electrically conductive layers 46, as described above with respect to FIG. 22. All via cavities (85A, 85B) are vacant at this step.

Referring to FIGS. 35A and 35B, the conformal dielectric spacer material layer 82L can be deposited in the first and second via cavities (85A, 85B), as described above with respect to FIG. 24.

Referring to FIGS. 36A and 36B, the anisotropic etch process is performed to remove horizontal portions of the conformal dielectric spacer material layer 82L, as described above with respect to FIG. 25. Each remaining cylindrical portion of the conformal dielectric spacer material layer 82L located in the via cavities (85A, 85B) extending to a respective one of the electrically conductive layers 46 the layer contact dielectric spacer 82. The layer contact dielectric spacers 82 include the first dielectric spacer 82A located within the first via cavity 85A and a second dielectric spacer 82B located within the second via cavity 85B.

Referring to FIGS. 37A and 37B, the contact via structures 86 are formed in via cavities, as described above with respect to FIGS. 26A and 26B. The first contact via structure 86A is formed in the first via cavity 85A in contact with the upper electrically conductive layer 46. The second contact via structure 86B is formed in the second via cavity 85B in contact with the lower electrically conductive layer 46. The second dielectric spacer 82B contacts the sidewalls of the upper electrically conductive layer exposed in the second via cavity 85B, and contacts the top surface of the lower electrically conductive layer 46 exposed in the second via cavity 85B. The second contact via structure 86B is surrounded by the second dielectric spacer 82B in the second via cavity 85B and extends through upper electrically conductive layer 46 without contacting the upper electrically conductive layer 46.

Referring to all drawings and according to various embodiments of the present disclosure, a three-dimensional memory device is provided, which comprises: an alternating stack of insulating layers 32 and electrically conductive layers 46 containing a terrace region comprising a plurality of steps 48, memory stack structures 55 extending through the alternating stack (32, 46), a retro-stepped dielectric material portion 65 overlying terrace region of the alternating stack, first laterally-isolated contact structures (82A, 86A) each including a respective first contact via structure 86A and a respective first dielectric spacer 82A, wherein the respective first contact via structure 86A contacts a top surface of a respective upper electrically conductive layer 46A of the electrically conductive layers 46 in the respective step 48, and the respective first dielectric spacer 82A extends through the retro-stepped dielectric material portion 65 and does not contact any of the electrically conductive layers 46 other than the respective upper electrically conductive layer 46A in the respect step 48, and second laterally-isolated contact structures (82B, 86B) including a respective second contact via structure 86B and a respective second dielectric spacer 82B, wherein the respective second contact via structure 86B contacts a top surface of a respective lower electrically conductive layer 46B of the electrically conductive layers 46 in the respective step 48, and the respective second dielectric spacer 82B extends through the retro-stepped dielectric material portion 65 and through the respective upper electrically conductive layer 46, and contacts the respective lower electrically conductive layer 46B.

Additional laterally-isolated contact structures {(82C, 86C), (82D, 86D)} including a respective additional contact via structure (86C, 86D) and a respective additional dielectric spacer (82C, 82D) can be provided. The respective additional contact via structure (86C, 86D) contact top surfaces of respective additional electrically conductive layer (46C, 46D) of the electrically conductive layers 46, and the respective additional dielectric spacers (82C, 82D) extend through the retro-stepped dielectric material portion 65 and respective additional electrically conductive layers (46A, 46C, or 46B) and contact the respective additional electrically conductive layers (46C, 46D).

In one embodiment, the respective second dielectric spacer 82B extends through a via cavity 85B and contacts a sidewall of the upper electrically conductive layer 46A exposed in the via cavity 85B. In one embodiment, the respective second dielectric spacer 82B contacts a sidewall of a respective one of the insulating layers 32 exposed in the via cavity 85B.

In one embodiment, the first dielectric spacers and the second dielectric spacers comprise a same dielectric material and have annular top surfaces located within a horizontal plane located above a top surface of the retro-stepped dielectric material portion 65. In one embodiment, the first contact via structures 86A and the second contact via structures 86B have top surfaces located within the horizontal plane. In one embodiment, each contact via structure 86 can have a top surface within the horizontal plane.

In one embodiment, an annular bottom surface of the respective first dielectric spacer 82A contacts a top surface of the respective upper electrically conductive layer 46A, and an annular bottom surface of the respective second dielectric spacer 82B contacts the respective lower electrically conductive layer 46B. In one embodiment, a cylindrical portion of an outer sidewall of the respective second dielectric spacer 82B contacts a cylindrical surface of the respective upper electrically conductive layer 46A exposed in the via cavity 85B.

In one embodiment, the respective second dielectric spacer 82B contacts cylindrical sidewalls of at least two upper electrically conductive layers (46A, 46C) of the electrically conductive layers 46 exposed in the via cavity 85B.

In one embodiment, the three-dimensional memory device comprises third laterally-isolated contact structures (82C, 86C) including a respective third contact via structure 86C and a respective third dielectric spacer 82C, wherein the respective third contact via structure 86C contacts a top surfaces of a respective third electrically conductive layer 46C of electrically conductive layers 46, and the respective third dielectric spacer 82C extends through the retro-stepped dielectric material portion 65.

In one embodiment, the retro-stepped dielectric material portion 65 comprises a contiguous set of surfaces that includes horizontal bottom surface segments and vertical surface segments, the horizontal bottom surface segments are vertically spaced apart from each other and are laterally spaced apart from each other; and each of the horizontal bottom surface segments other than a bottommost one of the horizontal bottom surface segments is adjoined to a respective pair of vertical surfaces segments of the vertical surface segments of the retro-stepped dielectric material portion 65.

In one embodiment, each of the insulating layers 32 contacts has a respective sidewall that contacts a respective one of the vertical sidewall segments of the retro-stepped dielectric material portion 65, and each of electrically conducive layers 46 contacts the retro-stepped dielectric material portion 65, or is laterally spaced from the retro-stepped dielectric material portion 65 by a respective backside blocking dielectric layer 44. In one embodiment, one the vertical sidewall segments of the retro-stepped dielectric material portion 65 contacts sidewalls of at least two insulating layers 32 of the insulating layers (32, 46).

In one embodiment, the alternating stack (32, 46) has a vertical periodicity that is the same as a vertical separation distance between top surfaces of a vertically neighboring pair of insulating layers 32 within the alternating stack (32, 46); top surfaces of the first electrically conductive layers 46A are vertically offset from each other by multiples of K times the vertical periodicity, wherein K is an integer in a range from 2 to $2^N$, and wherein N is an integer in a range from 2 to 6; and top surfaces of the second electrically conductive layers 46B are vertically offset from each other multiples of K times the vertical periodicity.

In one embodiment, each of the memory stack structures 55 comprises a memory film 50 and a vertical semiconductor channel 60 which vertically extends through each layer within the alternating stack (32, 46).

The various embodiments of the present disclosure provide a compact terrace region in the staircase region 300 in which multiple contact via structures can be formed within the area of each step 48. The number of steps 48 can be reduced relative to prior art terrace regions to simplify and reduce the number of steps in the process of forming the staircase region 300. The total area of the staircase region 300 can be reduced to increase the device density in the three-dimensional memory device.

Figure 38:
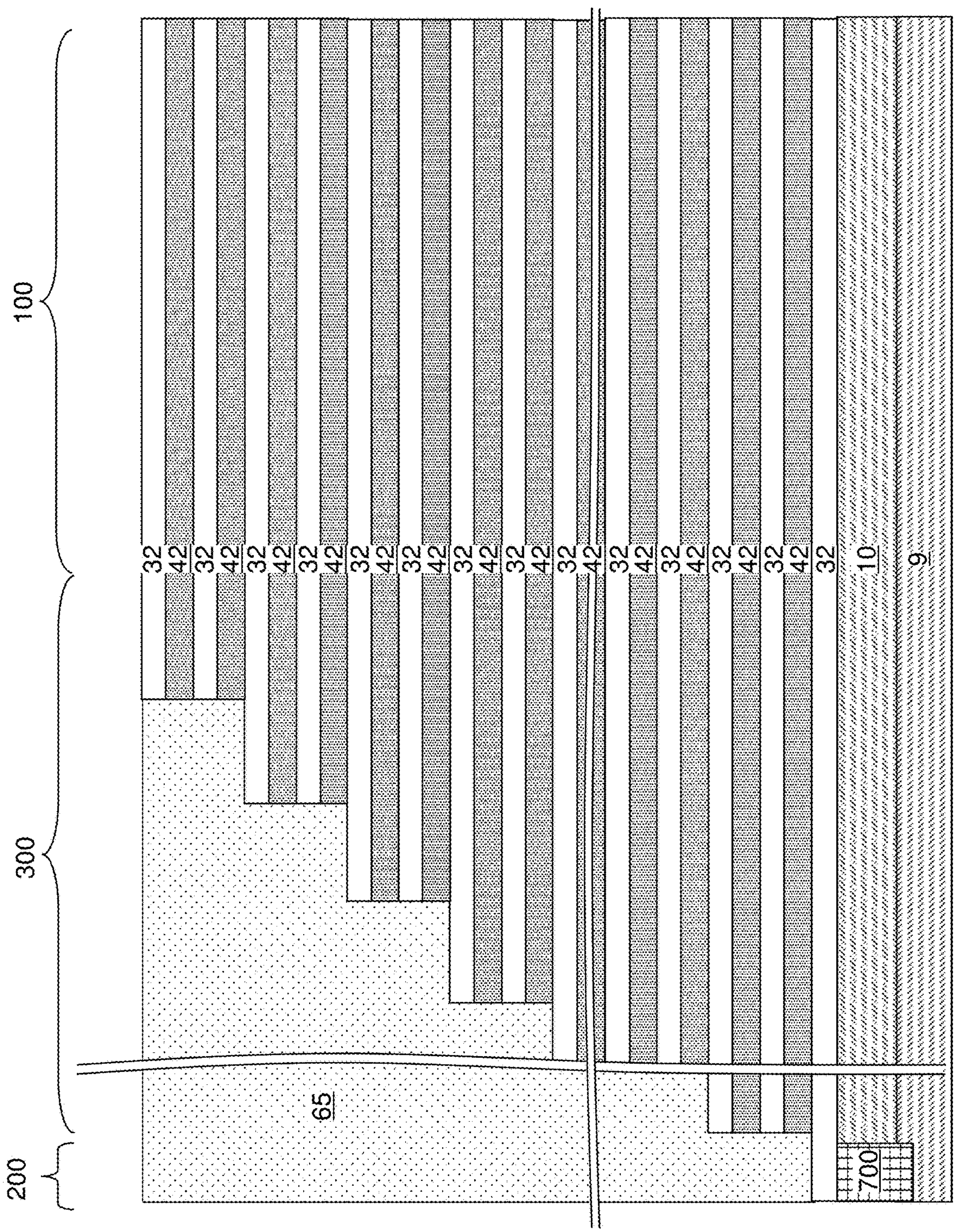
FIG. 38 is a schematic vertical cross-sectional view of a second exemplary structure after formation of stepped terraces and a retro-stepped dielectric material portion according to an embodiment of the present disclosure.

Referring to FIG. 38, a second exemplary structure according to an embodiment of the present disclosure can be derived from the first exemplary structure illustrated in FIG. 2 by modifying the pattern of the stepped surfaces that are formed on the alternating stack (32, 42). Specifically, the stepped surfaces can be formed to include vertical steps in which the height of one, a plurality and/or each of the vertical steps equals Q times the sum of the thickness of an insulating layer 32 and the thickness of a sacrificial material layer 42. Q is an integer greater than 1, i.e., an integer that can be selected from 2, 3, 4, 5, 6, etc. For example, Q=2 in the embodiment shown in FIG. 38. Thus, one, a plurality and/or each of the vertical steps of the stepped surfaces may comprise a respective set of vertically coincident sidewalls of Q insulating layers 32 and Q sacrificial material layers 42. In one embodiment, each of the vertical steps of the stepped surfaces may comprise a respective set of vertically coincident sidewalls of Q insulating layers 32 and Q sacrificial material layers 42. In one embodiment, a predominant fraction (i.e., more than 50%) of the vertical steps of the stepped surfaces may comprise a respective set of vertically coincident sidewalls of two insulating layers 32 and two sacrificial material layers 42.

In one embodiment, the alternating stack (32, 42) has a vertical periodicity that is the same as a vertical separation distance between top surfaces of a vertically neighboring pair of insulating layers within the alternating stack (32, 42). In one embodiment, a neighboring pair of horizontal bottom surface segments that is adjoined to each other by a vertical surface segment is vertically spaced apart from each other by Q times the vertical periodicity, wherein Q is an integer in a range from 2 to 16. While the integer Q is 2 in the illustrated example of FIG. 38, embodiments are expressly contemplated herein in which Q is an integer greater than 2.

Generally, the stepped surfaces of the alternating stack (32, 42) in the second exemplary structure include a plurality of horizontal surfaces that are laterally spaced apart along the first horizontal direction (e.g., word line direction) hd1, laterally extend along the second horizontal direction (e.g., bit line direction) hd2 that is perpendicular to the first horizontal direction hd1, and are interlaced with the plurality of vertical surfaces. Each of the horizontal surfaces within the stepped surfaces may have two parallel edges that laterally extend along the second horizontal direction hd2 and are laterally spaced apart from each other by a uniform spacing therebetween.

In the embodiment illustrated in FIG. 38, the horizontal surfaces of the stepped surfaces comprise top surfaces of the respective insulating layers 32. However, in an alternative embodiment, the horizontal surfaces of the stepped surfaces comprise top surfaces of the respective sacrificial material layers 42. Thus, the top surfaces of the sacrificial material layers 42 may be exposed at each stepped surface.

Each vertical surface within the plurality of vertical surfaces of the stepped surfaces laterally extends straight along the second horizontal direction hd2 between the first backside trench fill structure (74, 76) and the second backside trench fill structure (74, 76). In one embodiment, the stepped surfaces continuously extend from a bottommost layer within the alternating stack (32, 42) to a topmost layer within the alternating stack (32, 42). The stepped surfaces comprise a plurality of horizontal surfaces that are interlaced with and adjoined to the plurality of vertical surfaces. Each horizontal surface within the plurality of horizontal surfaces of the stepped surfaces has a respective uniform width along the first horizontal direction hd1 and laterally extends along the second horizontal direction hd2 between the first backside trench fill structure (74, 76) and the second backside trench fill structure (74, 76).

In one embodiment, the retro-stepped dielectric material portion 65 comprises a contiguous set of surfaces that includes horizontal bottom surface segments and vertical surface segments. In one embodiment, the horizontal bottom surface segments are vertically spaced apart from each other and are laterally spaced apart from each other. In one embodiment, each of the horizontal bottom surface segments other than a bottommost one of the horizontal bottom surface segments is adjoined to a respective pair of vertical surfaces segments of the vertical surface segments of the retro-stepped dielectric material portion 65.

In one embodiment, the alternating stack (32, 42) has a vertical periodicity that is the same as a vertical separation distance between top surfaces of a vertically neighboring pair of insulating layers within the alternating stack (32, 42). In one embodiment, a neighboring pair of horizontal bottom surface segments that is adjoined to each other by a vertical surface segment is vertically spaced apart from each other by Q times the vertical periodicity, wherein Q is an integer in a range from 2 to 16.

Figure 39A:
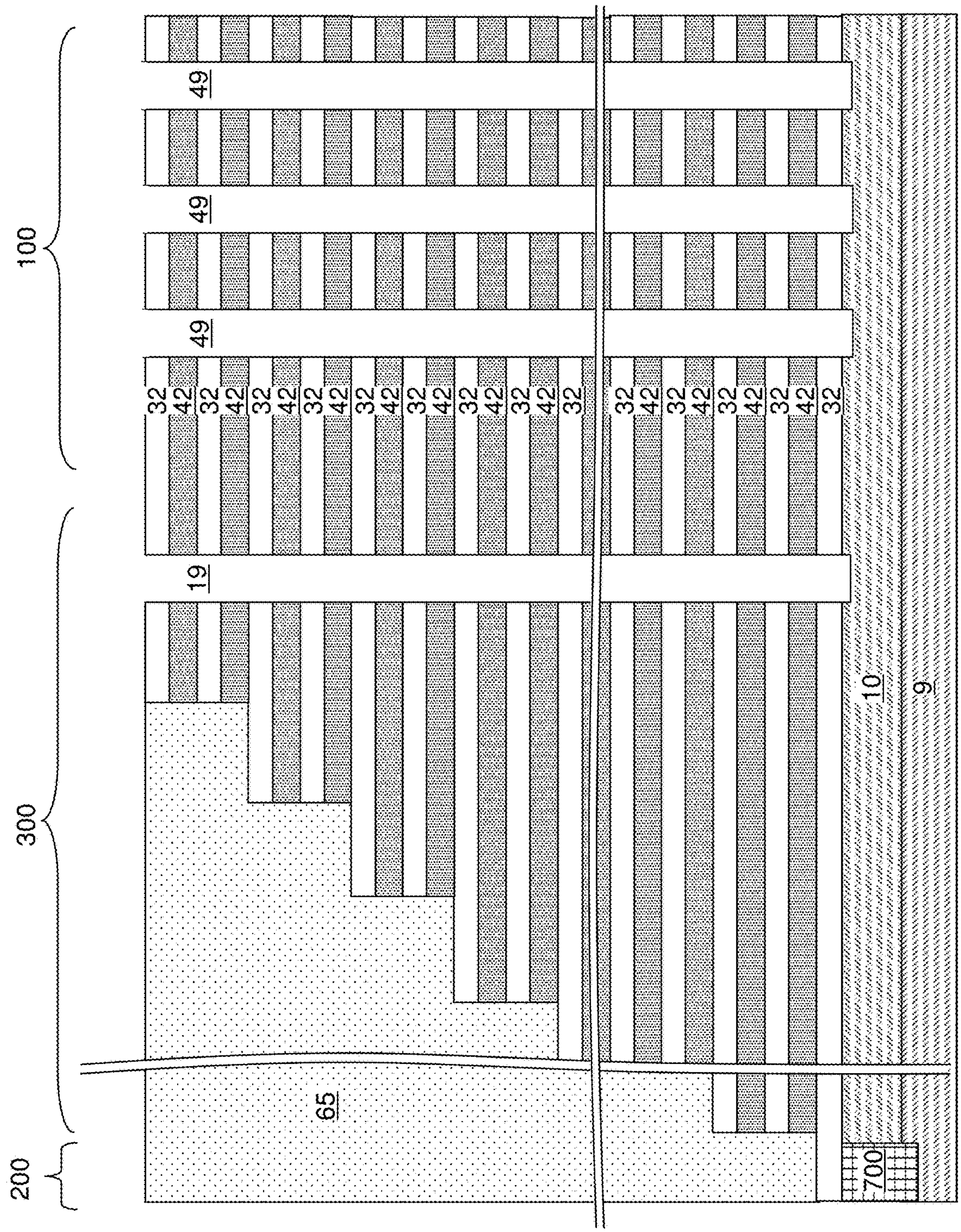
FIG. 39A is a schematic vertical cross-sectional view of the second exemplary structure after formation of memory openings and support openings according to an embodiment of the present disclosure.
Figure 39B:
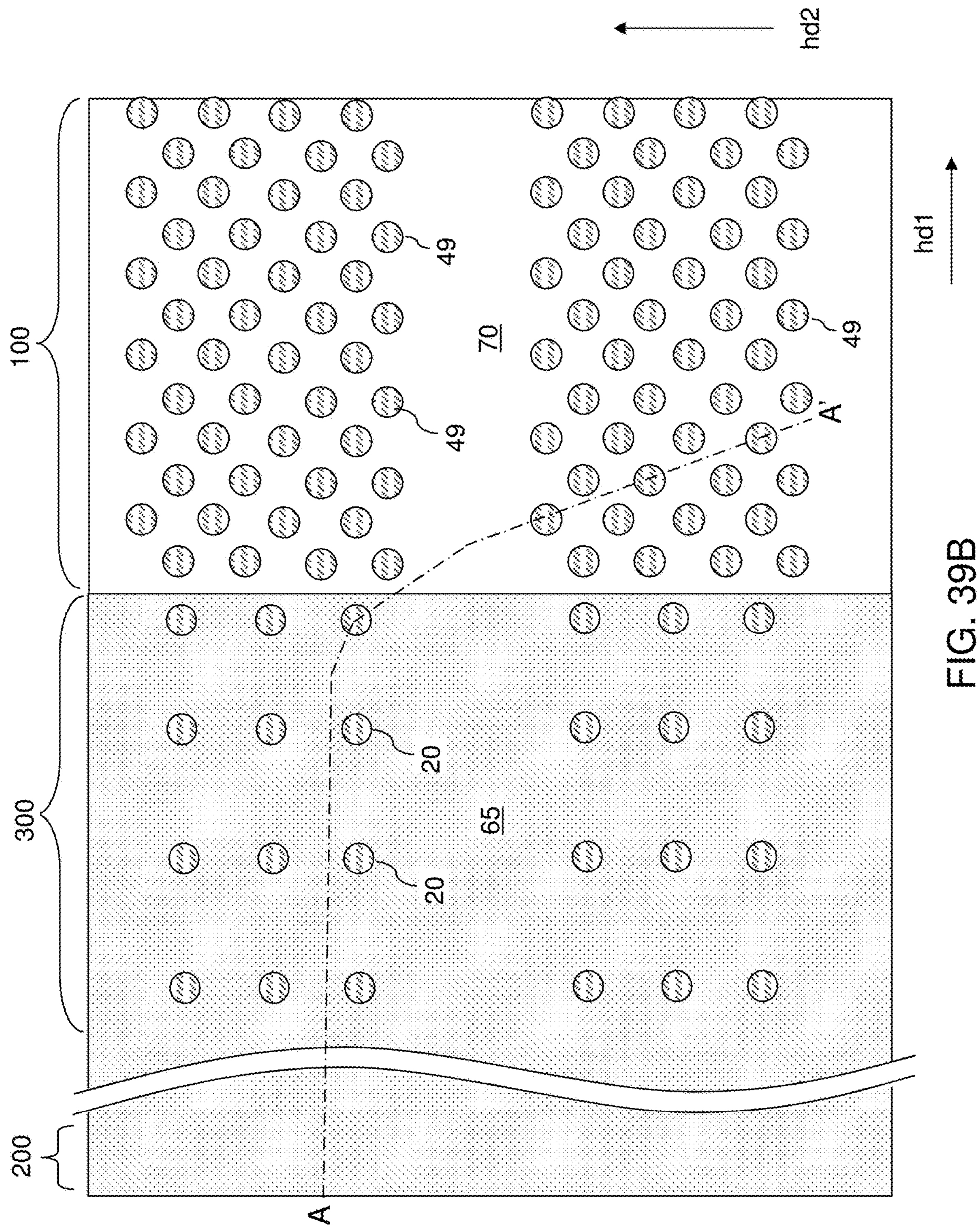
FIG. 39B is a top-down view of the second exemplary structure of FIG. 39A. The vertical plane A-A' is the plane of the cross-section for FIG. 39A.

Referring to FIGS. 39A and 39B, the processing steps of FIGS. 4A and 4B can be performed to form memory openings 49 and support openings 19.

Figure 40:
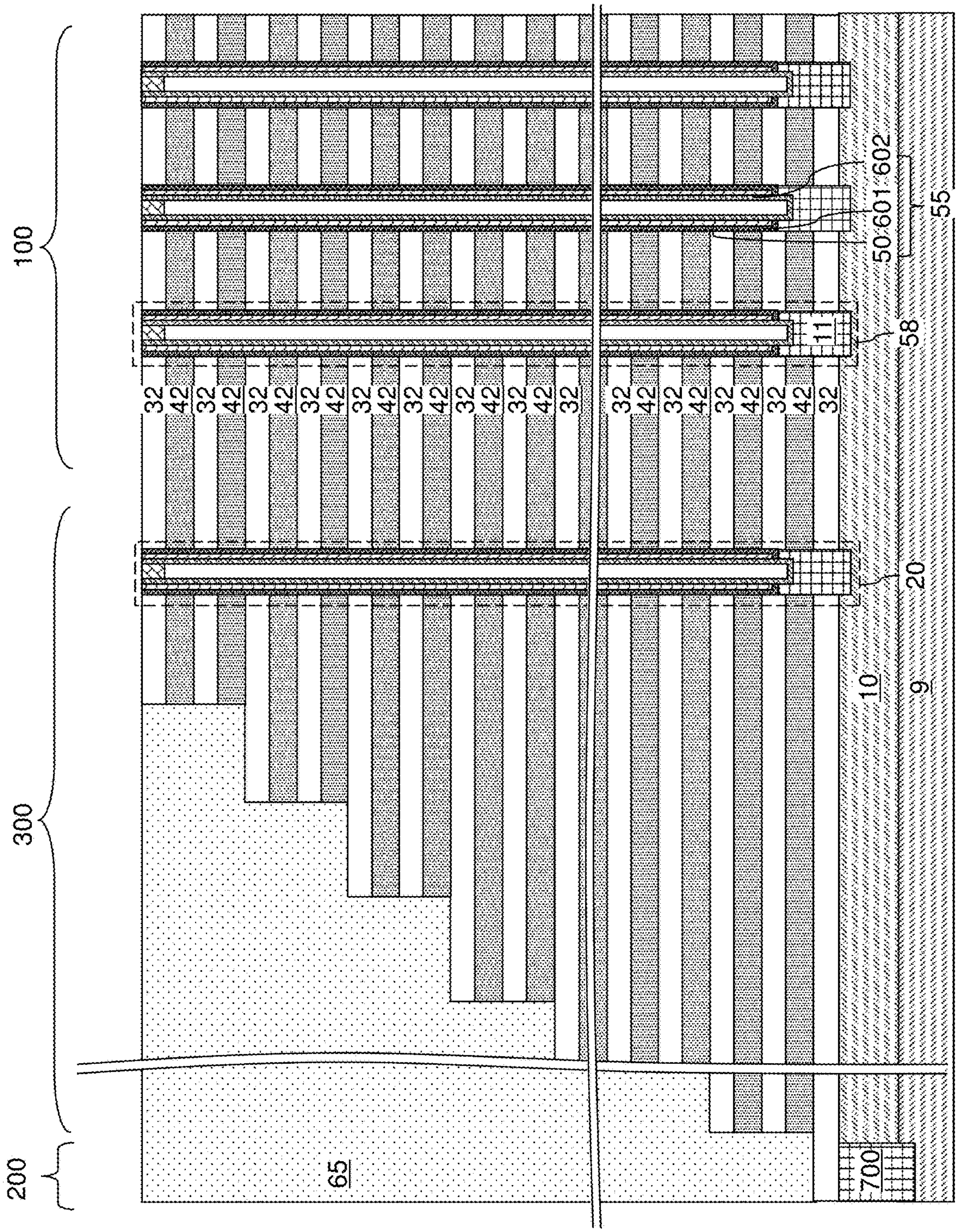
FIG. 40 is a schematic vertical cross-sectional view of the second exemplary structure after formation of memory stack structures and support pillar structures according to an embodiment of the present disclosure.

Referring to FIG. 40, the processing steps of FIGS. 5A-5H can be performed to form a memory opening fill structure 58 within each memory opening 49, and to form a support pillar structure 20 within each support openings 19.

Figure 41A:
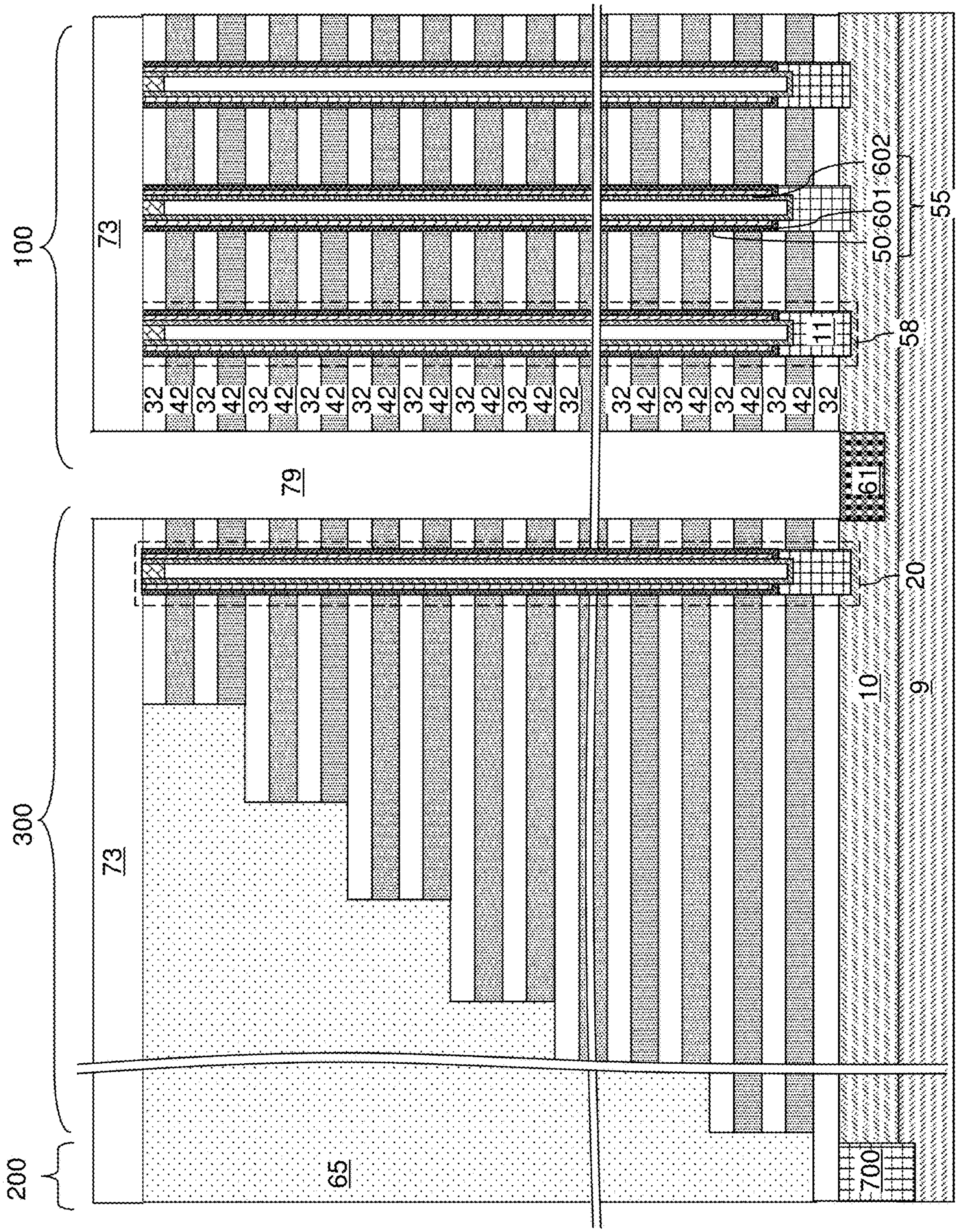
FIG. 41A is a schematic vertical cross-sectional view of the second exemplary structure after formation of backside trenches according to an embodiment of the present disclosure.
Figure 41B:
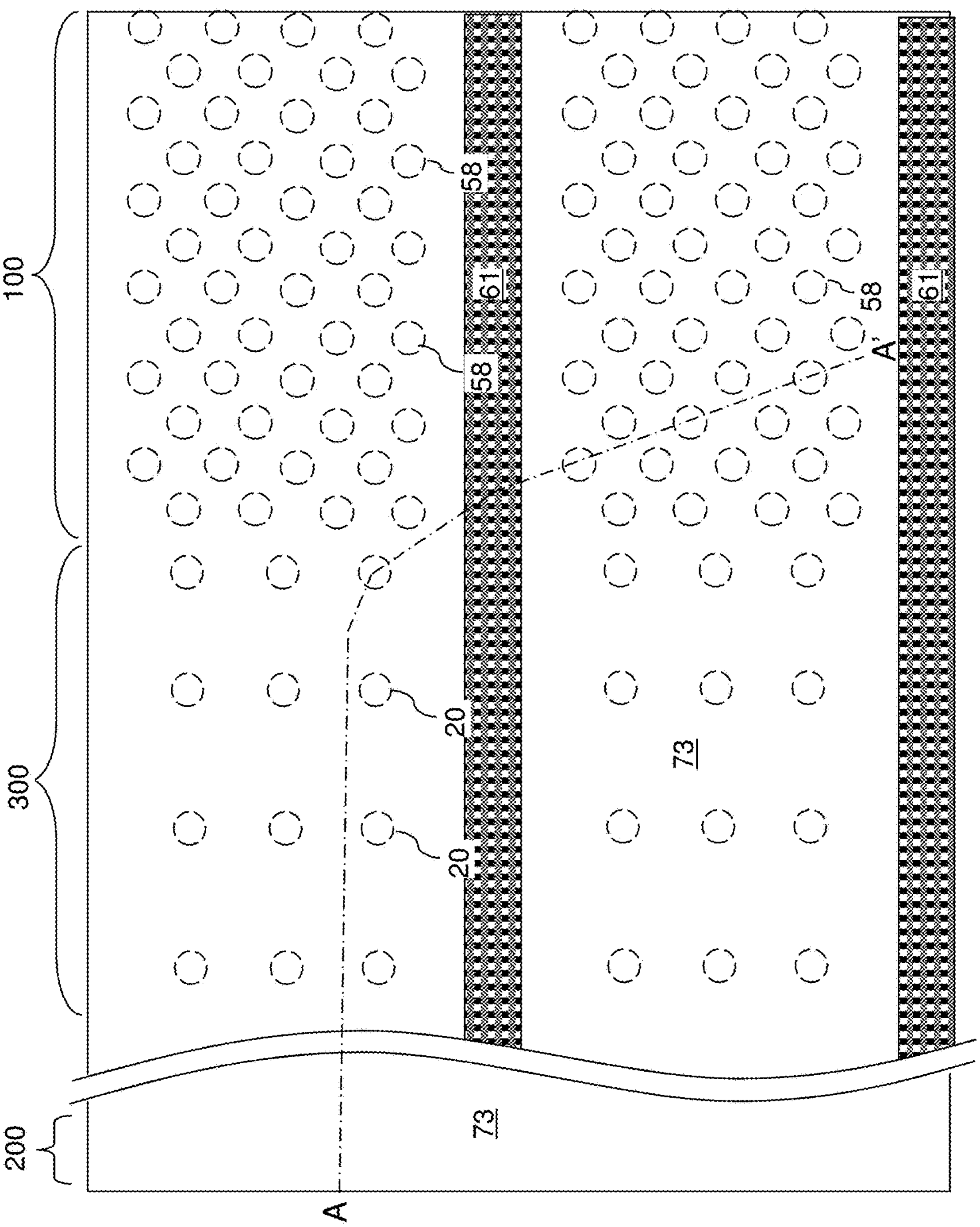
FIG. 41B is a partial see-through top-down view of the second exemplary structure of FIG. 41A. The vertical plane A-A' is the plane of the schematic vertical cross-sectional view of FIG. 41A.

Referring to FIGS. 41A and 41B, the processing steps of FIGS. 7A and 7B can be performed to form a contact-level dielectric layer 73, backside trenches 79, and source regions 61.

Figure 42:
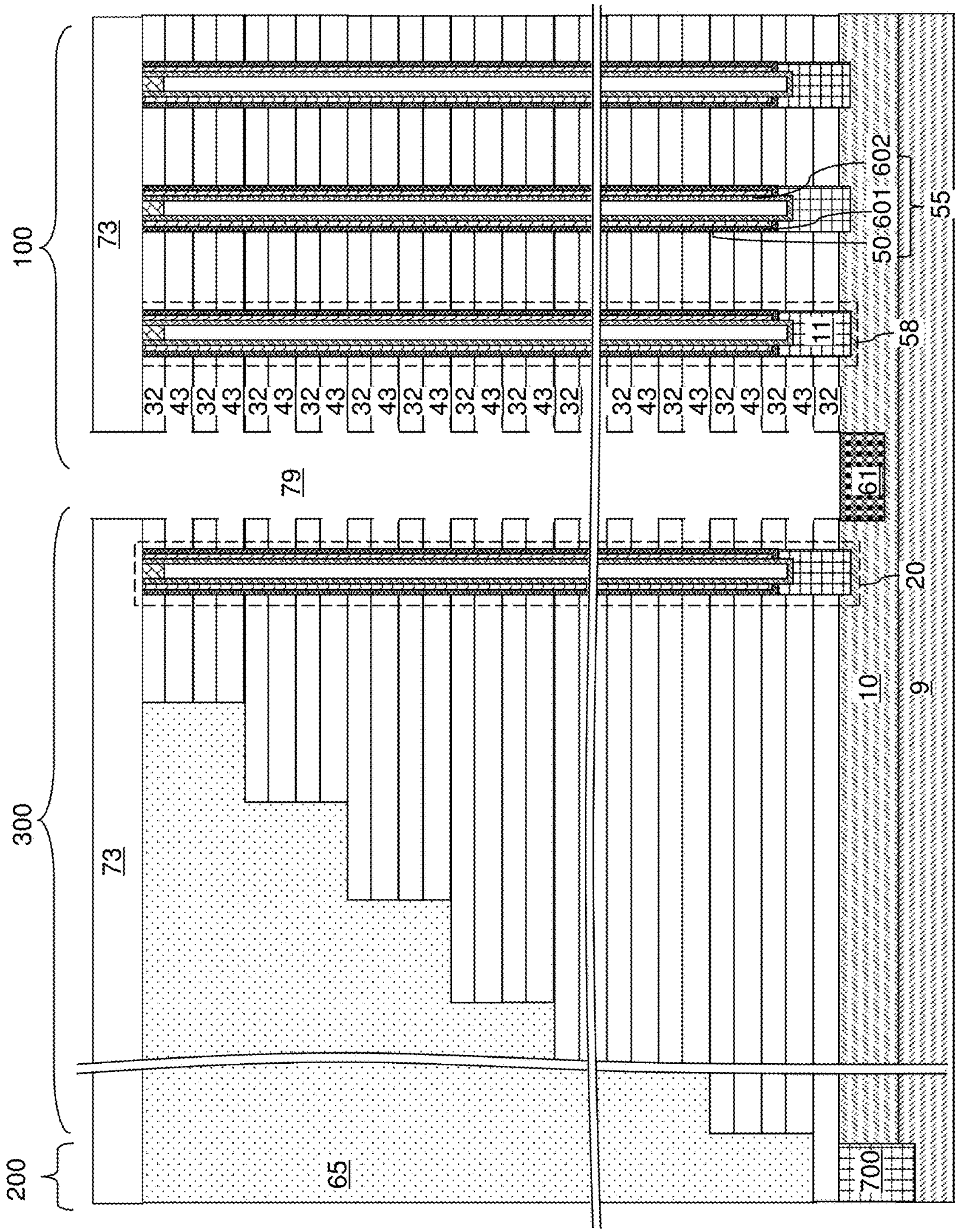
FIG. 42 is a schematic vertical cross-sectional view of the second exemplary structure after formation of backside recesses according to an embodiment of the present disclosure.

Referring to FIG. 42, the processing steps of FIGS. 8 and 9A can be performed to form backside recesses 43 by removing the sacrificial material layers 42 selective to the insulating layers 32, the memory opening fill structures 58, and the support pillar structures 20.

Figure 43:
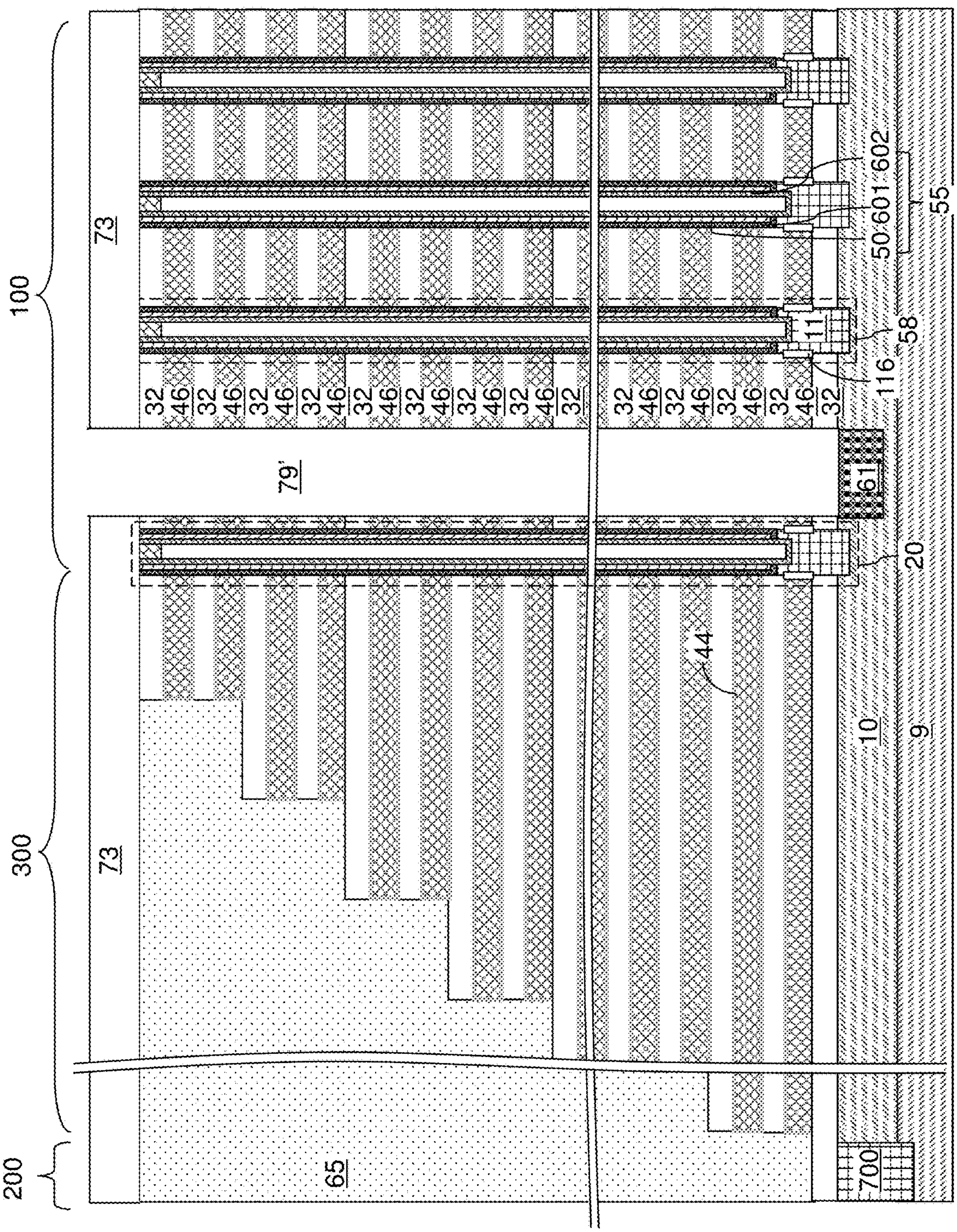
FIG. 43 is a schematic vertical cross-sectional view of the second exemplary structure after formation of electrically conductive layers according to an embodiment of the present disclosure.

Referring to FIG. 43, the processing steps of FIGS. 9B, 9C, 9D, and 10 can be performed to form optional backside blocking dielectric layers 44 and the electrically conductive layers 46 within the backside recesses 43.

Figure 44:
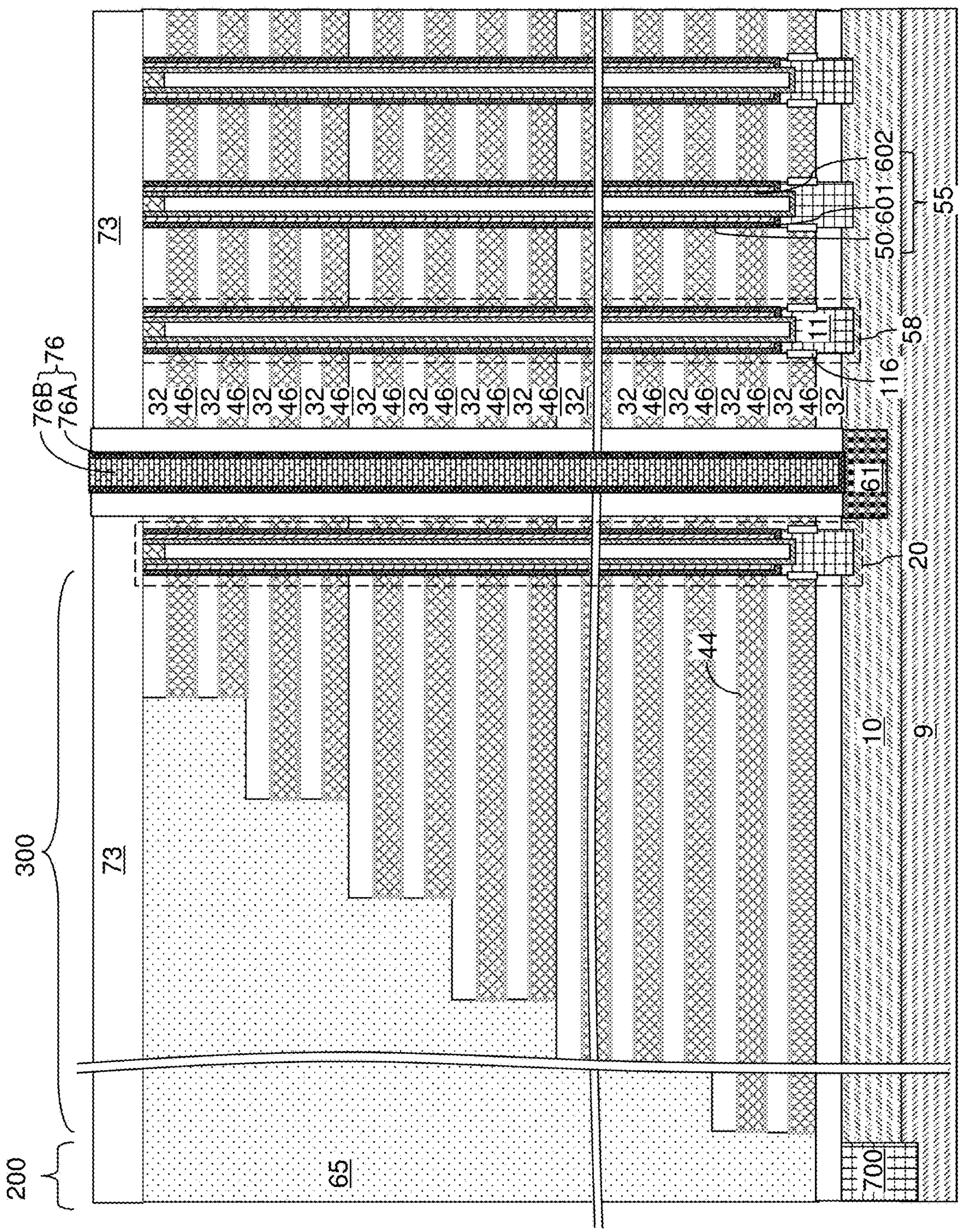
FIG. 44 is a schematic vertical cross-sectional view of the second exemplary structure after formation of an insulating spacer and a backside contact structure in each backside trench according to an embodiment of the present disclosure.

Referring to FIG. 44, the processing steps of FIG. 11 can be performed to form a backside trench fill structure (74, 76) within each backside trench 79. Each backside trench fill structure (74, 76) comprises an insulating spacer 74 and an optional backside contact via structure 76.

Generally, a combination of an alternating stack (32, 46) of insulating layers and electrically conductive layers 46, memory stack structures 55, and a retro-stepped dielectric material portion 65 can be formed over a substrate (9, 10). The memory stack structures 55 vertically extend through the alternating stack (32, 46). The alternating stack (32, 46) comprises stepped surfaces that continuously extend from a bottommost layer of the alternating stack (32, 46) to a topmost layer of the alternating stack (32, 46). The retro-stepped dielectric material portion 65 overlies the stepped surfaces of the alternating stack (32, 46).

In the embodiment illustrated in FIG. 44, the horizontal surfaces of the stepped surfaces comprise top surfaces of the respective insulating layers 32. However, in an alternative embodiment which will be described with reference to FIG. 59 below, the horizontal surfaces of the stepped surfaces comprise top surfaces of the respective electrically conductive layers 46. Thus, the top surfaces of the electrically conductive layers 46 may be exposed at each stepped surface.

In one embodiment, a first backside trench fill structure (74, 76) and a second backside trench fill structure (74, 76) can be located directly on a respective sidewall of the alternating stack (32, 46). The first backside trench fill structure (74, 76) laterally extends along the first horizontal direction hd1 and contacts first sidewalls of each layer within the alternating stack (32, 46). The second backside trench fill structure (74, 76) laterally extends along the first horizontal direction hd1 and contacts second sidewalls of each layer within the alternating stack (32, 46). A set of stepped surfaces of the alternating stack (32, 46) can be provided between the first backside trench fill structure (74, 76) and the second backside trench fill structure (74, 76). The set of stepped surfaces comprise a plurality of horizontal surfaces and a plurality of vertical surfaces. Each vertical surface within the plurality of vertical surfaces of the stepped surfaces laterally extends straight along the second horizontal direction hd2 between the first backside trench fill structure (74, 76) and the second backside trench fill structure (74, 76).

In one embodiment, the stepped surfaces continuously extend from a bottommost layer within the alternating stack (32, 46) to a topmost layer within the alternating stack (32, 42). The stepped surfaces comprise a plurality of horizontal surfaces that is interlaced with, and adjoined to, the plurality of vertical surfaces. Each horizontal surface within the plurality of horizontal surfaces of the stepped surfaces has a respective uniform width along the first horizontal direction hd1 and laterally extends along the second horizontal direction hd2 between the first backside trench fill structure (74, 76) and the second backside trench fill structure (74, 76).

In one embodiment, the stepped surfaces continuously extend from a bottommost layer within the alternating stack (32, 46) to a topmost layer within the alternating stack (32, 46). In one embodiment, the stepped surfaces comprise a plurality of horizontal surfaces that is interlaced with and adjoined to the plurality of vertical surfaces. In one embodiment, each horizontal surface within the plurality of horizontal surfaces of the stepped surfaces has a respective uniform width along the first horizontal direction hd1 and laterally extends along the second horizontal direction hd2 between the first backside trench fill structure (74, 76) and the second backside trench fill structure (74, 76).

In one embodiment, the retro-stepped dielectric material portion 65 comprises a contiguous set of surfaces that includes horizontal bottom surface segments and vertical surface segments. In one embodiment, the horizontal bottom surface segments are vertically spaced apart from each other and are laterally spaced apart from each other. In one embodiment, each of the horizontal bottom surface segments other than a bottommost one of the horizontal bottom surface segments is adjoined to a respective pair of vertical surfaces segments of the vertical surface segments of the retro-stepped dielectric material portion 65.

In one embodiment, the alternating stack (32, 46) has a vertical periodicity that is the same as a vertical separation distance between top surfaces of a vertically neighboring pair of insulating layers within the alternating stack (32, 46). In one embodiment, a neighboring pair of horizontal bottom surface segments that is adjoined to each other by a vertical surface segment is vertically spaced apart from each other by Q times the vertical periodicity, wherein Q is an integer in a range from 2 to 16.

Figure 45A:
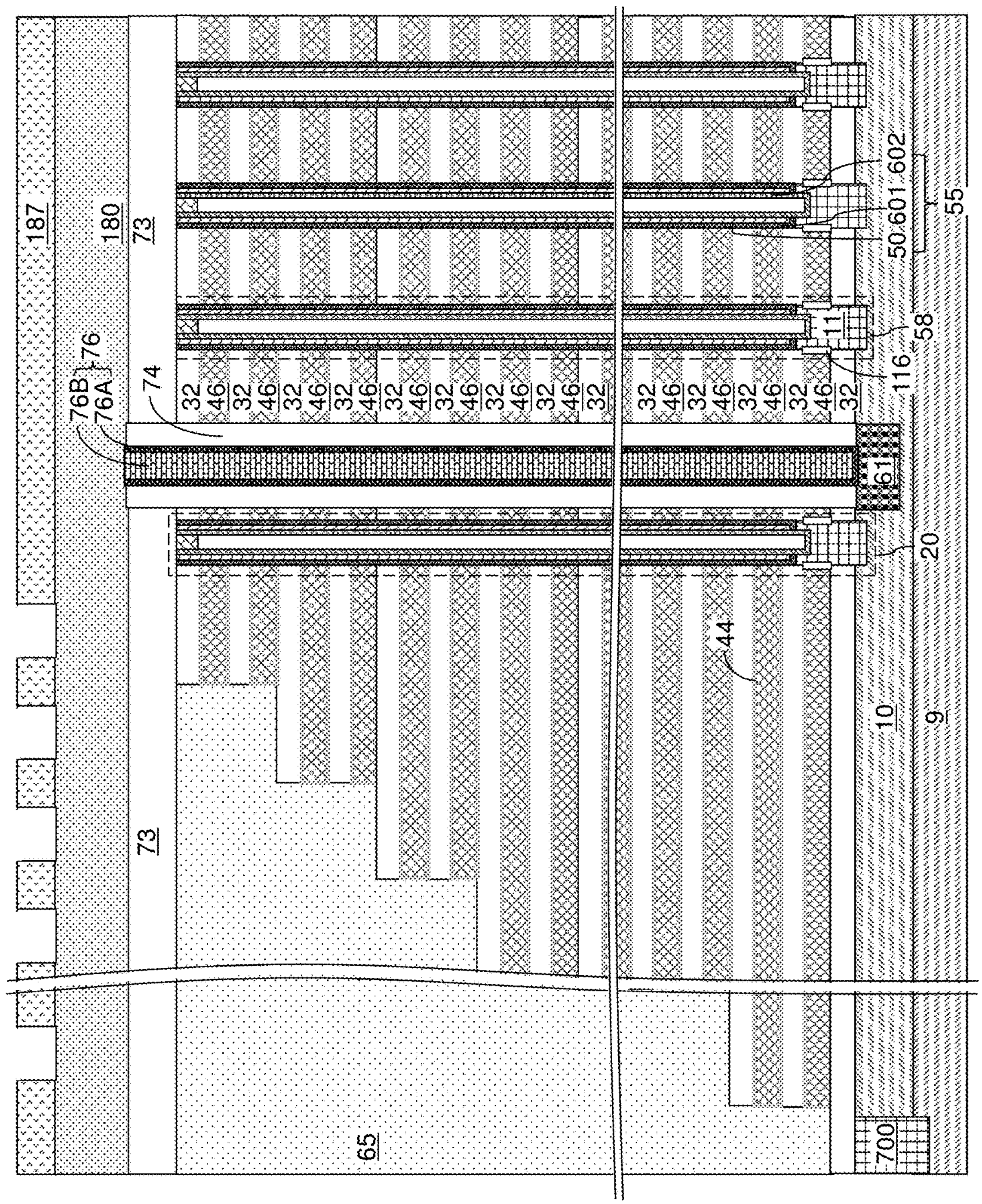
FIG. 45A is a schematic vertical cross-sectional view of the second exemplary structure after formation of a hard mask layer and a first photoresist layer according to an embodiment of the present disclosure.
Figure 45B:
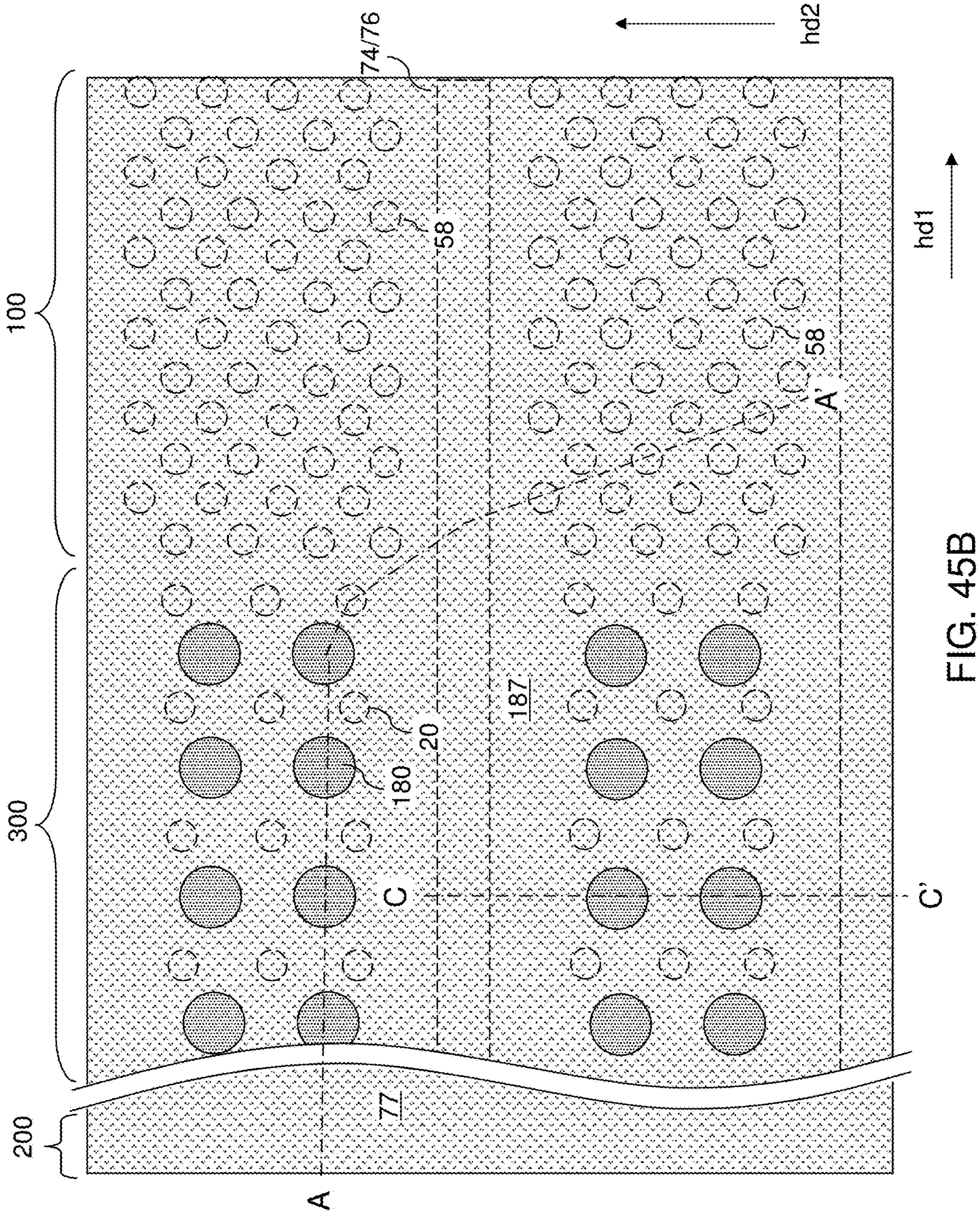
FIG. 45B is a top-down view of the second exemplary structure of FIG. 45A. The vertical plane A-A' is the plane of the schematic vertical cross-sectional view of FIG. 45A.
Figure 45C:
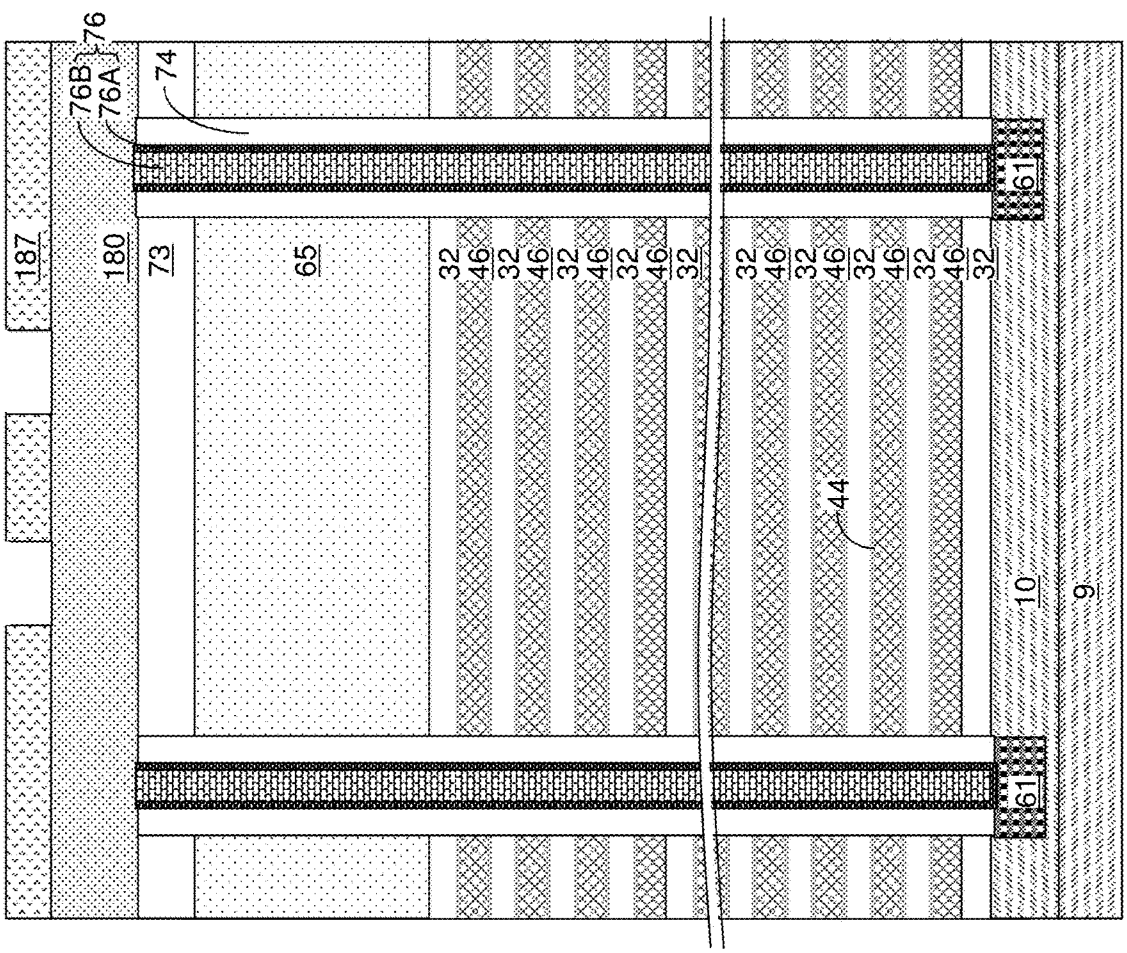
FIG. 45C is a vertical cross-sectional view of the second exemplary structure along the vertical plane C-C' of FIG. 45B.

Referring to FIGS. 45A-45C, a hard mask layer 180 can be formed over the contact-level dielectric layer 73. The hard mask layer 180 comprises a dielectric material or a metallic material that can be removed selective to the material of the contact-level dielectric layer 73. In an illustrative example, the hard mask layer 180 comprises silicon nitride, silicon oxynitride, or silicon carbide nitride. The thickness of the hard mask layer 180 may be in a range from 30 nm to 600 nm, such as from 60 nm to 300 nm, although lesser and greater thicknesses may also be employed.

A first photoresist layer 187 can be applied over the hard mask layer 180, and can be lithographically patterned to form an array of openings between each neighboring pair of backside trench fill structures (74, 76). In one embodiment, Q rows of openings can be formed in the first photoresist layer 187 between each neighboring pair of backside trench fill structures (74, 76). Q is the integer that represents the number of insulating layers 32 or the number of electrically conductive layers 46 within each step. Generally, one, a plurality and/or each of the vertical steps of the stepped bottom surfaces of the retro-stepped dielectric material portion 65 may contact a respective set of vertically coincident sidewalls of Q insulating layers 32 and Q electrically conductive layers 46, or a respective set of vertically coincident sidewalls of Q insulating layers 32 and Q backside blocking dielectric layers 44.

In one embodiment, each row of openings in the first photoresist layer 187 may be arranged along the first horizontal direction hd1. In one embodiment, the Q rows of openings in the first photoresist layer 187 may be laterally spaced part from each other along the second horizontal direction hd2, and may be located between a respective neighboring pair of backside trench fill structures (74, 76). In one embodiment, the Q rows of openings in the first photoresist layer 187 may be arranged as a rectangular array. In one embodiment, each row of openings in the first photoresist layer 187 may comprise at least M openings in which M is an integer greater than 2, such as an integer within a range from 2 to 256, such as from 2 to 512. In this case, the Q rows of openings in the first photoresist layer 187 may comprise a Q×M rectangular array of openings.

Figure 46A:
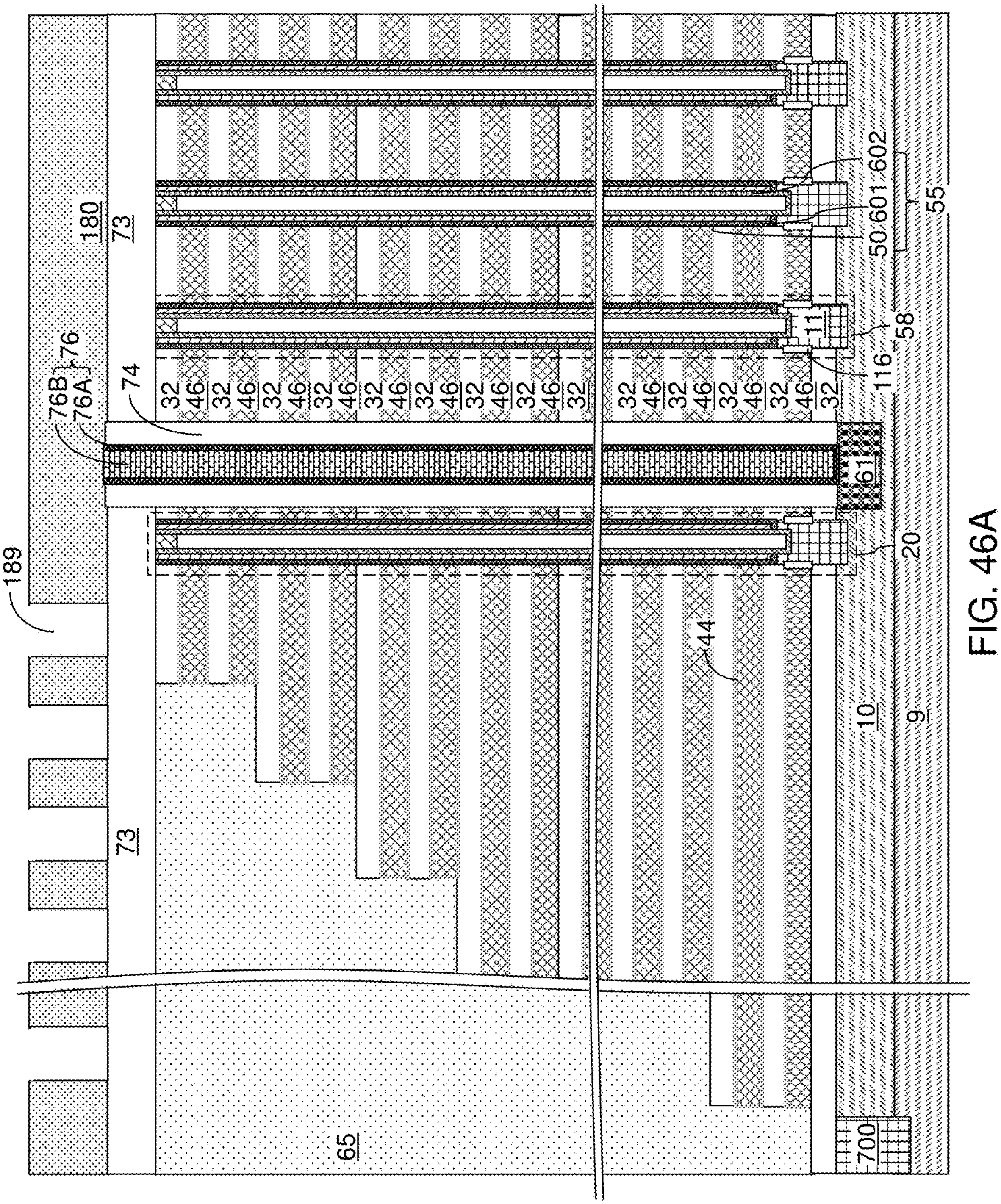
FIG. 46A is a schematic vertical cross-sectional view of the second exemplary structure after patterning the hard mask layer and removing the first photoresist layer according to an embodiment of the present disclosure.
Figure 46B:
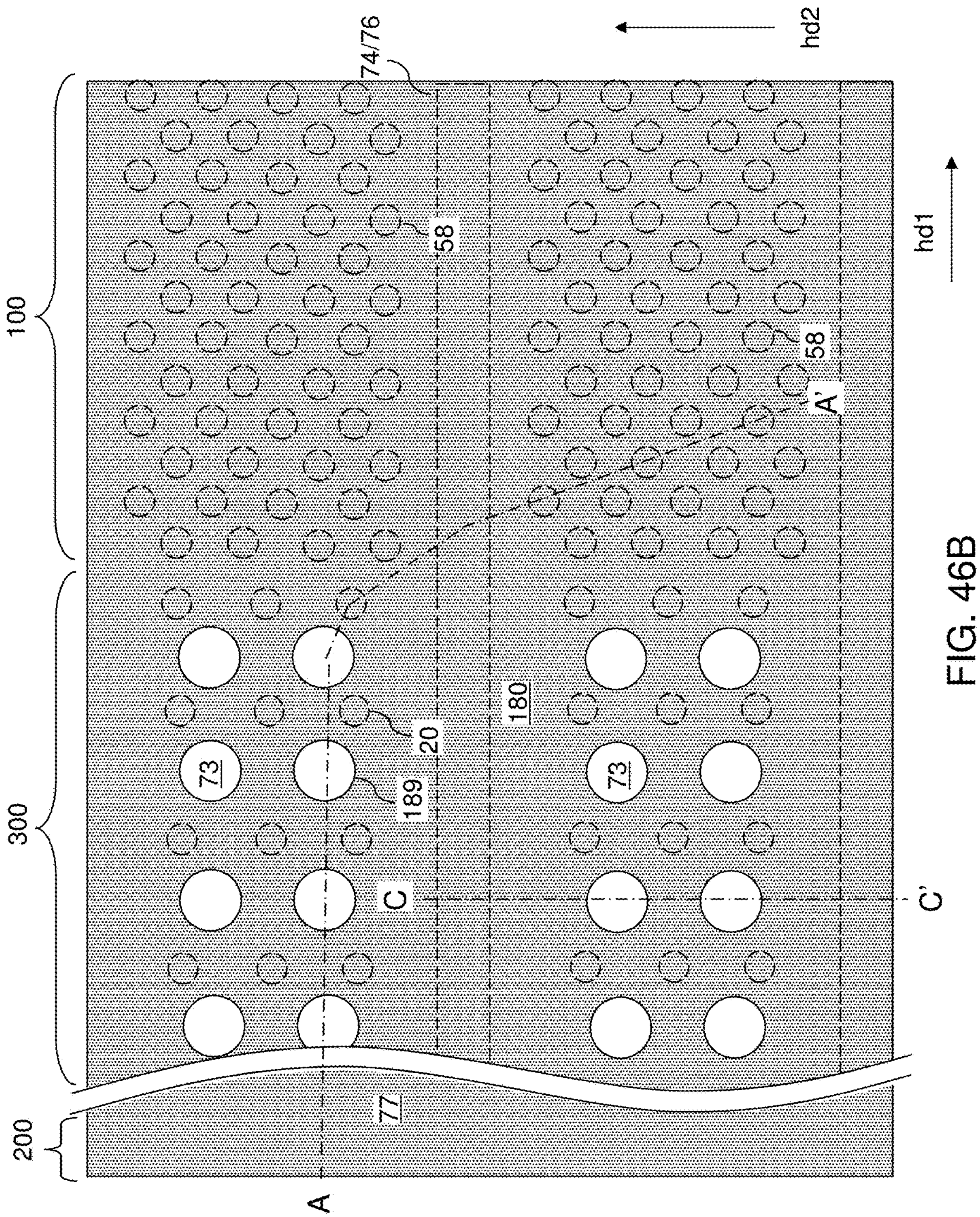
FIG. 46B is a top-down view of the second exemplary structure of FIG. 46A. The vertical plane A-A' is the plane of the schematic vertical cross-sectional view of FIG. 46A.
Figure 46C:
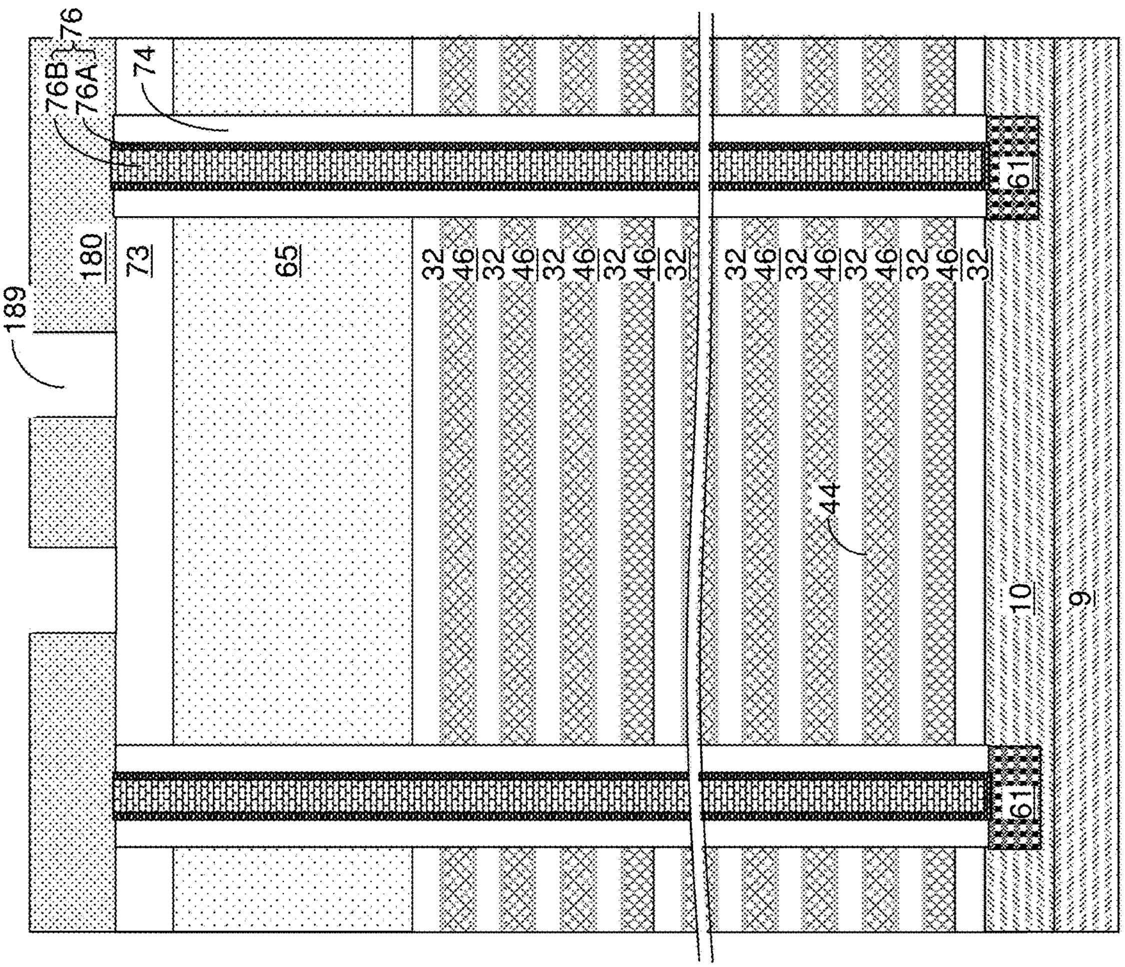
FIG. 46C is a vertical cross-sectional view of the second exemplary structure along the vertical plane C-C' of FIG. 46B.

Referring to FIGS. 46A-46C, an anisotropic etch process can be performed to etch portions of the hard mask layer 180 that are not masked by the first photoresist layer 187. Hard mask openings 189 can be formed underneath the openings in the first photoresist layer 187. The first photoresist layer 187 may be subsequently removed, for example, by ashing. Alternatively, the first photoresist layer 187 may be collaterally etched during a subsequently anisotropic etch process. Generally, an array of hard mask openings 189 can be formed in the hard mask layer 180 within each area between a respective neighboring pair of backside trench fill structures (74, 76) in a plan view.

Figure 47A:
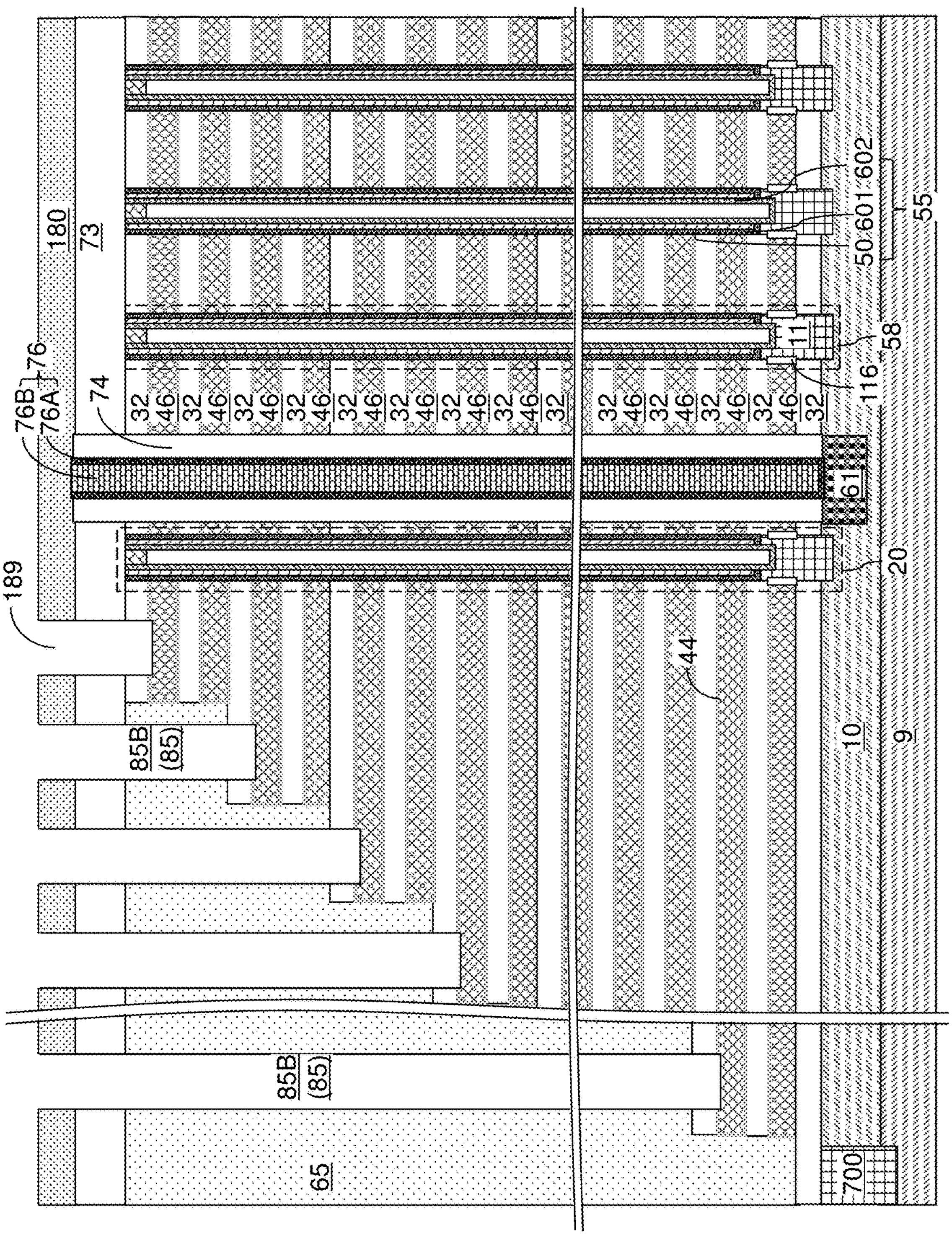
FIG. 47A is a schematic vertical cross-sectional view of the second exemplary structure after formation of via cavities according to an embodiment of the present disclosure.
Figure 47B:
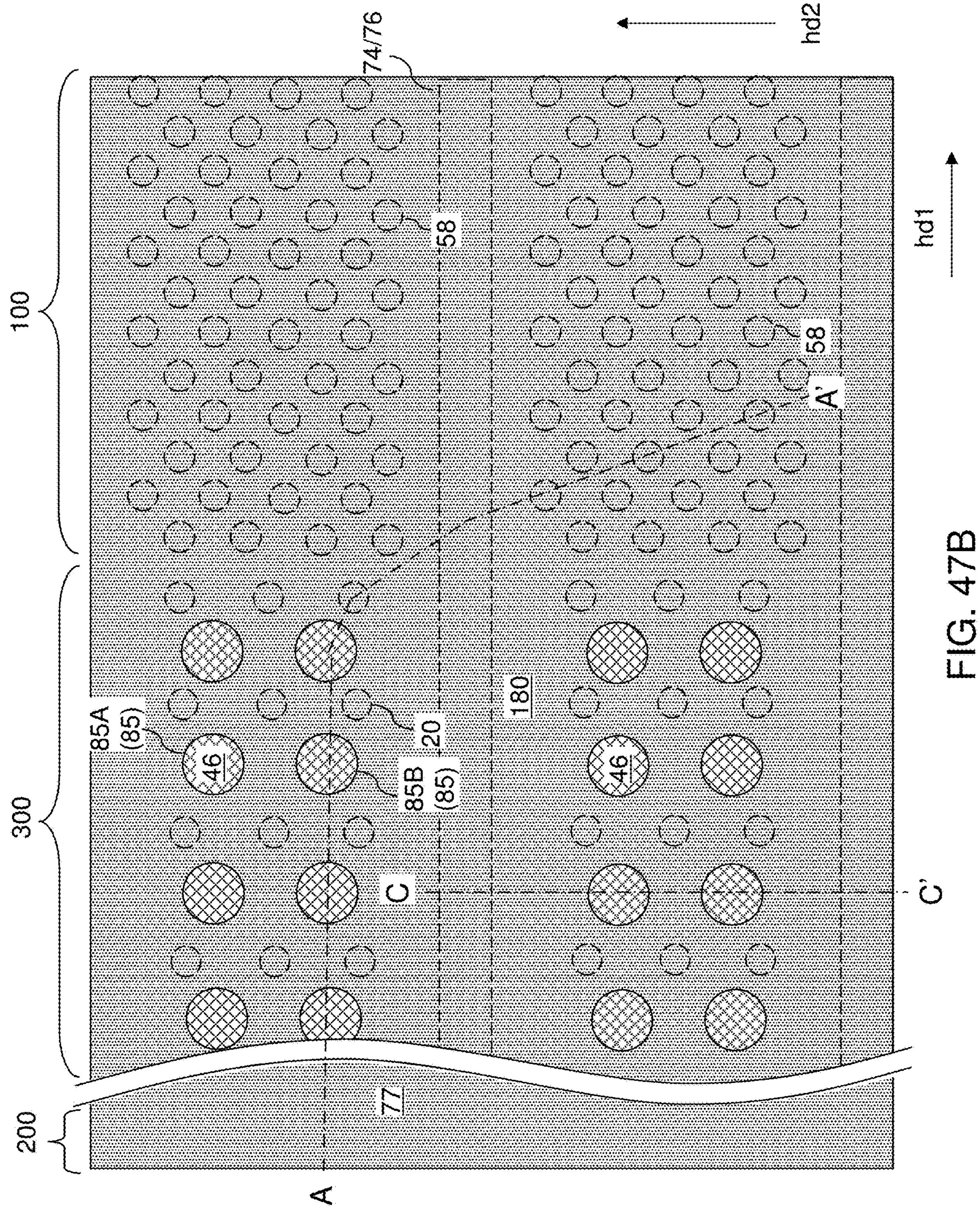
FIG. 47B is a top-down view of the second exemplary structure of FIG. 47A. The vertical plane A-A' is the plane of the schematic vertical cross-sectional view of FIG. 47A.
Figure 47C:
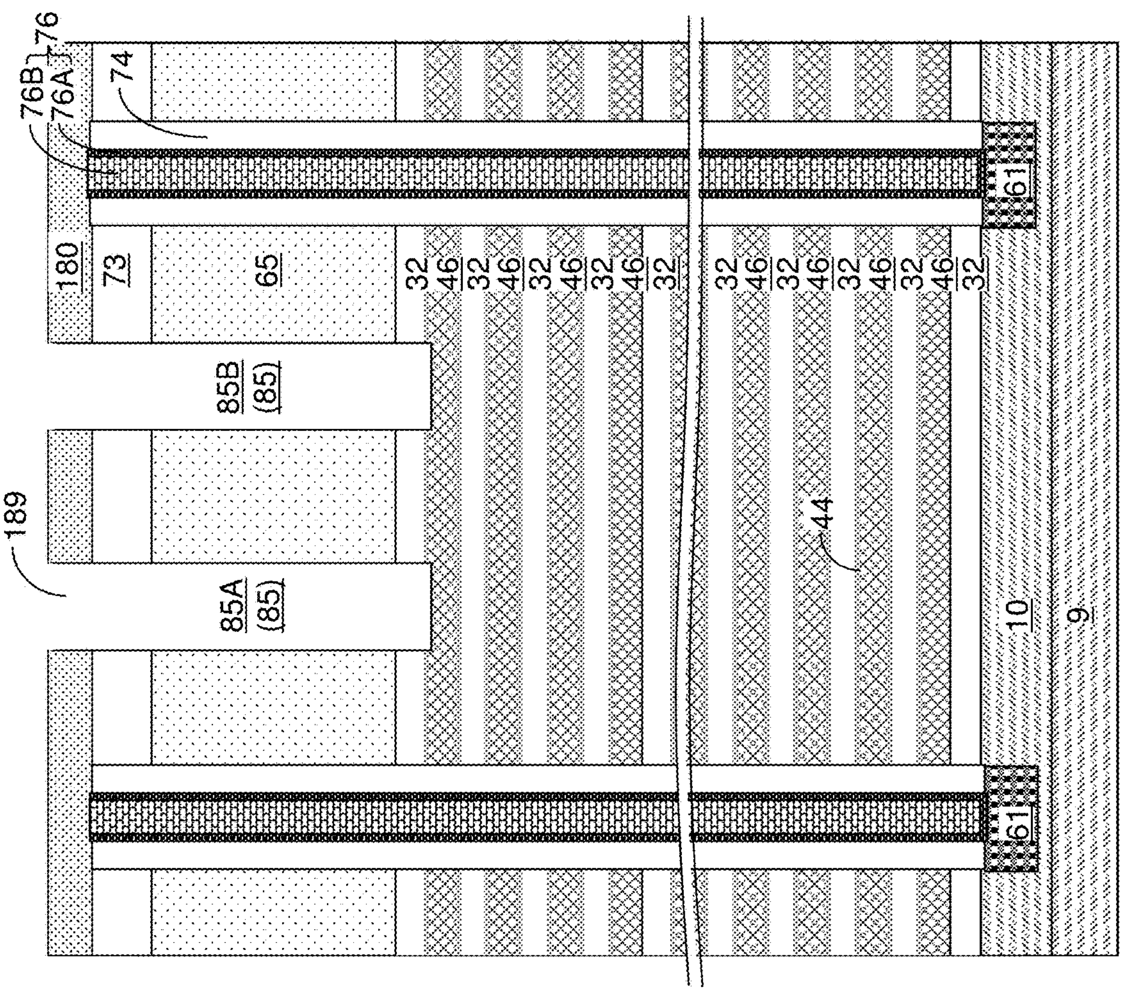
FIG. 47C is a vertical cross-sectional view of the second exemplary structure along the vertical plane C-C' of FIG. 47B.

Referring to FIGS. 47A-47C, an anisotropic etch process can be performed to transfer the pattern of the hard mask openings 189 in the hard mask layer 180 through the contact-level dielectric layer 73, the retro-stepped dielectric material portion 65, and optional through the insulating layers 32 (if they are present on top of each step). The electrically conductive layers 46 can be employed as etch stop structures for the anisotropic etch process. Via cavities 85 are formed underneath the hard mask openings 189 in the hard mask layer 180. Each of the via cavities 85 may comprise a respective straight sidewall that vertically extends from a top surface of the contact-level dielectric layer 73 to a top surface of a respective electrically conductive layer 46. A segment of a top surface of a respective electrically conductive layer 46 can be physically exposed at the bottom of each via cavity 85.

Generally, the anisotropic etch process employs the hard mask layer 180 as an etch mask, and etches the material of the retro-stepped dielectric material portion 65 selective to the material of the electrically conductive layers 46. In one embodiment, K rows of via cavities 85 can be formed between each neighboring pair of backside trench fill structures (74, 76) in a plan view. In one embodiment, K equals to Q. A first row of via cavities 85 of the K rows of via cavities 85 may include first via cavities 85A, a second row of via cavities 85 of the K rows of via cavities 85 may include second via cavities 85B, etc. In one embodiment, the first via cavities 85A may be arranged along a first horizontal direction hd1 in a first row, and the second via cavities 85B may be arranged along the first horizontal direction hd1 in a second row. The second row is laterally offset from the first row along the second horizontal direction hd2. While FIG. 47B illustrates an embodiment in which K is 2, embodiments are expressly contemplated herein in which K is an integer greater than 2.

A subset of the first via cavities 85A and the second via cavities 85B can be formed through the retro-stepped dielectric material portion 65. In one embodiment, each of such first via cavities 85A and such second via cavities 85B vertically extends through the retro-stepped dielectric material portion 65, and has a bottom surface that coincides with a top surface segment of a respective one of the electrically conductive layers 46 in each step.

In one embodiment, for each first horizontal surface selected from the plurality of horizontal surfaces of the set of stepped surfaces of the retro-stepped dielectric material portion 65 that vertically extends from a bottommost layer within the alternating stack (32, 46) to a topmost layer within the alternating stack (32, 46), at least one of the first via cavities 85A vertically extends through the first horizontal surface, and at least one of the second via cavities 85B vertically extends through the first horizontal surface.

Figure 48A:
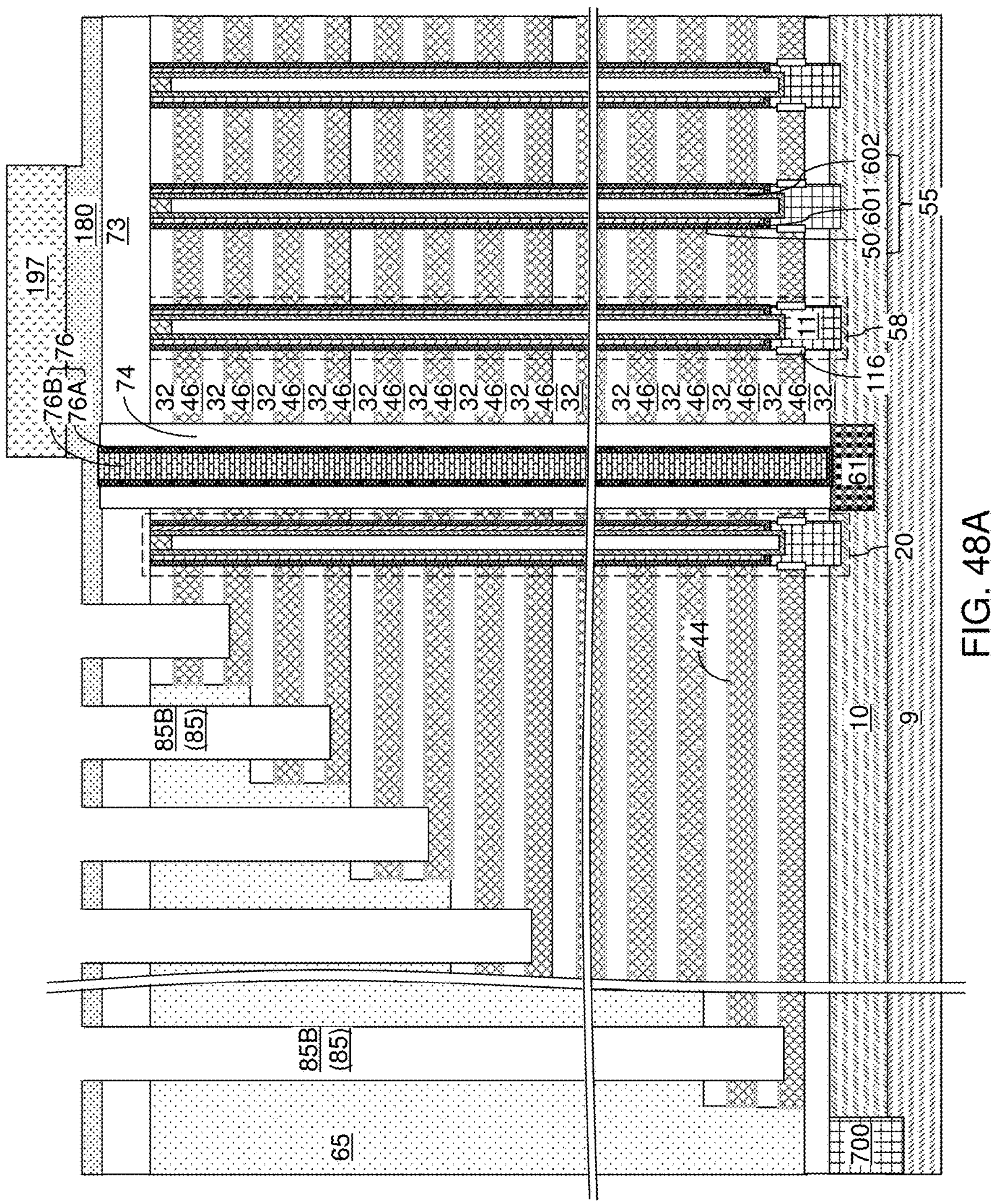
FIG. 48A is a schematic vertical cross-sectional view of the second exemplary structure after formation of a patterned second photoresist layer and an anisotropic etch process that vertically extends an unmasked subset of the via cavities according to an embodiment of the present disclosure.
Figure 48B:
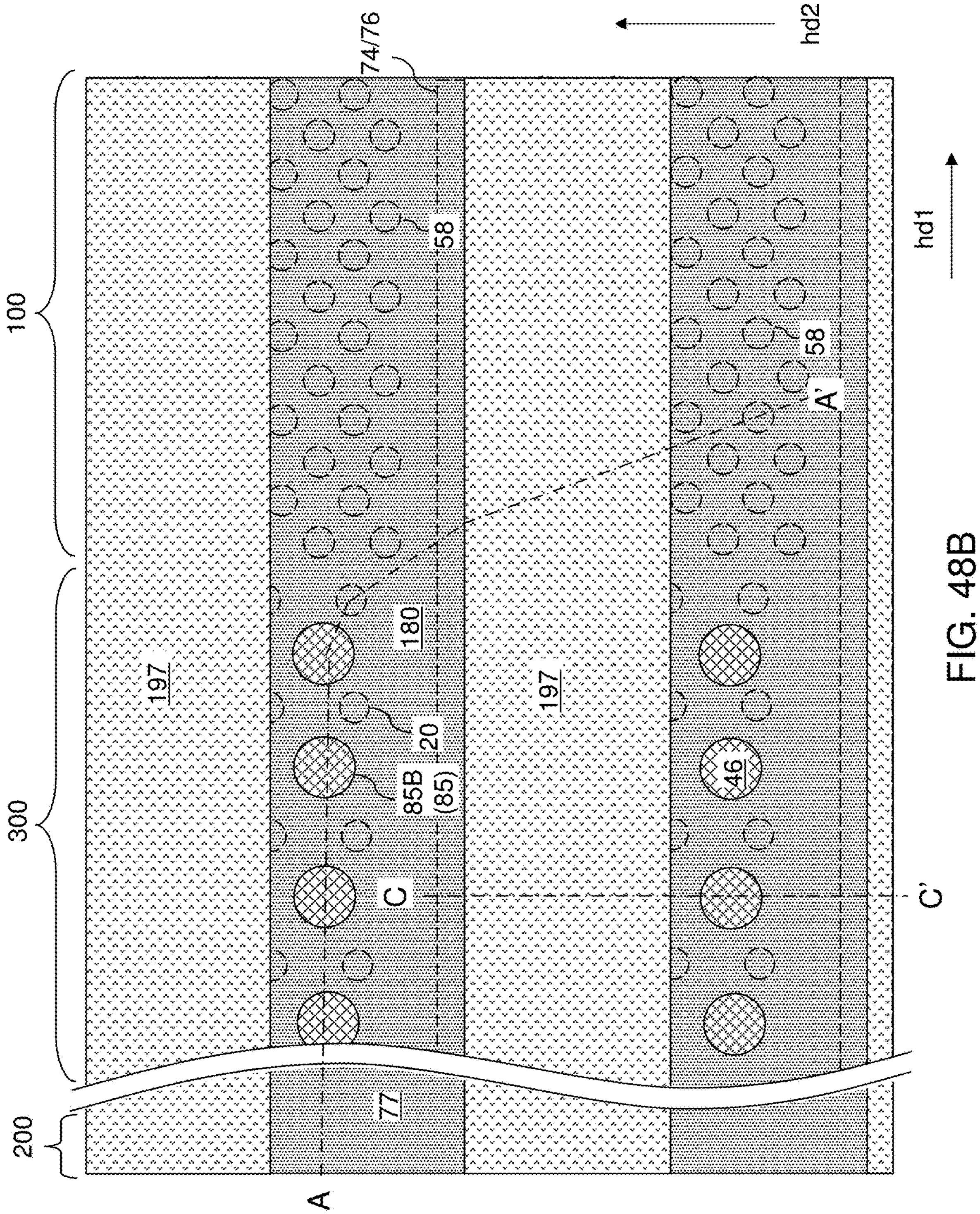
FIG. 48B is a top-down view of the second exemplary structure of FIG. 48A. The vertical plane A-A' is the plane of the schematic vertical cross-sectional view of FIG. 48A.
Figure 48C:
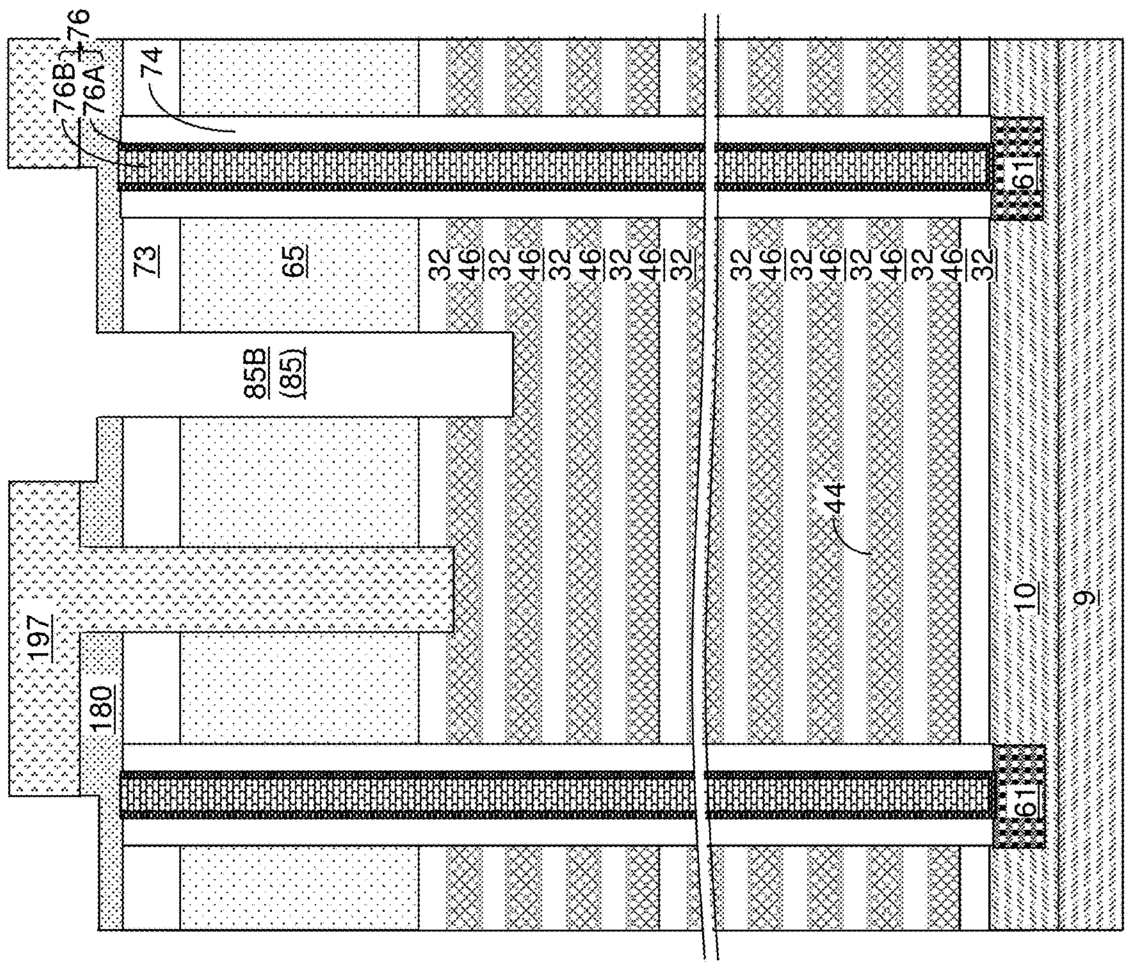
FIG. 48C is a vertical cross-sectional view of the second exemplary structure along the vertical plane C-C' of FIG. 48B.

Referring to FIGS. 48A-48C, a patterned etch mask layer (e.g., a photoresist layer) 197 can be formed over the hard mask layer 180. The patterned etch mask layer 197 covers the first via cavities 85A without covering other via cavities 85. For example, the patterned etch mask layer 197 covers the first via cavities 85A and does not cover any of the second via cavities 85B. In one embodiment, the patterned etch mask layer 197 comprises a straight edge that laterally extends along the first horizontal direction hd1 and is located between the first row of the first via cavities 85A and the second row of the second via cavities 85B. In an illustrative example, the patterned etch mask layer 197 may comprise a second photoresist layer that is applied over the hard mask layer 180, and is subsequently lithographically patterned to cover the first via cavities 85A without covering other via cavities 85 (such as the second via cavities 85B). The patterned etch mask layer 197 may fill the first via cavities 85A.

An anisotropic etch process can be performed to vertically extend an unmasked subset of the via cavities 85 (such as the second via cavities 85B). The anisotropic etch process that etches a respective pair of the electrically conductive layer 46 and the insulating layer 32 underneath each second via cavity 85B while the patterned etch mask layer 197 masks the first via cavities 85A. The second via cavities 85B can be vertically extended through one electrically conductive layer 46 and through one insulating layer 32, and may stop on a respective underlying electrically conductive layer 46. In this case, each second via cavity 85B may be vertically extended by a sum of a thickness of an electrically conductive layer 46 and a thickness of an insulating layer 32. Generally, each second via cavities 85B can be vertically extended through a respective pair of an electrically conductive layer 46 and an insulating layer 32 while the first via cavities 85A are masked by the patterned etch mask layer 197. A top surface of a respective underlying electrically conductive layer 46 is physically exposed underneath each of the second via cavities 85B after the anisotropic etch process.

Figure 49A:
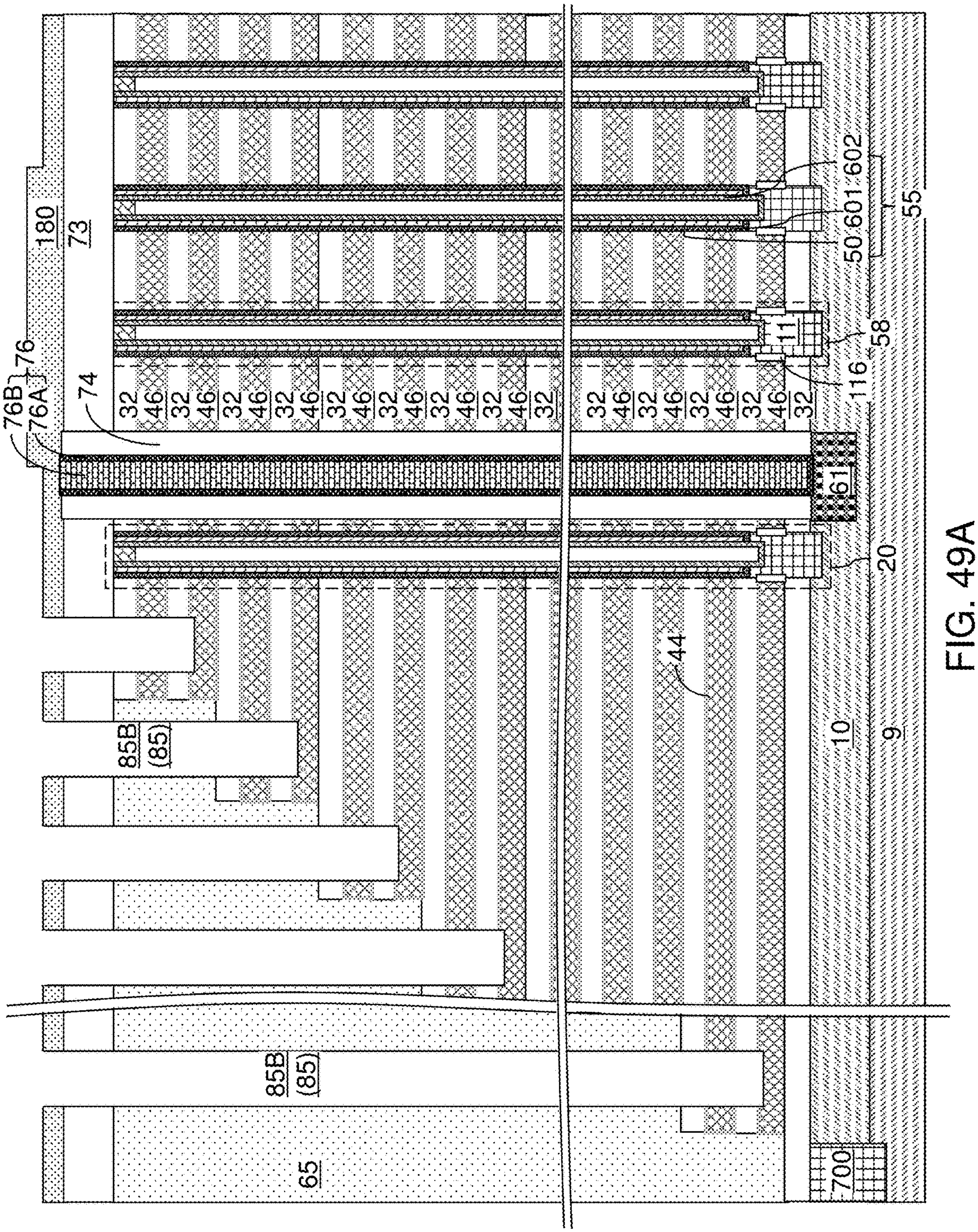
FIG. 49A is a schematic vertical cross-sectional view of the second exemplary structure after removal of the patterned second photoresist layer according to an embodiment of the present disclosure.
Figure 49B:
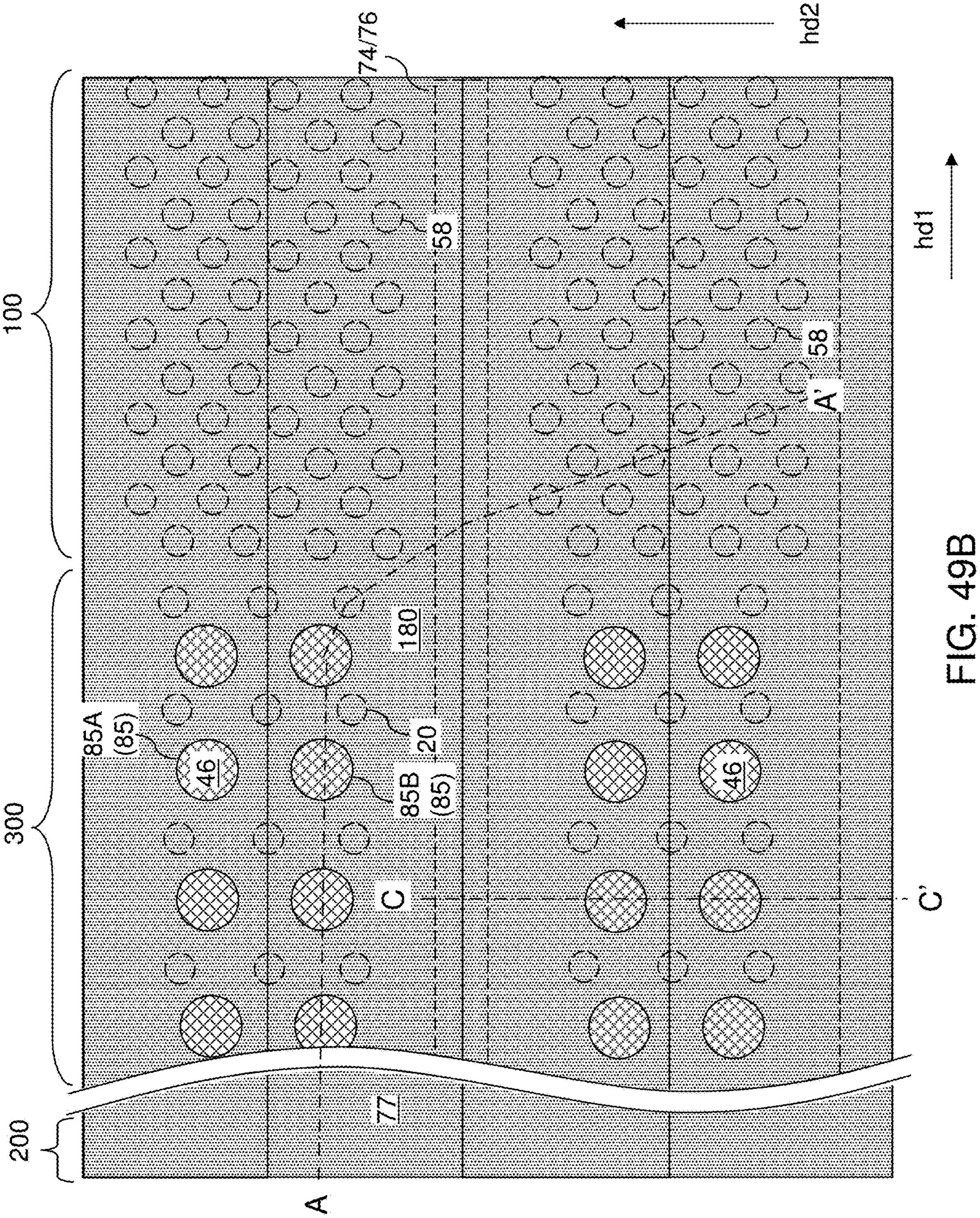
FIG. 49B is a top-down view of the second exemplary structure of FIG. 49A. The vertical plane A-A' is the plane of the schematic vertical cross-sectional view of FIG. 49A.
Figure 49C:
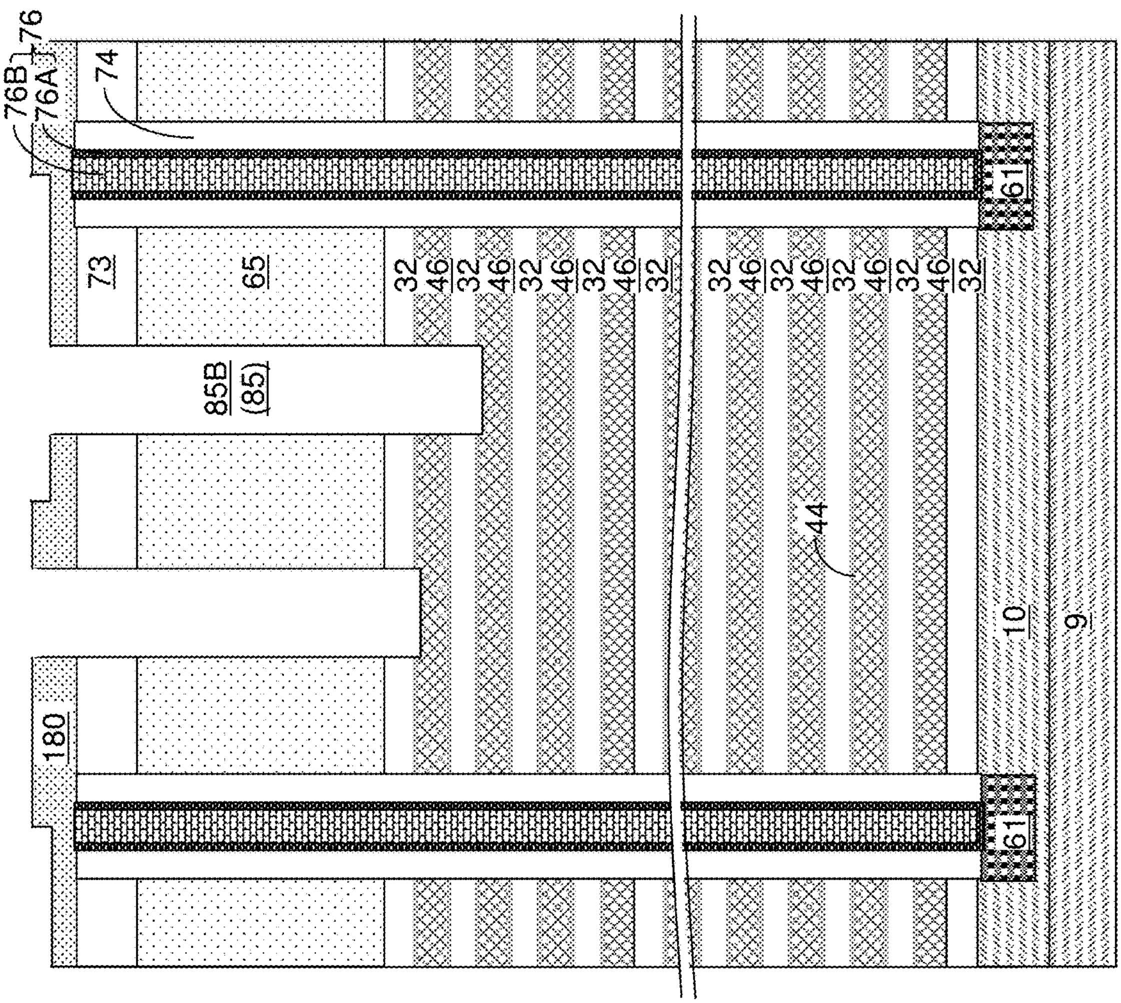
FIG. 49C is a vertical cross-sectional view of the second exemplary structure along the vertical plane C-C' of FIG. 49B.

Referring to FIGS. 49A-49C, the patterned etch mask layer 197 may be removed selective to the hard mask layer 180. If the patterned etch mask layer 197 comprises a second photoresist layer, then the patterned etch mask layer 197 may be removed by ashing.

Figure 50A:
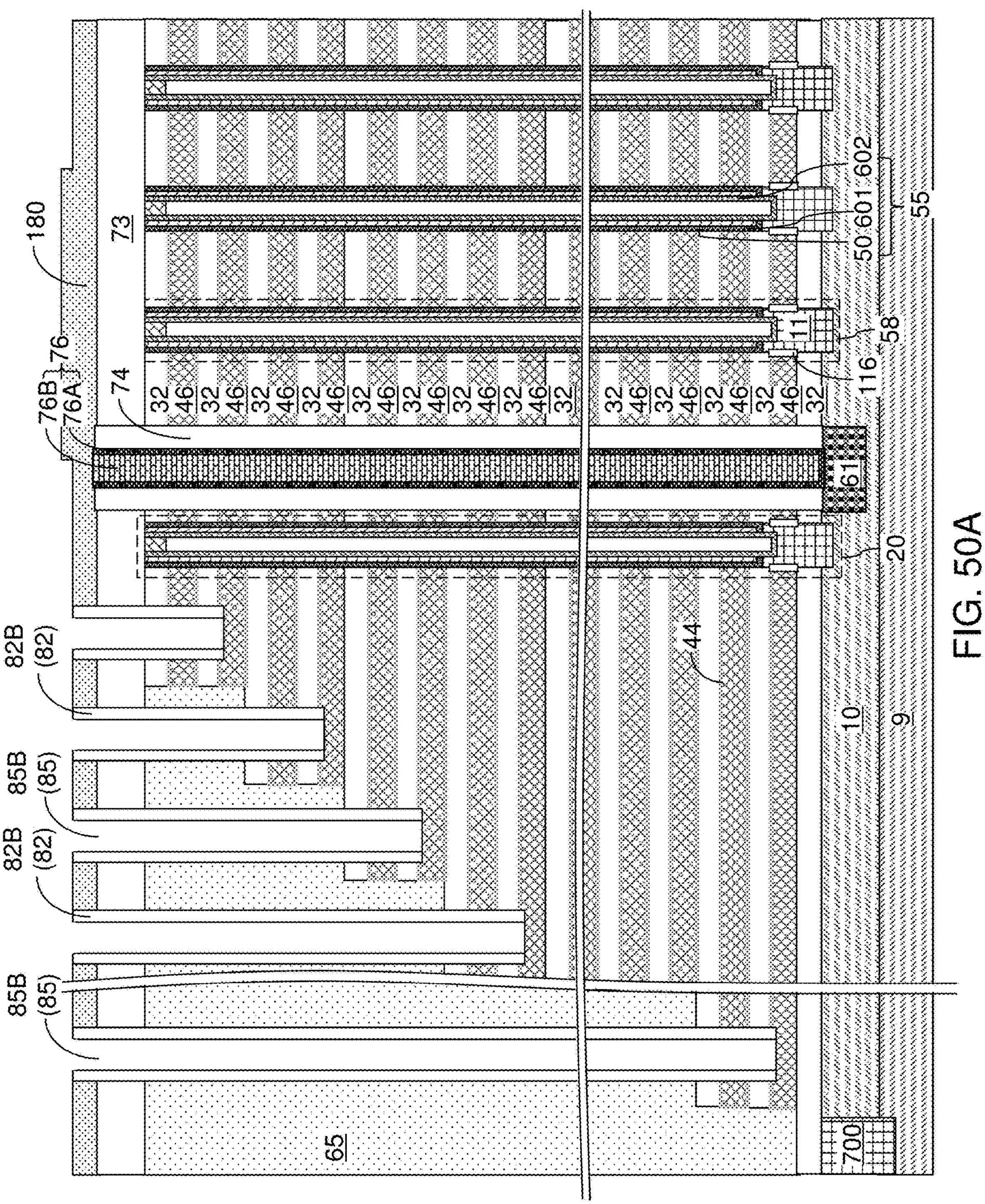
FIG. 50A is a schematic vertical cross-sectional view of the second exemplary structure after formation of dielectric spacers according to an embodiment of the present disclosure.
Figure 50B:
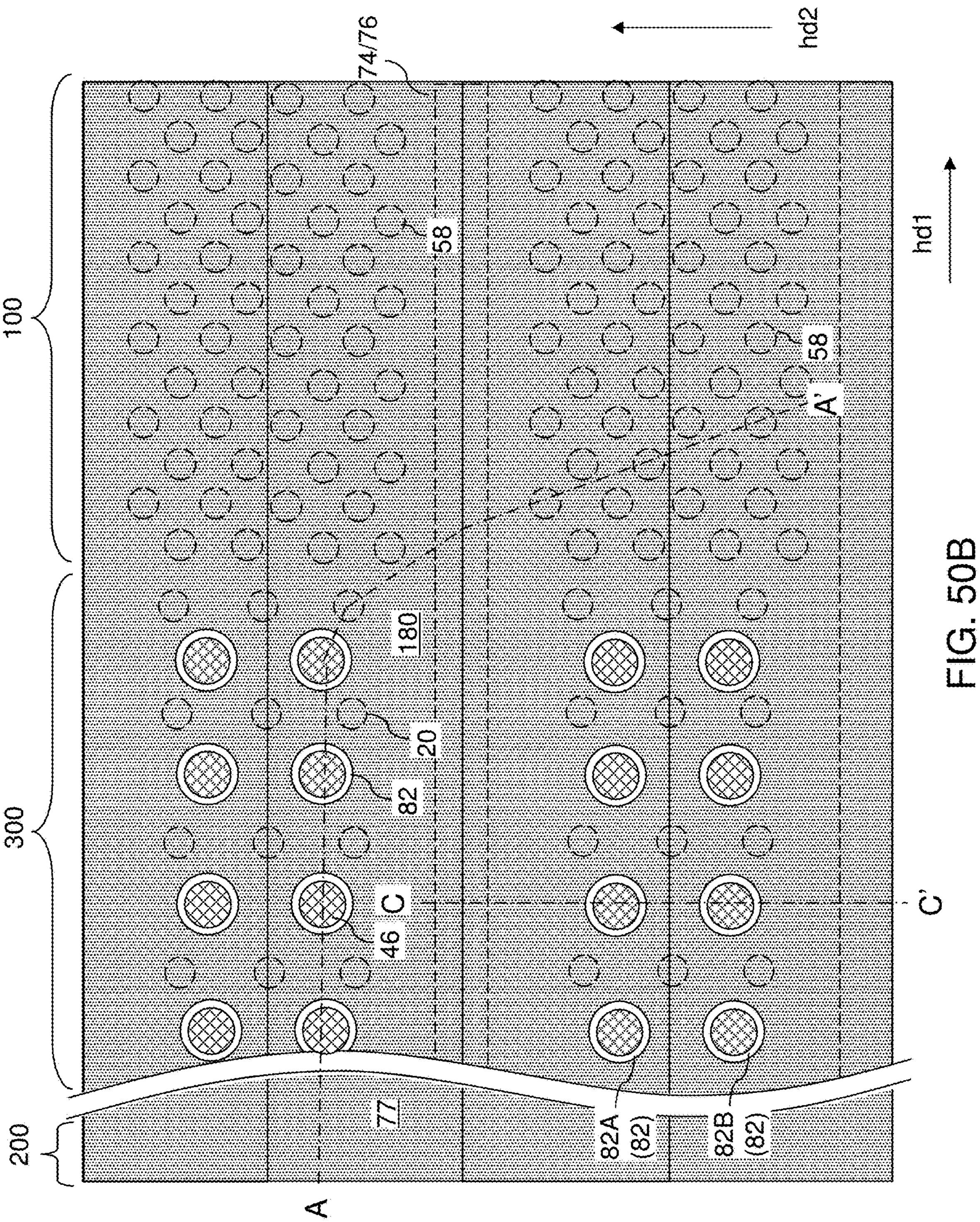
FIG. 50B is a top-down view of the second exemplary structure of FIG. 50A. The vertical plane A-A' is the plane of the schematic vertical cross-sectional view of FIG. 50A.
Figure 50C:
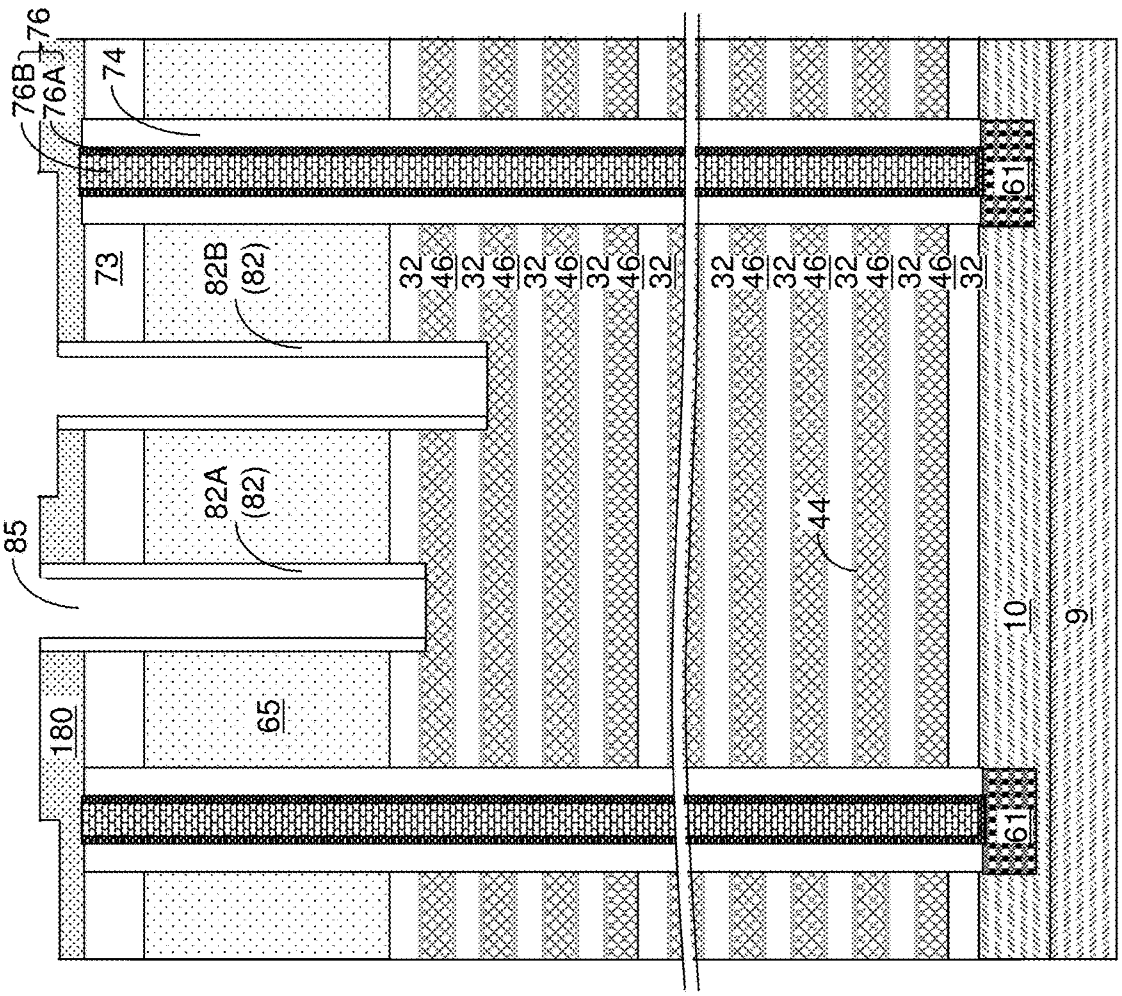
FIG. 50C is a vertical cross-sectional view of the second exemplary structure along the vertical plane C-C' of FIG. 50B.

Referring to FIGS. 50A-50C, a dielectric material layer can be conformally deposited in the peripheral regions of the via cavities 85 and over the hard mask layer 180 by a conformal deposition process such as a chemical vapor deposition process. The dielectric material layer comprise a dielectric material that is different from the material of the hard mask layer 180. For example, if the hard mask layer 180 comprises silicon nitride, then the dielectric material layer may comprise silicon oxide. The thickness of the dielectric material layer is less than one half of the lateral dimension (such as a diameter) of the via cavities 85. In one embodiment, the thickness of the dielectric material layer may be in a range from 6 nm to 100 nm, such as from 12 nm to 50 nm, although lesser and greater thicknesses may also be employed.

An anisotropic etch process (e.g., a sidewall spacer etch process) can be performed to remove horizontally-extending portions of the dielectric material layer. Each remaining cylindrical portion of the dielectric material layer constitutes a dielectric spacer 82. The dielectric spacers 82 comprise first dielectric spacers 82A that are formed at a periphery of a respective one of the first via cavities 85A, second dielectric spacers 82B that are formed at a periphery of a respective one of the second via cavities 85B, etc. If Q rows of via cavities 85 including Q types of via cavities 85 each vertically extending through a different number (including at least 0 and 1) of electrically conductive layers 46 are provided between a neighboring pair of backside trench fill structures (74, 76), then Q types of dielectric spacers 82 each vertically extending through a different number (including at least 0 and 1) of electrically conductive layers 46 can be formed.

In one embodiment, each first dielectric spacer 82A vertically extends through the retro-stepped dielectric material portion 65 and contacts no more than a respective single electrically conductive layer 46 of the insulating layers of the alternating stack (32, 46). In one embodiment, each second dielectric spacer 82B vertically extends through the retro-stepped dielectric material portion 65 and contacts an annular top surface segment of a respective first electrically conductive layer 46 of the electrically conductive layers 46 of the alternating stack (32, 46) and a cylindrical surface of a respective second electrically conductive layer 46 of the electrically conductive layers 46 of the alternating stack (32, 46) that overlies the respective first electrically conductive layer 46. Each second dielectric spacer 82B vertically extends through one electrically conducive layer 46 and contacts a top surface of another one underlying electrically conductive layer 46 in the same step.

Figure 51A:
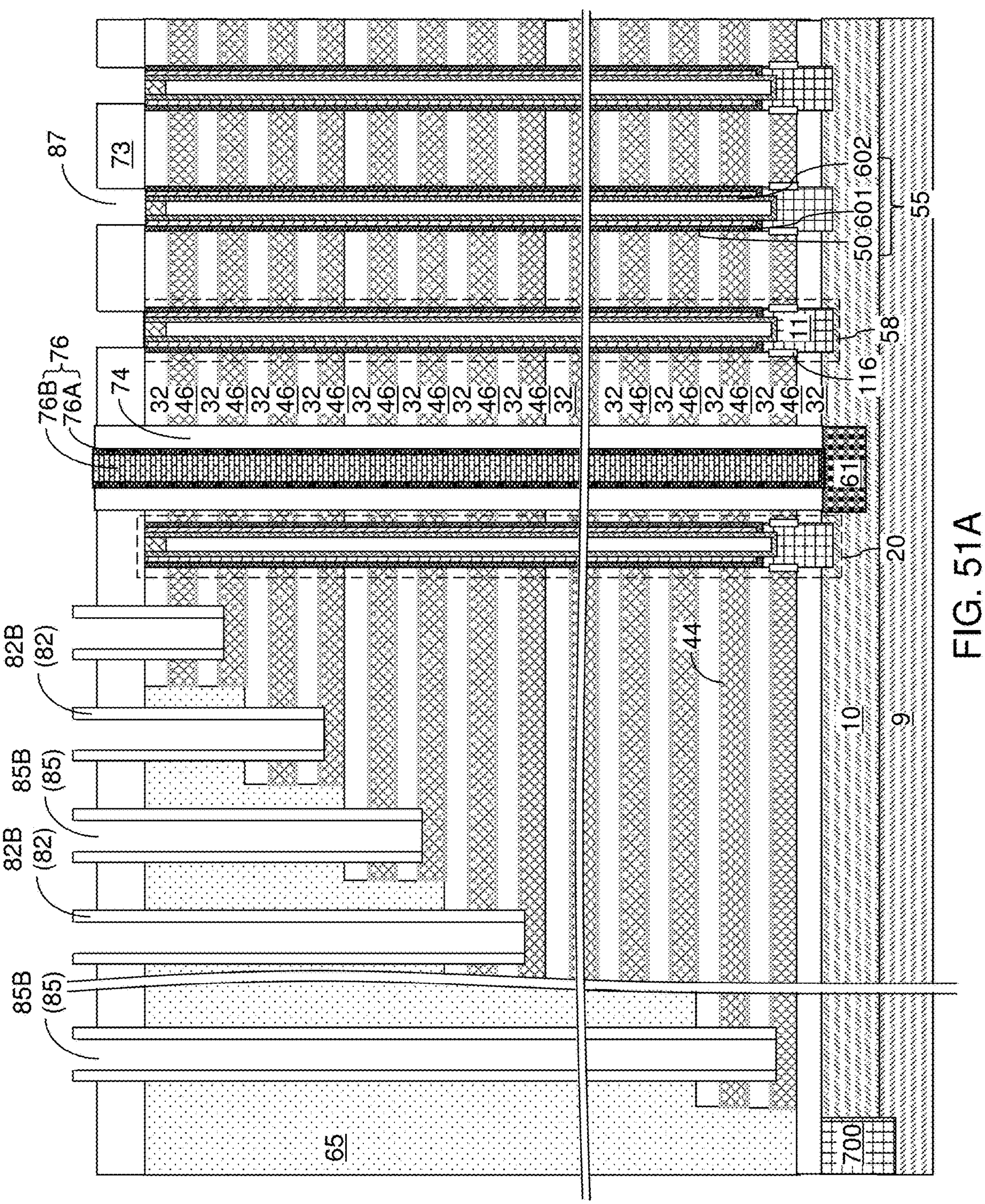
FIG. 51A is a schematic vertical cross-sectional view of the second exemplary structure after removal of the hard mask layer according to an embodiment of the present disclosure.
Figure 51B:
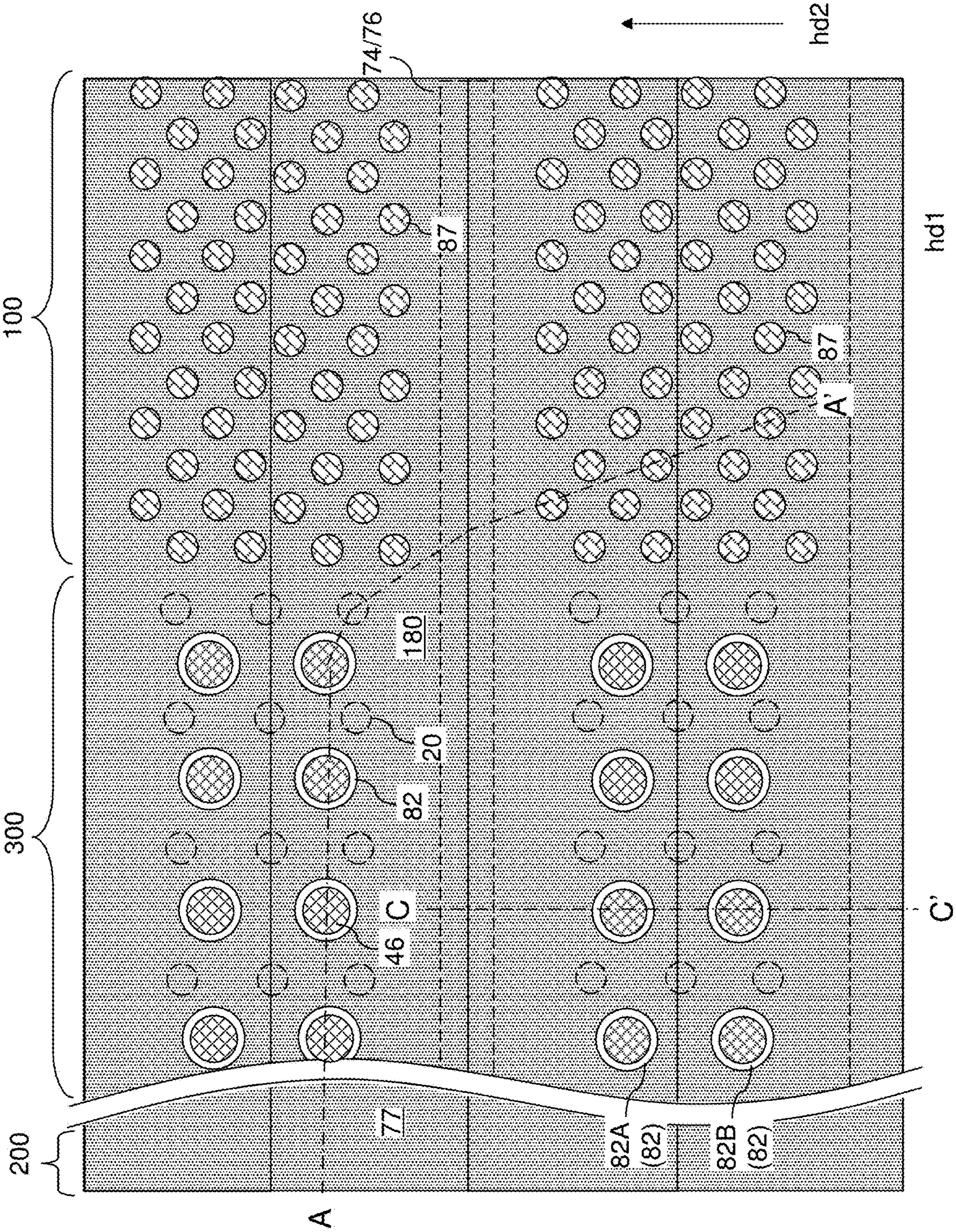
FIG. 51B is a top-down view of the second exemplary structure of FIG. 51A. The vertical plane A-A' is the plane of the schematic vertical cross-sectional view of FIG. 51A.
Figure 51C:
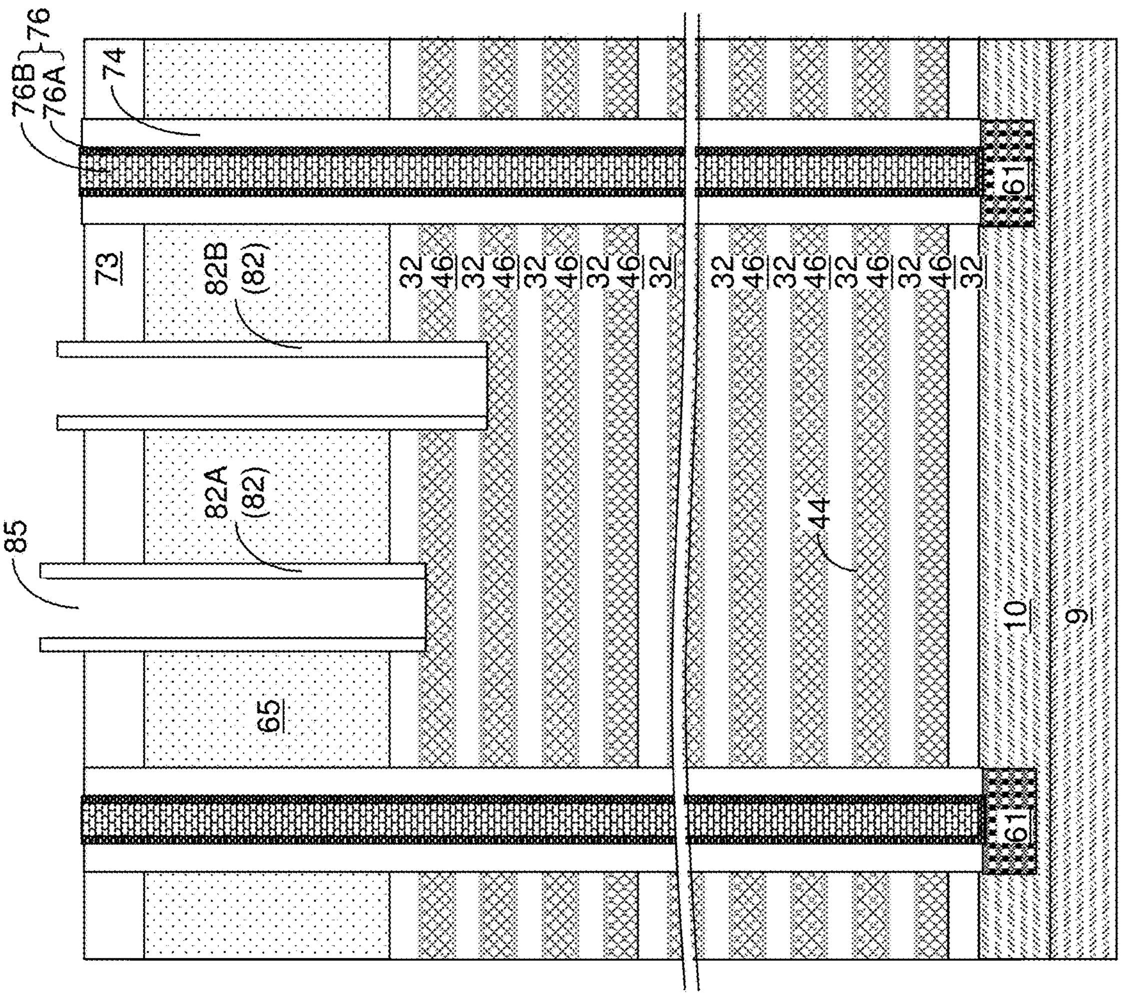
FIG. 51C is a vertical cross-sectional view of the second exemplary structure along the vertical plane C-C' of FIG. 51B.

Referring to FIGS. 51A-51C, the hard mask layer 180 can be removed selective to the materials of the contact-level dielectric layer 73, the dielectric spacers 82, the electrically conductive layers 46, and the backside trench fill structures (74, 76). For example, if the hard mask layer 180 comprises silicon oxide, a wet etch process employing hot phosphoric acid can be performed to remove the hard mask layer 180. The dielectric spacers 82 may optionally protrude above the underlying contact-level dielectric layer 73.

Alternatively, the hard mask layer 180 may be removed by CMP using the underlying contact-level dielectric layer 73 as a polish stop. In this case, the dielectric spacers 82 do not protrude above the underlying contact-level dielectric layer 73.

A photoresist layer (not shown) can be applied over the contact-level dielectric layer 73, and can be lithographically patterned to form openings over the drain regions 63 of the memory opening fill structures 58. An anisotropic etch process can be performed to form drain contact via cavities 87 over the drain regions 63 underneath each opening in the photoresist layer. The photoresist layer can be subsequently removed, for example, by ashing. A top surface of a drain region 63 can be physically exposed at the bottom of each drain contact via cavity 87.

Figure 52A:
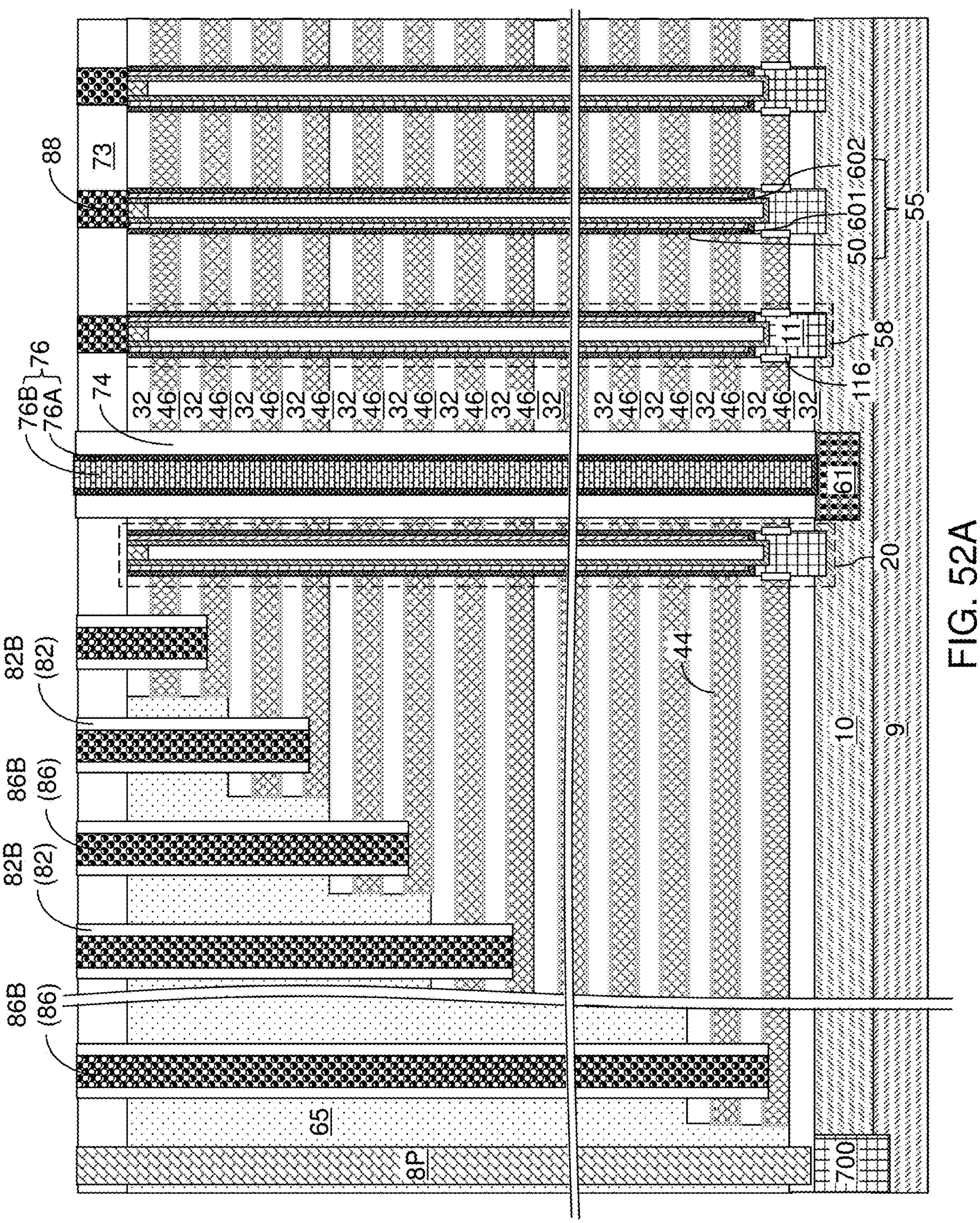
FIG. 52A is a schematic vertical cross-sectional view of the second exemplary structure after formation of contact via structures according to an embodiment of the present disclosure.
Figure 52B:
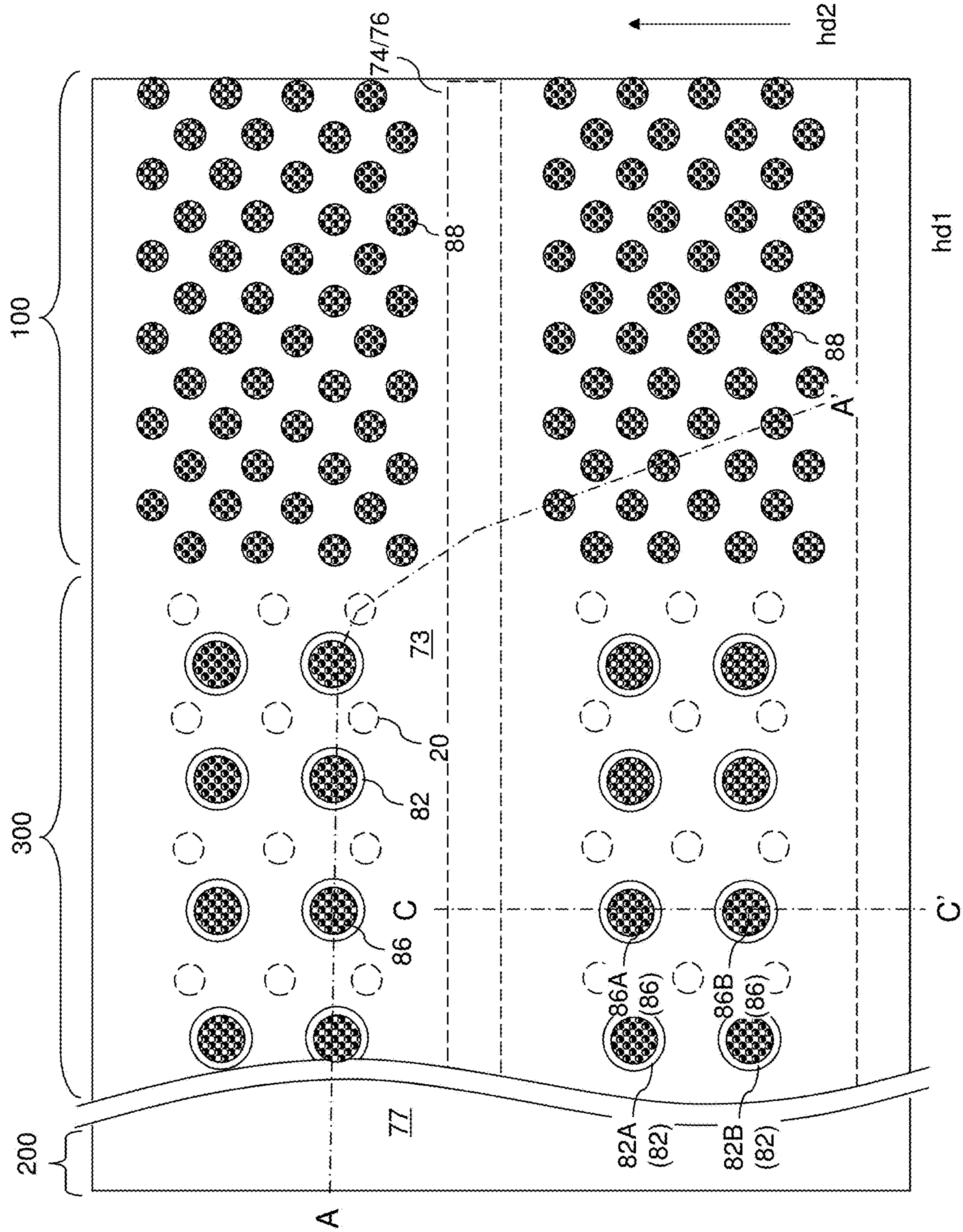
FIG. 52B is a top-down view of the second exemplary structure of FIG. 52A. The vertical plane A-A' is the plane of the schematic vertical cross-sectional view of FIG. 52A.
Figure 52C:
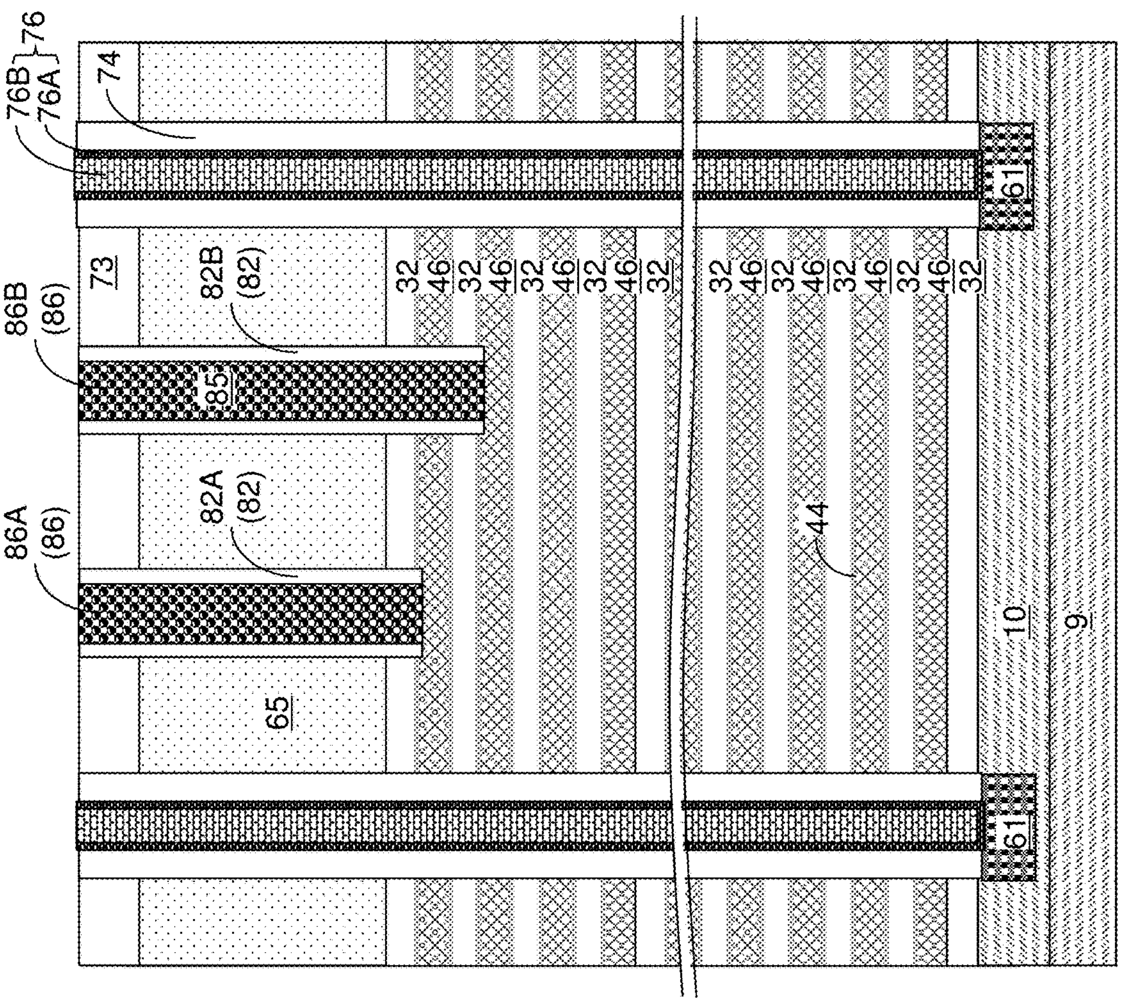
FIG. 52C is a vertical cross-sectional view of the second exemplary structure along the vertical plane C-C' of FIG. 52B.

Referring to FIGS. 52A-52C, peripheral via cavities may be optionally formed in the peripheral region (if present). In this case, the peripheral via cavities may be formed through the retro-stepped dielectric material portion 65 on an electrical node of a respective one of the semiconductor devices. At least one conductive material can be deposited in the various via cavities by a respective conformal deposition process. For example, the at least one conductive material can include a metallic nitride barrier layer including a metallic barrier material (such as TiN, TaN, WN, TiC, TaC, or WC), and a metallic fill material (such as Cu, W, Mo, Ru, Co, or compounds or alloys thereof) that is deposited on the metallic barrier material. Excess portions of the at least one conductive material can be removed from above the horizontal plane including the top surface of the contact-level dielectric layer 73.

Remaining portions of the at least one conductive material that fill remaining voids in the via cavities 85 comprise contact via structures, which are herein referred to as layer contact via structures 86. Each layer contact via structure 86 contacts a top surface of a respective one of the electrically conductive layers 46 (e.g., word line or select gate line). Remaining portions of the at least one conductive material in the drain contact via cavities 87 comprise drain contact via structures 88. Remaining portions of the at least one conductive material in the optional peripheral via cavities extending to the semiconductor devices 700 comprise optional peripheral contact via structures 8P.

Each contiguous combination of a dielectric spacer 82 and a layer contact via structure 86 constitutes a laterally-isolated contact structure (82, 86). The laterally-isolated contact structures (82, 86) comprise first laterally-isolated contact structures (82A, 86A) that are formed in the first via cavities 85A and second laterally-isolated contact structures (82B, 86B) that are formed in the second via cavities 85B. Each of the first laterally-isolated contact structures (82A, 86A) includes a respective first layer contact via structure 86A and a respective first dielectric spacer 82A. Each of the second laterally-isolated contact structures (82B, 86B) comprises a respective second layer contact via structure 86B and a respective second dielectric spacer 82B.

Each first dielectric spacer 82A vertically extends through the retro-stepped dielectric material portion 65 and contacts no more than a respective single electrically conductive layer 46 of the alternating stack (32, 46). Each first layer contact via structure 86A contacts a top surface segment of the respective single electrically conductive layer 46. Each second layer contact via structure 86B vertically extends through the retro-stepped dielectric material portion 65 and contacts an annular top surface segment of a respective first electrically conductive layer 46 of the electrically conductive layers 46 of the alternating stack (32, 46) and a cylindrical sidewall surface of a respective second electrically conductive layer 46 of the electrically conductive layers 46 of the alternating stack (32, 46) that overlies the respective first electrically conductive layer 46. In one embodiment, a periphery of the top surface segment of the respective first electrically conductive layer 46 coincides with an inner periphery of the annular top surface segment for each of the second laterally-isolated contact structures (82B, 86B).

In one embodiment, the first dielectric spacers 82A and the second dielectric spacers 82B have a same dielectric material composition, have a same lateral distance between a respective inner sidewall and a respective outer sidewall, and have top surfaces within the horizontal plane including the top surfaces of the first layer contact via structures 86A and the second layer contact via structures 86B (such as the horizontal plane including the top surface of the contact-level dielectric layer 73). In one embodiment, the first layer contact via structures 86A and the second layer contact via structures 86B have top surfaces located within a horizontal plane located at or above a topmost surface of the alternating stack (32, 46) (such as the horizontal plane including the top surface of the contact-level dielectric layer 73). In one embodiment, the first layer contact via structures 86A and the second layer contact via structures 86B have the same or different material composition than the electrically conductive layers 46.

Figure 53A:
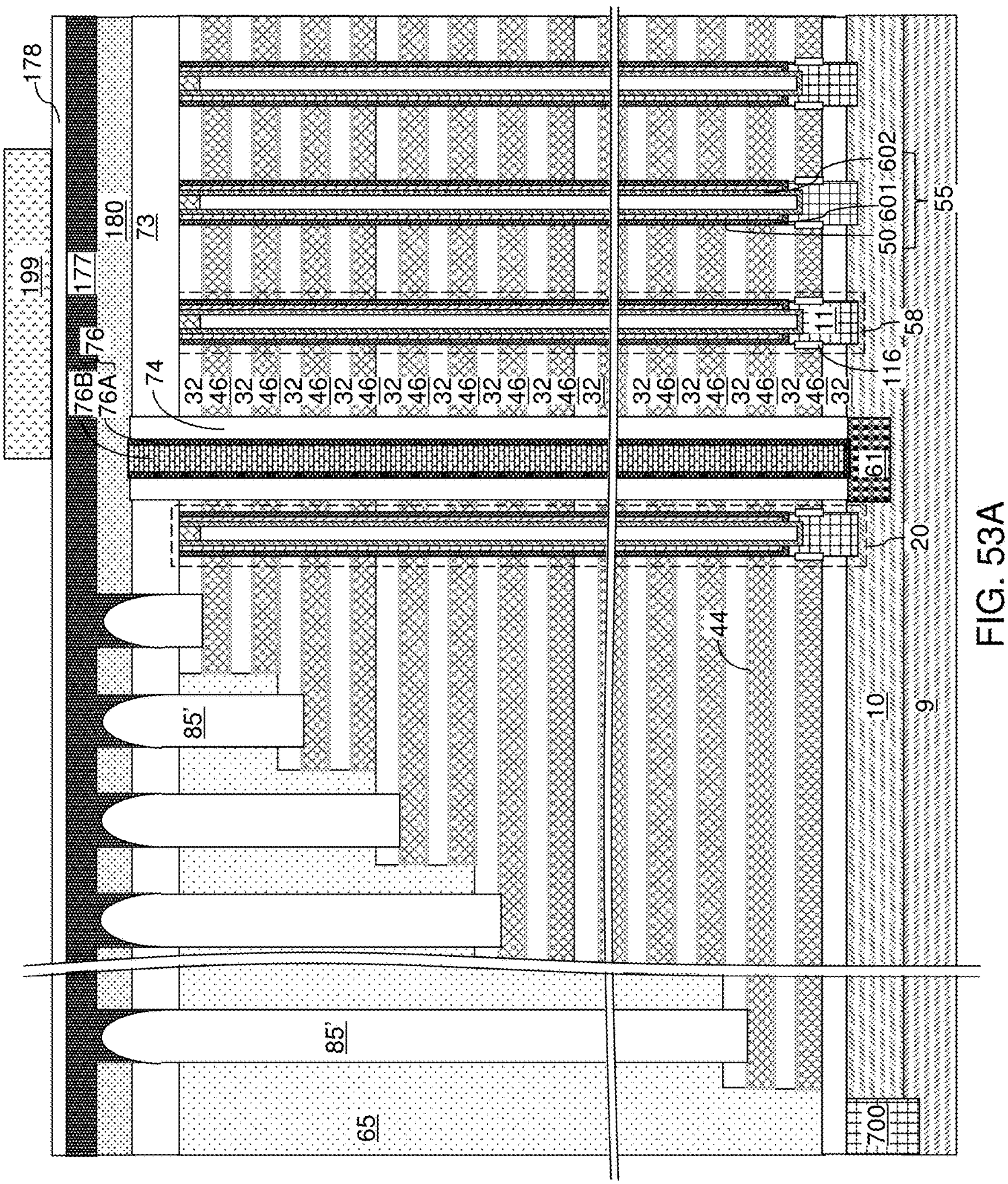
FIG. 53A is a schematic vertical cross-sectional view of a first alternative configuration of the second exemplary structure after formation of a patterning film, an optional dielectric hard mask layer, and a patterned second photoresist layer according to an embodiment of the present disclosure.
Figure 53B:
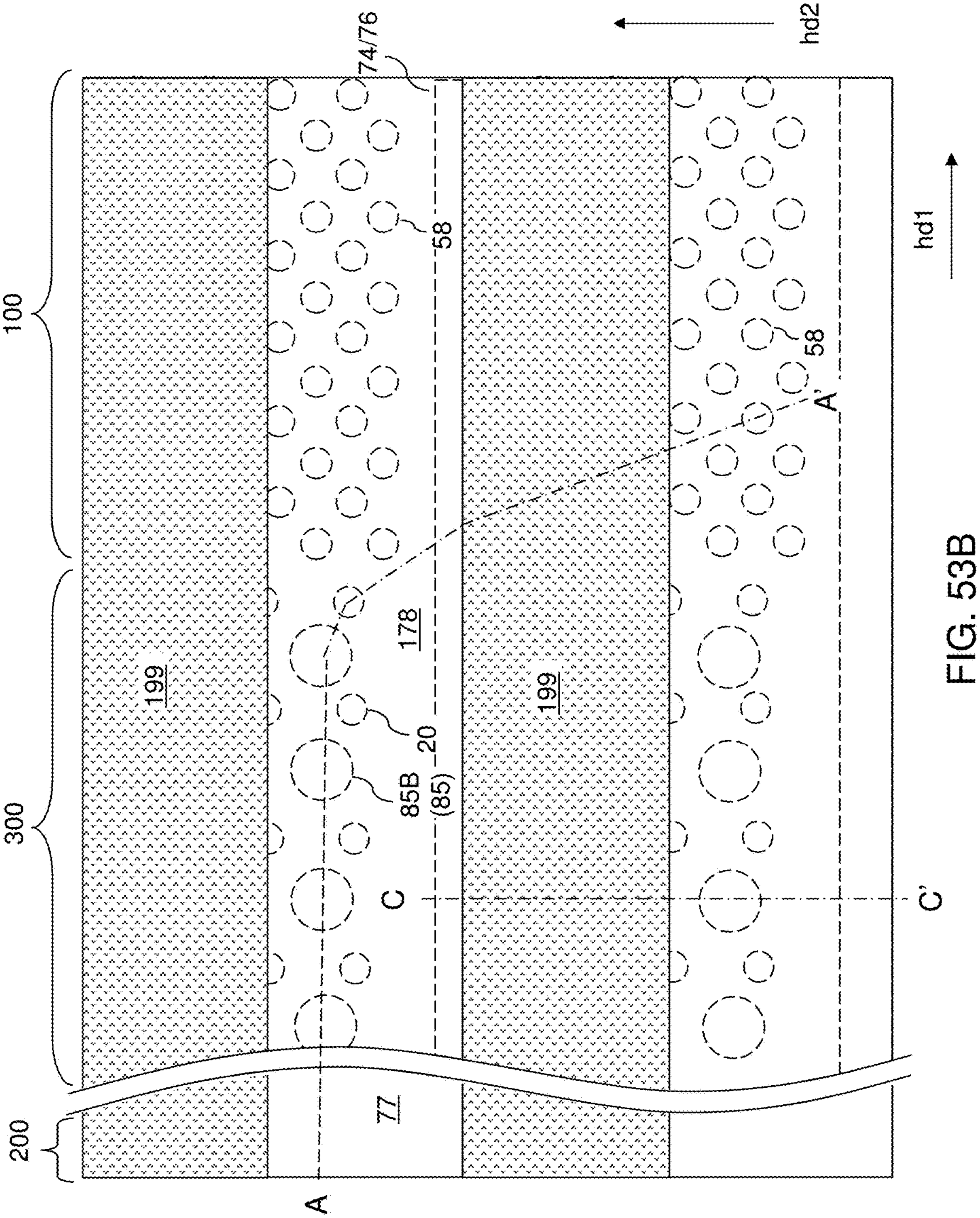
FIG. 53B is a top-down view of the first alternative configuration of the second exemplary structure of FIG. 53A. The vertical plane A-A' is the plane of the schematic vertical cross-sectional view of FIG. 53A.
Figure 53C:
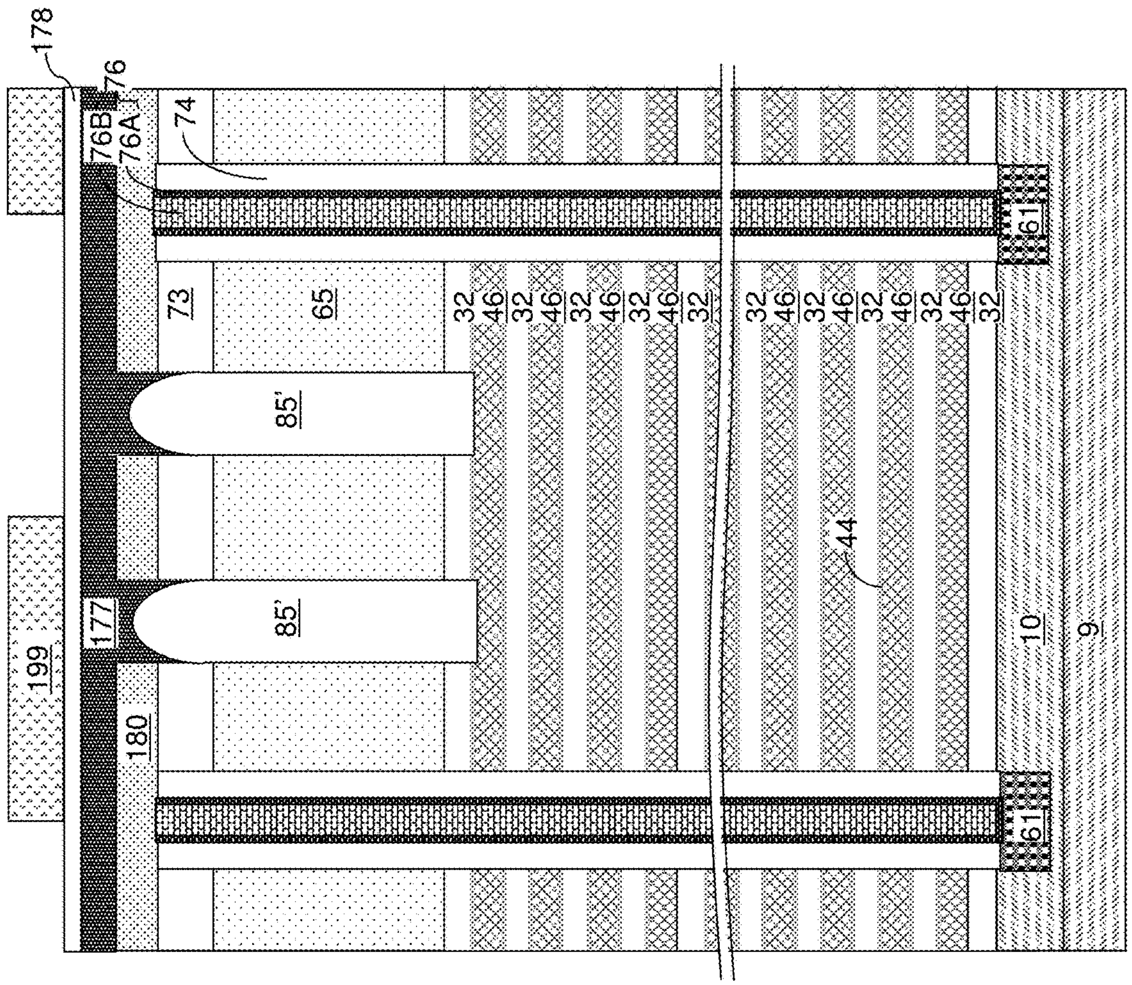
FIG. 53C is a vertical cross-sectional view of the first alternative configuration of the second exemplary structure along the vertical plane C-C' of FIG. 53B.

Referring to FIGS. 53A-53C, a first alternative configuration of the second exemplary structure can be derived from the second exemplary structure illustrated in FIGS. 47A-47C by forming a patterning film 177 over the hard mask layer 180 prior to formation of a patterned etch mask layer 197. In one embodiment, the patterning film 177 may comprise a carbon-based material such as amorphous carbon, diamond-like carbon, or a compound thereof. For example, the patterning film 177 may include Advanced Patterning Film (APF) commercially available from Applied Materials, Inc.™ The patterning film 177 may be formed by an anisotropic deposition method. The patterning film 177 does not fill the via cavities. If the patterning film 177 includes a carbon-based material, then a dielectric etch mask layer 178 may be formed over the patterning film 177. The dielectric etch mask layer 178 comprises a dielectric material such as silicon oxide, silicon nitride, silicon carbide, or a combination thereof. The thickness of the dielectric etch mask layer 178 may be in a range from 5 nm to 100 nm, although lesser and greater thicknesses may also be employed.

A second photoresist layer 199 can be formed over the patterning film 177 and the dielectric etch mask layer 178 (if present). The second photoresist layer 199 can be lithographically patterned with the same pattern as the pattern in the patterned etch mask layer 197 illustrated in FIGS. 48A-48C. Thus, the patterned second photoresist layer 199 overlies the areas of the first via cavities 85A, and does not cover areas of other via cavities 85. For example, the patterned second photoresist layer 199 covers the areas of the first via cavities 85A, and does not cover any area of the second via cavities 85B in a plan view. In one embodiment, the patterned second photoresist layer 199 comprises a straight edge that laterally extends along the first horizontal direction hd1 and is located between the first row of the first via cavities 85A and the second row of the second via cavities 85B. In an illustrative example, the patterned second photoresist layer 199 may comprise a second photoresist layer that is applied over the hard mask layer 180, and is subsequently lithographically patterned to cover the first via cavities 85A without filling them and without covering other via cavities 85 (such as the second via cavities 85B).

Figure 54A:
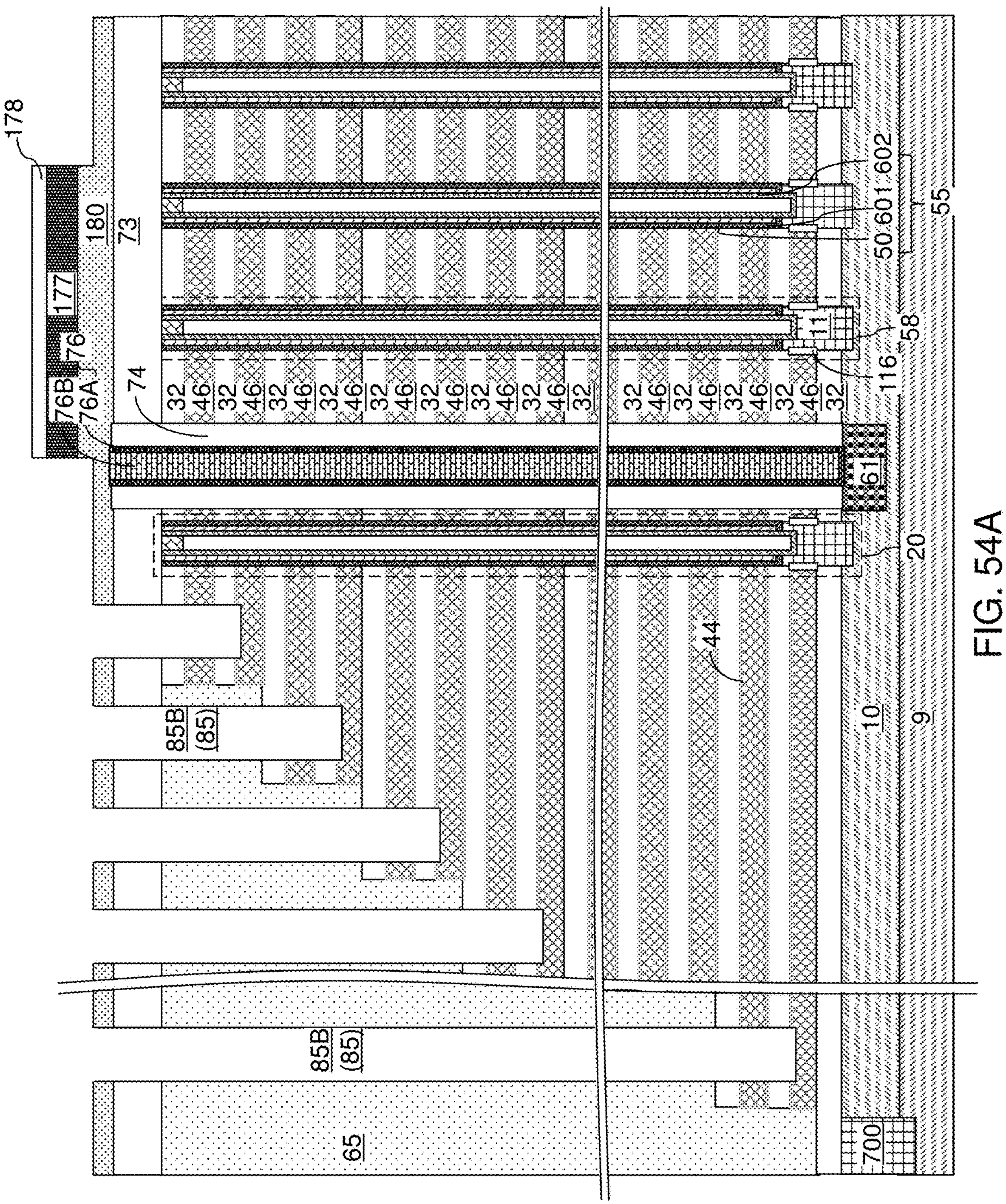
FIG. 54A is a schematic vertical cross-sectional view of the first alternative configuration of the second exemplary structure after patterning the optional dielectric hard mask layer and the patterning film and vertically extending an unmasked subset of the via cavities according to an embodiment of the present disclosure.
Figure 54B:
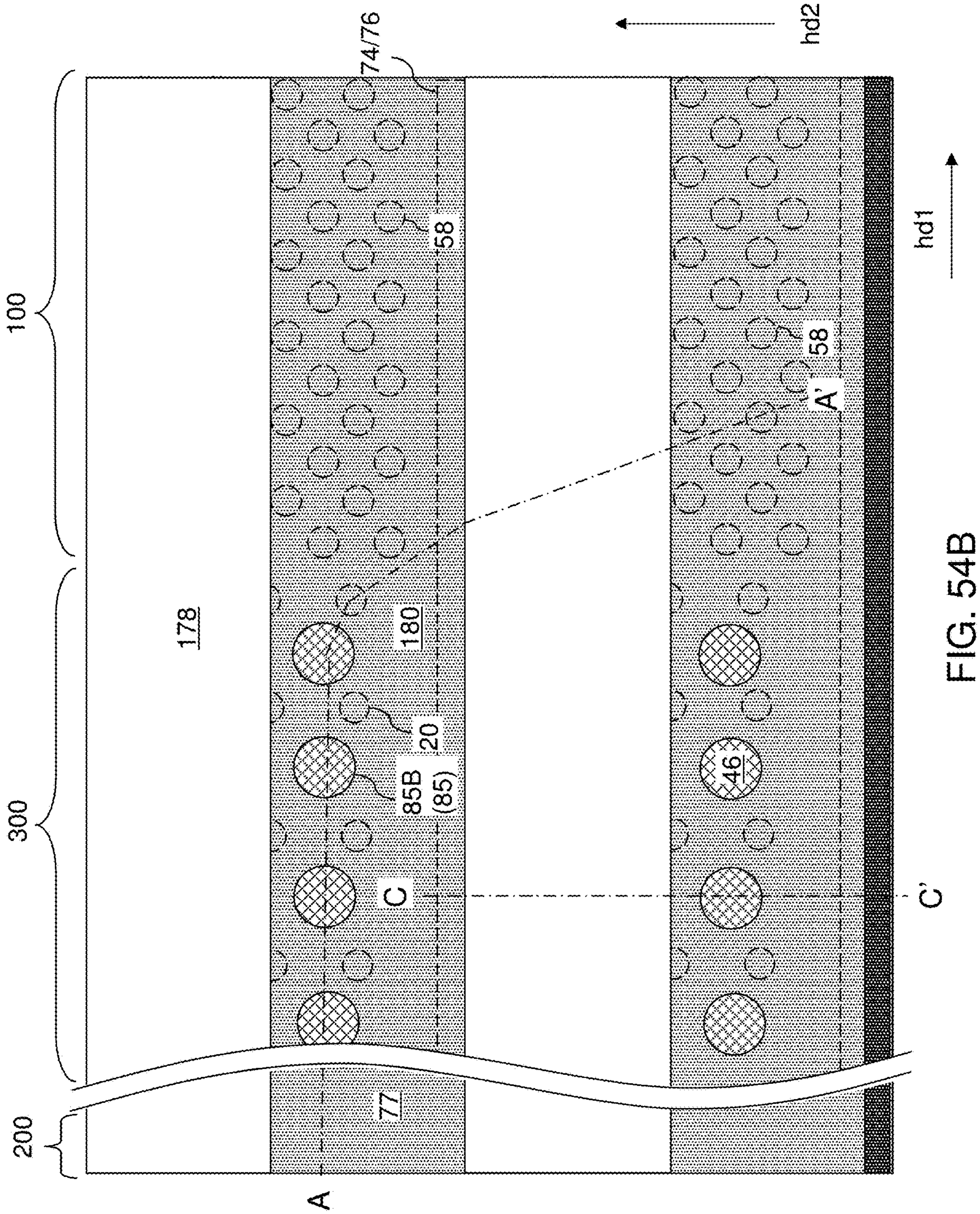
FIG. 54B is a top-down view of the first alternative configuration of the second exemplary structure of FIG. 54A. The vertical plane A-A' is the plane of the schematic vertical cross-sectional view of FIG. 54A.
Figure 54C:
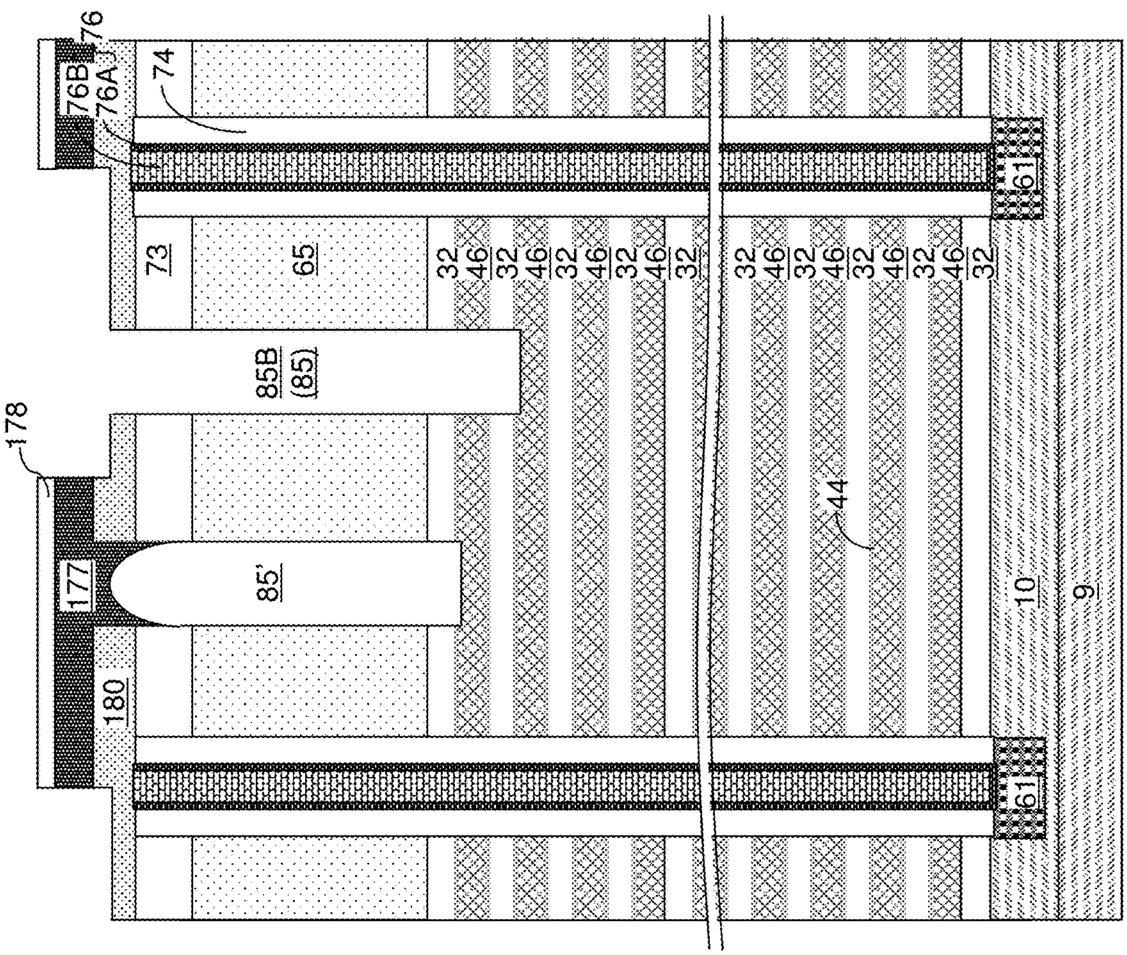
FIG. 54C is a vertical cross-sectional view of the first alternative configuration of the second exemplary structure along the vertical plane C-C' of FIG. 51B.

Referring to FIGS. 54A-54C, a first anisotropic etch process can be performed to transfer the pattern in the patterned second photoresist layer 199 through the dielectric etch mask layer 178 (if present) and the patterning film 177. Portions of the patterning film 177 that are formed over or within each via cavity 85 other than the first via cavities 85A can be removed during the first anisotropic etch process. Thus, portions of the patterning film 177 that are formed over the second via cavities 85B can be removed during the first anisotropic etch process. The patterned second photoresist layer 199 may be subsequently removed, for example, by ashing. Alternatively, the patterned second photoresist layer 199 may be collaterally removed during a second anisotropic etch process.

A second anisotropic etch process described above with respect to FIGS. 48A-48C can be performed to vertically extend an unmasked subset of the via cavities 85 (such as the second via cavities 85B). The patterning film 177 and the dielectric etch mask layer 178 (if present) may be employed as a patterned etch mask during the second anisotropic etch process. The second anisotropic etch process that etches a respective pair of the electrically conductive layer 46 and the insulating layer 32 underneath each second via cavity 85B while the patterning film masks the first via cavities 85A.

Figure 55A:
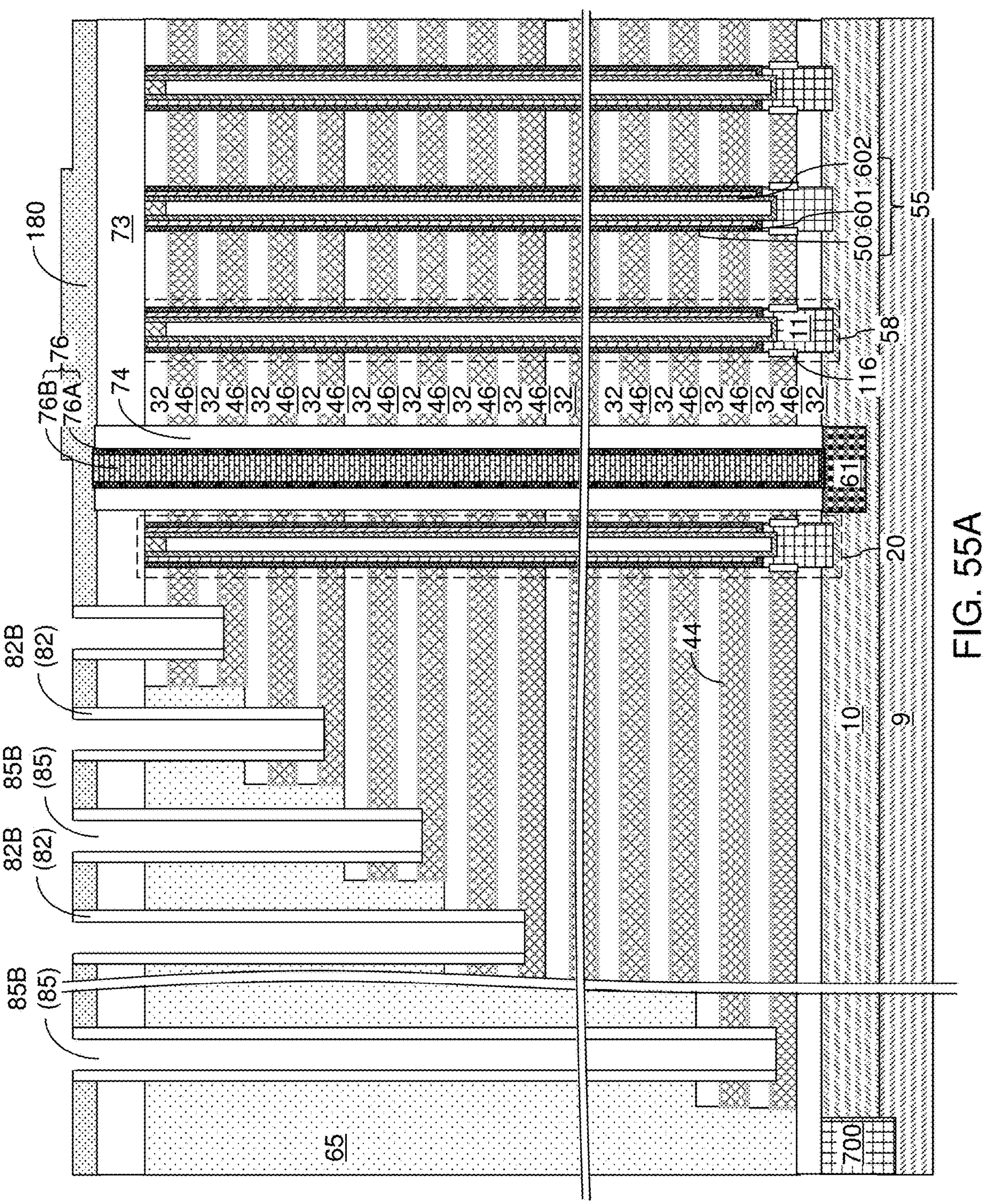
FIG. 55A is a schematic vertical cross-sectional view of the first alternative configuration of the second exemplary structure after formation of dielectric spacers according to an embodiment of the present disclosure.
Figure 55B:
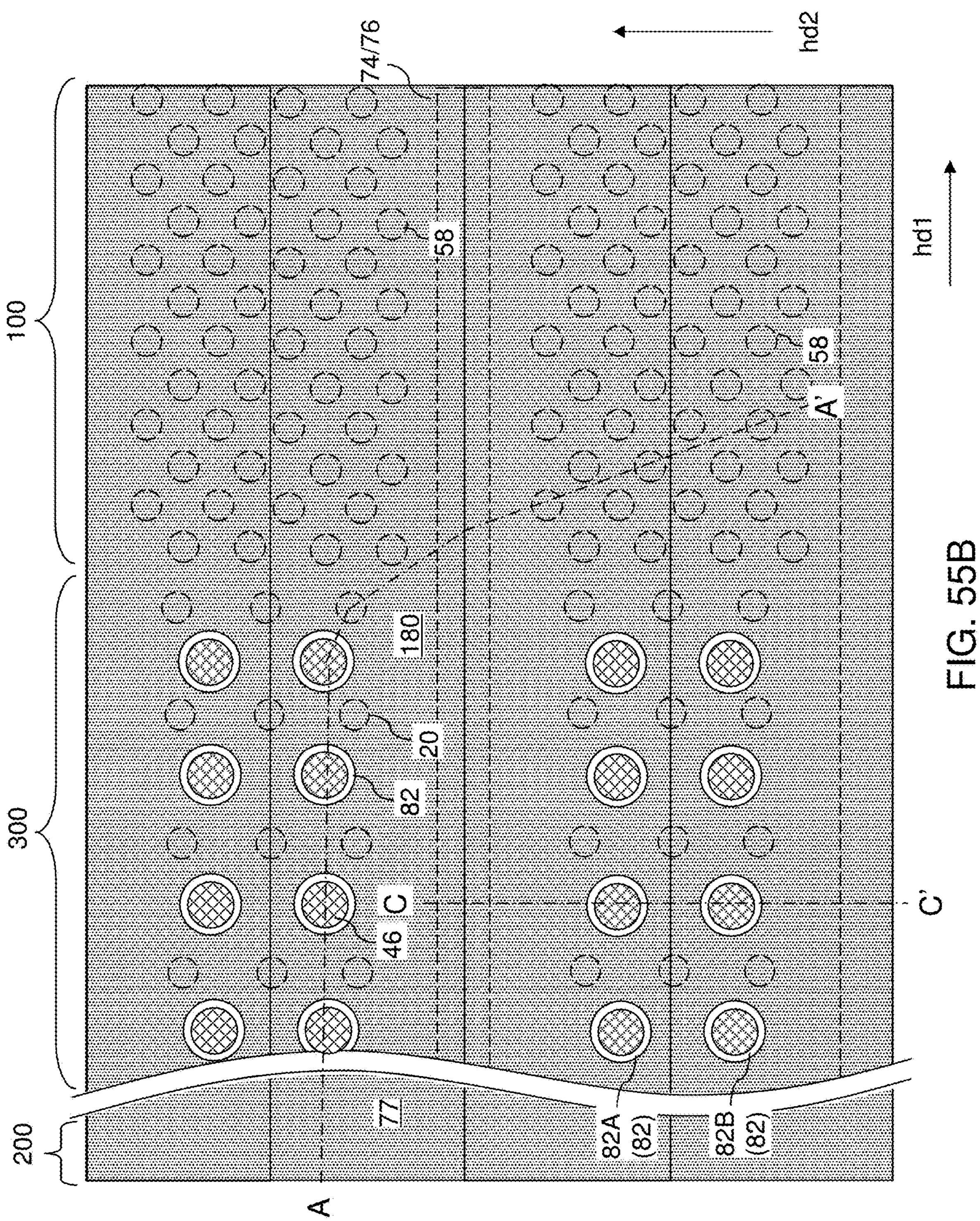
FIG. 55B is a top-down view of the first alternative configuration of the second exemplary structure of FIG. 55A. The vertical plane A-A' is the plane of the schematic vertical cross-sectional view of FIG. 55A.
Figure 55C:
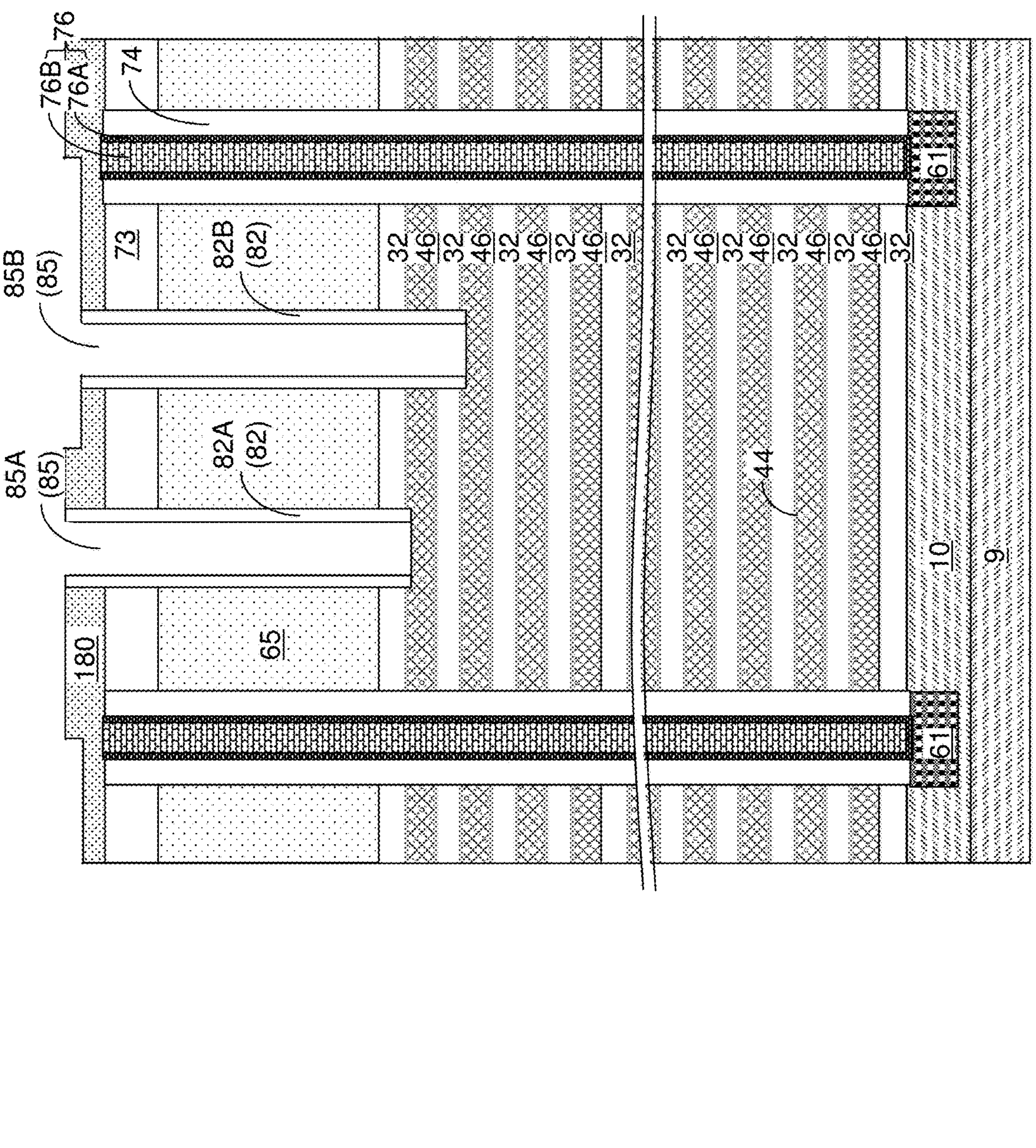
FIG. 55C is a vertical cross-sectional view of the first alternative configuration of the second exemplary structure along the vertical plane C-C' of FIG. 55B.

Referring to FIGS. 55A-55C, the patterning film 177 may be removed selective to the hard mask layer 180. The dielectric hard mask layer 178 (if present) can be subsequently removed, for example, employing an isotropic etch process, such as a wet etch process, or by a lift-off process during removal of the patterning film 177.

Subsequently, the processing steps of FIGS. 50A-50C may be performed to form a dielectric spacer 82 within each via cavity 85. As discussed above, a first dielectric spacer 82A may be formed within each first via cavity 85A, and a second dielectric spacer 82B may be formed within each second via cavity 85B.

Figure 56A:
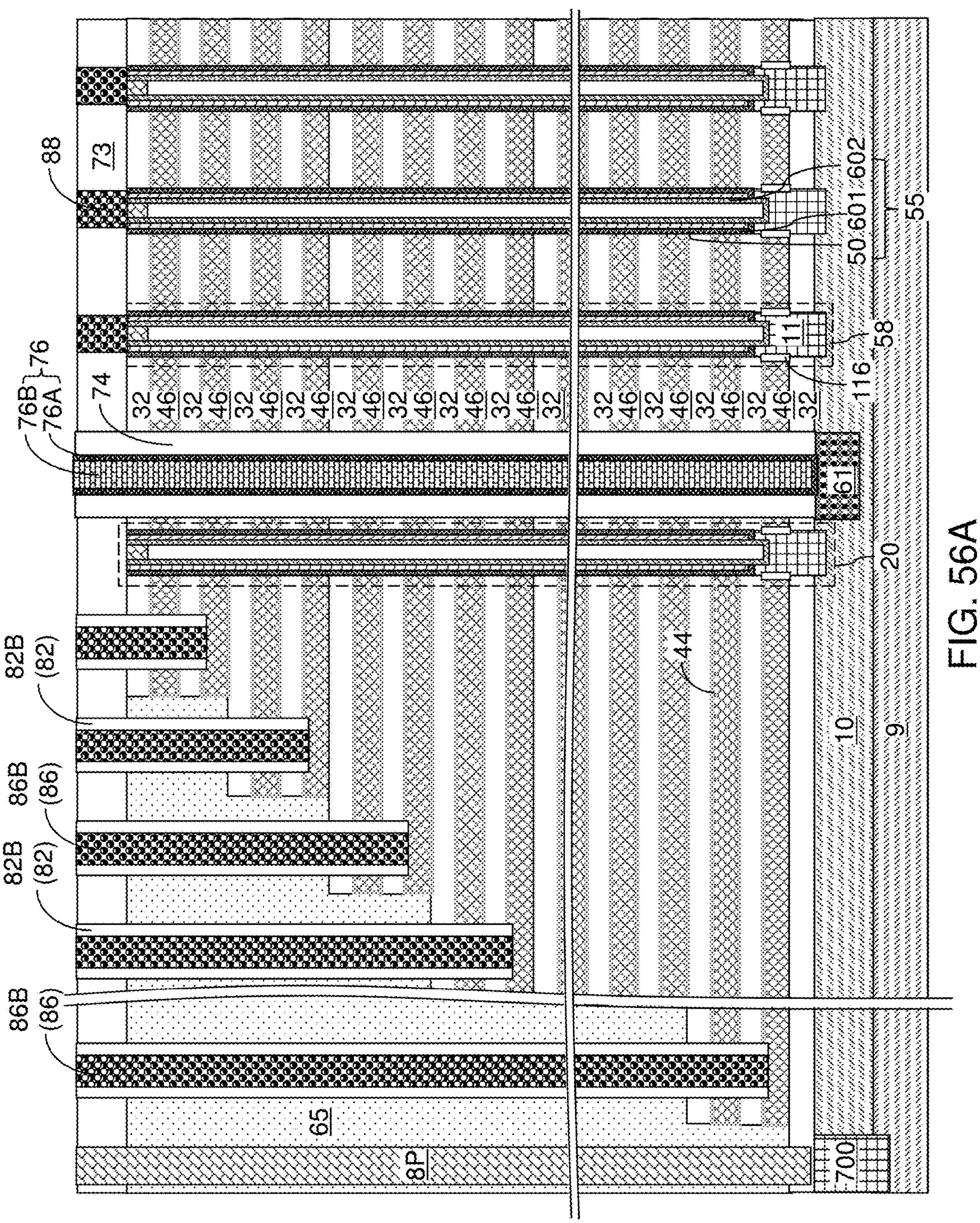
FIG. 56A is a schematic vertical cross-sectional view of the first alternative configuration of the second exemplary structure after formation of contact via structures according to an embodiment of the present disclosure.
Figure 56B:
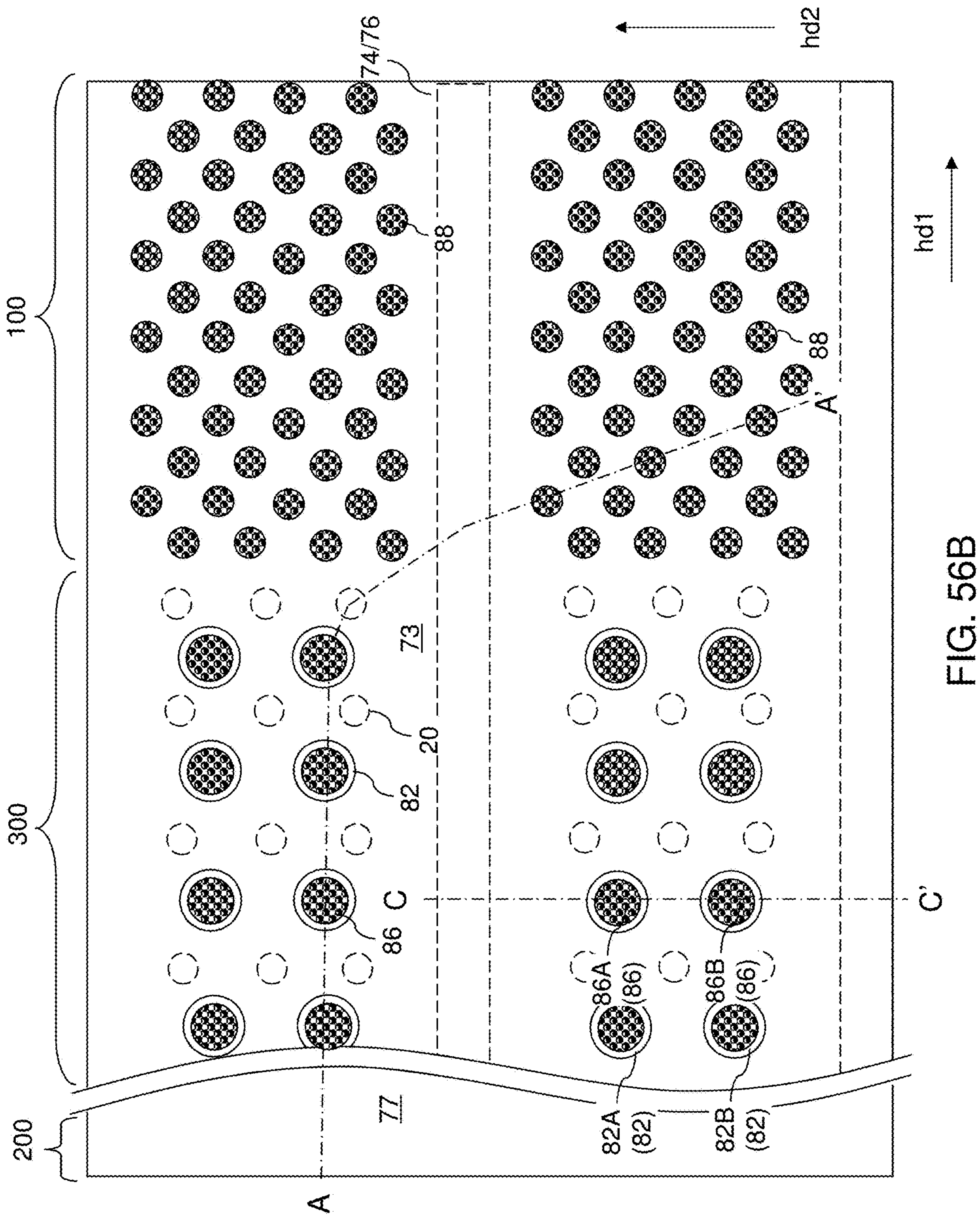
FIG. 56B is a top-down view of the first alternative configuration of the second exemplary structure of FIG. 56A. The vertical plane A-A' is the plane of the schematic vertical cross-sectional view of FIG. 56A.
Figure 56C:
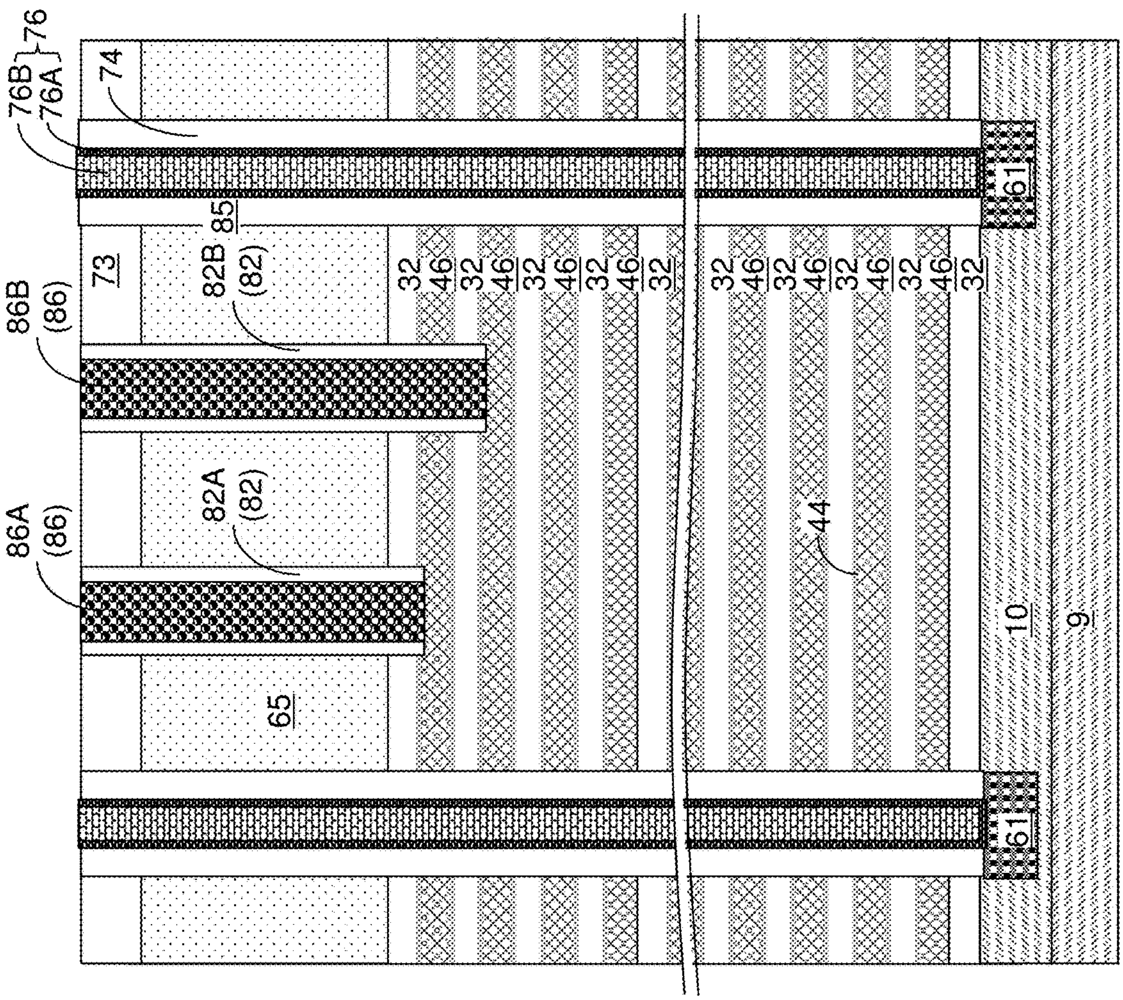
FIG. 56C is a vertical cross-sectional view of the first alternative configuration of the second exemplary structure along the vertical plane C-C' of FIG. 56B.

Referring to FIGS. 56A-56C, the processing steps of FIGS. 51A-51C can be performed to remove the hard mask layer 180, and to form drain contact via cavities 87. The processing steps of FIGS. 52A-52C can be subsequently performed to form various contact via structures (88, 86, 8P). The dielectric spacers 82 and the layer contact via structures 86 may have the same structural features as in the second exemplary structure described with reference to FIGS. 52A-52C.

As discussed above, embodiments of the present disclosure may be practiced with one or more vertical steps including sidewalls of Q insulating spacers 32 and Q sacrificial material layers 42 that are vertically coincident among one another. In this case, Q rows of via cavities 85 including Q types of via cavities 85 can be formed. Each type of via cavities 85 of the Q types of via cavities each vertically extends through a different number (including at least 0 and 1) of electrically conductive layers 46 provided between a neighboring pair of backside trench fill structures (74, 76).

Figure 57:
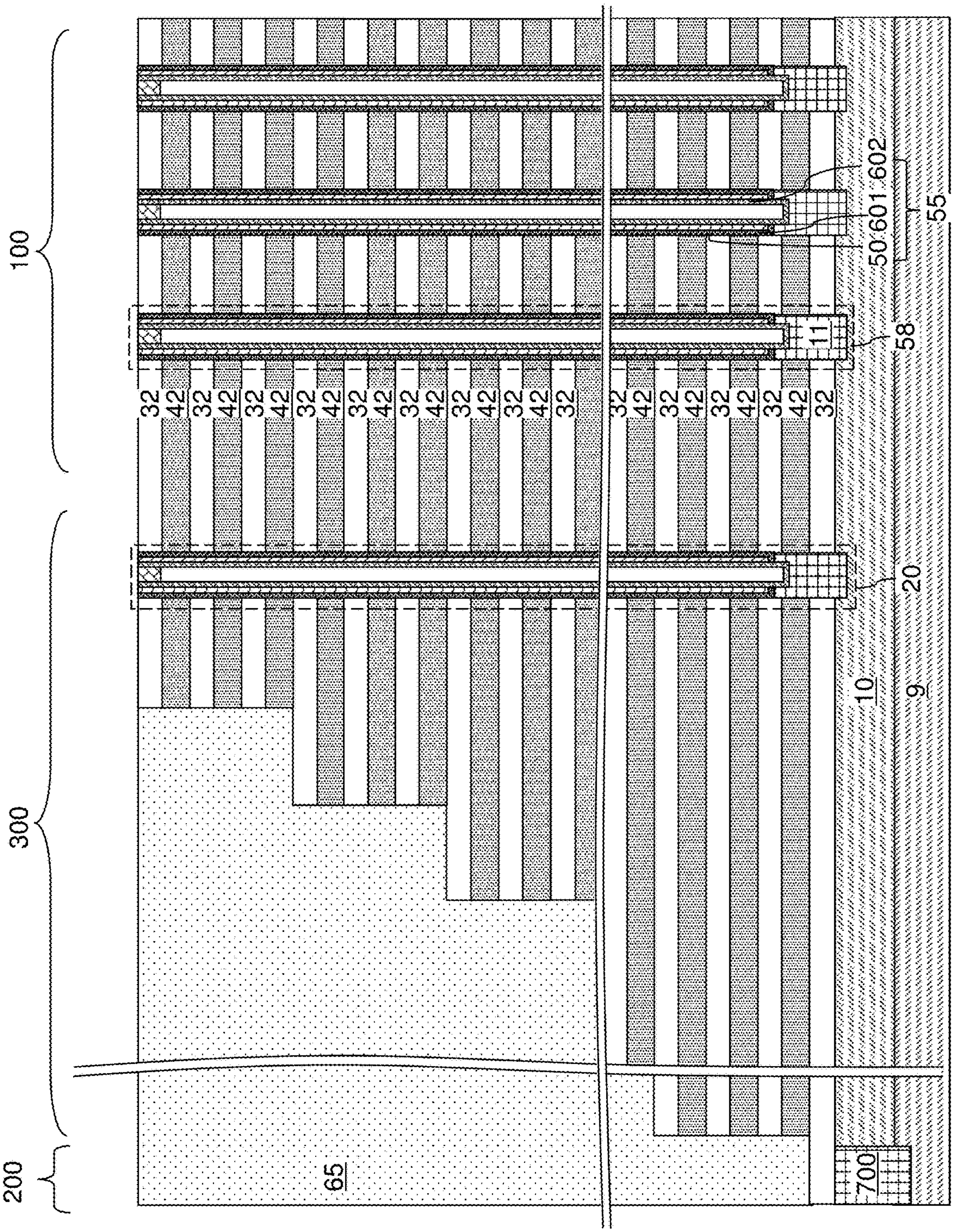
FIG. 57 is a schematic vertical cross-sectional view of a second alternative configuration of the second exemplary structure after formation of memory openings and memory opening fill structures according to an embodiment of the present disclosure.

Referring to FIG. 57, a second alternative configuration of the second exemplary structure according to an embodiment of the present disclosure is illustrated at a processing step that corresponds to the processing step of FIG. 40. The second alternative configuration of the second exemplary structure corresponds to the case in which Q equals 3.

In the embodiments in which Q is greater than 2, the processing steps described with reference to FIGS. 48A-48C or the processing steps described with reference to FIGS. 53A-54C may be repeated with any needed changes (for example, in the pattern of a patterned etch mask layer) to vertically extend a respective subset of the via cavities 85 through at least one pair of an insulating layer 32 and an electrically conductive layer 46. Q types of dielectric spacers 82 each vertically extending through a different number (including at least 0 and 1) of electrically conductive layers 46 can be formed. Q types of layer contact via structures 86 each vertically extending through a different number (including at least 0 and 1) of electrically conductive layers 46 can be formed.

Figure 58A:
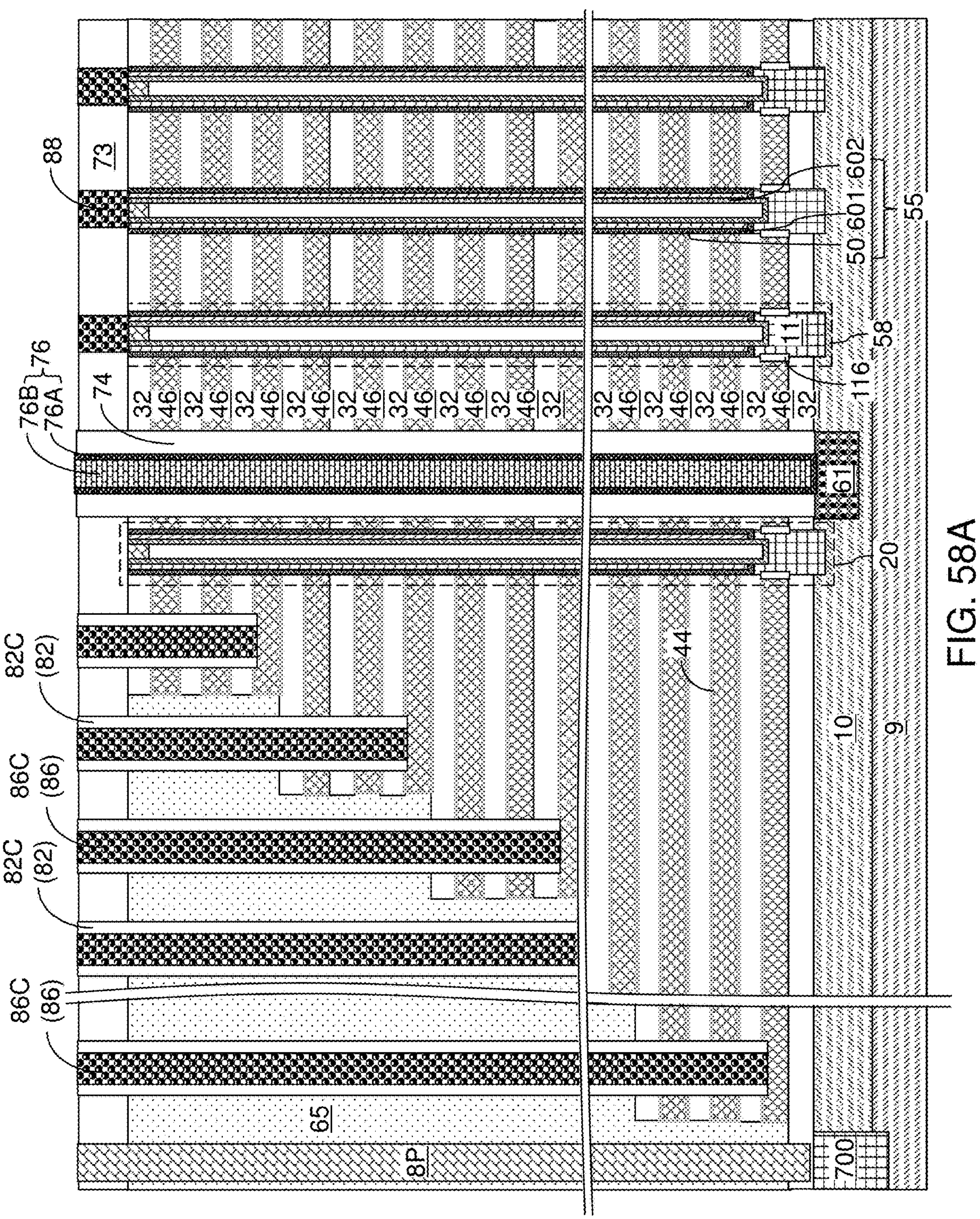
FIG. 58A is a schematic vertical cross-sectional view of the second alternative configuration of the second exemplary structure after formation of contact via structures according to an embodiment of the present disclosure.
Figure 58B:
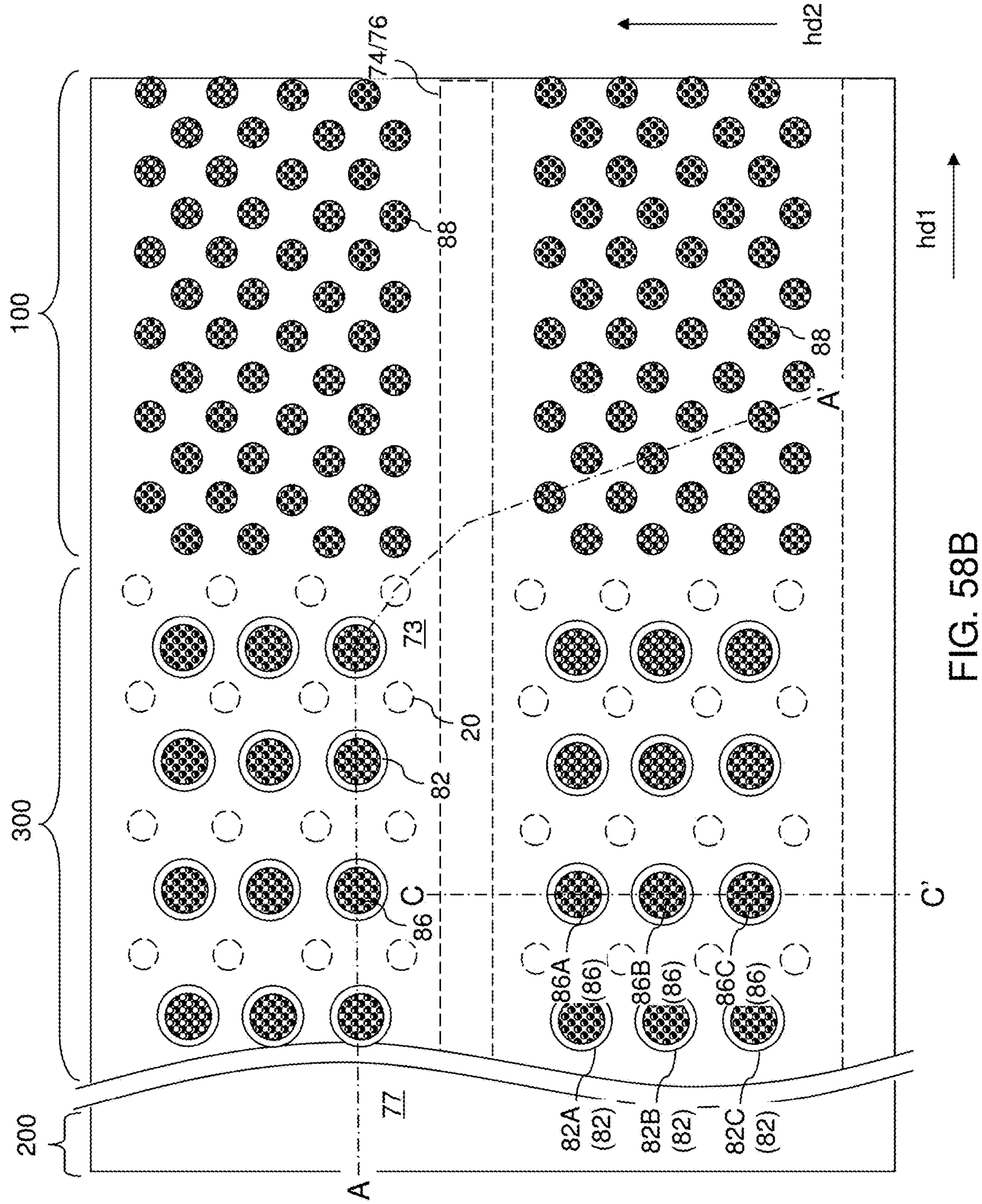
FIG. 58B is a top-down view of the second alternative configuration of the second exemplary structure of FIG. 58A. The vertical plane A-A' is the plane of the schematic vertical cross-sectional view of FIG. 58A.
Figure 58C:
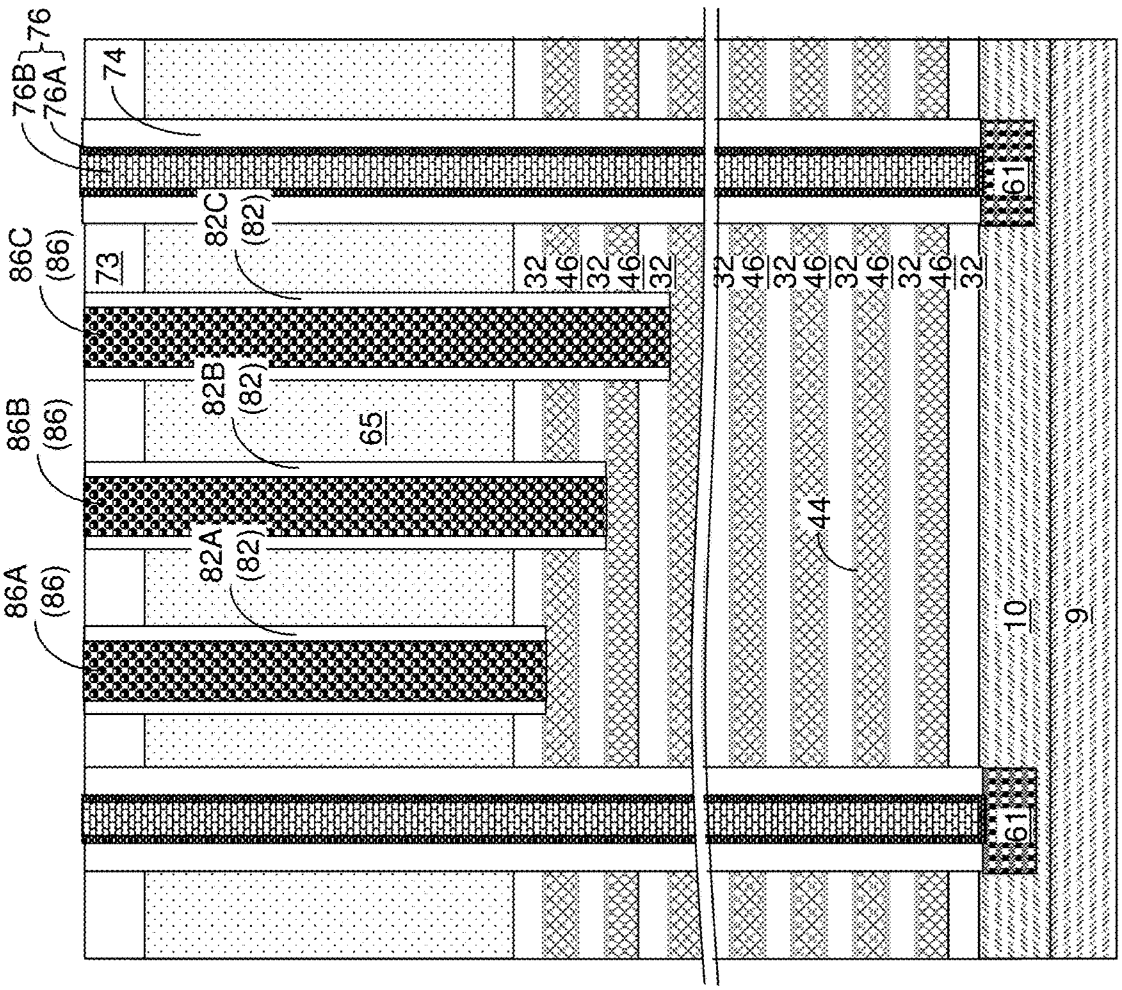
FIG. 58C is a vertical cross-sectional view of the second alternative configuration of the second exemplary structure along the vertical plane C-C' of FIG. 58B.

Referring to FIGS. 58A-58C, the processing steps described above can be performed with an additional set of processing steps for providing third via cavities that vertically extend through a respective set of two electrically conductive layers 46. In this case, the third via cavities located within a third row of via cavities can be vertically extended through a respective pair of an electrically conductive layer 46 and an insulating layer 32 while masking the first via cavities 85A and the second via cavities 85B with an additional patterned etch mask layer after the processing steps that correspond to the processing steps of FIGS. 48A-48C or after the processing steps corresponding to the processing steps of FIGS. 53A-54C. A top surface of a respective underlying electrically conductive layer 46 is physically exposed underneath each of the third via cavities.

Subsequently, the processing steps described with reference to FIGS. 49A-52C may be performed. First laterally-isolated contact structures (82A, 86A) can be formed in the first via cavities 85A. Second laterally-isolated contact structures (82B, 86B) can be formed in the second via cavities 85B. Third laterally-isolated contact structures (82C, 86C) can be formed in the third via cavities. Each of the first laterally-isolated contact structures (82A, 86A) includes a respective first layer contact via structure 86A and a respective first dielectric spacer 82A. Each of the second laterally-isolated contact structures (82B, 86B) comprises a respective second layer contact via structure 86B and a respective second dielectric spacer 82B. Each of the third laterally-isolated contact structures (82C, 86C) comprises a respective third layer contact via structure 86C and a respective third dielectric spacer 82C.

Each third dielectric spacer 82C vertically extends through the retro-stepped dielectric material portion 65 and contacts an annular top surface segment of a respective first electrically conductive layer 46 of the electrically conductive layers 46 of the alternating stack (32, 46), a cylindrical surface of a respective second electrically conductive layer 46 of the electrically conductive layers 46 of the alternating stack (32, 46) that overlies the respective first electrically conductive layer 46, and a cylindrical surface of a respective third electrically conductive layer 46 of the electrically conductive layers 46 of the alternating stack (32, 46) that overlies the respective second electrically conductive layer 46.

Figure 59:
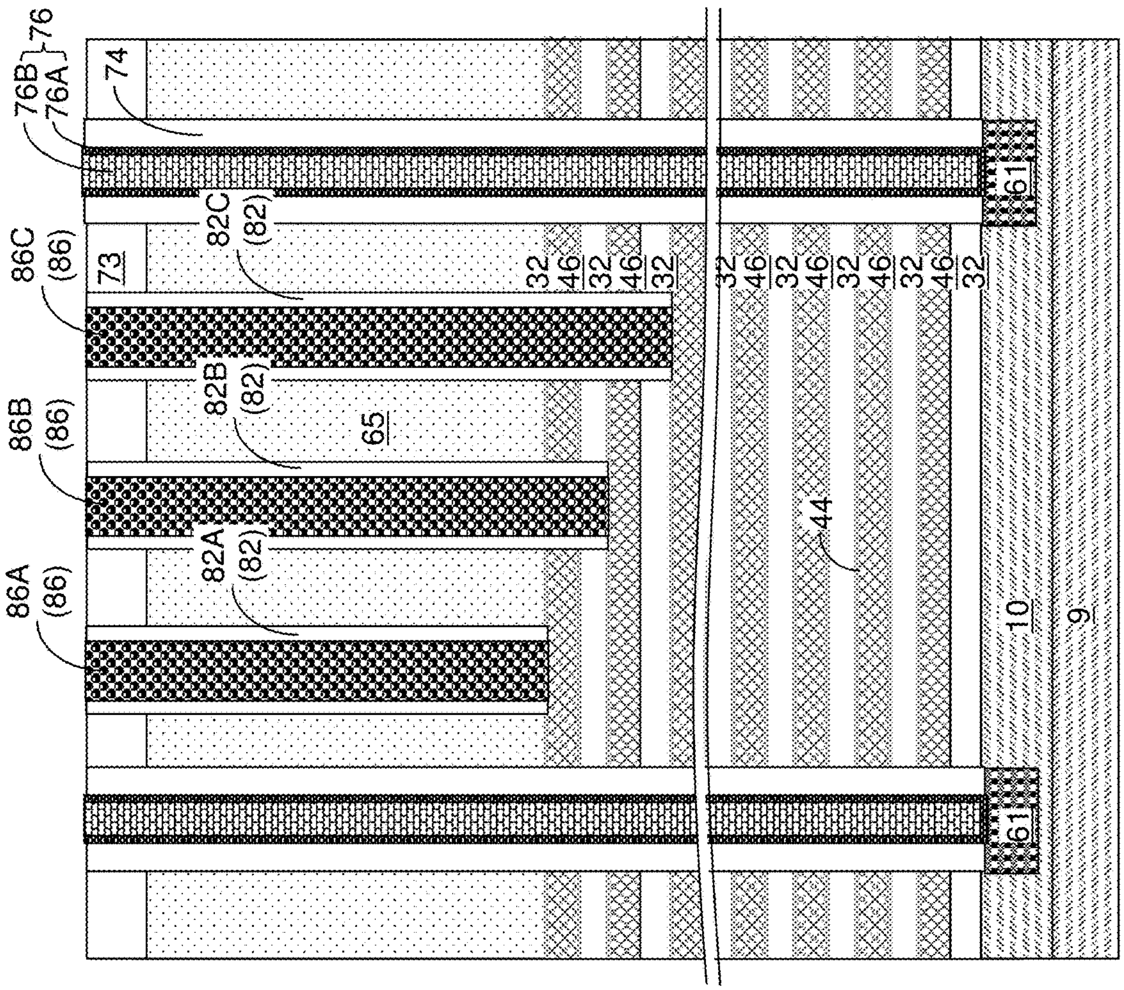
FIG. 59, is a schematic vertical cross-sectional view of the third alternative configuration of the second exemplary structure according to an embodiment of the present disclosure

Referring to FIG. 59, a third alternative configuration of the second exemplary structure according to an embodiment of the present disclosure is illustrated. The structure of FIG. 59 can be derived from FIG. 58C by patterning the alternating stack such that the horizontal surfaces of the stepped surfaces comprise top surfaces of the respective electrically conductive layers 46. Thus, the top surfaces of the electrically conductive layers 46 may be exposed at each stepped surface. Such an alternating stack may be patterned at the step shown in FIG. 38 such that the horizontal surfaces of the stepped surface comprise top surfaces of the respective sacrificial material layers 42. Thus, the top surfaces of the sacrificial material layers 42 may be exposed at each stepped surface at the step shown in FIG. 38. While Q=3 in FIG. 59, in alternative embodiments, Q may equal to 2 or to 4 or more.

Referring to all drawings and according to various embodiments of the present disclosure, a three-dimensional memory device includes an alternating stack (32, 46) of insulating layers 32 and electrically conductive layers 46 containing a terrace region (e.g., the staircase region 300) having a plurality of steps, memory stack structures 55 extending through the alternating stack, a retro-stepped dielectric material portion 65 overlying the terrace region, first laterally isolated contact structures (82A, 86A) including a respective first contact via structure 86A and a respective first dielectric spacer 82A, and second laterally isolated contact structures (82B, 86B) including a respective second contact via structure 86B and a respective second dielectric spacer 82B. The respective first contact via structure 86A contacts a top surface of a respective first electrically conductive layer 46 in the respective step of the plurality of steps. The respective second contact via structure 86B extends through the respective first electrically conductive layer 46 in the respective step and contacts a top surface of a respective second electrically conductive layer 46 which underlies the first electrically conductive layer 46 in the respective step.

In one embodiment, the respective first contact via structure 86A contacts a top surface segment of the respective single electrically conductive layer 46; and the respective second contact via structure 86B contacts a top surface segment of the respective first electrically conductive layer 46. In one embodiment, a periphery of the top surface segment of the respective first electrically conductive layer 46 coincides with an inner periphery of the annular top surface segment for each of the second laterally-isolated contact structures (82B, 86B).

In one embodiment, the plurality of steps in the terrace region comprise stepped surfaces that include a plurality of vertical surfaces that are laterally spaced apart along a first horizontal direction hd1 and laterally extend along a second horizontal direction hd2 that is perpendicular to the first horizontal direction. The respective second dielectric spacer 82B vertically extends through the retro-stepped dielectric material portion 65 and contacts an annular top surface segment of the respective second electrically conductive layer 46 and a cylindrical sidewall surface of the respective first electrically conductive layer 46. The respective first dielectric spacer 82A vertically extends through the retro-stepped dielectric material portion 65 and contacts only the single first electrically conductive layer 46 of the electrically conductive layers. The respective first contact via structure 86A contacts a top surface segment of the respective single first electrically conductive layer 46, and the respective second contact via structure 86B contacts a top surface segment of the respective second electrically conductive layer 46.

In one embodiment, the stepped surfaces include a plurality of horizontal surfaces that are laterally spaced apart along the first horizontal direction hd1, laterally extend along the second horizontal direction hd2, and are interlaced with the plurality of vertical surfaces. In one embodiment, for a first horizontal surface selected from the plurality of horizontal surfaces: one of the first laterally-isolated contact structures (82A, 86A) vertically extends to or through the first horizontal surface; and one of the second laterally-isolated contact structures (82B, 86B) vertically extends through the first horizontal surface. In one embodiment, the one of the second laterally-isolated contact structures (82B, 86B) is laterally offset from the one of the first laterally-isolated contact via structures 86 along the second horizontal direction hd2.

In one embodiment, the first laterally-isolated contact structures (82A, 86A) are arranged along the first horizontal direction hd1 in a first row; the second laterally-isolated contact structures (82B, 86B) are arranged along the first horizontal direction hd1 in a second row; and the second row is laterally offset from the first row along the second horizontal direction hd2.

In one embodiment, the first contact via structures 86A and the second contact via structures 86B have top surfaces located within a horizontal plane located at, or above, a topmost surface of the alternating stack (32, 46). In one embodiment, the first dielectric spacers 82A and the second dielectric spacers 82B have a same dielectric material composition, have a same lateral distance between a respective inner sidewall and a respective outer sidewall, and have top surfaces within the horizontal plane including the top surfaces of the first contact via structures 86A and the second contact via structures 86B.

In one embodiment, the first contact via structures 86A and the second contact via structures 86B have a same or different material composition than the electrically conductive layers 46.

In one embodiment, the three-dimensional memory device comprises: a first backside trench fill structure (74, 76) laterally extending along the first horizontal direction hd1 and contacting first sidewalls of each layer within the alternating stack (32, 46); a second backside trench fill structure (74, 76) laterally extending along the first horizontal direction hd1 and contacting second sidewalls of each layer within the alternating stack (32, 46), wherein each vertical surface within the plurality of vertical surfaces of the stepped surfaces laterally extends straight along the second horizontal direction hd2 between the first backside trench fill structure (74, 76) and the second backside trench fill structure (74, 76). In one embodiment, the stepped surfaces continuously extend from a bottommost layer within the alternating stack (32, 46) to a topmost layer within the alternating stack (32, 46); the stepped surfaces comprise a plurality of horizontal surfaces that is interlaced with, and adjoined to, the plurality of vertical surfaces; and each horizontal surface within the plurality of horizontal surfaces of the stepped surfaces has a respective uniform width along the first horizontal direction hd1 and laterally extends along the second horizontal direction hd2 between the first backside trench fill structure (74, 76) and the second backside trench fill structure (74, 76).

In one embodiment, the retro-stepped dielectric material portion 65 comprises a contiguous set of surfaces that includes horizontal bottom surface segments and vertical surface segments; the horizontal bottom surface segments are vertically spaced apart from each other and are laterally spaced apart from each other; and each of the horizontal bottom surface segments other than a bottommost one of the horizontal bottom surface segments is adjoined to a respective pair of vertical surfaces segments of the vertical surface segments of the retro-stepped dielectric material portion 65.

In one embodiment, the three-dimensional memory device further comprises third laterally-isolated contact structures (82C, 86C), each including a respective third contact via structure 86C and a respective third dielectric spacer 82C, wherein the respective third contact via structure extends through the first and the second electrically conductive layers 46 in the respective step and contacts a top surface of a third electrically conductive layer 46 of the electrically conductive layers underlying the first and second electrically conductive layers in the respective step.

The various embodiments of the present disclosure may be employed to provide a contact region 300 having a smaller area. By forming layer contact via structures 86 contacting different electrically conductive layers 46 through a same horizontal surface of a step, the lateral dimension of the contact region 300 along a horizontal direction can be reduced by a factor of Q, which is an integer greater than 1. Thus, the three-dimensional memory device can be formed with a higher areal device density.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:

an alternating stack of insulating layers and electrically conductive layers containing a terrace region comprising a plurality of steps;

memory stack structures extending through the alternating stack;

a retro-stepped dielectric material portion overlying the terrace region;

first laterally isolated contact structures each including a respective first contact via structure and a respective first dielectric spacer, wherein the respective first contact via structure contacts a top surface of a respective first electrically conductive layer of the electrically conductive layers in a respective step of the plurality of steps; and second laterally isolated contact structures including a respective second contact via structure and a respective second dielectric spacer, wherein the respective second contact via structure extends through the respective first electrically conductive layer in the respective step and contacts a top surface of a respective second electrically conductive layer of the electrically conductive layers which underlies the first electrically conductive layer in the respective step.

2. The three-dimensional memory device of claim 1, wherein:

the plurality of steps in the terrace region comprise stepped surfaces that include a plurality of vertical surfaces that are laterally spaced apart along a first horizontal direction and laterally extend along a second horizontal direction that is perpendicular to the first horizontal direction;

the respective second dielectric spacer vertically extends through the retro-stepped dielectric material portion and contacts an annular top surface segment of the respective second electrically conductive layer and a cylindrical sidewall surface of the respective first electrically conductive layer; and the respective first dielectric spacer vertically extends through the retro-stepped dielectric material portion and contacts only the single first electrically conductive layer of the electrically conductive layers.

3. The three-dimensional memory device of claim 2, wherein:

the respective first contact via structure contacts a top surface segment of the respective single first electrically conductive layer; and the respective second contact via structure contacts a top surface segment of the respective second electrically conductive layer.

4. The three-dimensional memory device of claim 2, wherein the stepped surfaces further comprise a plurality of horizontal surfaces that are laterally spaced apart along the first horizontal direction, laterally extend along the second horizontal direction, and are interlaced with the plurality of vertical surfaces.

5. The three-dimensional memory device of claim 4, wherein for a first horizontal surface selected from the plurality of horizontal surfaces:

one of the first laterally-isolated contact structures vertically extends to or through the first horizontal surface; and one of the second laterally-isolated contact structures vertically extends through the first horizontal surface.

6. The three-dimensional memory device of claim 5, wherein the one of the second laterally-isolated contact structures is laterally offset from the one of the first laterally-isolated contact via structures along the second horizontal direction.

7. The three-dimensional memory device of claim 1, wherein:

the first laterally-isolated contact structures are arranged along the first horizontal direction in a first row;

the second laterally-isolated contact structures are arranged along the first horizontal direction in a second row; and the second row is laterally offset from the first row along the second horizontal direction.

8. The three-dimensional memory device of claim 1, wherein the first contact via structures and the second contact via structures have top surfaces located within a horizontal plane located at or above a topmost surface of the alternating stack.

9. The three-dimensional memory device of claim 8, wherein the first dielectric spacers and the second dielectric spacers have a same dielectric material composition, have a same lateral distance between a respective inner sidewall and a respective outer sidewall, and have top surfaces within the horizontal plane including the top surfaces of the first contact via structures and the second contact via structures.

10. The three-dimensional memory device of claim 1, wherein the first contact via structures and the second contact via structures have a same or a different material composition than the electrically conductive layers.

11. The three-dimensional memory device of claim 2, further comprising:

a first backside trench fill structure laterally extending along the first horizontal direction and contacting first sidewalls of each layer within the alternating stack; and a second backside trench fill structure laterally extending along the first horizontal direction and contacting second sidewalls of each layer within the alternating stack, wherein each vertical surface within the plurality of vertical surfaces of the stepped surfaces laterally extends straight along the second horizontal direction between the first backside trench fill structure and the second backside trench fill structure.

12. The three-dimensional memory device of claim 11, wherein:

the stepped surfaces continuously extend from a bottommost layer within the alternating stack to a topmost layer within the alternating stack;

the stepped surfaces further comprise a plurality of horizontal surfaces that are interlaced with and adjoined to the plurality of vertical surfaces; and each horizontal surface within the plurality of horizontal surfaces of the stepped surfaces has a respective uniform width along the first horizontal direction and laterally extends along the second horizontal direction between the first backside trench fill structure and the second backside trench fill structure.

13. The three-dimensional memory device of claim 2, wherein:

the retro-stepped dielectric material portion comprises a contiguous set of surfaces that includes horizontal bottom surface segments and vertical surface segments;

the horizontal bottom surface segments are vertically spaced apart from each other and are laterally spaced apart from each other; and each of the horizontal bottom surface segments other than a bottommost one of the horizontal bottom surface segments is adjoined to a respective pair of vertical surfaces segments of the vertical surface segments of the retro-stepped dielectric material portion.

14. The three-dimensional memory device of claim 2, further comprising third laterally-isolated contact structures, each including a respective third contact via structure and a respective third dielectric spacer, wherein the respective third contact via structure extends through the first and the second electrically conductive layers in the respective step and contacts a top surface of a third electrically conductive layer of the electrically conductive layers in the respective step.

15. A method of forming a three-dimensional memory device, comprising:

forming a combination of an alternating stack of insulating layers and electrically conductive layers, memory stack structures, and a retro-stepped dielectric material portion over a substrate, wherein the memory stack structures vertically extend through the alternating stack, the alternating stack comprises stepped surfaces that continuously extend from a bottommost layer of the alternating stack to a topmost layer of the alternating stack, and the retro-stepped dielectric material portion overlies the stepped surfaces of the alternating stack;

forming first via cavities and second via cavities through the retro-stepped dielectric material portion, wherein each of the first via cavities and the second via cavities vertically extends through the retro-stepped dielectric material portion and has a bottom surface that coincides with a top surface segment of a respective one of the electrically conductive layers;

vertically extending the second via cavities through a respective pair of an electrically conductive layer and an insulating layer while masking the first via cavities, whereby a top surface of a respective underlying electrically conductive layer is physically exposed underneath each of the second via cavities; and forming first laterally-isolated contact structures in the first via cavities and second laterally-isolated contact structures in the second via cavities, wherein each of the first laterally-isolated contact structures includes a respective first contact via structure and a respective first dielectric spacer, and each of the second contact via structures comprises a respective second contact via structure and a respective second dielectric spacer.

16. The method of claim 15 wherein:

the respective first dielectric spacer vertically extends through the retro-stepped dielectric material portion and contacts no more than a respective single first electrically conductive layer of the electrically conductive layers of the alternating stack; and the respective second dielectric spacer vertically extends through the retro-stepped dielectric material portion and contacts an annular top surface segment of a respective second electrically conductive layer of the electrically conductive layers of the alternating stack and a cylindrical sidewall surface of the respective first electrically conductive layer that overlies the respective second electrically conductive layer.

17. The method of claim 15, wherein:

the first via cavities are arranged along a first horizontal direction in a first row;

the second via cavities are arranged along the first horizontal direction in a second row; and the second row is laterally offset from the first row along the second horizontal direction.

18. The method of claim 17, further comprising:

forming a hard mask layer over the alternating stack and the retro-stepped dielectric material portion;

forming an array of openings in the hard mask layer; and performing an anisotropic etch process that etches a material of the retro-stepped dielectric material portion selective to a material of the electrically conductive layers employing the hard mask layer as an etch mask to form the first via cavities and the second via cavities through the retro-stepped dielectric material portion.

19. The method of claim 18, further comprising:

forming a patterned etch mask layer over the hard mask layer after formation of the first via cavities and the second via cavities, wherein the patterned etch mask layer fills the first via cavities; and performing an anisotropic etch process that etches the respective pair of the electrically conductive layer and the insulating layer underneath each second via cavity while the patterned etch mask layer fills the first via cavities.

20. The method of claim 18, further comprising:

forming a patterned etch mask layer over the hard mask layer after formation of the first via cavities and the second via cavities, wherein the patterned etch mask layer covers the first via cavities; and performing an anisotropic etch process that etches the respective pair of the electrically conductive layer and the insulating layer underneath each second via cavity while the patterned etch mask layer covers the first via cavities.

* * * * *